United States Patent
Kimura et al.

(10) Patent No.: US 8,878,803 B2
(45) Date of Patent: Nov. 4, 2014

(54) DISPLAY DEVICE

(75) Inventors: Tomohiro Kimura, Osaka (JP); Keiichi Fukuyama, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 140 days.

(21) Appl. No.: 13/642,254

(22) PCT Filed: Apr. 13, 2011

(86) PCT No.: PCT/JP2011/059167
§ 371 (c)(1),
(2), (4) Date: Oct. 19, 2012

(87) PCT Pub. No.: WO2011/132582
PCT Pub. Date: Oct. 27, 2011

(65) Prior Publication Data
US 2013/0050126 A1  Feb. 28, 2013

(30) Foreign Application Priority Data

Apr. 21, 2010 (JP) ................. 2010-097953

(51) Int. Cl.
*G06F 3/041* (2006.01)
*G02F 1/1333* (2006.01)
*H01L 27/12* (2006.01)
*G06F 3/044* (2006.01)
*G06F 3/0487* (2013.01)
*G02F 1/1362* (2006.01)
*G02F 1/1339* (2006.01)

(52) U.S. Cl.
CPC .......... *G06F 3/0412* (2013.01); *G02F 2201/12* (2013.01); *G02F 2001/13629* (2013.01); *G06F 2203/04106* (2013.01); *G06F 2203/04105* (2013.01); *G06F 3/0414* (2013.01); *G02F 1/13338* (2013.01); *H01L 27/1259* (2013.01); *G06F 3/044* (2013.01); *H01L 27/1214* (2013.01); *G02F 1/13394* (2013.01); *G02F 1/136286* (2013.01); *G06F 3/0487* (2013.01)
USPC ........................................................ 345/173

(58) Field of Classification Search
CPC ................ G06F 3/0414; G06F 3/0487; G06F 2203/04105; G06F 2203/04106
See application file for complete search history.

(56) References Cited

U.S. PATENT DOCUMENTS 6,501,529 B1  12/2002  Kurihara et al.
2002/0134163 A1*  9/2002  Clifford ........................ 73/715

(Continued)

FOREIGN PATENT DOCUMENTS

| JP | 11-271712 A | 10/1999 |
| JP | 2001-075074 A | 3/2001 |

(Continued)

OTHER PUBLICATIONS

Official Communication issued in International Patent Application No. PCT/JP2011/059167, mailed on Jul. 19, 2011.

(Continued)

*Primary Examiner* — Dwayne Bost
*Assistant Examiner* — Christopher Kohlman
(74) *Attorney, Agent, or Firm* — Keating & Bennett, LLP

(57) ABSTRACT

A liquid crystal display device includes a glass substrate having a first main surface, a glass substrate spaced apart from a first substrate and having a second main surface facing said first main surface, and a highly-sensitive sensor and a low-sensitive sensor arranged between the glass substrate and the glass substrate.

2 Claims, 102 Drawing Sheets

(56) References Cited

U.S. PATENT DOCUMENTS

| | | | |
|---|---|---|---|
| 2003/0015040 A1* | 1/2003 | Ishio et al. | 73/718 |
| 2004/0206190 A1 | 10/2004 | Kawahata | |
| 2004/0261544 A1* | 12/2004 | Peshkin | 73/862.53 |
| 2008/0129898 A1* | 6/2008 | Moon | 349/12 |
| 2010/0156827 A1* | 6/2010 | Joo et al. | 345/173 |
| 2010/0194709 A1* | 8/2010 | Tamaki et al. | 345/174 |

FOREIGN PATENT DOCUMENTS

| | | |
|---|---|---|
| JP | 2002-287660 A | 10/2002 |
| JP | 2002-318163 A | 10/2002 |
| JP | 2003-075277 A | 3/2003 |
| JP | 2004-317403 A | 11/2004 |
| JP | 2005-181031 A | 7/2005 |
| JP | 2005-233798 A | 9/2005 |
| JP | 2007-058070 A | 3/2007 |

OTHER PUBLICATIONS

Yamamoto et al.; "Touch-Mode Capacitive Pressure Sensor"; Fujikura Technical Review; Oct. 2001; pp. 71-74.

Yamamoto et al.; "Touch Mode Capacitive Pressure Sensor"; Fujikura Technical Review No. 32; Jan. 2003; pp. 45-49.

* cited by examiner

FIG.128
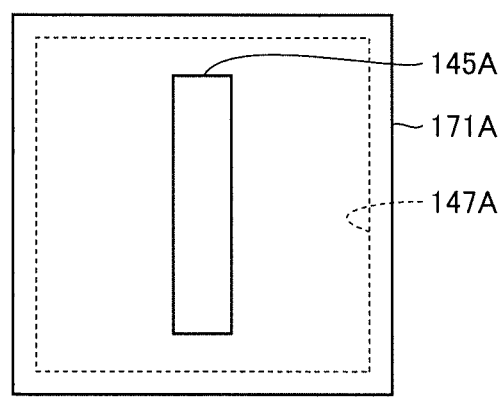
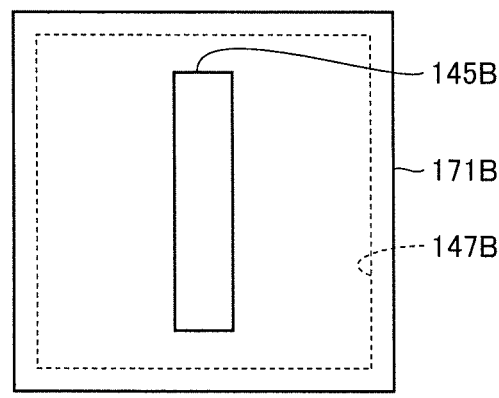

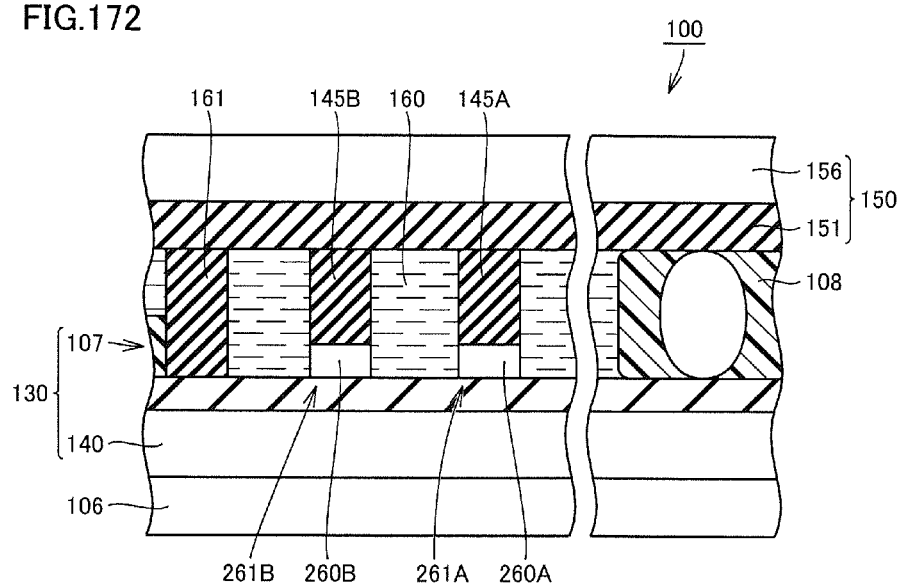
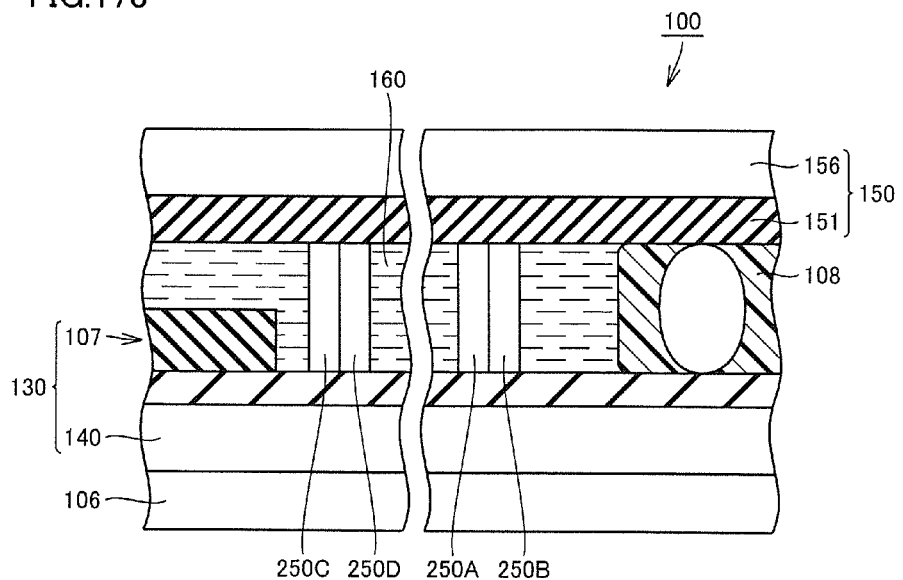

DISPLAY DEVICE

TECHNICAL FIELD

The present invention relates to a display device, and particularly to a display device having a touch panel function.

BACKGROUND ART

A liquid crystal display element integrated with a touch sensor as described in Japanese Patent Laying-Open No. 2001-75074 (PTL 1) includes a first substrate, a second substrate, and a liquid crystal layer inserted between the first substrate and the second substrate. A display electrode for image display and a touch electrode for touch point detection are provided on surfaces of the first substrate and the second substrate facing each other.

A position pressure detector described in Japanese Patent Laying-Open No. 2005-233798 (PTL 2) includes a base having a resistance film on one side thereof and a base having a conductive material on one side thereof. The resistance film and the conductive material are arranged to face each other, and a spacer is provided between these bases. A voltage is supplied to a pair of electrodes at the opposing ends of the resistance film, such that a voltage of the resistance film increases linearly from the one end side to the other end side of the resistance film. The conductive material is provided with an electrode. The position pressure detector further includes a circuit outputting a position signal based on a signal obtained from the electrode of the conductive material, and a circuit outputting a pressure signal based on a signal obtained from the pair of electrodes at the opposing ends of the resistance film.

A display device with an input function described in Japanese Patent Laying-Open No. 2002-287660 (PTL 3) includes a first substrate, a second substrate, a contact position detecting electrode formed on the first substrate and protruding from this first substrate toward the second substrate, a first contact position detecting signal line formed on the first substrate and electrically connected to the contact position detecting electrode, and a second contact position detecting signal line formed on the second substrate.

A liquid crystal display device described in Japanese Patent Laying-Open No. 11-271712 (PTL 4) includes an array substrate, a common substrate, a spacer for keeping a gap between the array substrate and the common substrate, and a pressure detecting element sandwiched between the spacer and the common substrate. An element formed by dispersing conductive fine particles onto an insulating material, a piezoelectric body generating surface charge, and the like are used as the pressure detecting element.

Various types of pressure sensors have been conventionally suggested. For example, a touch-mode capacitive pressure sensor described in the Fujikura Technical Review includes a diaphragm deformed by the applied pressure, a substrate facing the diaphragm, an electrode formed on the substrate, and a dielectric film formed on the electrode.

A pressure sensor described in Japanese Patent Laying-Open No. 2002-318163 (PTL 5) includes an insulating porous sheet and metal layers formed on upper and lower surfaces of this insulating porous sheet. The insulating porous sheet is made of polyethylene, polyester, polyimide, PTFE, polypropylene, polycarbonate, polysulfone, polyvinylidene fluoride, polyacrylonitrile, polyamide, cellulose acetate or the like.

A sheet-like pressure sensor described in Japanese Patent Laying-Open No. 2003-75277 (PTL 6) includes electrodes facing each other and a pressure-sensitive layer formed between these electrodes and changing a dielectric constant by pressure. A surface pressure distribution sensor described in Japanese Patent Laying-Open No. 2004-317403 (PTL 7) includes a line wiring part and a column wiring part arranged to face each other with a certain spacing therebetween via a spacer. The line wiring part includes a glass substrate, multiple line wirings aligned in parallel to one another in a first direction on this glass substrate, and an insulating film covering these line wirings. The column wiring part includes a flexible film and multiple column wirings aligned in parallel to one another in a second direction on this flexible film.

A pressure detector described in Japanese Patent Laying-Open No. 2005-181031 (PTL 8), Japanese Patent Laying-Open No. 2005-233798 (PTL 2) and the like includes a base having a resistance film on one side thereof and a base having a conductive material on one side thereof. The resistance film and the conductive material are arranged to face each other, and a spacer is provided between these bases. A voltage is supplied to a pair of electrodes at the opposing ends of the resistance film, such that a voltage of the resistance film increases linearly from the one end side to the other end side of the resistance film. The conductive material is provided with an electrode. The pressure detector further includes a circuit outputting a position signal based on a signal obtained from the electrode of the conductive material, and a circuit outputting a pressure signal based on a signal obtained from the pair of electrodes at the opposing ends of the resistance film.

CITATION LIST

Patent Literature

PTL 1: Japanese Patent Laying-Open No. 2001-75074
PTL 2: Japanese Patent Laying-Open No. 2005-233798
PTL 3: Japanese Patent Laying-Open No. 2002-287660
PTL 4: Japanese Patent Laying-Open No. 11-271712
PTL 5: Japanese Patent Laying-Open No. 2002-318163
PTL 6: Japanese Patent Laying-Open No. 2003-75277
PTL 7: Japanese Patent Laying-Open No. 2004-317403
PTL 8: Japanese Patent Laying-Open No. 2005-181031

Non Patent Literature

NPL 1: Satoshi Yamamoto et al. "Touch Mode Capacitive Pressure Sensor", Fujikura Technical Review No. 32 January 2003 pp. 45-49
Internet <URL: http://www.fujikura.co.jp/00/gihou/gihou32e/pdf32e/32e_10.pdf>

SUMMARY OF INVENTION

Technical Problem

The pressing force applied to the substrate when a user's finger touches the substrate is different from the pressing force applied to the substrate when a pen touches the screen. In addition, generally, a central portion of the substrate deflects easily and the substrate does not deflect easily on the outer peripheral edge side of the substrate.

In the liquid crystal display element integrated with a touch sensor described in Japanese Patent Laying-Open No. 2001-75074, the touch electrode formed on the first substrate comes into contact with the touch electrode formed on the second substrate, and thereby a touch position is detected. In this liquid crystal display element integrated with a touch sensor, however, a range of detection of the pressing force is limited due to the formed sensor structure, and particularly in a case where objects having different contact areas such as the finger and the pen are supposed to touch a touch point, it is difficult to set the range of detection of the pressing force. In addition, the fact that an amount of deflection of the substrate varies in accordance with the touch points even when the same load is applied is not taken into consideration.

In the position pressure detector described in Japanese Patent Laying-Open No. 2005-233798, it is difficult to set the wide range of detection of the pressing force. Therefore, in the case where objects having different contact areas such as the finger and the pen are supposed to touch a touch point, it is difficult to set the range of detection of the pressing force. In addition, the fact that an amount of deflection of the base differs in accordance with the positions of the base where the objects touch even when the same load is applied is not taken into consideration.

In the display device with an input function described in Japanese Patent Laying-Open No. 2002-287660 as well, the wide range of detection of the pressing force cannot be set. Therefore, in the case where objects having different contact areas such as the finger and the pen are supposed to touch a touch point, it is difficult to set the range of detection of the pressing force. In addition, the fact that an amount of deflection of the second substrate differs in accordance with the contact positions even when the same load is applied is not taken into consideration.

In the pressure detecting element described in Japanese Patent Laying-Open No. 11-271712 or the like, when the piezoelectric body generating surface charge is used as the piezoelectric detecting element, a capacitance of the piezoelectric body fluctuates depending on a distance between electrodes of the piezoelectric body. Even if the distance between the electrodes fluctuates, the capacitance does not fluctuate greatly. Particularly when an amount of reduction in the distance between the electrodes is small, a change rate of the capacitance between the electrodes is small. Therefore, when the force with which the substrate is touched is small, it is not easy to sense the fluctuations in the capacitance, and it is difficult to sense the contact force even when the finger and the like touch the substrate. Furthermore, when a piezoelectric body in which the distance between electrodes fluctuates greatly even when the touching force is small is used, a large load cannot be sensed. As described above, in the pressure detecting element described in Japanese Patent Laying-Open No. 11-271712 or the like as well, it is difficult to set the wide range of detection of the detectable pressing force. Therefore, in the case where objects having different contact areas such as the finger and the pen are supposed to come into contact with a touch point, it is difficult to set the range of detection of the pressing force. In addition, the fact that an amount of deflection of the position where the finger, the pen and the like touch the touch point fluctuates in accordance with the positions of the common substrate is not taken into consideration.

When the element formed by dispersing conductive particles in an insulating resin is used as the piezoelectric detecting element, it is also difficult to set the wide range of detection of the pressing force. Furthermore, the fact that an amount of deflection of the substrate fluctuates in accordance with the touching positions of the substrate is not taken into consideration.

The touch-mode capacitive pressure sensor described in the aforementioned Fujikura Technical Review is used to sense the tire pressure, and is a sensor relating to the technical field that has nothing to do with the display device.

Generally, a sensor is built into a display device with a touch panel function. When the user operates this display device, the user performs various types of operations by, for example, bringing someone's finger, someone's pen or the like into contact with a screen.

A contact area when the finger touches the screen is different from a contact area when the pen or the like touches the screen, and the contact area when the finger touches the screen is larger than the contact area when the pen touches the screen. As a result, a stress applied per unit area of the touch point when the finger comes into contact with the screen is smaller than a stress when the pen comes into contact with the screen.

Generally, in the pressure sensor that can sense application of the load, the load range where application of the load can be accurately sensed is determined.

Consequently, in the case where objects having different contact areas such as the finger and the pen are supposed to come into contact with a touch point, it is very difficult to set the range of detection where the pressing force can be detected.

Furthermore, an ON/OFF sensor that can sense a small load applied by the finger cannot determine whether the finger or the pen touches the screen even when the load is applied and the ON/OFF sensor is turned on. In a pressure sensor as well that can sense a small load applied by the finger, an output value becomes fixed when a predetermined load or a larger load is applied, and it is difficult to determine whether the finger or the pen touches the screen.

An ON/OFF sensor and a pressure sensor that can sense a large load applied by the pen cannot sense that the finger has touched the screen.

As described above, in the display device as well on which the ON/OFF sensor is simply mounted, the wide range of detection of the pressing force cannot be set. There has not been proposed a display device with a touch panel function that is improved by focusing attention on the fact that various types of contact objects come into contact with the screen.

The present invention has been made in light of the aforementioned problems, and a first object of the present invention is to provide a display device that has an extended range of sensing where sensing is possible and that can accurately sense the contact even when a variety of contact objects touch a substrate. A second object is to provide a display device having a uniform range of sensing among respective sensors. A third object is to provide a display device in which variations in sensor sensitivity caused by occurrence of a difference in an amount of deflection of the substrate in accordance with touching positions can be suppressed.

Solution to Problem

A display device according to the present invention includes: a first substrate having a first main surface; a second substrate spaced apart from the first substrate and having a second main surface facing the first main surface; and a first pressure sensor and a second pressure sensor arranged between the first substrate and the second substrate. Sensitivity of the first pressure sensor is different from sensitivity of the second pressure sensor.

Preferably, the first pressure sensor outputs a first output value corresponding to a load applied to the first pressure sensor, and the second pressure sensor outputs a second output value corresponding to a load applied to the second pressure sensor. When the loads applied to the first pressure sensor and the second pressure sensor fluctuate, a difference between the first output value and the second output value fluctuates.

Preferably, the first pressure sensor outputs a first output value corresponding to a load applied to the first pressure sensor, and the second pressure sensor outputs a second output value corresponding to a load applied to the second pressure sensor. A rate of change in the first output value is larger than a rate of change in the second output value.

Preferably, the first output value is larger than the second output value when pressing force applied to the first pressure sensor and the second pressure sensor is smaller than a predetermined value, and the first output value becomes smaller than the second output value when the pressing force becomes larger than the predetermined value.

Preferably, the first pressure sensor outputs a first output value corresponding to a load applied to the first pressure sensor, and the second pressure sensor outputs a second output value corresponding to a load applied to the second pressure sensor. When the load applied to the first pressure sensor becomes larger than a first reference load, the first pressure sensor can output the first output value corresponding to the applied load. When the load applied to the second pressure sensor becomes larger than a second reference load, the second pressure sensor can output the second output value corresponding to the applied load.

Preferably, the display device further includes: a pressing member pressing both the first pressure sensor and the second pressure sensor.

Preferably, the first pressure sensor and the second pressure sensor are arranged to be adjacent to each other. Preferably, the display device further includes: a matrix substrate including the first substrate; a common substrate including the second substrate and spaced apart from the matrix substrate; and a spacer located between the matrix substrate and the common substrate. The spacer serves as the pressing member, and the first pressure sensor and the second pressure sensor are arranged between the spacer and the matrix substrate or between the spacer and the common substrate.

Preferably, the display device further includes: a matrix substrate including the first substrate; and a common substrate including the second substrate and a color filter formed on the second main surface, and spaced apart from the matrix substrate. The color filter includes a black matrix having a plurality of window portions and having a light blocking function, and a colored layer formed in the window portion. The first pressure sensor and the second pressure sensor are arranged below the black matrix, and the black matrix serves as the pressing member.

Preferably, the display device further includes: a matrix substrate including the first substrate; a common substrate including the second substrate and spaced apart from the matrix substrate; a liquid crystal layer filled between the matrix substrate and the common substrate; and a sealing member extending along an outer periphery of the matrix substrate and the common substrate, and sealing the liquid crystal layer between the matrix substrate and the common substrate. The sealing member serves as the pressing member, and the first pressure sensor and the second pressure sensor are arranged between the sealing member and the matrix substrate.

Preferably, the pressing member includes a contact portion that is in contact with both the first pressure sensor and the second pressure sensor.

Preferably, the first pressure sensor includes a first sensor electrode located between the first substrate and the second substrate, and a second sensor electrode spaced apart from the first sensor electrode in a stacking direction of the first substrate and the second substrate and arranged to face the first sensor electrode. The second pressure sensor includes a third sensor electrode located between the first substrate and the second substrate, and a fourth sensor electrode spaced apart from the third sensor electrode in the stacking direction of the first substrate and the second substrate and arranged to face the third sensor electrode. At least one of the first sensor electrode and the second sensor electrode can be displaced toward the other. At least one of the third sensor electrode and the fourth sensor electrode can be displaced toward the other.

Preferably, the display device further includes: a first insulating layer formed between the first sensor electrode and the second sensor electrode; a second insulating layer formed between the third sensor electrode and the fourth sensor electrode; and a detecting unit capable of detecting a capacitance between the first sensor electrode and the second sensor electrode as well as a capacitance between the third sensor electrode and the fourth sensor electrode.

Preferably, when the second substrate is pressed, the first sensor electrode can come into contact with the second sensor electrode, and when the second substrate is pressed, the third sensor electrode can come into contact with the fourth sensor electrode. The display device further includes a detecting unit capable of detecting a change in current flowing between the first sensor electrode and the second sensor electrode as well as a change in current flowing between the third sensor electrode and the fourth sensor electrode.

Preferably, the second sensor electrode includes an elastically deformable first projection and a first conductive layer formed on a surface of the first projection, and the fourth sensor electrode includes an elastically deformable second projection and a second conductive layer formed on a surface of the second projection. A shape of the first projection is different from a shape of the second projection.

Preferably, the second sensor electrode includes an elastically deformable first projection and a first conductive layer formed on a surface of the first projection, and the fourth sensor electrode includes an elastically deformable second projection and a second conductive layer formed on a surface of the second projection. An area of a portion of the first conductive layer that can deform to conform to the first sensor electrode is different from an area of a portion of the second conductive layer that can deform to conform to the third sensor electrode.

Preferably, the second sensor electrode can be displaced when pressed, and the fourth sensor electrode can be displaced when pressed. The first pressure sensor includes a first support unit supporting the second sensor electrode and a second support unit spaced apart from the first support unit and supporting the second sensor electrode, and the second pressure sensor includes a third support unit supporting the fourth sensor electrode and a fourth support unit spaced apart from the third support unit and supporting the fourth sensor electrode. The first support unit and the second support unit define a first recess that can receive the second sensor electrode that has been displaced, and the third support unit and the fourth support unit define a second recess that can receive the fourth sensor electrode that has been displaced. A spacing between the first support unit and the second support unit is larger than a spacing between the third support unit and the fourth support unit.

Preferably, the first pressure sensor includes a first sensor electrode and a second sensor electrode facing the first sensor electrode, and the second pressure sensor includes a third sensor electrode and a fourth sensor electrode facing the third sensor electrode. The display device further includes: a first pressing member pressing the second sensor electrode toward the first sensor electrode; and a second pressing member pressing the fourth sensor electrode toward the third sensor electrode. When the second sensor electrode is pressed by the first pressing member, the second sensor electrode is displaced and comes into contact with the first sensor electrode to conform to the first sensor electrode. When the fourth sensor electrode is pressed by the second pressing member, the fourth sensor electrode is displaced and comes into contact with the third sensor electrode to conform to the third sensor electrode. A shape of the first pressing member is different from a shape of the second pressing member.

Preferably, an area of contact between the first pressing member and the second sensor electrode is different from an area of contact between the second pressing member and the fourth sensor electrode.

Preferably, the first pressing member presses a central portion of the second sensor electrode, and the second pressing member presses a portion of the fourth sensor electrode located closer to a peripheral edge of the fourth sensor electrode than a central portion of the fourth sensor electrode.

Preferably, the first pressure sensor includes a first sensor electrode and a second sensor electrode facing the first sensor electrode, and the second pressure sensor includes a third sensor electrode and a fourth sensor electrode facing the third sensor electrode. A spacing between the first sensor electrode and the second sensor electrode is different from a spacing between the third sensor electrode and the fourth sensor electrode. Preferably, the first pressure sensor includes a first sensor electrode, a second sensor electrode spaced apart from the first sensor electrode, and a first support member and a second support member spaced apart from each other and arranged to keep a spacing between the first sensor electrode and the second sensor electrode. The second pressure sensor includes a third sensor electrode, a fourth sensor electrode spaced apart from the third sensor electrode, and a third support member and a fourth support member spaced apart from each other and arranged to keep a spacing between the third sensor electrode and the fourth sensor electrode. A spacing between the first support member and the second support member is different from a spacing between the third support member and the fourth support member.

Preferably, the first pressure sensor includes a first coil located between the first substrate and the second substrate, and a second coil spaced apart from the first coil in a stacking direction of the first substrate and the second substrate and arranged to face the first coil. The second pressure sensor includes a third coil located between the first substrate and the second substrate, and a fourth coil spaced apart from the third coil in the stacking direction of the first substrate and the second substrate and arranged to face the third coil.

Preferably, the first coil and the third coil are located closer to the first substrate or the second substrate than the second coil and the fourth coil, and a size of the first coil is different from a size of the third coil.

Preferably, the first coil and the third coil are located closer to the first substrate or the second substrate than the second coil and the fourth coil, and an amount of current supplied to the second coil is different from an amount of current supplied to the third coil.

Preferably, the first pressure sensor is located closer to a central portion of the first substrate than the second pressure sensor, and the sensitivity of the first pressure sensor is lower than the sensitivity of the second pressure sensor.

A display device according to the present invention includes: a first substrate having a first main surface; a second substrate spaced apart from the first substrate and having a second main surface facing the first main surface; and a first sensor and a second sensor arranged between the first substrate and the second substrate. Sensitivity of the first sensor is different from sensitivity of the second sensor.

Advantageous Effects of Invention

In the display device according to the present invention, even when the finger, the pen or the like touches the substrate, the contact can be accurately sensed.

BRIEF DESCRIPTION OF DRAWINGS

FIG. 120 is a plan view showing a modification of upper electrode 171A of pressure sensor 118A and upper electrode 171B of pressure sensor 118B.

FIG. 121 is a cross-sectional view of liquid crystal display device 100 according to a twelfth embodiment and is a cross-sectional view showing pressure sensor 118A.

FIG. 122 is a cross-sectional view of liquid crystal display device 100 according to the twelfth embodiment and is a cross-sectional view showing pressure sensor 118B.

FIG. 123 is a cross-sectional view of liquid crystal display device 100 according to a thirteenth embodiment and is a cross-sectional view showing pressure sensor 118A.

FIG. 124 is a cross-sectional view of liquid crystal display device 100 according to the thirteenth embodiment and is a cross-sectional view showing pressure sensor 118B.

FIG. 125 is a plan view schematically showing an arrangement relationship between upper electrodes 171A and 171B and pressing members 145A and 145B.

FIG. 126 is a cross-sectional view of liquid crystal display device 100 according to a fourteenth embodiment and is a cross-sectional view showing pressure sensor 118A.

FIG. 127 is a cross-sectional view showing pressure sensor 118B.

FIG. 128 is a plan view showing a positional relationship between upper electrodes 171A and 171B and pressing members 145A and 145B.

FIG. 129 is a circuit diagram schematically showing a circuit diagram of liquid crystal display device 100 according to a fifteenth embodiment.

FIG. 130 is a cross-sectional view of liquid crystal display device 100 showing TFT element 115.

FIG. 131 is a cross-sectional view of liquid crystal display device 100 according to the fifteenth embodiment and is a cross-sectional view showing a TFT element for selection 116A and a pressure sensor 190A.

Figure 132:
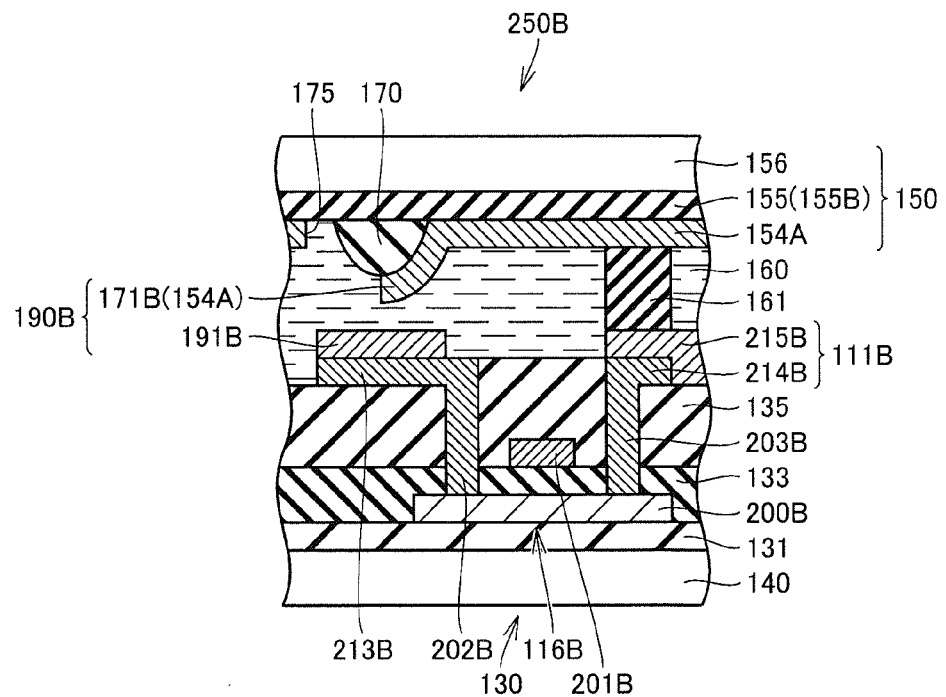

FIG. 132 is a cross-sectional view of liquid crystal display device 100 according to the fifteenth embodiment and is a cross-sectional view showing a pressure sensor 190B and a TFT element for selection 116B.

Figure 133:
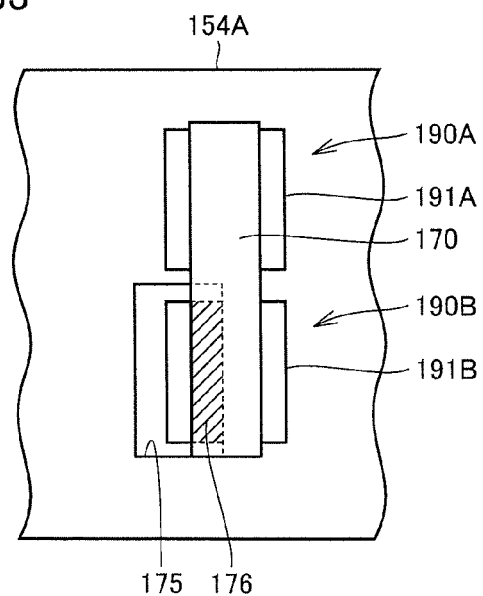

FIG. 133 is a plan view schematically showing an arrangement relationship among lower electrodes 191A and 191B, projection 170 and upper electrode wiring 154A.

Figure 134:
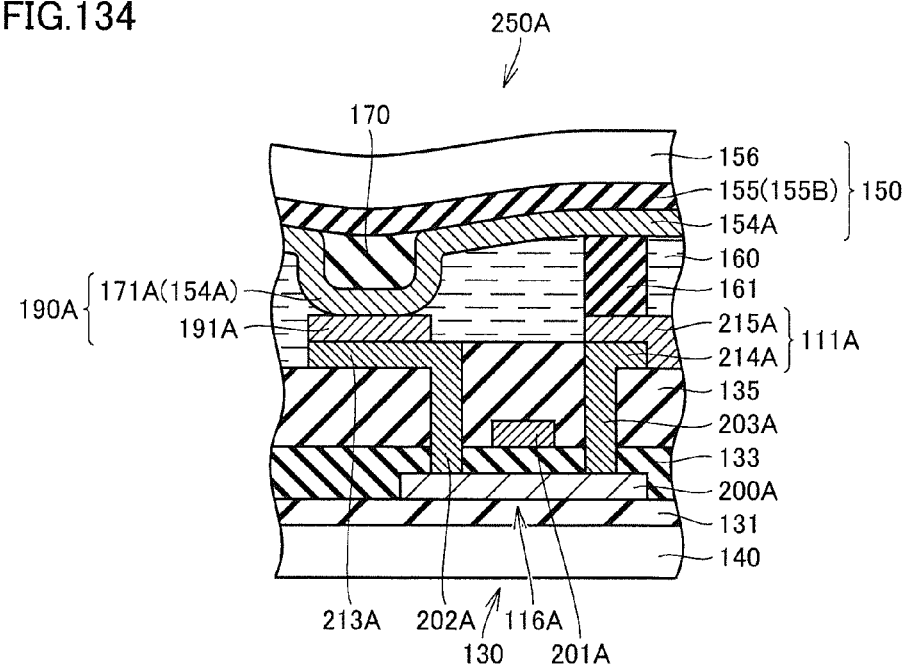

FIG. 134 is a cross-sectional view showing pressure sensor 190A and the like when common substrate 150 is pressed.

Figure 135:
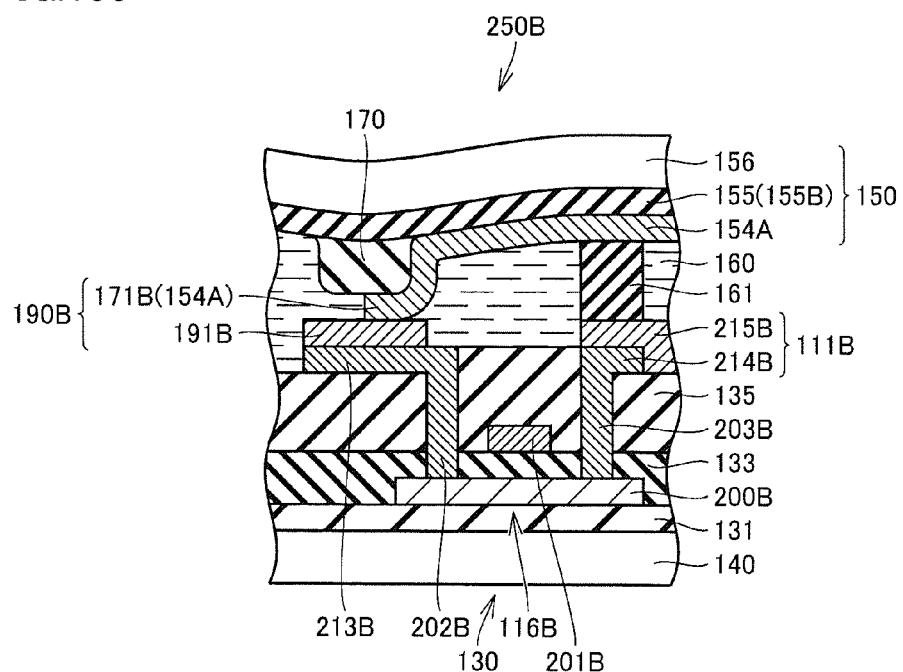

FIG. 135 is a cross-sectional view showing pressure sensor 190B when common substrate 150 is pressed.

Figure 136:
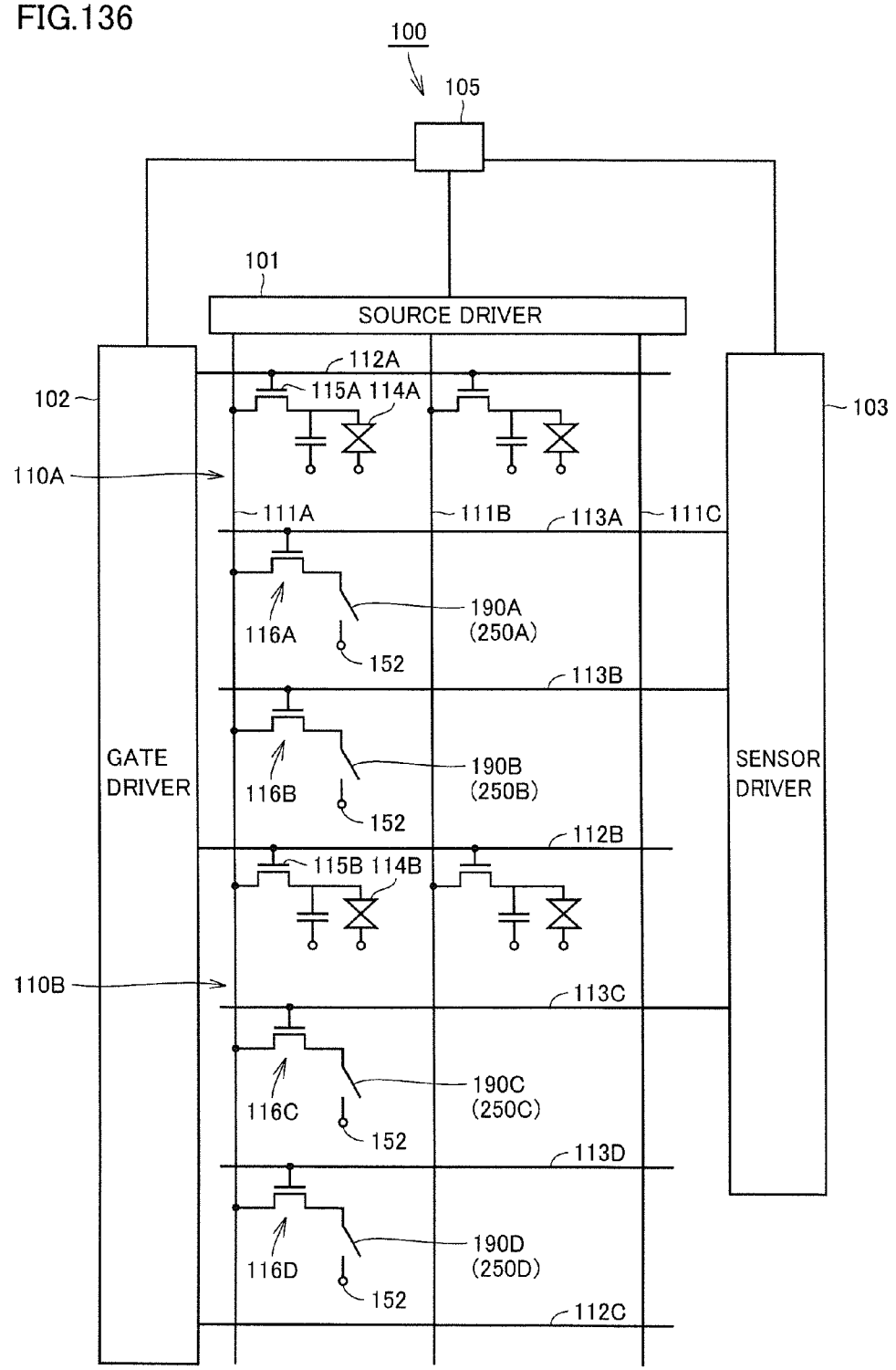

FIG. 136 is a circuit diagram schematically showing an electrical circuit of liquid crystal display device 100 according to a sixteenth embodiment.

Figure 137:
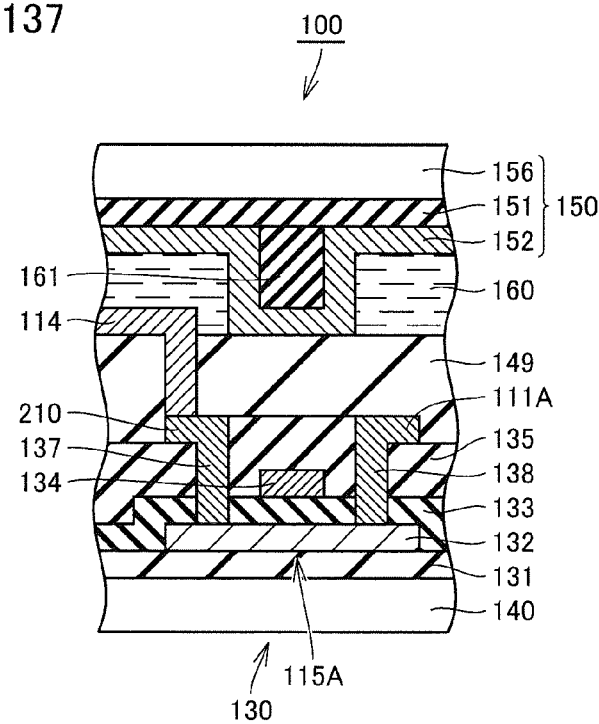

FIG. 137 is a cross-sectional view of liquid crystal display device 100 showing a TFT element 115A.

Figure 138:
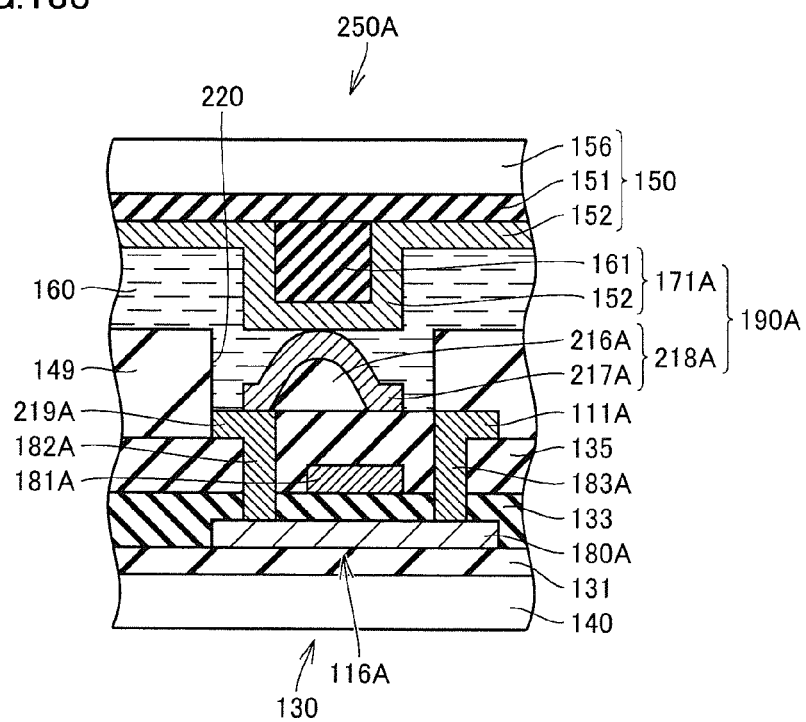

FIG. 138 is a cross-sectional view showing TFT element for selection 116 and pressure sensor 190A.

Figure 139:
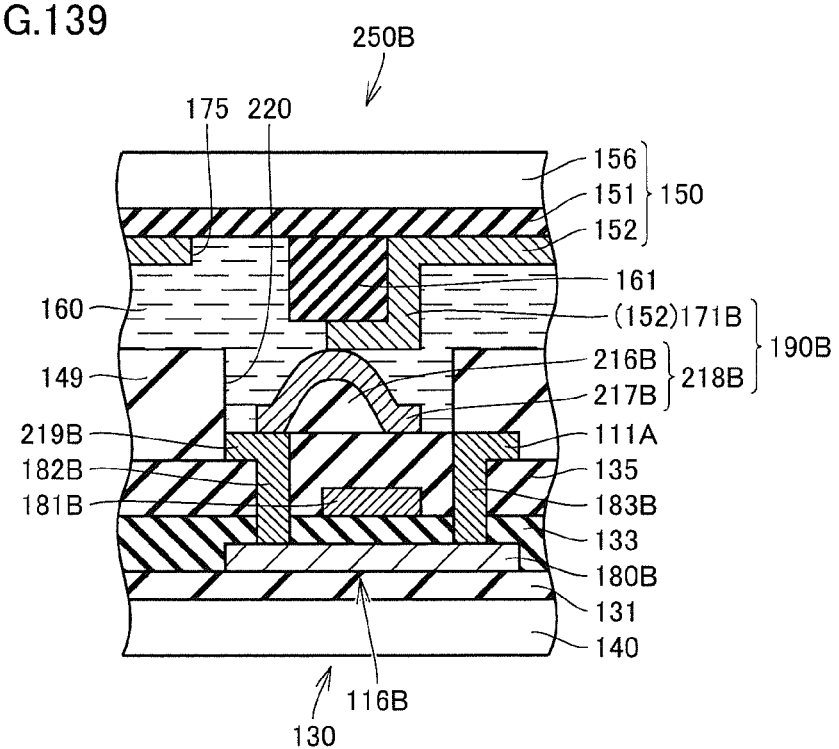

FIG. 139 is a cross-sectional view of liquid crystal display device 100 showing TFT element for selection 116B and pressure sensor 190B.

Figure 140:
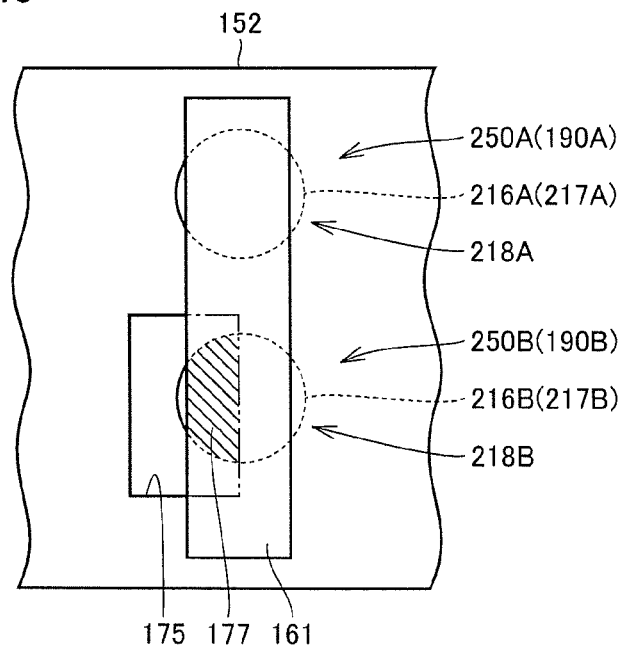

FIG. 140 is a plan view showing a positional relationship among common electrode 152, projections 216A and 216B, and spacer 161.

Figure 141:
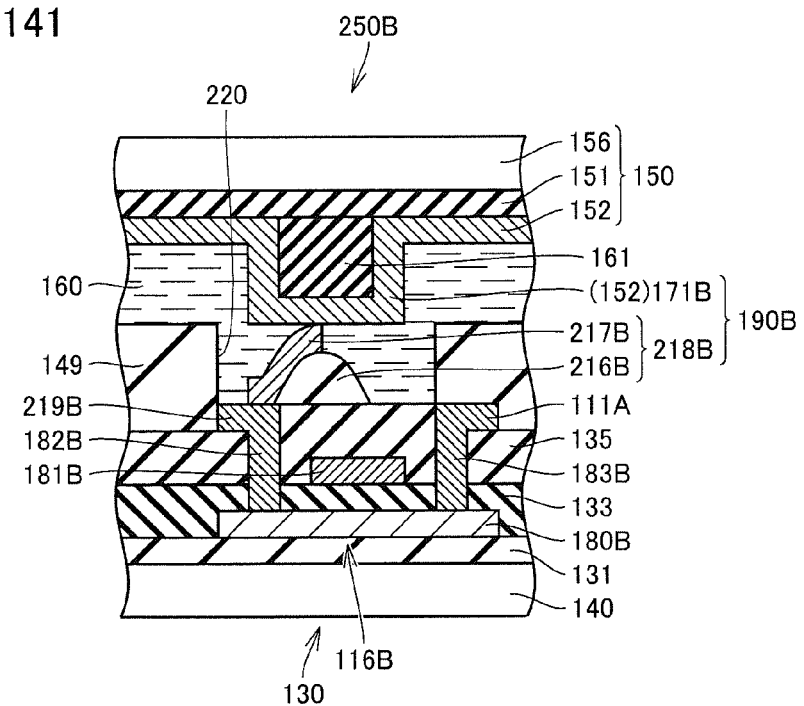

FIG. 141 is a cross-sectional view showing a modification of pressure sensor 190B.

Figure 142:
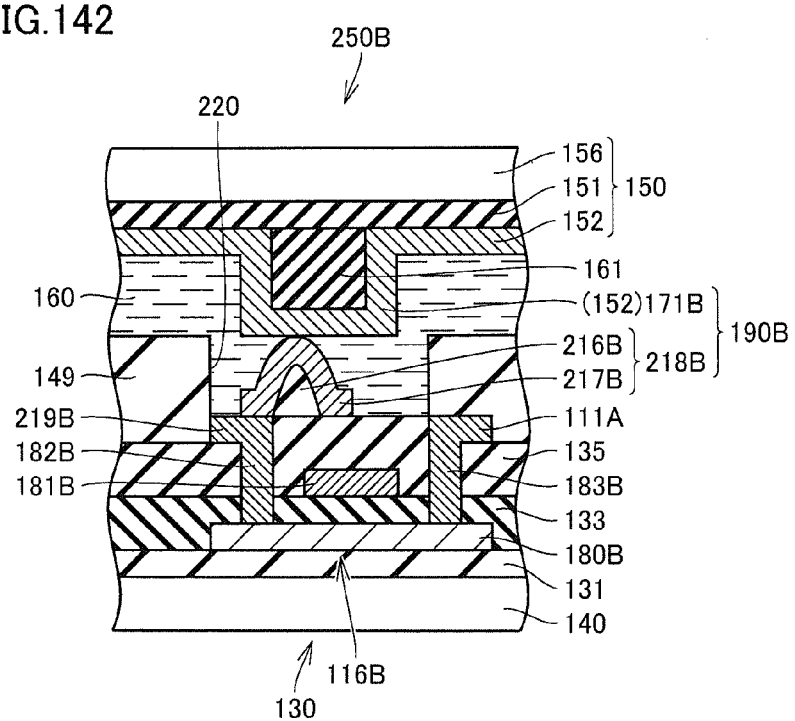

FIG. 142 is a cross-sectional view showing a second modification of pressure sensor 190B.

Figure 143:
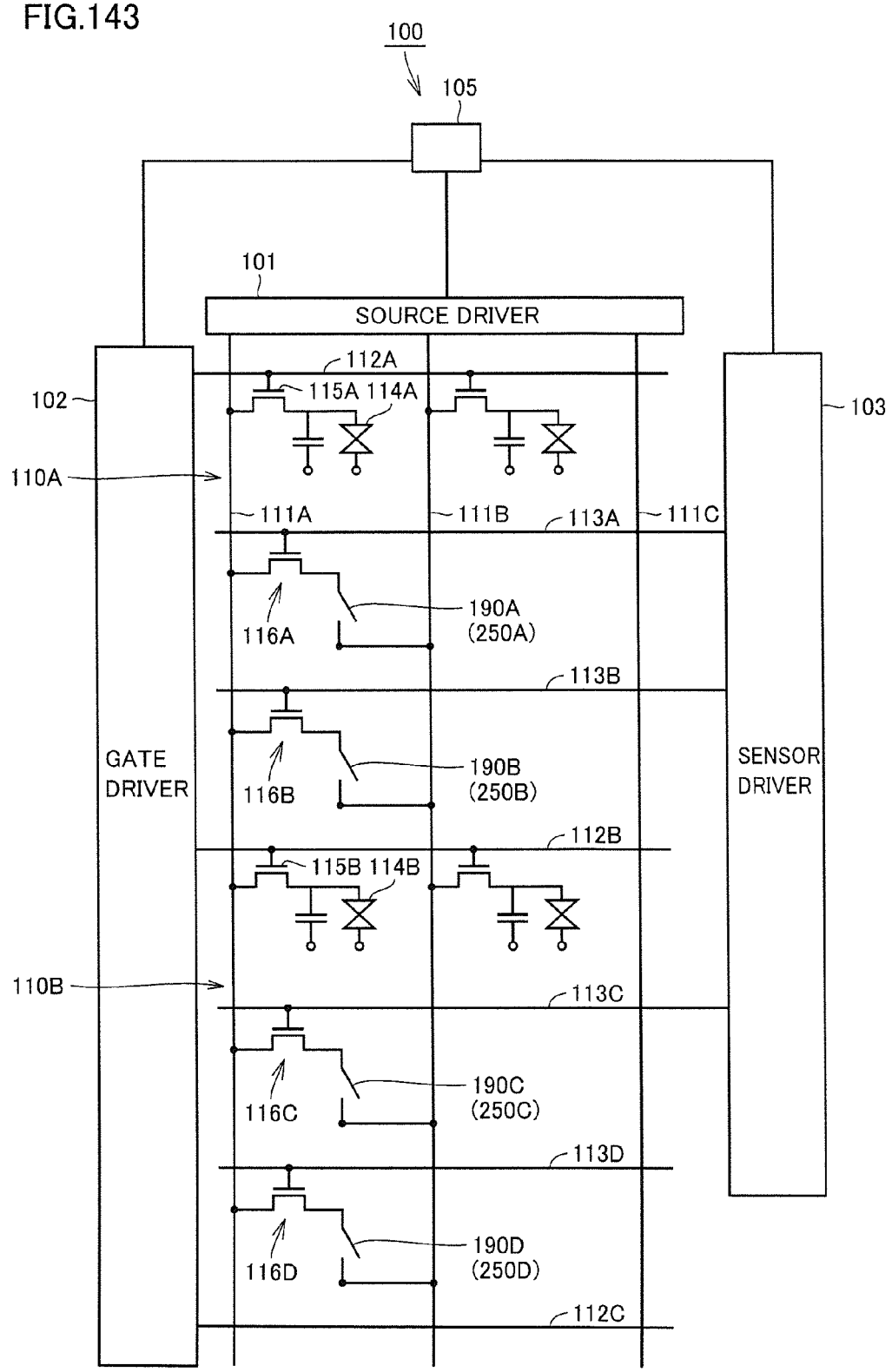

FIG. 143 is a circuit diagram schematically showing a circuit of liquid crystal display device 100 according to a seventeenth embodiment.

Figure 144:
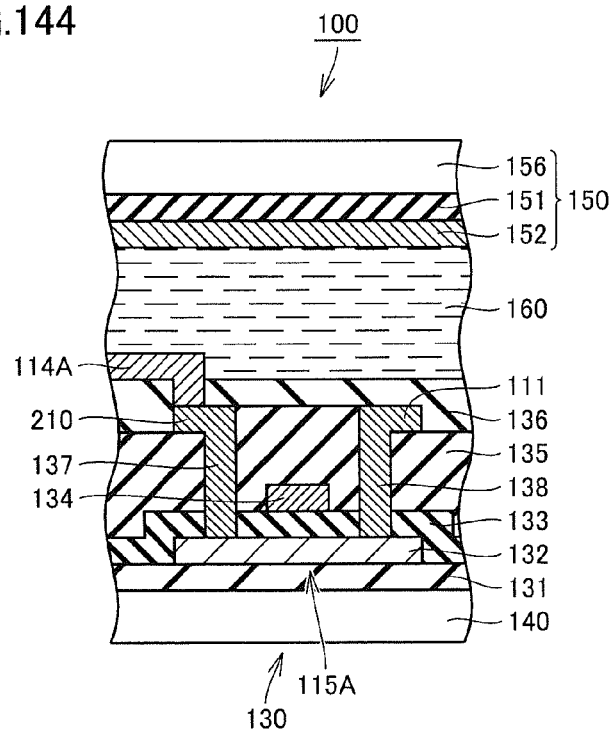

FIG. 144 is a cross-sectional view showing TFT element 115A.

Figure 145:
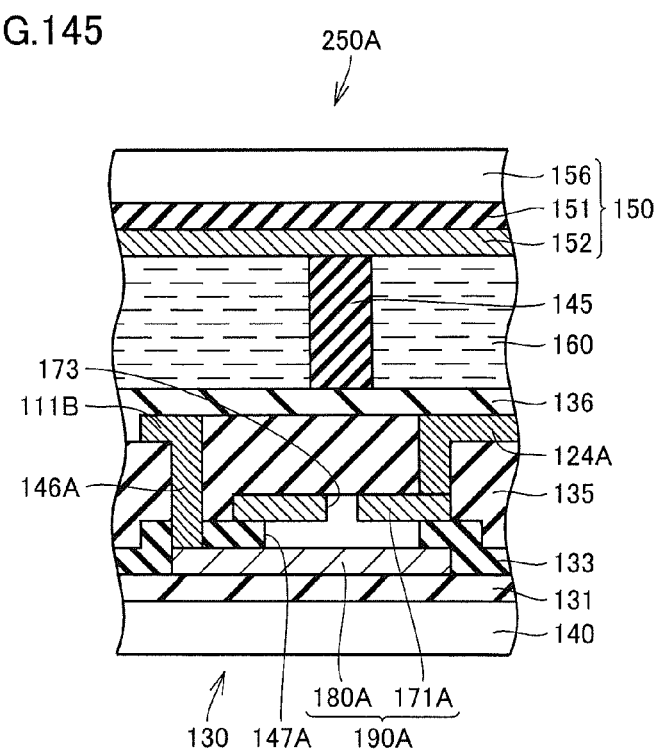

FIG. 145 is a cross-sectional view showing pressure sensor 190A.

Figure 146:
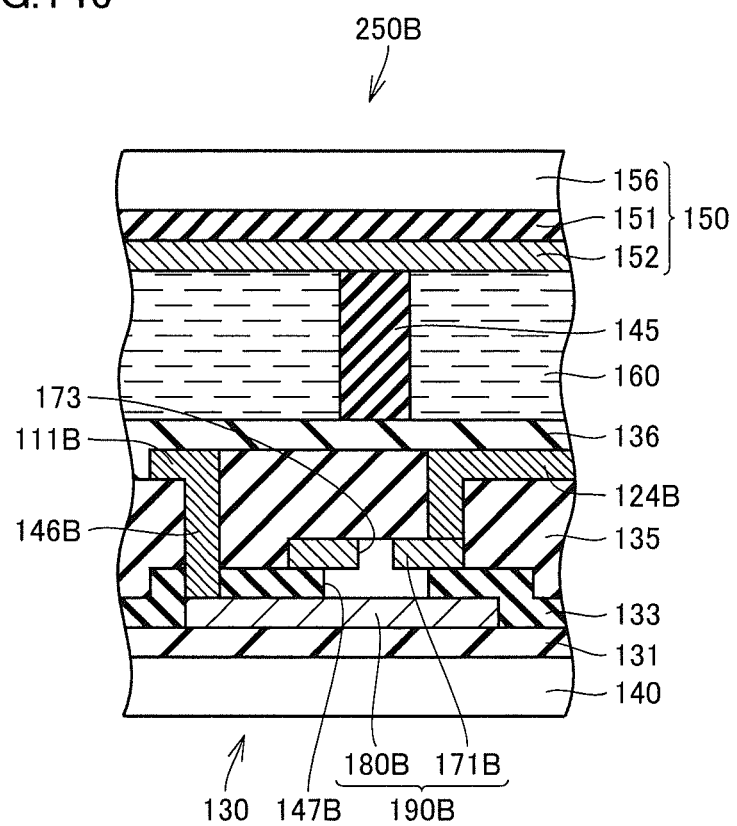

FIG. 146 is a cross-sectional view showing pressure sensor 190B.

Figure 147:
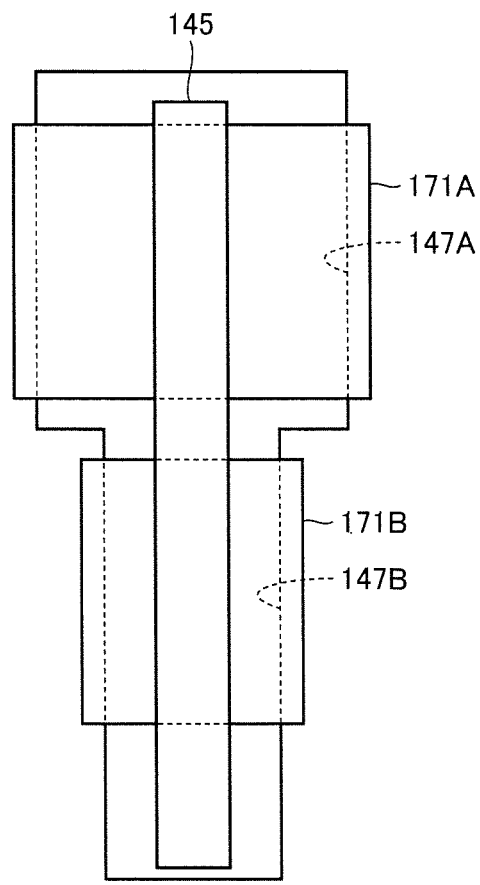

FIG. 147 is a plan view schematically showing an arrangement relationship between pressing member 145 and upper electrodes 171A and 171B.

Figure 148:
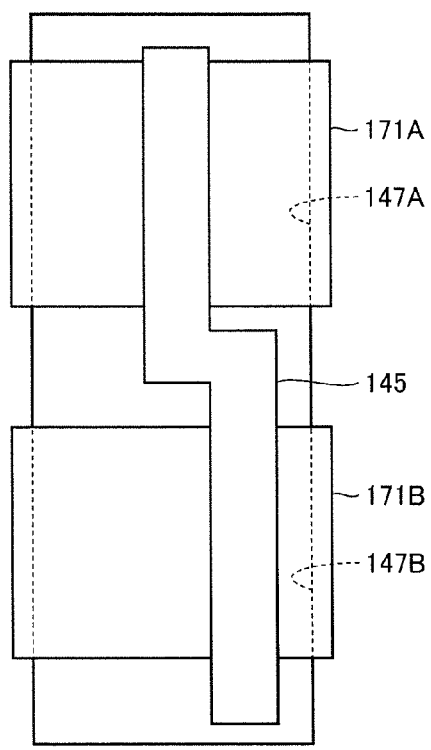

FIG. 148 is a plan view showing a first modification of pressure sensor 190A and pressure sensor 190B.

Figure 149:
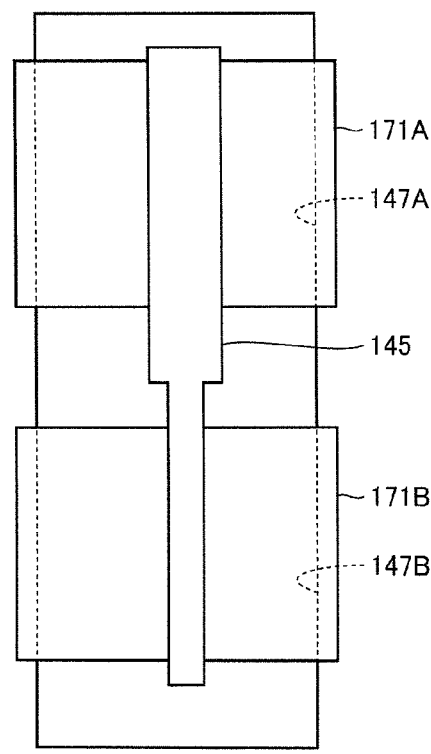

FIG. 149 is a plan view showing a second modification of pressure sensor 190A and pressure sensor 190B.

Figure 150:
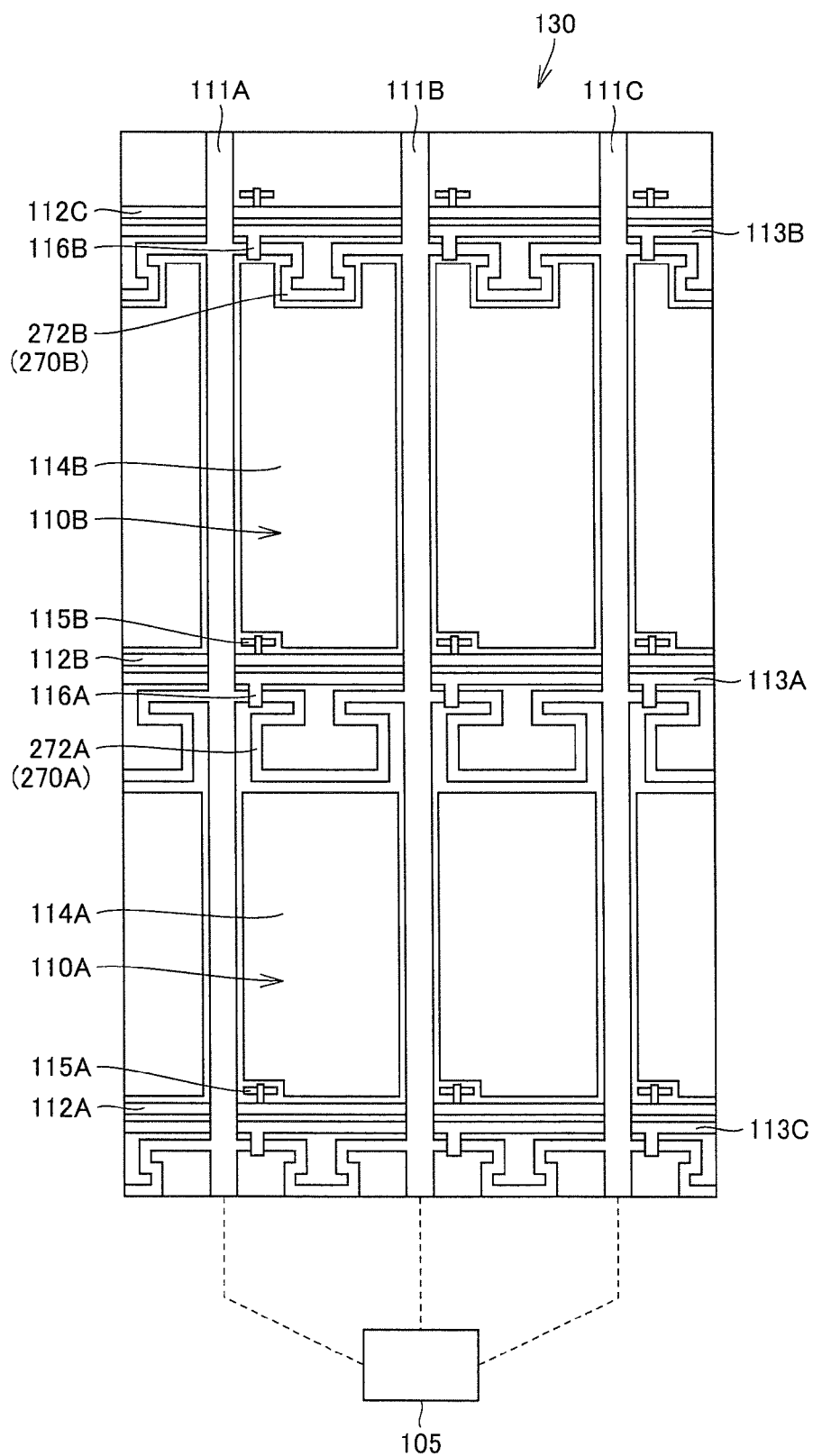

FIG. 150 is a plan view schematically showing TFT array substrate 130 of a liquid crystal display device according to an eighteenth embodiment.

Figure 151:
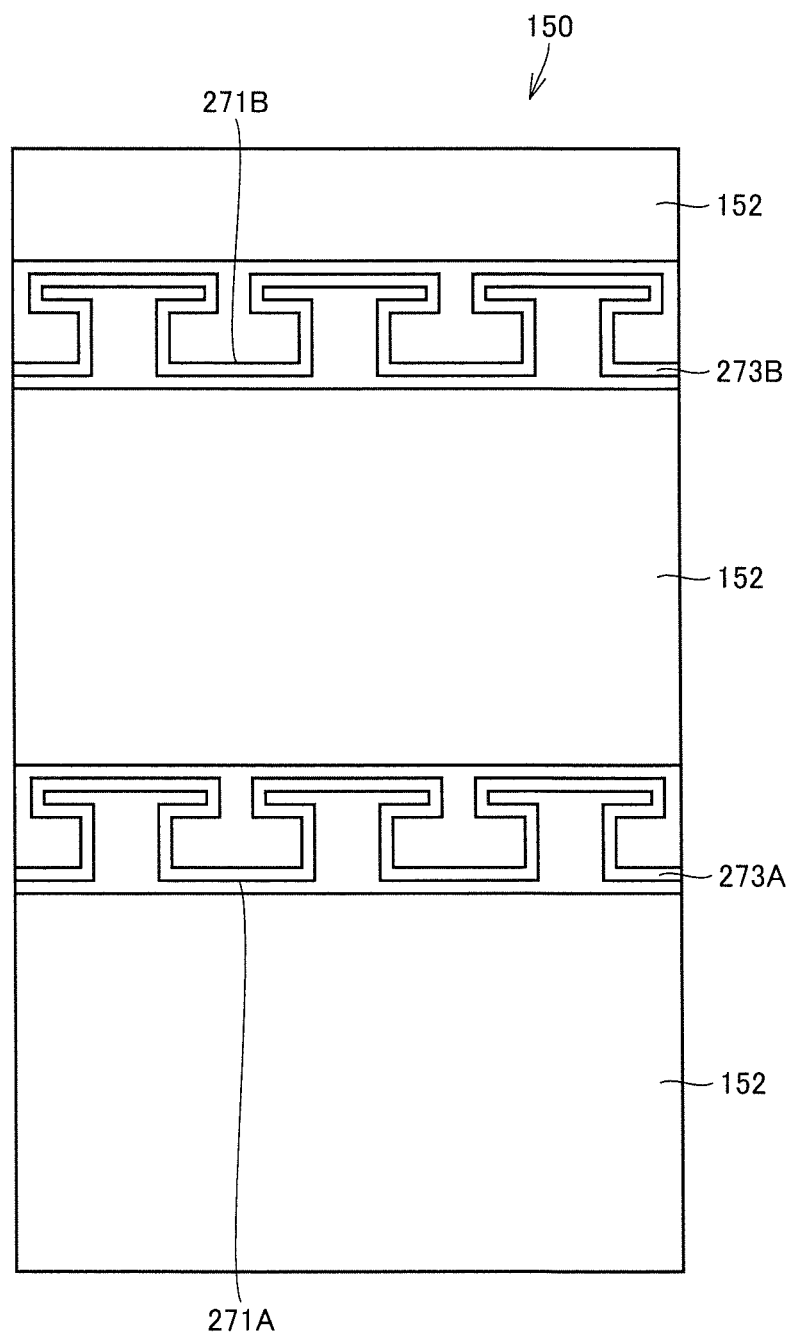

FIG. 151 is a plan view showing common substrate 150 of the liquid crystal display device according to the eighteenth embodiment.

Figure 152:
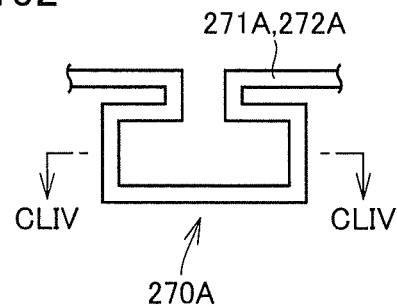

FIG. 152 is a plan view showing an arrangement state of an upper coil 271A and a lower coil 272A.

Figure 153:
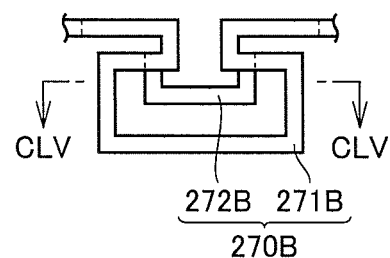

FIG. 153 is a plan view when a lower coil 272B and an upper coil 271B are viewed two-dimensionally.

Figure 154:
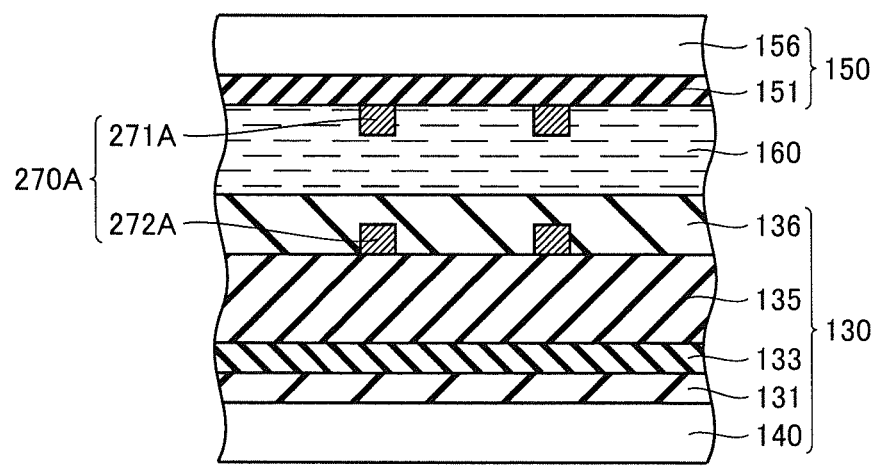

FIG. 154 is a cross-sectional view taken along line CLIV-CLIV in FIG. 152.

Figure 155:
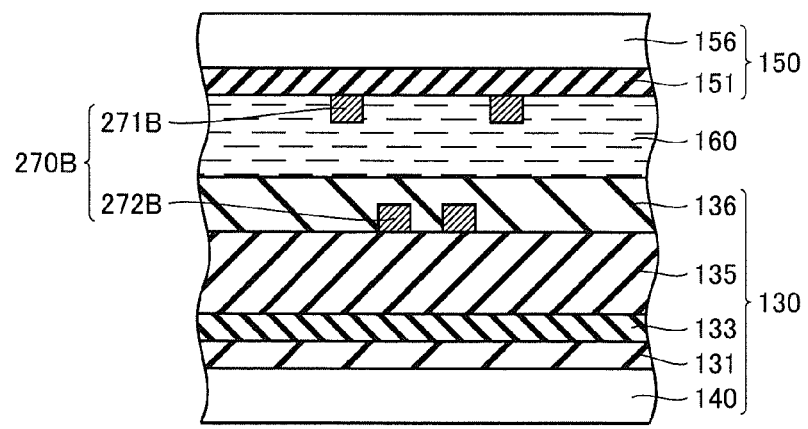

FIG. 155 is a cross-sectional view taken along line CLV-CLV in FIG. 153.

Figure 156:
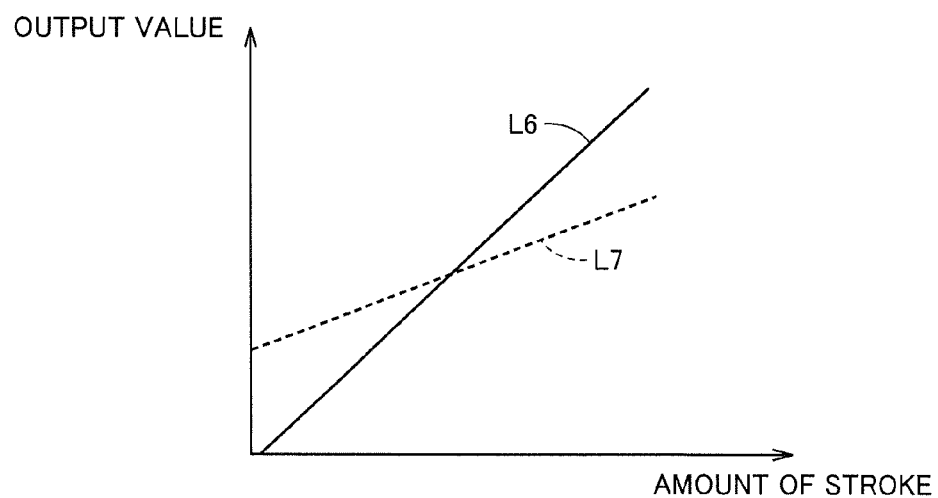

FIG. 156 is a graph showing characteristics of an output value outputted from a highly-sensitive pressure sensor and an output value outputted from a low-sensitive pressure sensor.

Figure 157:
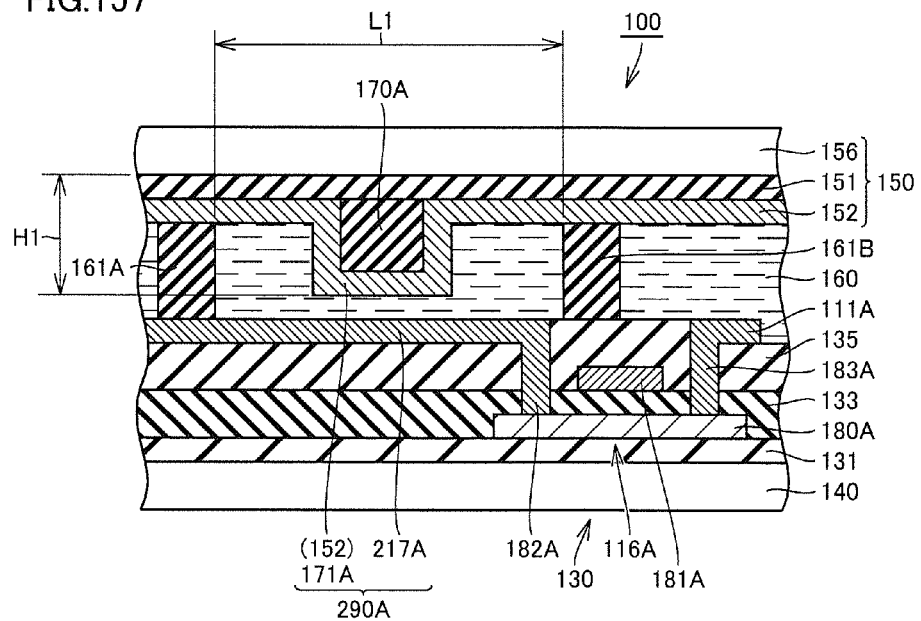

FIG. 157 is a cross-sectional view of liquid crystal display device 100 showing a highly-sensitive ON/OFF sensor 290A.

Figure 158:
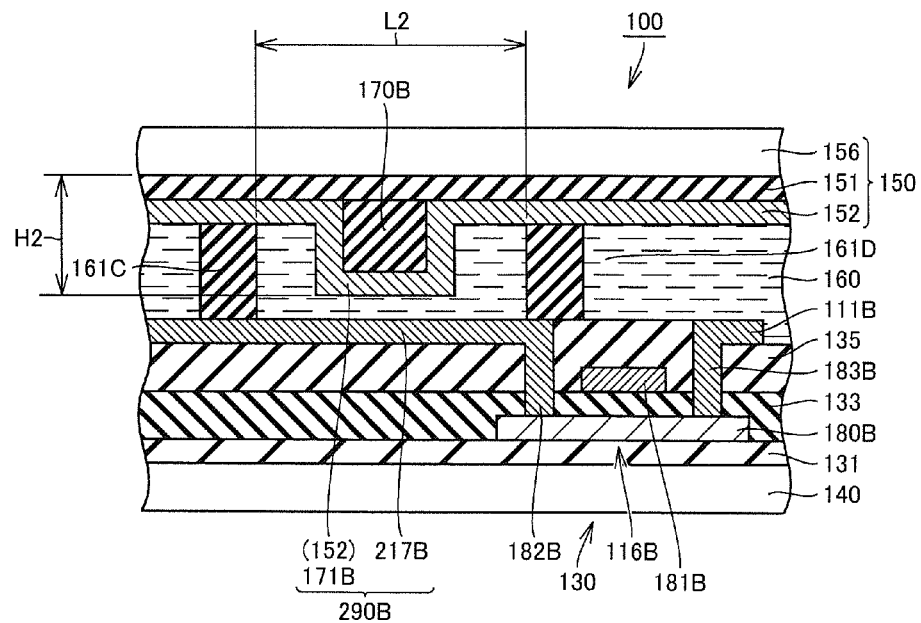

FIG. 158 is a cross-sectional view of liquid crystal display device 100 showing a low-sensitive ON/OFF sensor 290B.

Figure 159:
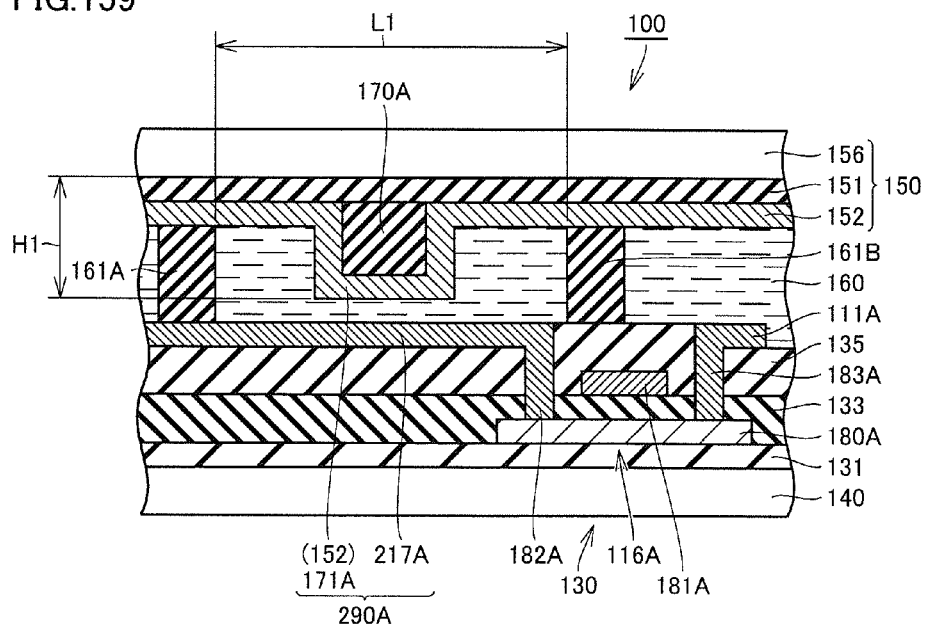

FIG. 159 is a cross-sectional view showing a first modification of liquid crystal display device 100 according to a nineteenth embodiment and is a cross-sectional view showing ON/OFF sensor 290A.

Figure 160:
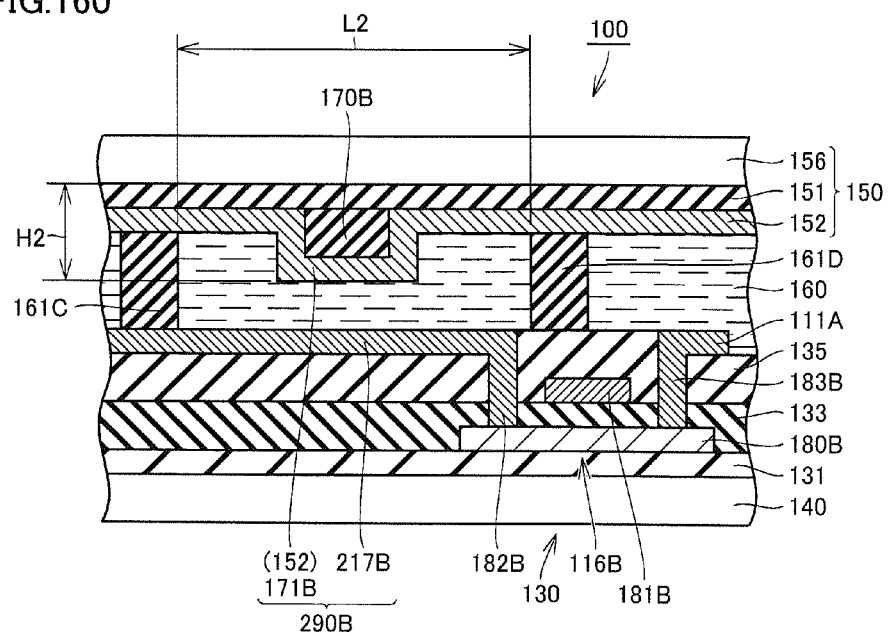

FIG. 160 is a cross-sectional view showing the first modification of liquid crystal display device 100 according to the nineteenth embodiment and is a cross-sectional view showing ON/OFF sensor 290B.

Figure 161:
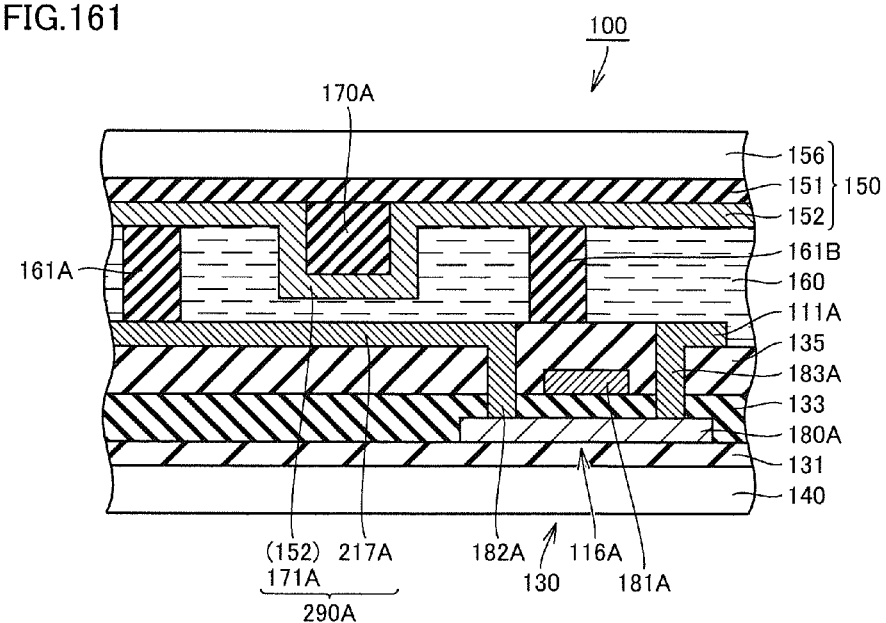

FIG. 161 is a cross-sectional view showing a second modification of liquid crystal display device 100 according to the nineteenth embodiment and is a cross-sectional view showing ON/OFF sensor 290A.

Figure 162:
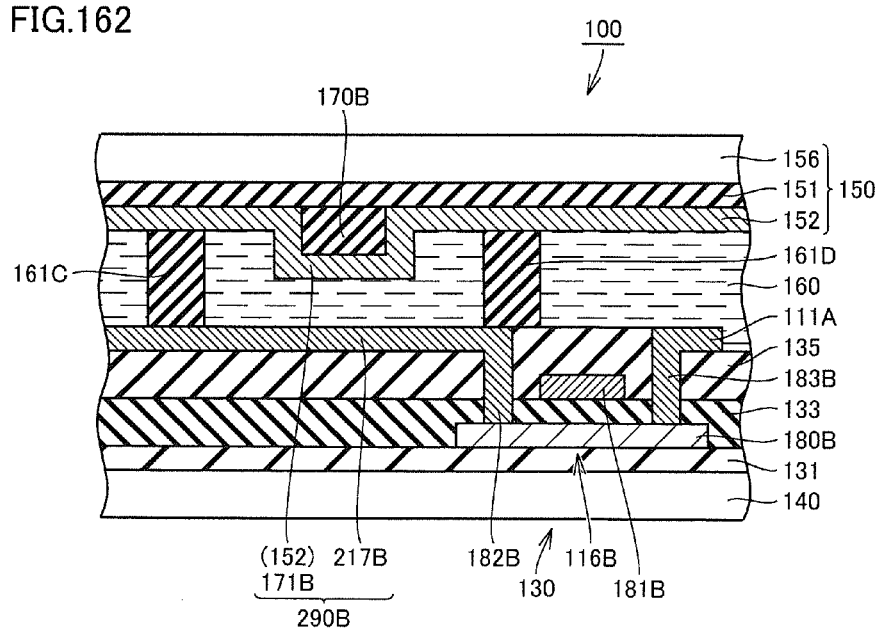

FIG. 162 is a cross-sectional view showing the second modification of liquid crystal display device 100 according to the nineteenth embodiment and is a cross-sectional view showing ON/OFF sensor 290B.

Figure 163:
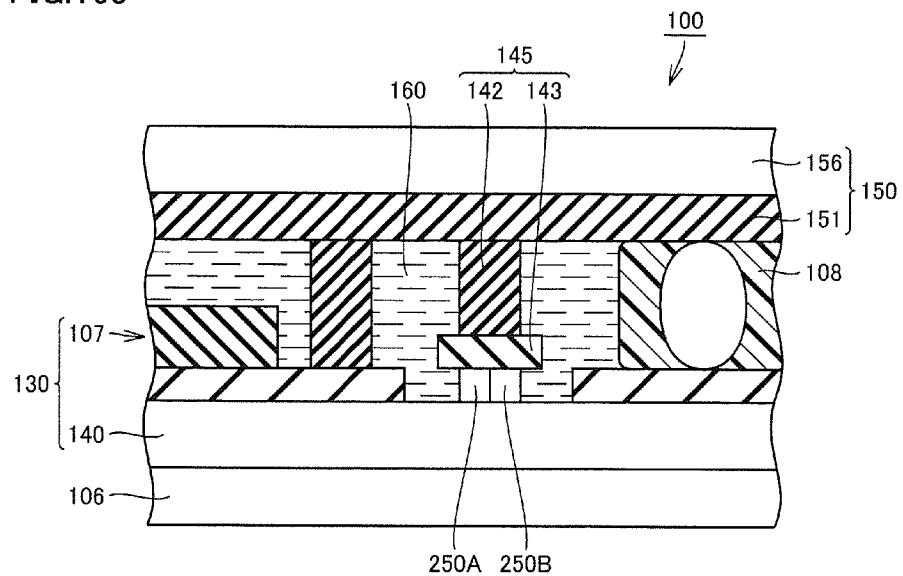

FIG. 163 is a cross-sectional view of liquid crystal display device 100 showing one example of arrangement of highly-sensitive sensor 250A and low-sensitive sensor 250B.

Figure 164:
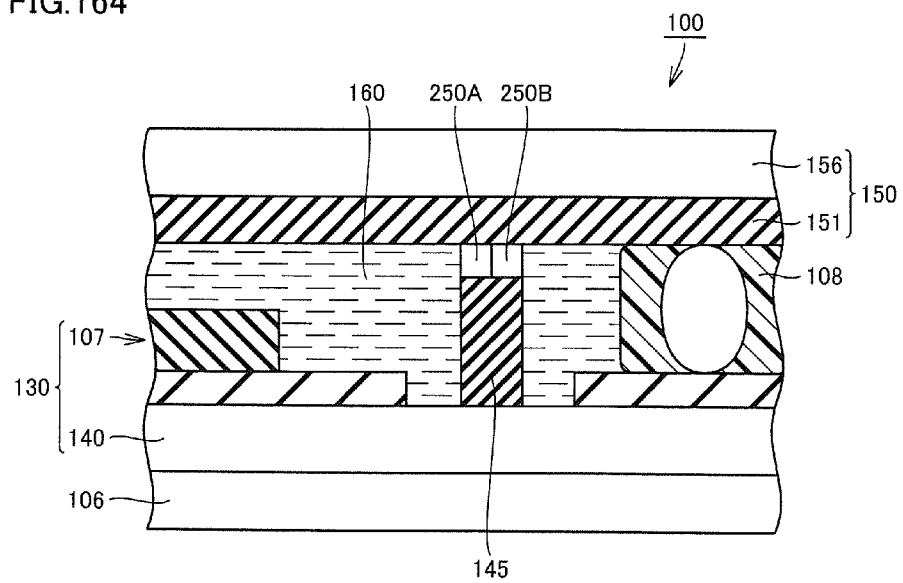

FIG. 164 is a cross-sectional view of liquid crystal display device 100 showing another example of arrangement of highly-sensitive sensor 250A and low-sensitive sensor 250B.

Figure 165:
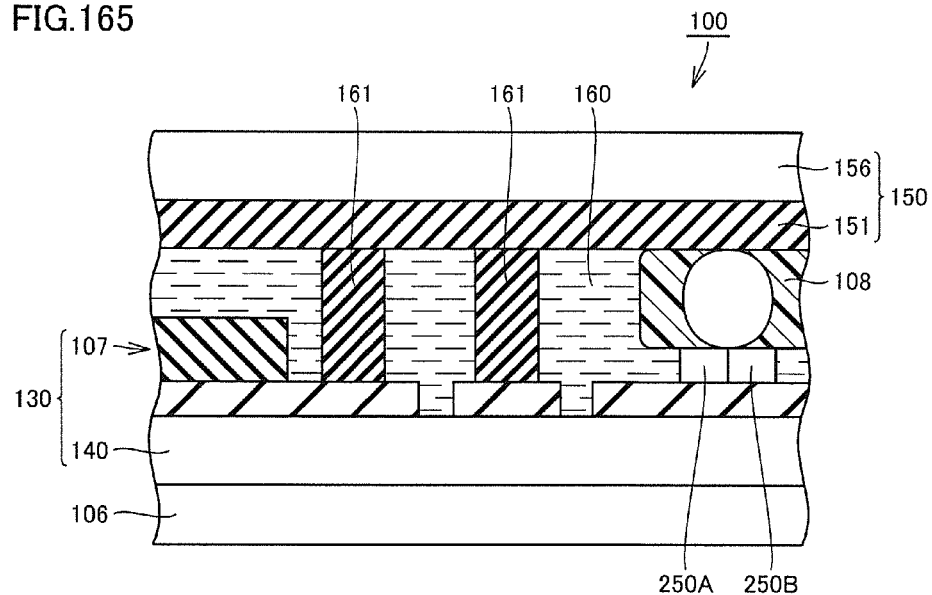

FIG. 165 is a cross-sectional view of liquid crystal display device 100 showing another example of arrangement of highly-sensitive sensor 250A and low-sensitive sensor 250B.

Figure 166:
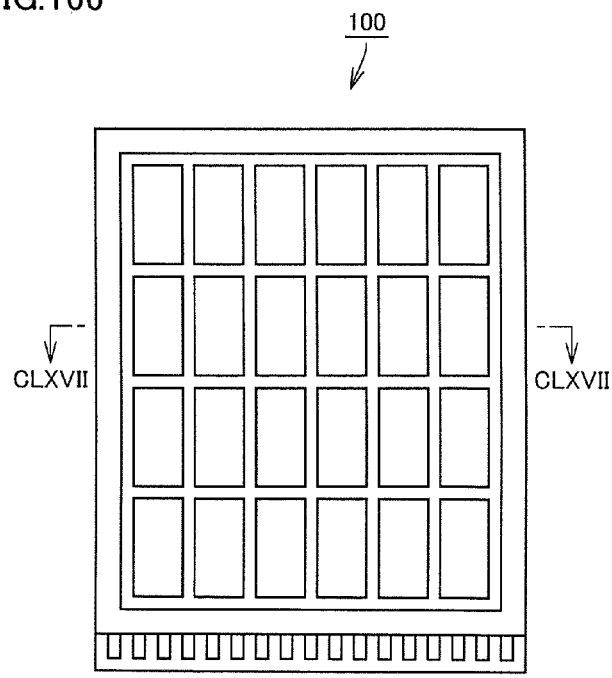

FIG. 166 is a plan view schematically showing liquid crystal display device 100 according to a twenty-first embodiment.

Figure 167:
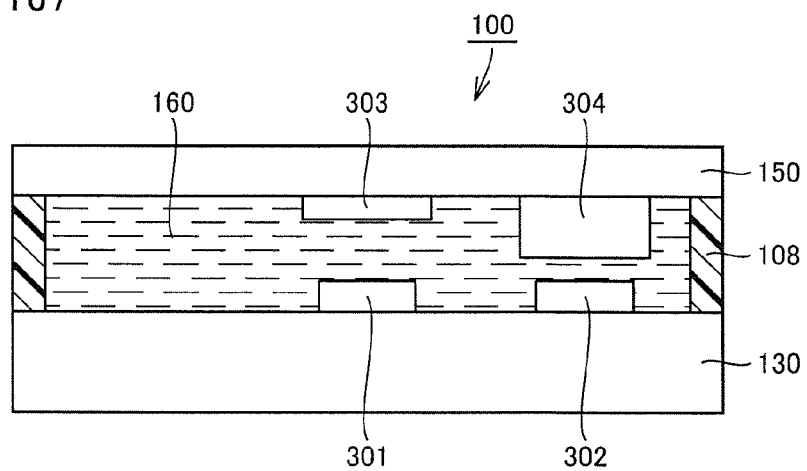

FIG. 167 is a cross-sectional view taken along line CLXVII-CLXVII shown in FIG. 166.

Figure 168:
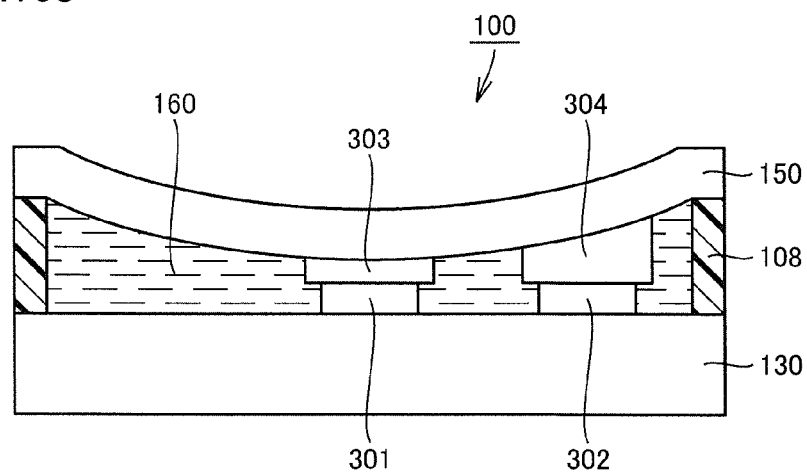

FIG. 168 is a cross-sectional view showing a state when common substrate 150 of liquid crystal display device 100 shown in FIG. 167 is pressed.

Figure 169:
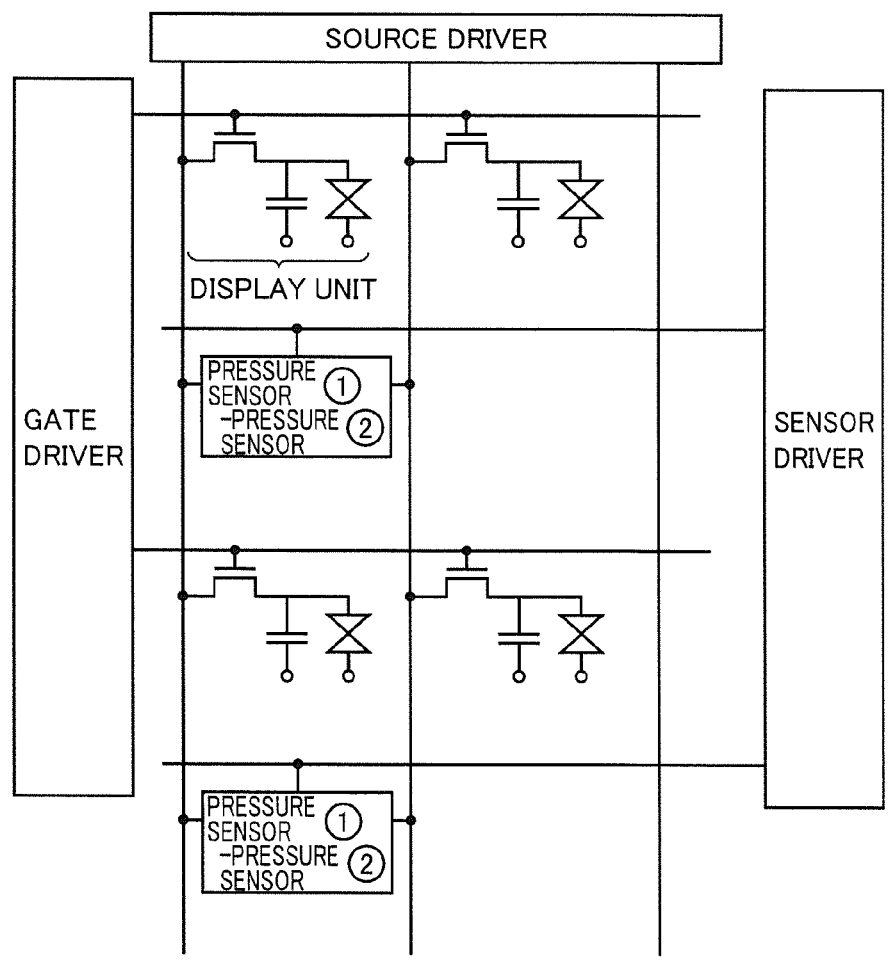

FIG. 169 is a circuit diagram of liquid crystal display device 100 according to a twenty-second embodiment.

Figure 170:
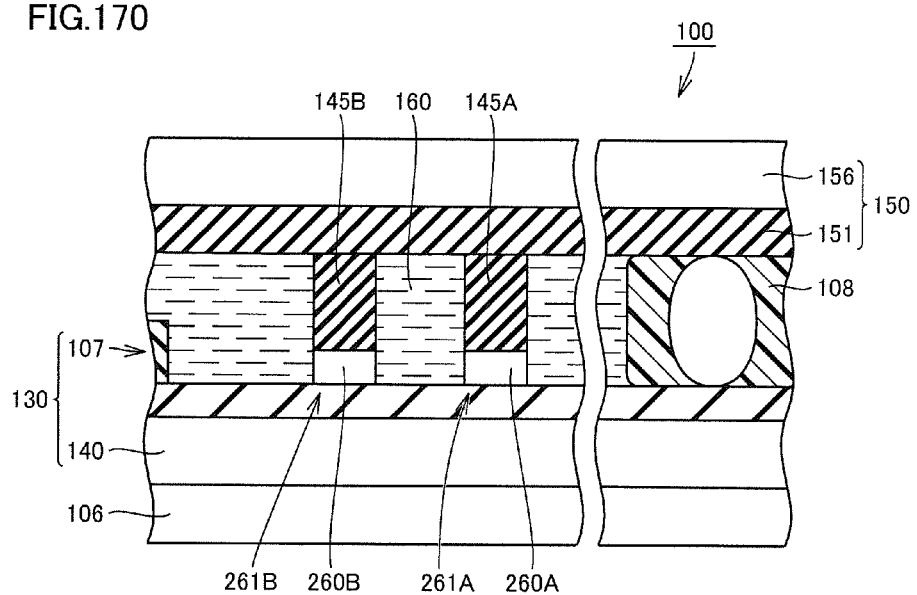

FIG. 170 is a cross-sectional view of liquid crystal display device 100 according to a twenty-third embodiment.

Figure 171:
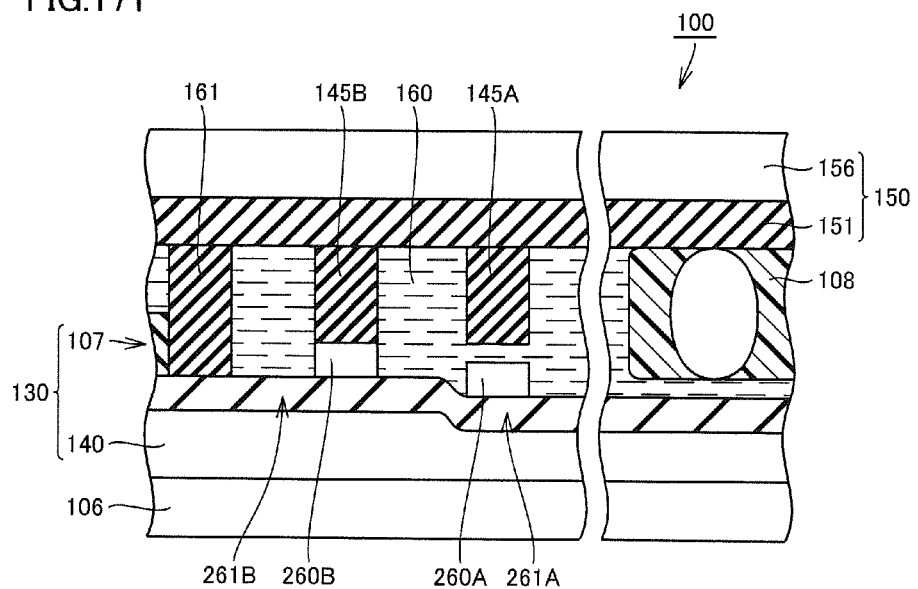

FIG. 171 is a cross-sectional view showing a first modification of the liquid crystal display device according to the twenty-third embodiment.

FIG. 172 is a cross-sectional view showing a second modification of the liquid crystal display device according to the twenty-third embodiment.

FIG. 173 is a cross-sectional view schematically showing liquid crystal display device 100 according to a twenty-fourth embodiment.

Figure 174:
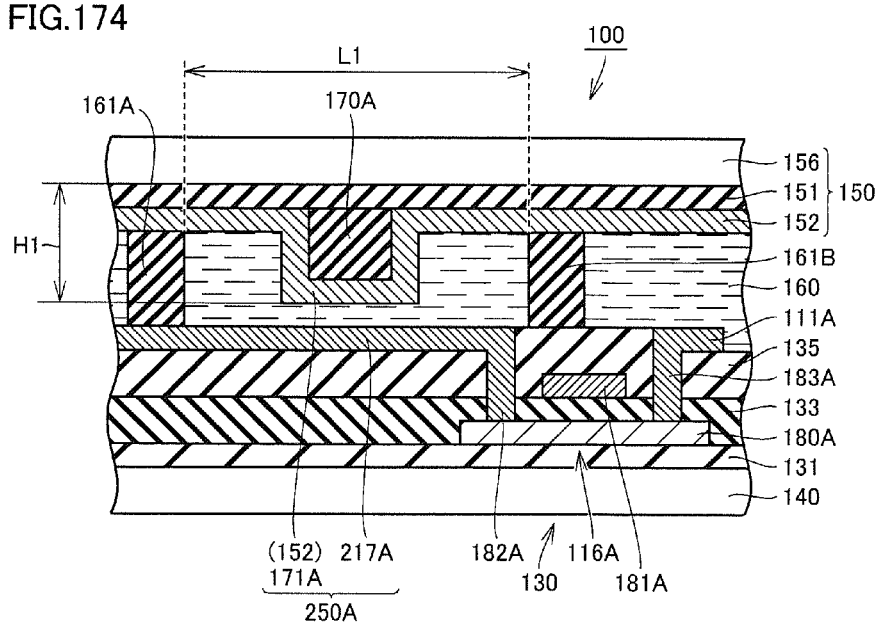

FIG. 174 is a cross-sectional view showing highly-sensitive sensor 250A.

Figure 175:
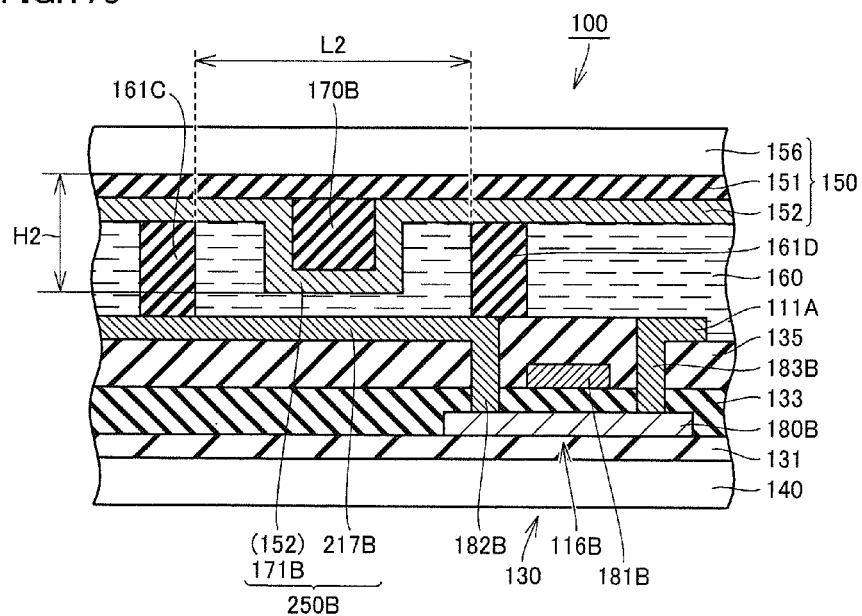

FIG. 175 is a cross-sectional view of liquid crystal display device 100 showing low-sensitive sensor 250B.

Figure 176:
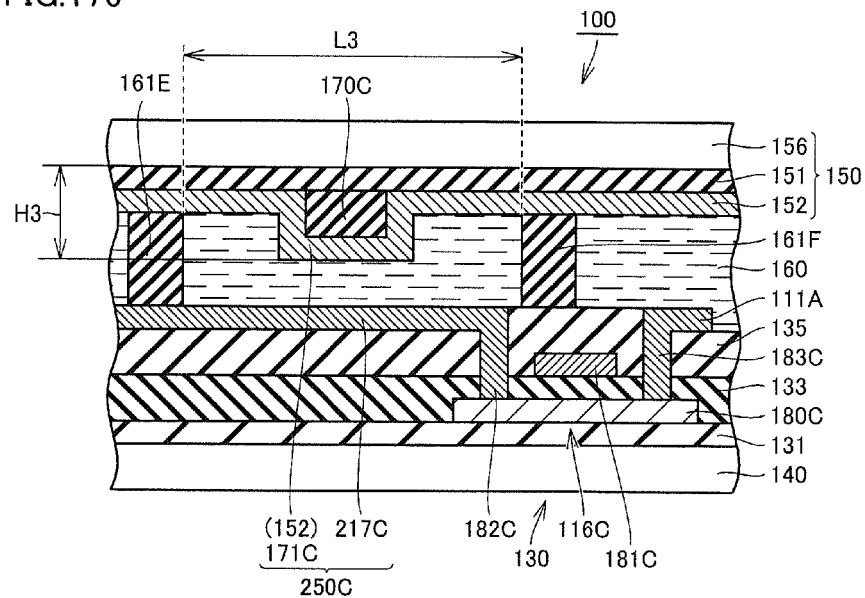

FIG. 176 is a cross-sectional view showing highly-sensitive sensor 250C.

Figure 177:
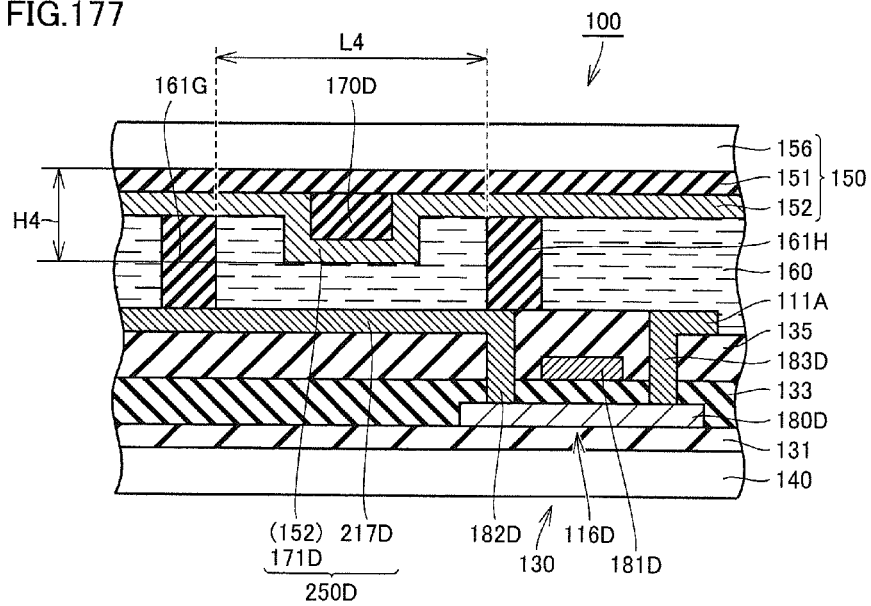

FIG. 177 is a cross-sectional view of liquid crystal display device 100 showing low-sensitive sensor 250D.

Figure 178:
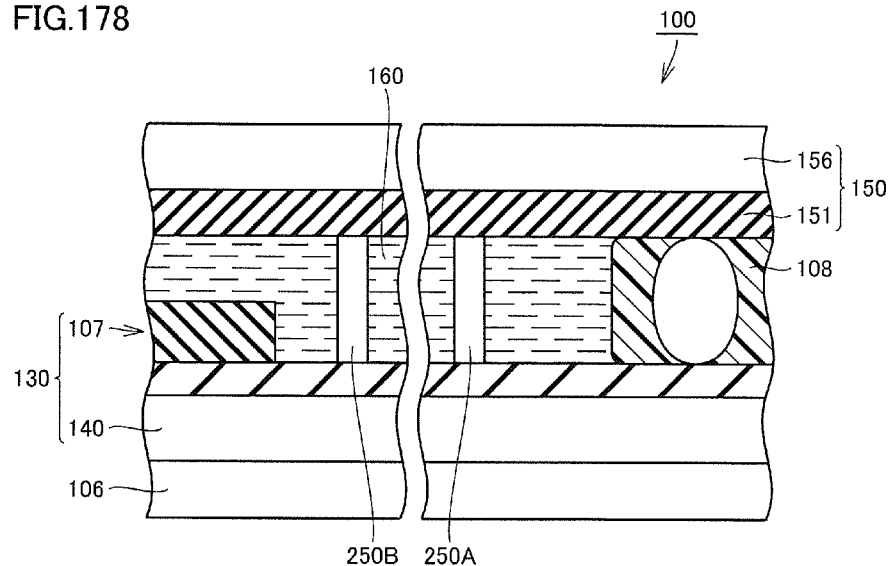

FIG. 178 is a cross-sectional view of liquid crystal display device 100 according to a twenty-fifth embodiment.

Figure 179:
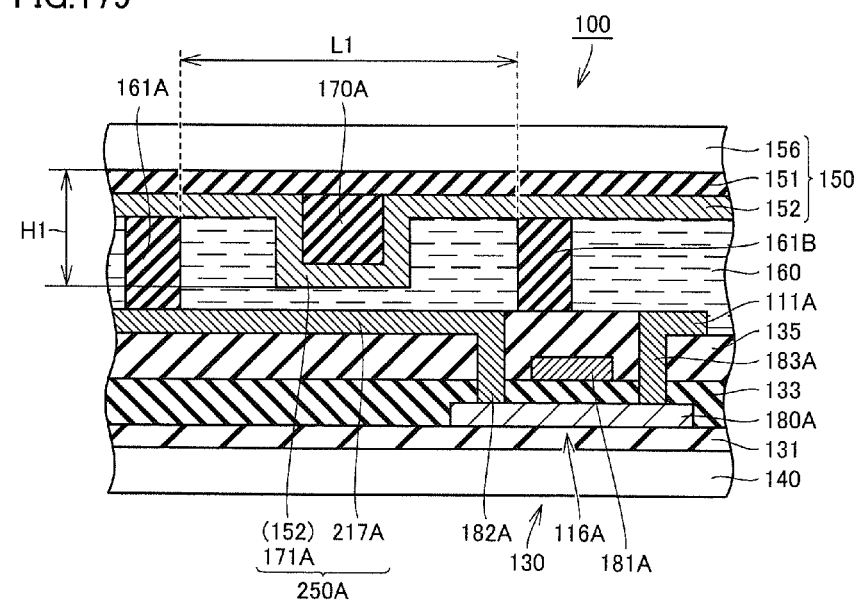

FIG. 179 is a cross-sectional view showing highly-sensitive sensor 250A.

Figure 180:
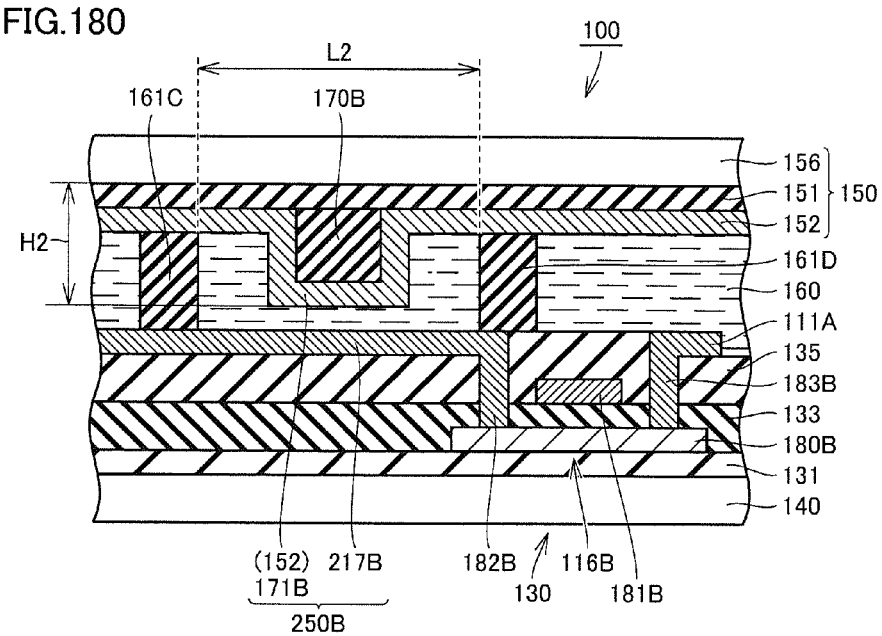

FIG. 180 is a cross-sectional view showing low-sensitive sensor 250B.

DESCRIPTION OF EMBODIMENTS

A pressure sensor, a display device and a method for manufacturing the display device according to the present invention will be described with reference to FIGS. 1 to 180. When the number, an amount or the like is mentioned in the embodiments described below, the scope of the present invention is not necessarily limited to that number, that amount or the like, unless otherwise specified. In addition, in the embodiments below, each component is not necessarily essential in the present invention, unless otherwise specified. Moreover, when a plurality of embodiments are shown below, combination as appropriate of features in the embodiments is originally encompassed, unless otherwise specified.

First Embodiment

Figure 1:
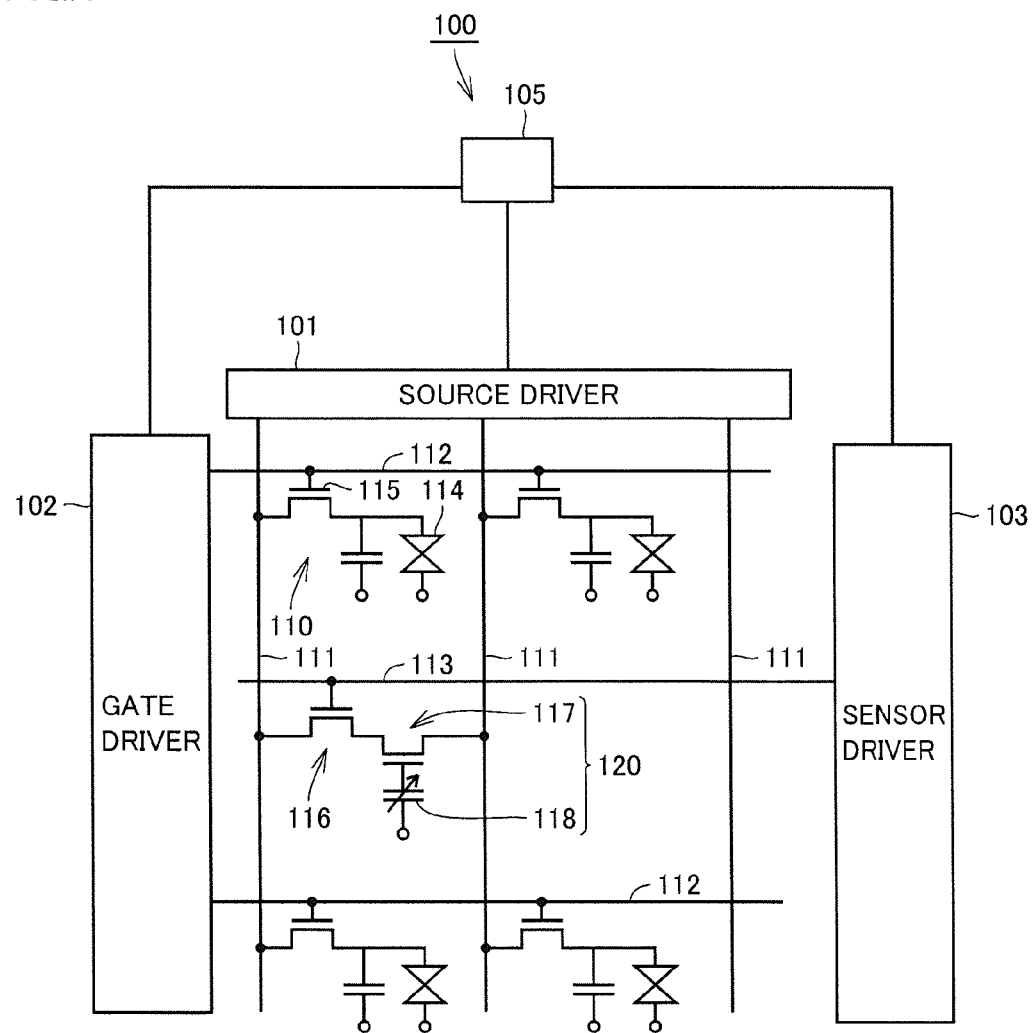
FIG. 1 is a circuit diagram schematically showing a circuit diagram of a liquid crystal display device 100 according to a first embodiment.

FIG. 1 is a circuit diagram schematically showing a circuit diagram of a liquid crystal display device 100 according to a first embodiment. As shown in this FIG. 1, liquid crystal display device 100 includes a control unit 105 and a plurality of pixels 110 arranged in an array. Pixel 110 includes a plurality of TFT (Thin Film Transistor) elements 115 and a pixel electrode 114 connected to this TFT element 115.

Liquid crystal display device 100 includes a plurality of gate lines 112 and gate lines for sensing 113 extending in a first direction and spaced apart from one another in a second direction, and a plurality of source lines 111 extending in the second direction and spaced apart from one another in the first direction.

Each gate line 112 is connected to a gate driver 102, and each source line 111 is connected to a source driver 101. Gate line for sensing 113 is arranged between adjacent gate lines 112, and the plurality of gate lines for sensing 113 extend in the first direction and are spaced apart from one another in the second direction. Each gate line for sensing 113 is connected to a sensor driver 103.

Source driver 101, gate driver 102 and sensor driver 103 are connected to control unit 105. Two adjacent gate lines 112 and two adjacent source lines 111 define pixel 110.

TFT element 115, a TFT element for selection 116 and a pressure sensing element 120 are arranged in pixel 110. A source electrode of TFT element 115 is connected to source line 111, and a gate electrode of TFT element 115 is connected to gate line 112. Pixel electrode 114 is connected to a drain electrode of TFT element 115.

A source electrode of TFT element for selection 116 is connected to source line 111, and a gate electrode of TFT element for selection 116 is connected to gate line for sensing 113. Pressure sensing element 120 is connected to a drain electrode of TFT element for selection 116.

Pressure sensing element 120 includes an output element 117 connected to the drain electrode of TFT element for selection 116, and a pressure sensor (pressure detecting device) 118 connected to a gate electrode of this output element 117. Output element 117 includes a source electrode connected to the drain electrode of TFT element for selection 116, a drain electrode connected to source line 111, and the gate electrode connected to a lower electrode of pressure sensor 118. Source line 111 to which the source electrode of TFT element for selection 116 is connected is another source line 111 that is adjacent to source line 111 to which the drain electrode of output element 117 is connected.

ON/OFF of TFT element for selection 116 is switched as appropriate in a time-divisional manner, and control unit 105 senses an output from pressure sensing element 120 connected to selected TFT element for selection 116. Specifically, control unit 105 senses an amount of current, which is an electrical characteristic from pressure sensing element 120.

An output of output element 117 fluctuates in accordance with a voltage applied to the gate electrode of output element 117. This voltage applied to the gate electrode is determined by a potential of the lower electrode of pressure sensor 118 connected to the gate electrode. The potential of the lower electrode of pressure sensor 118 is determined by a capacitance between the upper electrode and the lower electrode. The capacitance between the upper electrode and the lower electrode fluctuates in accordance with the pressing force applied to the substrate having the upper electrode. In other words, control unit 105 can sense the pressing force applied to the substrate, based on the amount of current from output element 117.

Figure 2:
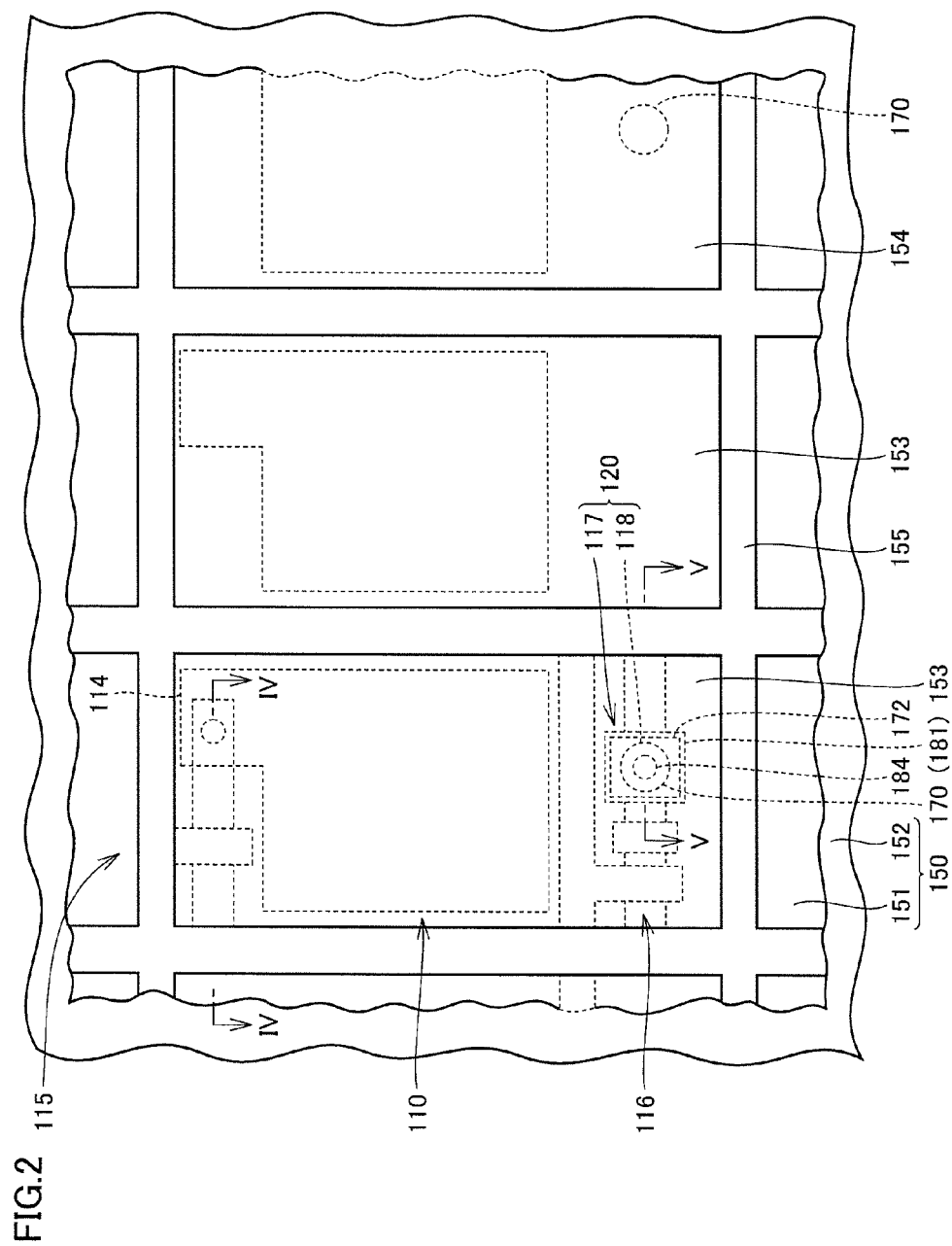
FIG. 2 is a plan view when a part of liquid crystal display device 100 is viewed two-dimensionally from the common substrate 150 side.

FIG. 2 is a plan view when a part of liquid crystal display device 100 is viewed two-dimensionally from the common substrate 150 side. As shown in this FIG. 2, common substrate 150 includes a color filter substrate 151 and a common electrode 152 arranged on a lower surface of this color filter substrate 151.

Color filter substrate 151 includes a black matrix 155 formed in the shape of a grid, and a colored layer 153 formed within the framework of this black matrix 155 and made of red, green and blue coloring photosensitive materials. One colored layer 153 is arranged above one pixel 110.

Common electrode 152 is a transparent electrode made of, for example, ITO (Indium Tin Oxide).

Figure 3:
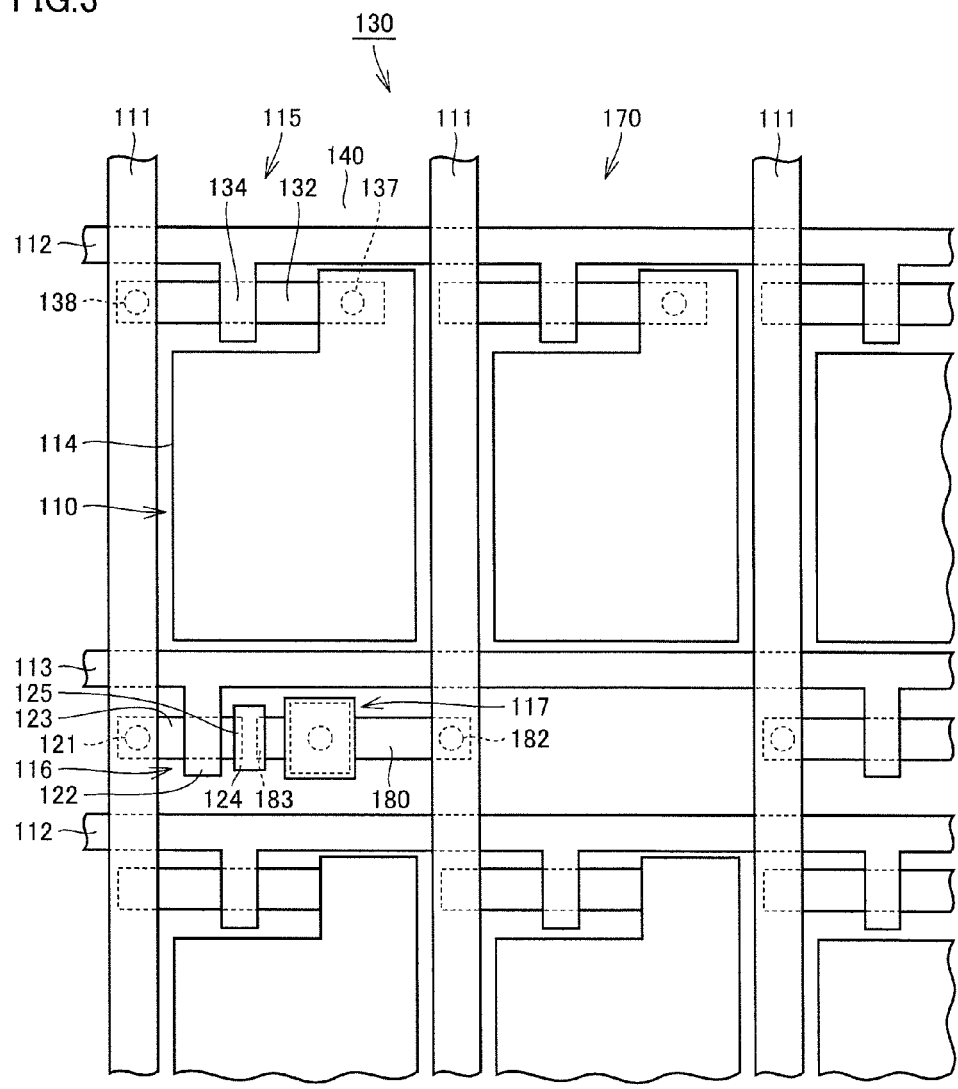
FIG. 3 is a plan view of a TFT array substrate 130 located under common substrate 150, and in this FIG. 3 and FIG. 2 above, a source line 111 and a gate line 112 are located under a black matrix 155.

FIG. 3 is a plan view of a TFT array substrate 130 located under common substrate 150. In this FIG. 3 and FIG. 2 above, source line 111 and gate line 112 are located under black matrix 155. TFT element for selection 116 and pressure sensing element 120 are arranged on the opposite side of TFT element 115 with respect to pixel electrode 114.

As shown in this FIG. 3, TFT element for selection 116 includes a semiconductor layer 123, a source electrode 121 connecting semiconductor layer 123 and source line 111, a gate electrode 122 connected to gate line for sensing 113, and a drain electrode 125.

A source electrode 183 of output element 117 and drain electrode 125 of TFT element for selection 116 are connected by a connection wiring 124. In the present embodiment, semiconductor layer 123 of TFT element for selection 116 and a semiconductor layer 180 of output element 117 are separated from each other, and drain electrode 125 of TFT element for selection 116 and source electrode 183 of output element 117 are connected by connection wiring 124. Semiconductor layer 123 may, however, be integrated with semiconductor layer 180 so as to connect drain electrode 125 and source electrode 183.

Figure 4:
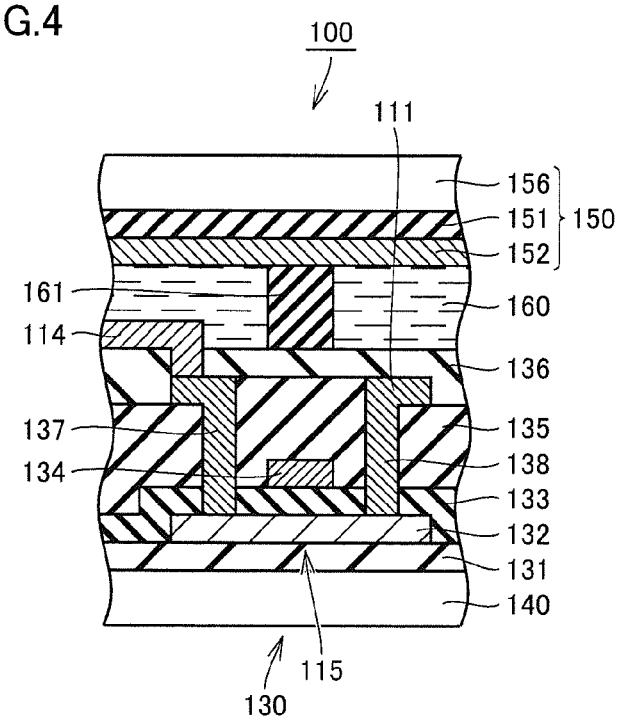
FIG. 4 is a cross-sectional view schematically showing a cross section taken along line IV-IV in FIG. 2.

FIG. 4 is a cross-sectional view schematically showing a cross section taken along line IV-IV in FIG. 2. The cross-sectional views shown in FIG. 4 and FIGS. 5, 6 and the like below are cross-sectional views simplified for convenience of description, and the aspect ratio and the like in each figure are not accurate.

As shown in FIG. 4, liquid crystal display device 100 includes TFT array substrate 130, common substrate 150 spaced apart from TFT array substrate 130 so as to face TFT array substrate 130, and a liquid crystal layer (display medium layer) 160 filled between common substrate 150 and TFT array substrate 130. A spacer 161 maintaining a spacing between TFT array substrate 130 and common substrate 150 at a predetermined spacing is formed between TFT array substrate 130 and common substrate 150.

Liquid crystal display device 100 further includes a polarizing plate arranged on an upper surface of common substrate 150, and a polarizing plate and a backlight unit arranged on a lower surface of TFT array substrate 130.

The polarizing plates are arranged such that the polarization direction of the polarizing plate arranged on the upper surface of common substrate 150 is orthogonal to the polarization direction of the polarizing plate arranged under TFT array substrate 130. The backlight unit emits light toward TFT array substrate 130. This backlight unit and the aforementioned two polarizing plates are not shown.

Common substrate 150 includes a glass substrate 156 having a main surface, color filter substrate 151 formed on the main surface of glass substrate 156, and common electrode 152 formed under this color filter substrate 151.

TFT array substrate 130 includes a glass substrate (first substrate) 140 having a main surface (first main surface), and pixel electrode 114 located above glass substrate 140, and TFT element (switching element) 115 is formed on the main surface of this glass substrate 140.

An underlying layer 131 formed of an insulating layer such as a silicon oxide layer ($SiO_2$ layer), a silicon nitride layer (SiN) and a silicon oxynitride layer (SiNO layer) is formed on the main surface of glass substrate 140. This underlying layer 131 has a film thickness of, for example, 0 nm or more and 500 nm or less, and preferably 0 nm or more and 400 nm or less.

TFT element 115 includes a semiconductor layer 132 formed on an upper surface of underlying layer 131, a gate insulating layer 133 formed to cover this semiconductor layer 132, a gate electrode 134 formed on an upper surface of gate insulating layer 133, and a drain electrode 137 and a source electrode 138 connected to semiconductor layer 132.

Gate electrode 134 is located on an upper surface of gate insulating layer 133 and above semiconductor layer 132. Drain electrode 137 is spaced apart from gate electrode 134. Source electrode 138 is located on the opposite side of drain electrode 137 with respect to gate electrode 134. Source electrode 138 is connected to source line 111, and drain electrode 137 is connected to pixel electrode 114.

Application of a predetermined voltage to gate electrode 134 causes TFT element 115 to be turned on. Application of a predetermined voltage to source line 111 and source electrode 138 causes a predetermined voltage to be applied to drain electrode 137 and pixel electrode 114.

TFT element 115 switches the voltage applied to pixel electrode 114, thereby controlling the direction of liquid crystals in liquid crystal layer 160 located between pixel electrode 114 and common electrode 152. By switching the direction of the liquid crystals, a switch is made between a state where light from the backlight unit passes through the polarizing plate arranged on the upper surface of common substrate 150 and a state where light from the backlight unit is blocked by the polarizing plate arranged on the upper surface of common substrate 150.

A continuous grain silicon film or the like is, for example, used as semiconductor layer 132. Semiconductor layer 132 has a film thickness of, for example, 20 nm or more and 200 nm or less. Semiconductor layer 132 preferably has a film thickness of approximately 30 nm or more and 70 nm or less.

Gate insulating layer 133 is formed of, for example, an insulating layer made of $SiO_2$, SiN, SiNO and the like. Gate insulating layer 133 has a film thickness of, for example, 20 nm or more and 200 nm or less, and preferably 50 nm or more and 120 nm or less.

Gate electrode 134 is a conductive layer that is formed of, for example, a metal layer made of tungsten (W), tantalum (Ta), titanium (Ti), molybdenum (Mo) and the like, or an alloy containing these, or a compound containing an element such as tungsten (W), tantalum (Ta), titanium (Ti), and molybdenum (Mo), or the like. Gate electrode 134 has a film thickness of, for example, 50 nm or more and 600 nm or less. Gate electrode 134 preferably has a film thickness of 100 nm or more and 500 nm or less.

An interlayer dielectric 135 is formed on the upper surface of gate insulating layer 133 to cover gate electrode 134. Interlayer dielectric 135 is formed of, for example, an insulating layer made of $SiO_2$, SiN, SiNO and the like. Interlayer dielectric 135 has a film thickness of, for example, 100 nm or more and 1000 nm or less. Interlayer dielectric 135 preferably has a film thickness of 100 nm or more and 700 nm or less.

Source line 111 is located on an upper surface of interlayer dielectric 135, and source electrode 138 is connected to source line 111. Drain electrode 137 is also formed to reach the upper surface of interlayer dielectric 135.

Source line 111, source electrode 138 and drain electrode 137 may be, for example, a metal layer made of aluminum (Al), copper (Cu), gold (Au), titanium (Ti) and the like, or stacked metal layers formed by sequentially stacking these metal layers. These source line 111 and the like have a film thickness of, for example, 300 nm or more and 1000 nm or less. Source line 111 and the like preferably have a film thickness of 400 nm or more and 800 nm or less.

An upper insulating layer 136 is formed on the upper surface of interlayer dielectric 135 to cover source line 111. Upper insulating layer 136 is formed of an insulating layer made of $SiO_2$, SiN, SiNO and the like. Upper insulating layer 136 has a film thickness of, for example, 50 nm or more and 500 nm or less. Upper insulating layer 136 preferably has a film thickness of 50 nm or more and 200 nm or less.

Pixel electrode 114 is formed on an upper surface of upper insulating layer 136. Pixel electrode 114 is formed of a transparent conductive layer made of ITO and the like.

Figure 5:
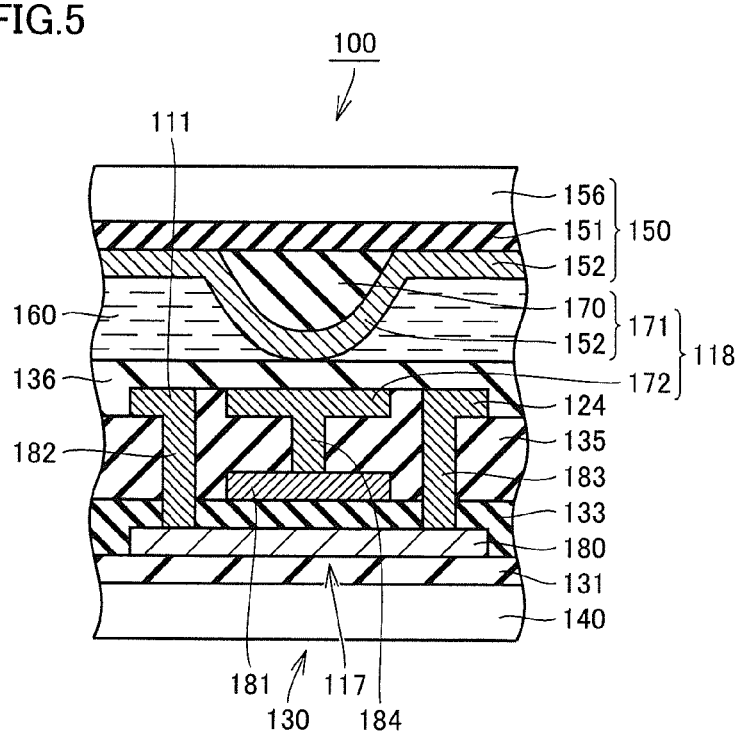
FIG. 5 is a cross-sectional view taken along line V-V shown in FIG. 2.

FIG. 5 is a cross-sectional view taken along line V-V shown in FIG. 2. As shown in this FIG. 5, underlying layer 131 is formed on the main surface of glass substrate 140, and output element 117 is formed on the upper surface of this underlying layer 131.

Output element 117 includes semiconductor layer 180 formed on underlying layer 131, gate insulating layer 133 formed to cover semiconductor layer 180, a gate electrode 181 formed on a portion of the upper surface of gate insulating layer 133 located above semiconductor layer 180, and source electrode 183 and a drain electrode 182 connected to semiconductor layer 180.

Source electrode 183 is spaced apart from gate electrode 181, and drain electrode 182 is arranged on the opposite side of source electrode 183 with respect to gate electrode 181.

Interlayer dielectric 135 is formed on the upper surface of gate insulating layer 133 to cover gate electrode 181.

Drain electrode 182 passes through gate insulating layer 133 and interlayer dielectric 135 and is connected to source line 111 formed on the upper surface of interlayer dielectric 135. Source electrode 183 is also formed to pass through gate insulating layer 133 and interlayer dielectric 135 and reach the upper surface of interlayer dielectric 135.

A lower electrode 172 and connection wiring 124 are formed on the upper surface of interlayer dielectric 135. Connection wiring 124 is connected to drain electrode 125 of TFT element for selection 116 shown in FIG. 3. Lower electrode 172 is connected to gate electrode 181 by a contact 184. Therefore, a voltage applied to gate electrode 181 is determined by a potential of lower electrode 172.

Upper insulating layer 136 is formed on lower electrode 172. Lower electrode 172 is formed into a flat surface. At least a portion of upper insulating layer 136 located on lower electrode 172 is formed into a flat surface to conform to an upper surface of lower electrode 172.

Pressure sensor (pressure detecting device) 118 includes aforementioned lower electrode 172 and an upper electrode 171 located above this lower electrode 172.

In the present embodiment, upper electrode 171 is formed in common substrate 150, and upper electrode 171 is constituted by a projection 170 formed on the lower side of color filter substrate 151 and common electrode 152 formed to cover a surface of this projection 170.

Projection 170 is made of, for example, an elastically deformable material such as an acrylic resin and a plastic resin. Projection 170 may be made of an elastically deformable conductive resin.

Projection 170 has a height of, for example, 1 μm or more and 10 μm or less. Projection 170 preferably has a height of 1.5 μm or more and 5 μm or less.

In the example shown in this FIG. 5, a portion of common electrode 152 located at a vertex of projection 170 is in contact with upper insulating layer 136.

In the present embodiment, projection 170 is formed to be circular in a cross section vertical to the protruding direction, and projection 170 has a smoothly curved surface. Furthermore, as shown in FIG. 2, a plurality of projections 170 are formed to be spaced apart from one another.

The shape of projection 170 is not limited to the aforementioned shape. For example, projection 170 may be formed to extend over lower electrodes 172 of a plurality of pressure sensors 118. Projection 170 is not limited to a projection having a circular cross-sectional shape, and further, is not limited to a projection having a smoothly curved outer surface.

Figure 6:
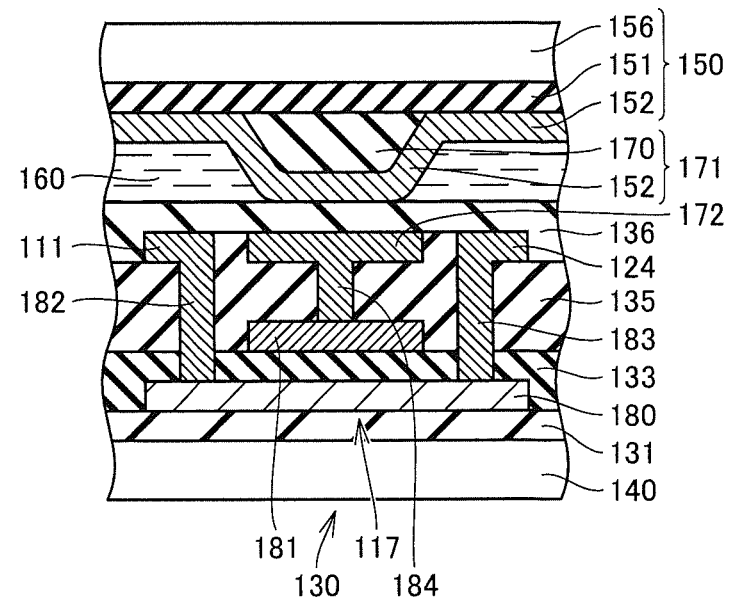
FIG. 6 is a cross-sectional view of liquid crystal display device 100 when common substrate 150 is pressed.

FIG. 6 is a cross-sectional view of liquid crystal display device 100 when common substrate 150 is pressed. As shown in this FIG. 6, when common substrate 150 is pressed by a pen or someone's finger, a pressed portion of common substrate 150 and its neighboring portion deflect.

As a result of deflection of glass substrate 156, upper electrode 171 comes closer to lower electrode 172. Since upper electrode 171 comes closer to lower electrode 172, upper electrode 171 is pressed against upper insulating layer 136, projection 170 deforms elastically, and upper electrode 171 deforms to conform to lower electrode 172.

Figure 7:
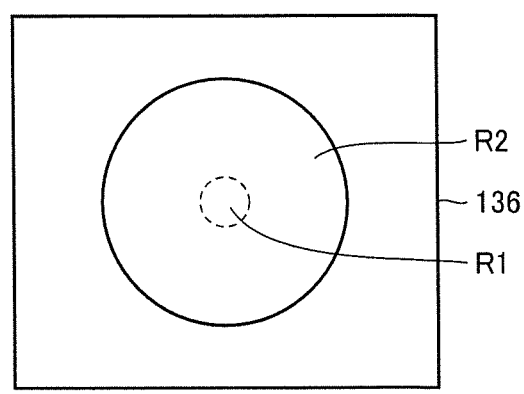
FIG. 7 is a plan view schematically showing a region where an upper electrode 171 is in contact with an upper insulating layer 136.

FIG. 7 is a plan view schematically showing a region where upper electrode 171 is in contact with upper insulating layer 136. In this FIG. 7, a region R1 is a region enclosed by a broken line in FIG. 7 and a region R2 is a region enclosed by a solid line. Region R1 represents a region where upper electrode 171 is in contact with upper insulating layer 136 in a state (initial state) where common substrate 150 is not pressed.

Region R2 represents a region where upper electrode 171 is in contact with upper insulating layer 136 in the state shown in FIG. 6. As shown in this FIG. 7, by slight displacement of upper electrode 171, a contact area between upper electrode 171 and upper insulating layer 136 increases greatly.

At the portion where upper electrode 171 is in contact with upper insulating layer 136, both upper electrode 171 and lower electrode 172 are in contact with upper insulating layer 136, and a spacing between upper electrode 171 and lower electrode 172 corresponds to a thickness of upper insulating layer 136.

Specifically, a distance between common electrode 152 located on a surface of upper electrode 171 and lower electrode 172 corresponds to a thickness of upper insulating layer 136.

As a result, a capacitance defined by upper electrode 171 and lower electrode 172 in the state shown in FIG. 7 is much larger than a capacitance defined by upper electrode 171 and lower electrode 172 in the initial state shown in FIG. 6.

Figure 8:
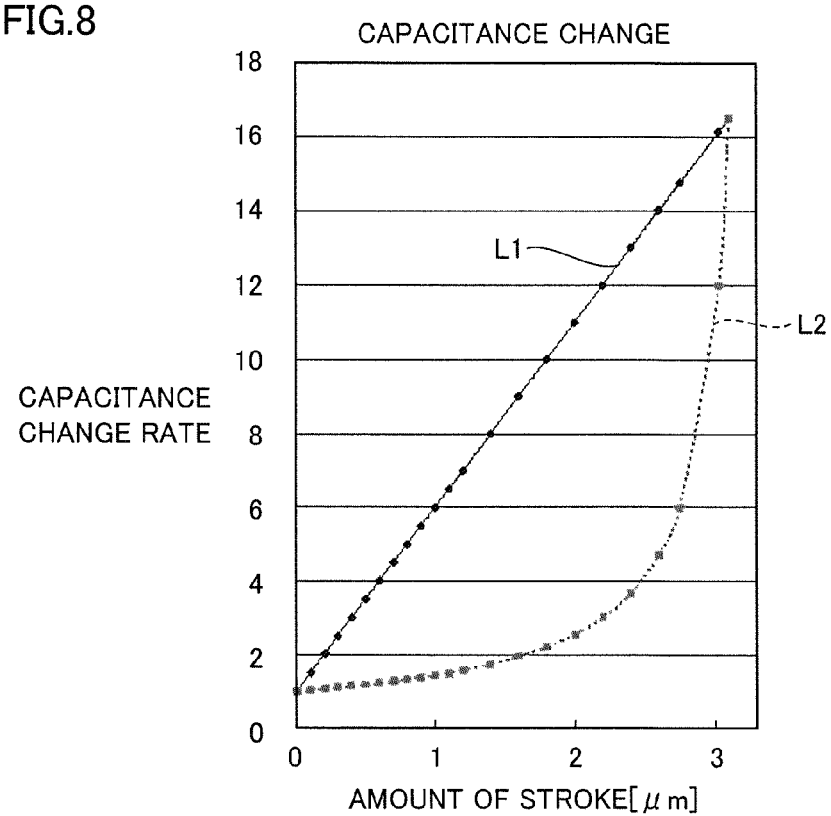
FIG. 8 is a graph comparing a characteristic of a pressure sensor 118 according to the present embodiment and a characteristic of a pressure sensor according to a comparative example.

FIG. 8 is a graph comparing a characteristic of pressure sensor 118 according to the present embodiment and a characteristic of a pressure sensor according to a comparative example.

In the graph shown in this FIG. 8, the horizontal axis indicates an amount of stroke of the upper electrode and the vertical axis indicates a capacitance change rate between the upper electrode and the lower electrode. In the graph, a solid line L1 indicates the characteristic of the pressure sensor according to the present embodiment and a broken line L2 indicates the characteristic of the pressure sensor according to the comparative example.

Figure 9:
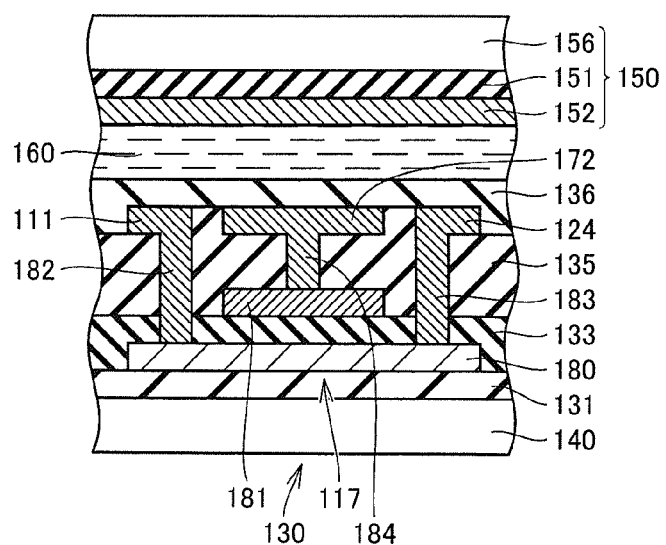
FIG. 9 is a cross-sectional view showing a display device including the pressure sensor according to the comparative example.

FIG. 9 is a cross-sectional view showing a display device including the pressure sensor according to the comparative example. Unlike pressure sensor 118 according to the present embodiment, the pressure sensor according to the comparative example shown in this FIG. 9 does not include projection 170. Therefore, the pressure sensor according to the comparative example includes common electrode 152 formed into a flat surface on the lower surface of color filter substrate 151, and lower electrode 172.

A distance between common substrate 150 in the comparative example and TFT array substrate 130 as well as a distance between common substrate 150 in the present embodiment and TFT array substrate 130 are both 3.3 μm.

In this comparative example, when common substrate 150 is pressed, common electrode 152 comes closer to lower electrode 172. Since a distance between common electrode 152 and lower electrode 172 becomes smaller, a capacitance between common electrode 152 and lower electrode 172 becomes larger.

As shown in FIG. 8 above, when an amount of displacement (amount of stroke) of the upper electrode is small, a capacitance fluctuation rate of the pressure sensor according to the comparative example is smaller than a capacitance fluctuation rate of pressure sensor 118 according to the present embodiment.

In the pressure sensor according to the comparative example, when the pressing force applied to common substrate 150 is small, it is difficult to accurately sense fluctuations in the capacitance and it is difficult to accurately sense the applied pressure.

On the other hand, as shown in FIG. 8, it can be seen that in pressure sensor 118 according to the present embodiment, the capacitance change rate is large even when the amount of stroke of the upper electrode is small. Therefore, in pressure sensor 118 according to the present embodiment, a voltage applied to gate electrode 181 shown in FIG. 5 can be fluctuated greatly even when the amount of stroke of the upper electrode is small. As a result, the control unit can accurately sense the applied pressing force.

In the pressure sensor according to the comparative example, when the amount of stroke exceeds a predetermined value, the capacitance change rate increases sharply. In a range where the capacitance changes sharply, the capacitance changes sharply even when a distance between the upper electrode and the lower electrode is reduced slightly. Therefore, in the range where the capacitance changes sharply, the voltage applied to the gate electrode of the output element also changes sharply and an amount of current from output element 117 also fluctuates greatly. Therefore, it is difficult for the control unit to calculate the accurate pressing force.

On the other hand, in pressure sensor 118 according to the present embodiment, the capacitance change rate is substantially constant even when the amount of stroke increases. As described above, in pressure sensor 118 according to the present embodiment, the capacitance change rate is substantially constant. Therefore, the applied pressure can be easily calculated based on the capacitance between the upper electrode and the lower electrode, and the applied pressure can be accurately calculated.

As described above, pressure sensor 118 according to the present embodiment includes lower electrode 172, upper electrode 171 spaced apart from this lower electrode 172 and arranged to face the lower electrode, and upper insulating layer (insulating layer) 136 formed between upper electrode 171 and lower electrode 172, and upper electrode 171 is formed on the surface of elastically deformable projection 170. Projection 170 abuts upper insulating layer 136 and further is pressed against upper insulating layer 136, and thereby common electrode 152 on projection 170 deforms to conform to lower electrode 172. The capacitance between lower electrode 172 and upper electrode 171 changes at predetermined magnitude with a certain change rate being kept. Therefore, by sensing the amount of current from output element 117, the capacitance between upper electrode 171 and lower electrode 172 can be sensed and the applied pressure can be accurately calculated.

As described above, pressure sensor 118 that can accurately output the capacitance fluctuations is mounted on liquid crystal display device 100 according to the first embodiment. Therefore, the pressing force applied to common substrate 150 can be accurately calculated even when common substrate 150 does not deflect greatly. As a result, even when glass substrate 156 of common substrate 150 is formed to be thicker than glass substrate 140, the applied pressing force can be calculated. Therefore, the rigidity of common substrate 150 can be enhanced.

Glass substrate 140 is supported by the backlight unit and the like. Therefore, even when glass substrate 140 is made thinner than glass substrate 156, deformation of TFT array substrate 130 is suppressed. The characteristic of pressure sensor 118 shown by the solid line in FIG. 8 is one example. Therefore, it is not necessary that the capacitance change rate should increase in a manner of linear function when the amount of stroke of the upper electrode increases as shown in FIG. 8. A rate of increase in the capacitance change rate may be partially different or the capacitance change rate may change in a manner of a curved line.

In FIG. 5, semiconductor layer 180 is formed on the upper surface of gate insulating layer 133 similarly to semiconductor layer 132 shown in FIG. 4. Semiconductor layer 180 is made of a material of the same kind (the same material) as that of semiconductor layer 132, and semiconductor layer 180 and semiconductor layer 132 have substantially the same film thickness. Specifically, a continuous grain silicon film or the like is, for example, used and semiconductor layer 132 has a film thickness of, for example, 20 nm or more and 200 nm or less. Semiconductor layer 132 preferably has a film thickness of approximately 30 nm or more and 70 nm or less.

Gate electrode 181 is also formed on gate insulating layer 133 similarly to gate electrode 134 shown in FIG. 4. Furthermore, gate electrode 181 is made of a material of the same kind (the same material) as that of gate electrode 134, and a film thickness of gate electrode 181 is also substantially identical to that of gate electrode 134.

A stacked metal film that is the same as drain electrode 137 and source electrode 138 shown in FIG. 4 is used as drain electrode 182, source electrode 183, lower electrode 172, and contact 184.

As described above, the structure of output element 117 is substantially the same as that of TFT element 115. Therefore, each member of output element 117 can be simultaneously formed when each member of TFT element 115 is formed. Furthermore, the lower electrode of pressure sensor 118 can also be simultaneously formed when drain electrode 137 and source electrode 138 of TFT element 115 are formed.

Therefore, the number of steps of manufacturing TFT array substrate 130 does not increase and an increase in manufacturing cost can be suppressed.

A method for manufacturing liquid crystal display device 100 according to the present embodiment will be described with reference to FIGS. 10 to 21.

When liquid crystal display device 100 is manufactured, TFT array substrate 130 and common substrate 150 are first formed independently. Thereafter, the liquid crystal layer is applied onto the upper surface of TFT array substrate 130, and then, common substrate 150 is arranged above TFT array substrate 130. TFT array substrate 130 is thus formed.

Thus, a method for manufacturing TFT array substrate 130 will be described first.

Figure 10:
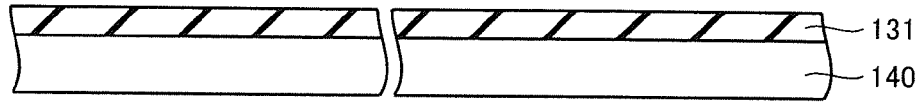
FIG. 10 is a cross-sectional view showing a first step of a process of manufacturing TFT array substrate 130.

FIG. 10 is a cross-sectional view showing a first step of a process of manufacturing TFT array substrate 130. As shown in FIG. 10, glass substrate 140 is prepared. Thereafter, the insulating layer made of $SiO_2$, SiN, SiNO and the like is deposited on the main surface of glass substrate 140 to form underlying layer 131.

Figure 11:
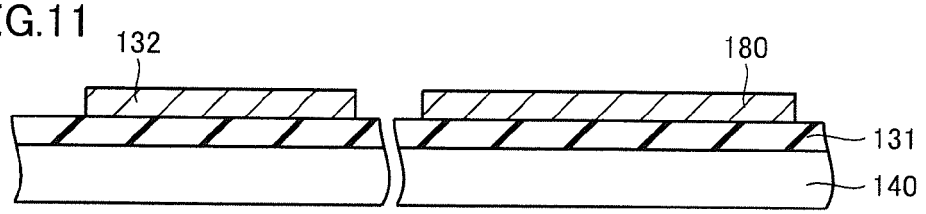
FIG. 11 is a cross-sectional view showing a second step of the process of manufacturing TFT array substrate 130.

FIG. 11 is a cross-sectional view showing a second step of the process of manufacturing TFT array substrate 130. In this FIG. 11, an amorphous semiconductor layer is first formed. A material of the amorphous semiconductor film is not particularly limited as long as the conductivity thereof is semiconductive. Silicon (Si), germanium (Ge), gallium-arsenide (GaAs) and the like are used as the material of the amorphous semiconductor film, and silicon is preferable because it is inexpensive and suitable for mass production. A method for forming the amorphous semiconductor film is not particularly limited. A method for forming an amorphous silicon (a-Si) film by a CVD method and the like is, for example, used as the method for forming the amorphous semiconductor film.

Thereafter, a catalytic element is added to the amorphous semiconductor layer. The catalytic element is for promoting crystallization in the amorphous semiconductor film and allows the semiconductor layer to be altered to CG-Si, which leads to higher performance of the TFT. Iron, cobalt, nickel, germanium, ruthenium, rhodium, palladium, osmium, iridium, platinum, copper, gold and the like are used as the catalytic element. The catalytic element preferably contains at least one element selected from the aforementioned group, and Ni is suitably used. A method for adding the catalytic element is not particularly limited. A resistive heating method, a coating method and the like are used as the method for adding the catalytic element.

Thereafter, the amorphous semiconductor layer is crystallized to form a continuous grain silicon layer (CG silicon layer). A combination of a solid phase crystallization (SPC) method in which crystallization is achieved by annealing treatment and a laser annealing method in which melt recrystallization is achieved by irradiation with excimer laser light and the like is suitable as a method for crystallization.

The continuous grain silicon layer is formed in such a manner, and thereafter, this continuous grain silicon layer is patterned by a photolithography method and the like to form semiconductor layer 132 and semiconductor layer 180. In this second step, semiconductor layer 123 shown in FIG. 3 is also formed. Although the example in which semiconductor layer 180 and semiconductor layer 123 are formed by the continuous grain silicon layer has been described, a material of semiconductor layer 180 and semiconductor layer 123 is not limited to the continuous grain silicon layer, and other materials may be selected as appropriate.

Figure 12:
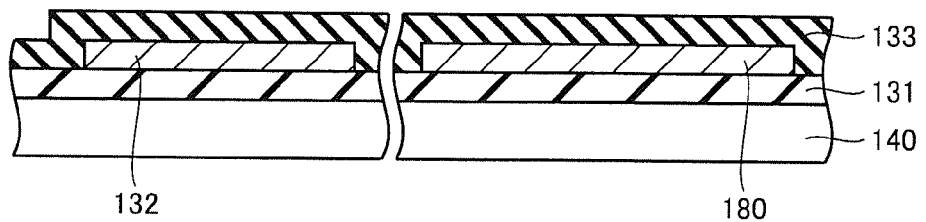
FIG. 12 is a cross-sectional view showing a third step of the process of manufacturing TFT array substrate 130.

FIG. 12 is a cross-sectional view showing a third step of the process of manufacturing TFT array substrate 130. As shown in this FIG. 12, the insulating layer made of $SiO_2$, SiN, SiNO and the like is formed on underlying layer 131 by the CVD method and the like to cover semiconductor layer 180 and semiconductor layer 132. Gate insulating layer 133 is thus formed.

Figure 13:
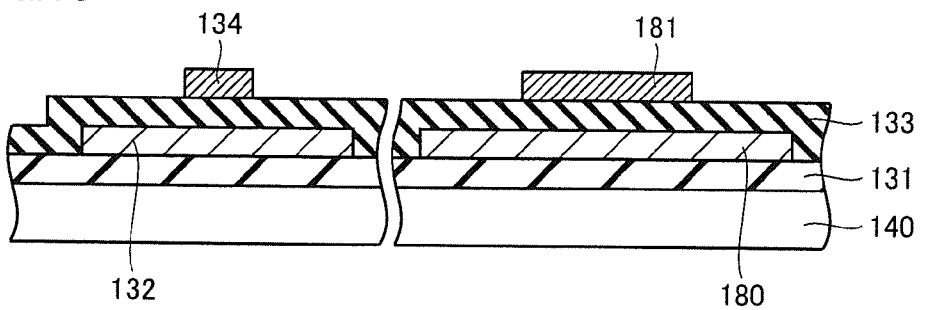
FIG. 13 is a cross-sectional view showing a fourth step of the process of manufacturing TFT array substrate 130.

FIG. 13 is a cross-sectional view showing a fourth step of the process of manufacturing TFT array substrate 130. As shown in this FIG. 13, the stacked metal layers are deposited by a sputtering method, the CVD method and the like, and thereafter, the stacked metal layers are patterned by the photolithography method and the like. As a result, gate electrode 134 and gate electrode 181 are formed.

Gate electrode 134 is formed on a portion of the upper surface of gate insulating layer 133 located above semiconductor layer 132. Gate electrode 181 is formed on a portion of the upper surface of gate insulating layer 133 located above semiconductor layer 180.

In this fourth step, gate line 112, gate line for sensing 113 and gate electrode 122 shown in FIG. 2 are also formed.

Figure 14:
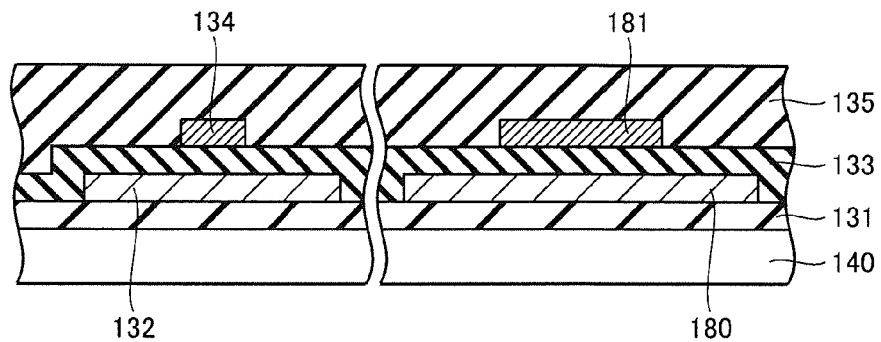
FIG. 14 is a cross-sectional view showing a fifth step of the process of manufacturing TFT array substrate 130.

FIG. 14 is a cross-sectional view showing a fifth step of the process of manufacturing TFT array substrate 130. As shown in this FIG. 14, interlayer dielectric 135 is formed on the upper surface of gate insulating layer 133 to cover gate electrode 134 and gate electrode 181.

Figure 15:
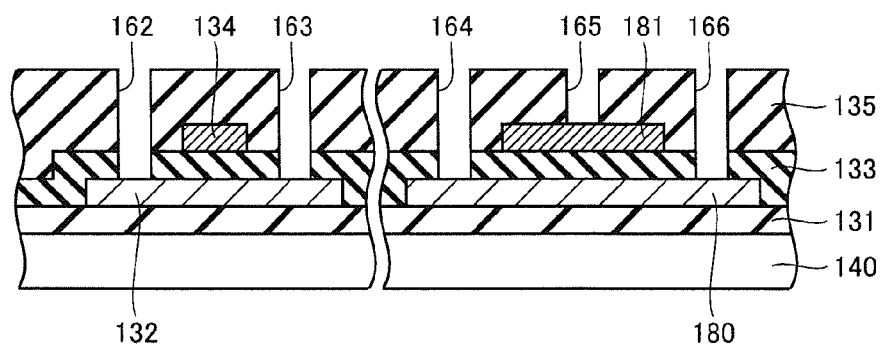
FIG. 15 is a cross-sectional view showing a sixth step of the process of manufacturing TFT array substrate 130.

FIG. 15 is a cross-sectional view showing a sixth step of the process of manufacturing TFT array substrate 130. As shown in this FIG. 15, interlayer dielectric 135 and gate insulating layer 133 are patterned by dry etching and the like to form contact holes 162 to 166.

Contact hole 162 and contact hole 163 are formed to reach semiconductor layer 132, and contact hole 164 and contact hole 166 are formed to reach semiconductor layer 180. Contact hole 165 is formed to reach an upper surface of gate electrode 181.

Figure 16:
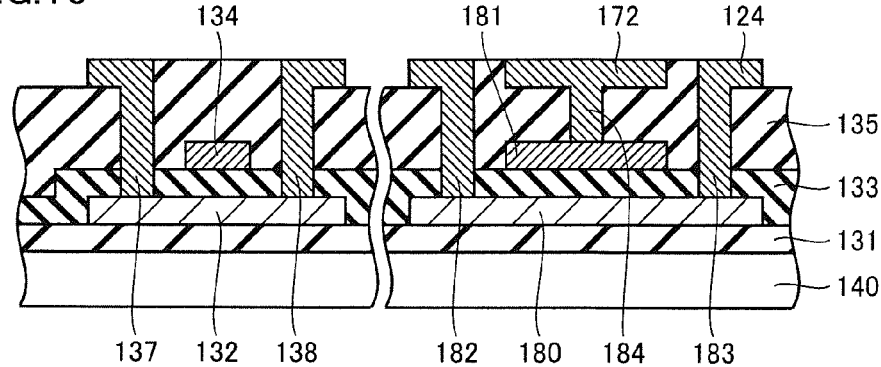
FIG. 16 is a cross-sectional view showing a seventh step of the process of manufacturing TFT array substrate 130.

FIG. 16 is a cross-sectional view showing a seventh step of the process of manufacturing TFT array substrate 130. In this FIG. 16, the metal layer is formed by sputtering. At this time, the metal layer also enters contact holes 162 to 166 shown in FIG. 15.

When drain electrodes 137 and 182, source electrodes 138 and 183, lower electrode 172, contact 184, and connection wiring 124 are configured by the stacked metal layers, a plurality of metal layers are stacked sequentially by sputtering.

Then, the formed metal layer or stacked metal layers are patterned to form drain electrodes 137 and 182, source electrodes 138 and 183, lower electrode 172, contact 184, and connection wiring 124.

In this seventh step, source line 111 shown in FIG. 2 as well as source electrode 121 and drain electrode 125 of TFT element for selection 116 are also formed.

Thereafter, upper insulating layer 136 is formed as shown in FIGS. 4 and 5 above. Specifically, the silicon nitride layer (SiN layer) having a thickness of, for example, approximately 200 nm is formed by a plasma enhanced chemical vapor deposition method. Thereafter, upper insulating layer 136 is patterned to form a contact hole for exposing a part of drain electrode 137. Then, an ITO film is formed and this ITO film is patterned to form pixel electrode 114.

When spacer 161 is formed in TFT array substrate 130, a resin layer made of an acrylic resin and the like is formed on the upper surface of upper insulating layer 136 and this resin layer is patterned to form spacer 161. Spacer 161 has a height of approximately 4 μm. TFT array substrate 130 can thus be formed.

As described above, in the method for manufacturing TFT array substrate 130 according to the present embodiment, when the semiconductor layer, the gate electrode, the source electrode, and the drain electrode of TFT element 115 are formed, the semiconductor layers and the like of TFT element for selection 116 and output element 117 can be formed, and the lower electrode of the pressure sensor can also be formed. Therefore, an increase in the number of manufacturing steps is suppressed.

Figure 17:
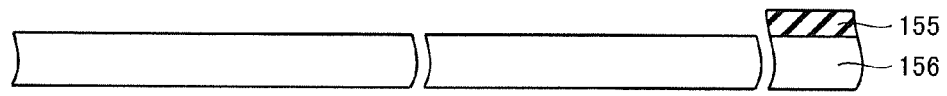
FIG. 17 is a cross-sectional view showing a first step of a process of manufacturing common substrate 150.

A method for manufacturing common substrate 150 will be described with reference to FIGS. 17 to 21. FIG. 17 is a cross-sectional view showing a first step of a process of manufacturing common substrate 150.

As shown in this FIG. 17, glass substrate 156 having the main surface is prepared. Then, a highly light blocking resin layer having a thickness of approximately 1 to 10 μm is, for example, formed on the main surface of glass substrate 156 by, for example, spin coating and the like. The resin layer preferably has a thickness of approximately 2 to 5 μm. Thereafter, exposure to light, development, cleaning, and postbaking are performed. As a result, black matrix 155 shown in FIG. 2 is formed on the main surface of glass substrate 156. A material of the resin may be a negative type resin or a positive type resin as long as the resin is a photosensitive resin such as an acrylic resin used as a general black photosensitive resin. When the conductivity is provided to black matrix 155, black matrix 155 is made of a conductive resin material or a metal material such as titanium (Ti).

Figure 18:
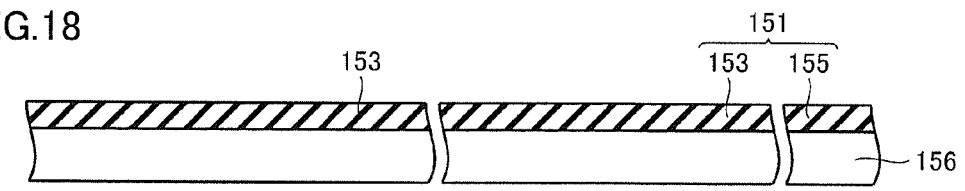
FIG. 18 is a cross-sectional view showing a second step of the process of manufacturing common substrate 150.

FIG. 18 is a cross-sectional view showing a second step of the process of manufacturing glass substrate 156. In this FIG. 18, black matrix 155 is a grid-like pattern having an opening of, for example, approximately 60 μm×100 μm and having a width of approximately 20 μm. Ink of colored layer 153 is applied to the opening of black matrix 155 by an ink-jet method. Color filter substrate 151 is thus formed on the main surface of glass substrate 156. Colored layer 153 has a film thickness of, for example, approximately 1 to 10 μm, and preferably approximately 2 to 5 μm.

Figure 19:
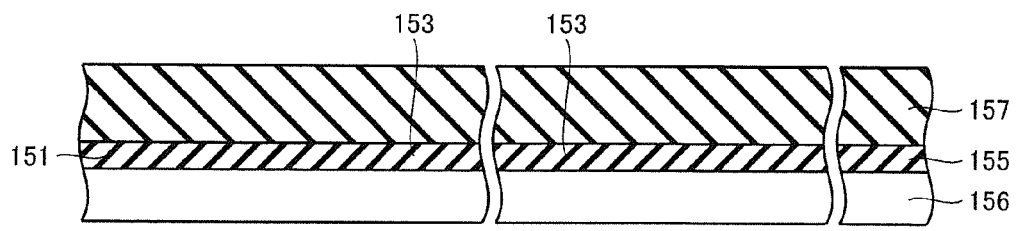
FIG. 19 is a cross-sectional view showing a third step of the process of manufacturing common substrate 150.

FIG. 19 is a cross-sectional view showing a third step of the process of manufacturing common substrate 150. As shown in this FIG. 19, a plastic resin layer 157 made of an acrylic resin and having a film thickness of, for example, approximately 1 to 10 μm is, for example, formed. Plastic resin layer 157 preferably has a film thickness of approximately 1.5 to 5 μm. For example, plastic resin layer 157 has a film thickness of 3.5 μm.

Figure 20:
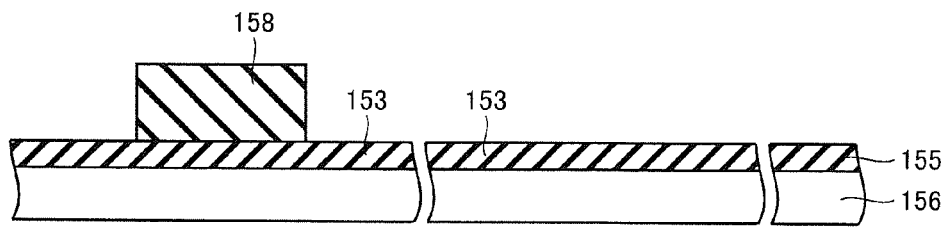
FIG. 20 is a cross-sectional view showing a fourth step of the process of manufacturing common substrate 150.
Figure 21:
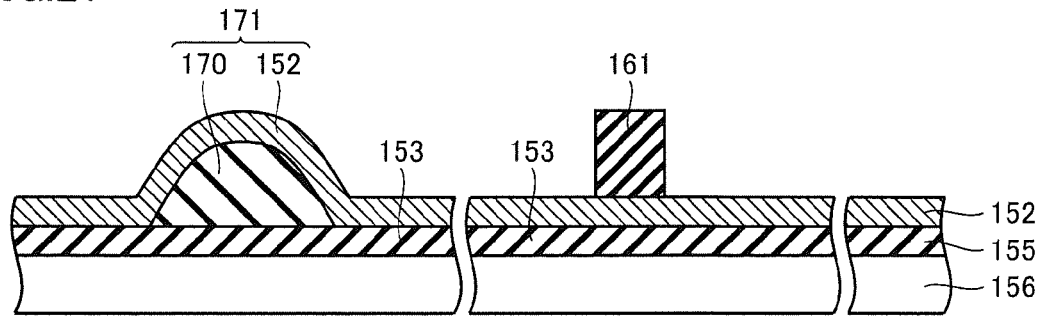
FIG. 21 is a cross-sectional view showing a fifth step of the process of manufacturing common substrate 150, and in this FIG. 21, a resin pattern 158 is subjected to annealing treatment (resin annealing) to form a projection 170.

FIG. 20 is a cross-sectional view showing a fourth step of the process of manufacturing common substrate 150. As shown in this FIG. 20, plastic resin layer 157 is patterned by photolithography to form a resin pattern 158. FIG. 21 is a cross-sectional view showing a fifth step of the process of manufacturing common substrate 150. In this FIG. 21, resin pattern 158 is subjected to the annealing treatment (resin annealing) to form projection 170.

Specifically, glass substrate 156 having resin pattern 158 is inserted into an oven and the annealing treatment is performed at a temperature of, for example, 100° C. or higher and 300° C. or lower. The annealing treatment temperature is preferably 100° C. or higher and 200° C. or lower. For example, baking is performed in the oven at 220° C. for approximately 60 minutes.

As a result of the annealing treatment to resin pattern 158, the resin on the surface flows and projection 170 having a smooth surface is formed.

When plastic resin layer 157 has a film thickness of 3.5 μm and patterned resin pattern 158 is subjected to the annealing treatment at 220° C. for 60 minutes, projection 170 has a height of approximately 3.4 μm.

Thereafter, the transparent conductive layer such as the ITO layer is applied to cover projection 170, and thereby common electrode 152 is formed. Common electrode 152 has a film thickness of, for example, approximately 50 nm or more and 400 nm or less. Common electrode 152 preferably has a film thickness of approximately 50 nm or more and 200 nm or less. For example, common electrode 152 has a film thickness of 200 nm.

Common electrode 152 is formed on projection 170 in such a manner, and thereby upper electrode 171 is formed. When spacer 161 is formed on common substrate 150, the resin layer made of an acrylic resin and the like is formed on an upper surface of common electrode 152 and this resin layer is patterned to form spacer 161. Spacer 161 has a height of approximately 4 μm. Common substrate 150 is thus formed.

Then, the liquid crystal layer is applied onto the upper surface of TFT array substrate 130, and further, common substrate 150 is arranged above TFT array substrate 130.

At this time, TFT array substrate 130 and common substrate 150 are stacked such that upper electrode 171 is located above common electrode 152. Thereafter, through various steps, liquid crystal display device 100 shown in FIGS. 4 and 5 can be formed.

When force of approximately 1 N is applied from the TFT array substrate 130 side in liquid crystal display device 100 thus obtained, an electrostatic capacitance that is six times as large as an electrostatic capacitance when the pressing force is not applied can be sensed. Furthermore, the electrostatic capacitance increases in a manner of linear function with respect to the pressing force during a period from the start of pressing to pressing at the force of 1 N.

Second Embodiment

Pressure sensor 118 and liquid crystal display device 100 according to a second embodiment of the present invention will be described with reference to FIGS. 22 to 26.

The same reference characters are given to the components shown in FIGS. 22 to 26 that are the same as or corresponding to those shown in FIGS. 1 to 21 above, and description thereof will not be repeated.

Figure 22:
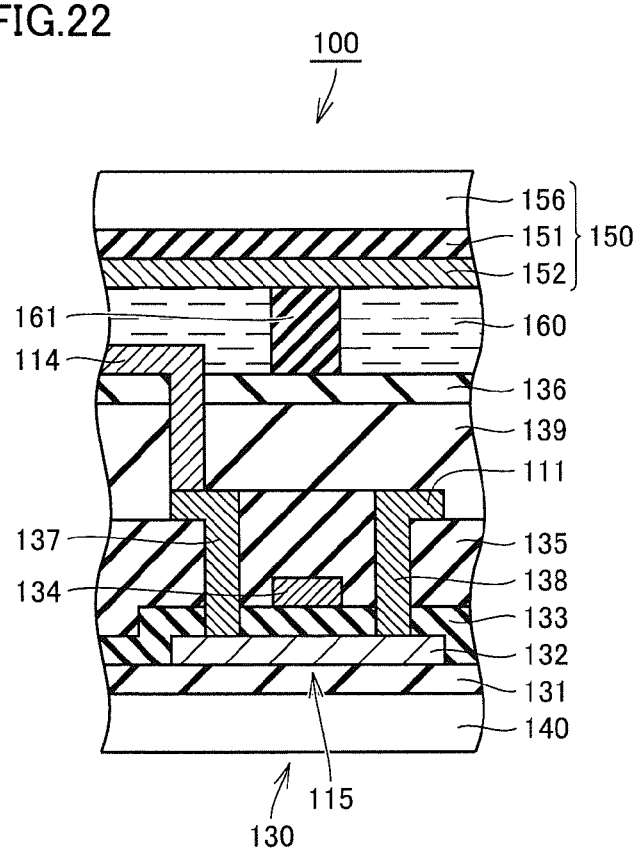
FIG. 22 is a cross-sectional view of liquid crystal display device 100 according to a second embodiment and is a cross-sectional view showing a TFT element 115.
Figure 23:
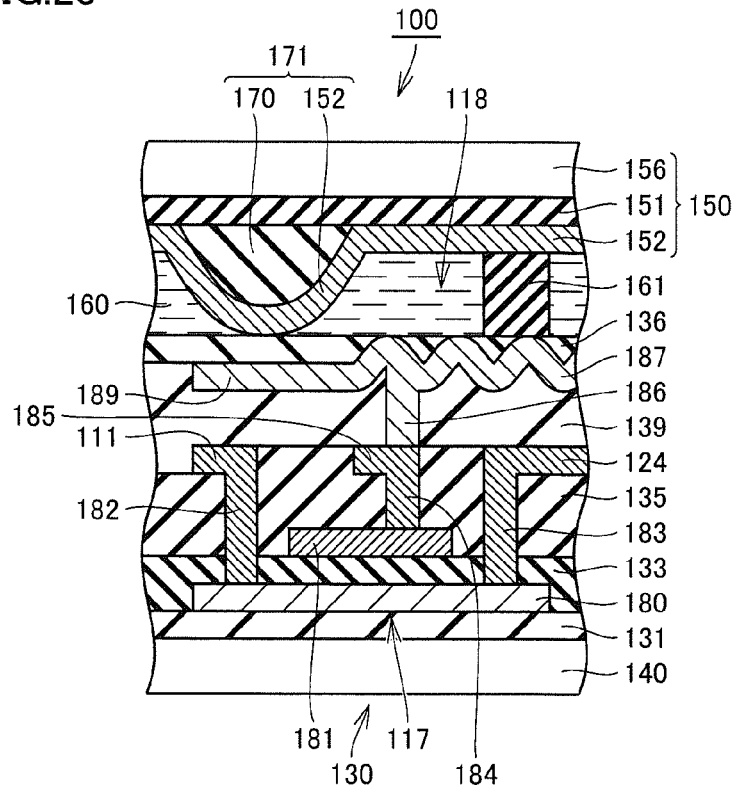
FIG. 23 is a cross-sectional view of liquid crystal display device 100 according to the second embodiment and is a cross-sectional view of an output element 117.

FIG. 22 is a cross-sectional view of liquid crystal display device 100 according to the second embodiment and is a cross-sectional view showing TFT element 115. FIG. 23 is a cross-sectional view of liquid crystal display device 100 according to the second embodiment and is a cross-sectional view of output element 117.

As shown in these FIGS. 22 and 23, liquid crystal display device 100 includes TFT element 115 and output element 117, and interlayer dielectric 135 is formed to cover TFT element 115 and output element 117.

Upper ends of drain electrode 137 and source electrode 138 of TFT element 115, upper ends of drain electrode 182 and source electrode 183 of output element 117, an upper end of contact 184, source line 111, and connection wiring 124 are located on the upper surface of interlayer dielectric 135.

A pad unit 185 is formed at the upper end of contact 184, and liquid crystal display device 100 includes an interlayer dielectric 139 formed to cover pad unit 185, the upper ends of drain electrode 137 and source electrode 138 of TFT element 115, the upper ends of drain electrode 182 and source electrode 183 of output element 117, the upper end of contact 184, source line 111, and connection wiring 124.

A reflection electrode 187 and a lower electrode 189 connected to this reflection electrode 187 are formed on the upper surface of this interlayer dielectric 139. Reflection electrode 187 and lower electrode 189 are integrally connected.

Lower electrode 189 and reflection electrode 187 are connected to pad unit 185 by a connection unit 186. Pad unit 185 is connected to gate electrode 181 by contact 184. Lower electrode 189 is connected to gate electrode 181 in such a manner.

Upper insulating layer 136 is formed on lower electrode 189 and reflection electrode 187. Lower electrode 189 is formed into a flat surface. A portion of upper insulating layer 136 located on an upper surface of lower electrode 189 is formed into a flat surface to conform to the upper surface of lower electrode 189.

Pixel electrode 114 shown in FIG. 22 is formed on upper insulating layer 136, passes through upper insulating layer 136 and interlayer dielectric 139, and is connected to drain electrode 137.

Upper electrode 171 is formed on the lower surface of common substrate 150 located above lower electrode 189. In the second embodiment as well, upper electrode 171 includes projection 170 formed on the lower surface of color filter substrate 151, and common electrode 152 formed on the surface of this projection 170.

In liquid crystal display device 100 according to the second embodiment as well, when common substrate 150 is pressed, upper electrode 171 comes into contact with upper insulating layer 136 and projection 170 deforms. Specifically, upper electrode 171 deforms to conform to lower electrode 189. Then, an area of a region where common electrode 152 formed on projection 170 faces lower electrode 189 with upper insulating layer 136 interposed therebetween increases sharply and a potential of lower electrode 189 fluctuates greatly. Therefore, a voltage applied to gate electrode 181 can be fluctuated greatly.

A method for manufacturing liquid crystal display device 100 according to the second embodiment will be described with reference to FIGS. 24 to 26.

A process of manufacturing TFT array substrate 130 of liquid crystal display device 100 according to the second embodiment overlaps partially with the process of manufacturing TFT array substrate 130 of liquid crystal display device 100 according to the first embodiment described above. Specifically, the manufacturing step shown in FIG. 10 to the manufacturing step shown in FIG. 14 are common to manufacturing steps for TFT array substrate 130 in the present embodiment.

Figure 24:
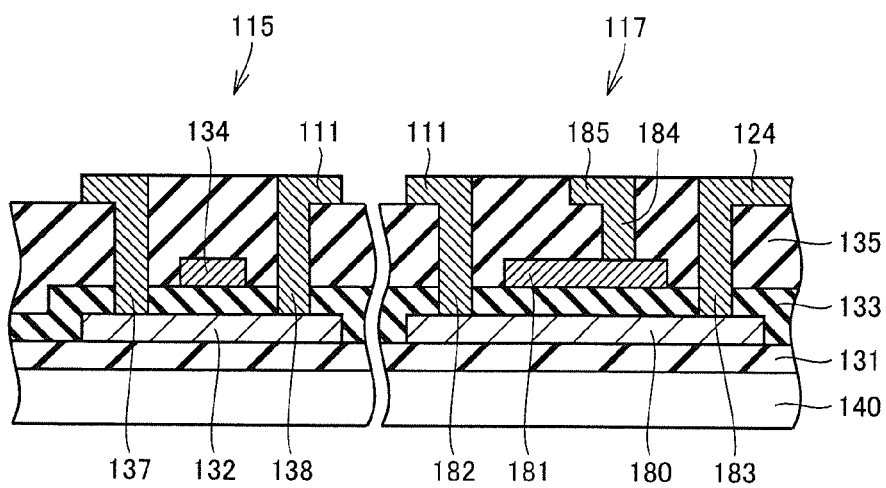
FIG. 24 is a cross-sectional view showing a manufacturing step after the manufacturing step shown in FIG. 14, in a process of manufacturing TFT array substrate 130 of liquid crystal display device 100 according to the second embodiment.

FIG. 24 is a cross-sectional view showing a manufacturing step after the manufacturing step shown in FIG. 14, in the process of manufacturing TFT array substrate 130 of liquid crystal display device 100 according to the second embodiment.

As shown in this FIG. 24, interlayer dielectric 135 and gate insulating layer 133 are patterned to form a plurality of contact holes. Thereafter, the metal layer or the stacked metal layers are formed on interlayer dielectric 135.

The metal layer or the stacked metal layers are patterned to form drain electrode 137, source electrode 138, drain electrode 182, contact 184, source electrode 183, pad unit 185, and connection wiring 124. Source line 111 and pad unit 185 are formed on the upper surface of interlayer dielectric 135.

Figure 25:
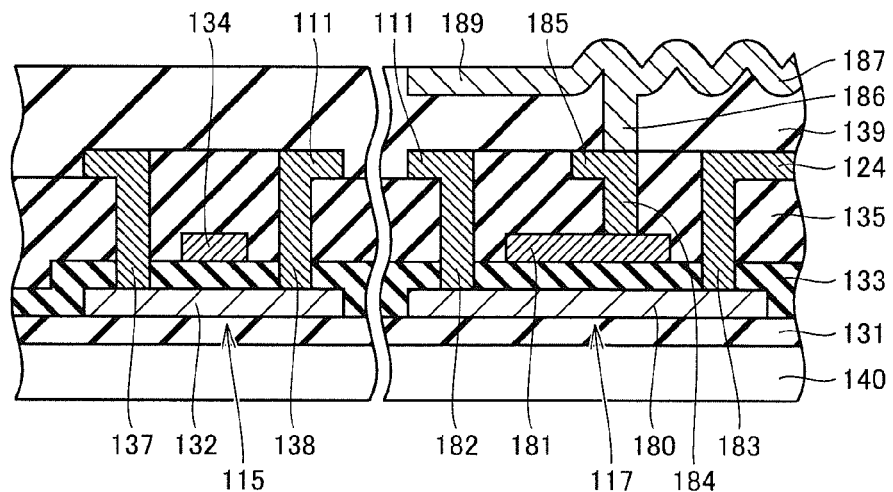
FIG. 25 is a cross-sectional view showing a manufacturing step after the manufacturing step for TFT array substrate 130 shown in FIG. 24.

FIG. 25 is a cross-sectional view showing a manufacturing step after the manufacturing step for TFT array substrate 130 shown in FIG. 24. As shown in this FIG. 25, interlayer dielectric 139 is formed to cover source line 111 and pad unit 185.

Then, interlayer dielectric 139 is patterned. At this time, a contact hole is formed at a portion where connection unit 186 will be formed, and projections and recesses are formed at a portion of the upper surface of interlayer dielectric 139 where reflection electrode 187 will be located.

Interlayer dielectric 139 is patterned in such a manner, and thereafter, a metal layer made of aluminum (Al), silver (Ag), molybdenum (Mo) and the like, a metal compound layer containing a metal element such as aluminum (Al), silver (Ag) and molybdenum (Mo), or stacked metal layers formed by stacking an aluminum (Al) layer, a silver (Ag) layer and a molybdenum (Mo) layer is formed on the upper surface of interlayer dielectric 139.

The metal layer or the stacked metal layers are formed on the upper surface of interlayer dielectric 139, and thereby connection unit 186 is formed in the contact hole formed in interlayer dielectric 139.

Then, the metal layer or the stacked metal layers are patterned, and thereby lower electrode 189 and reflection electrode 187 are formed.

Since the projections and recesses are formed in advance at the portion of the upper surface of interlayer dielectric 139 where reflection electrode 187 will be formed, reflection electrode 187 is formed in the shape of projections and recesses to conform to the surface of these projections and recesses.

Figure 26:
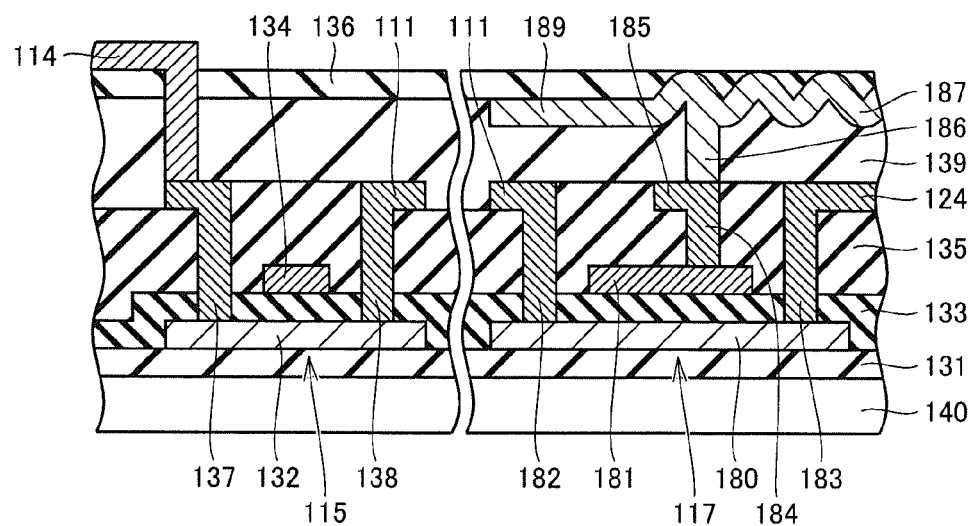
FIG. 26 is a cross-sectional view showing a manufacturing step for TFT array substrate 130 after the manufacturing step shown in FIG. 25.

FIG. 26 is a cross-sectional view showing a manufacturing step for TFT array substrate 130 after the manufacturing step shown in FIG. 25.

As shown in this FIG. 26, upper insulating layer 136 is formed on interlayer dielectric 139 to cover lower electrode 189 and reflection electrode 187.

Thereafter, upper insulating layer 136 and interlayer dielectric 139 are patterned to form a contact hole extending from the upper surface of upper insulating layer 136 to the upper end of drain electrode 137. After the formation of the contact hole, the ITO film is formed on the upper surface of upper insulating layer 136 and this ITO film is patterned to form pixel electrode 114. TFT array substrate 130 shown in FIGS. 22 and 23 is thus formed.

As described above, lower electrode 189 and connection unit 186 connected to this lower electrode 189 can be formed together with reflection electrode 187 in the step of forming reflection electrode 187. Therefore, in the present embodiment as well, the lower electrode of pressure sensor 118 can be formed in TFT array substrate 130 without causing an increase in the number of manufacturing steps.

Third Embodiment

Pressure sensor 118, liquid crystal display device 100 and a method for manufacturing liquid crystal display device 100 according to a third embodiment of the present invention will be described with reference to FIGS. 27 to 37. The same reference characters are given to the components shown in FIGS. 27 to 37 that are the same as or corresponding to those shown in FIGS. 1 to 26 above, and description thereof will not be repeated.

Figure 27:
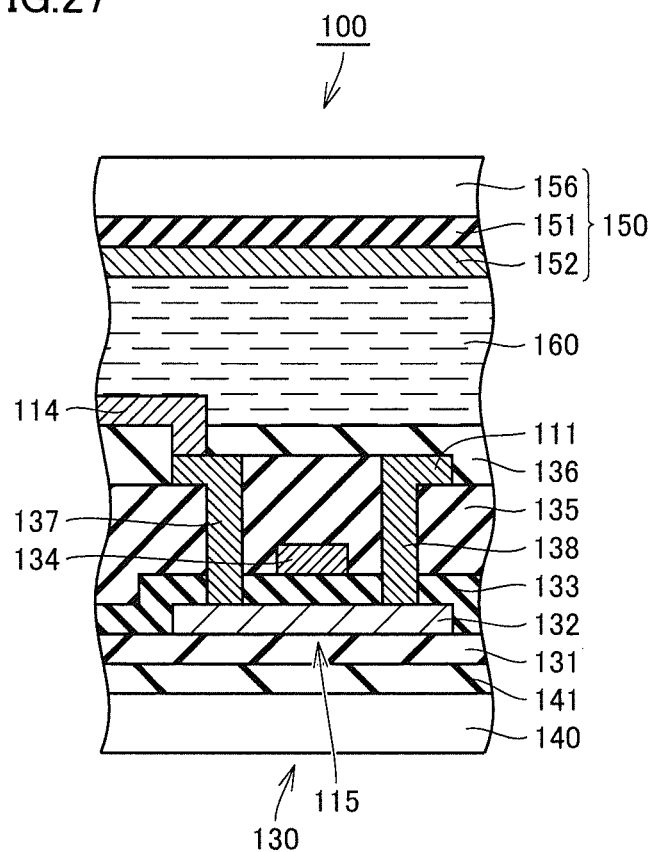
FIG. 27 is a cross-sectional view of liquid crystal display device 100 according to a third embodiment and is a cross-sectional view showing TFT element 115.
Figure 28:
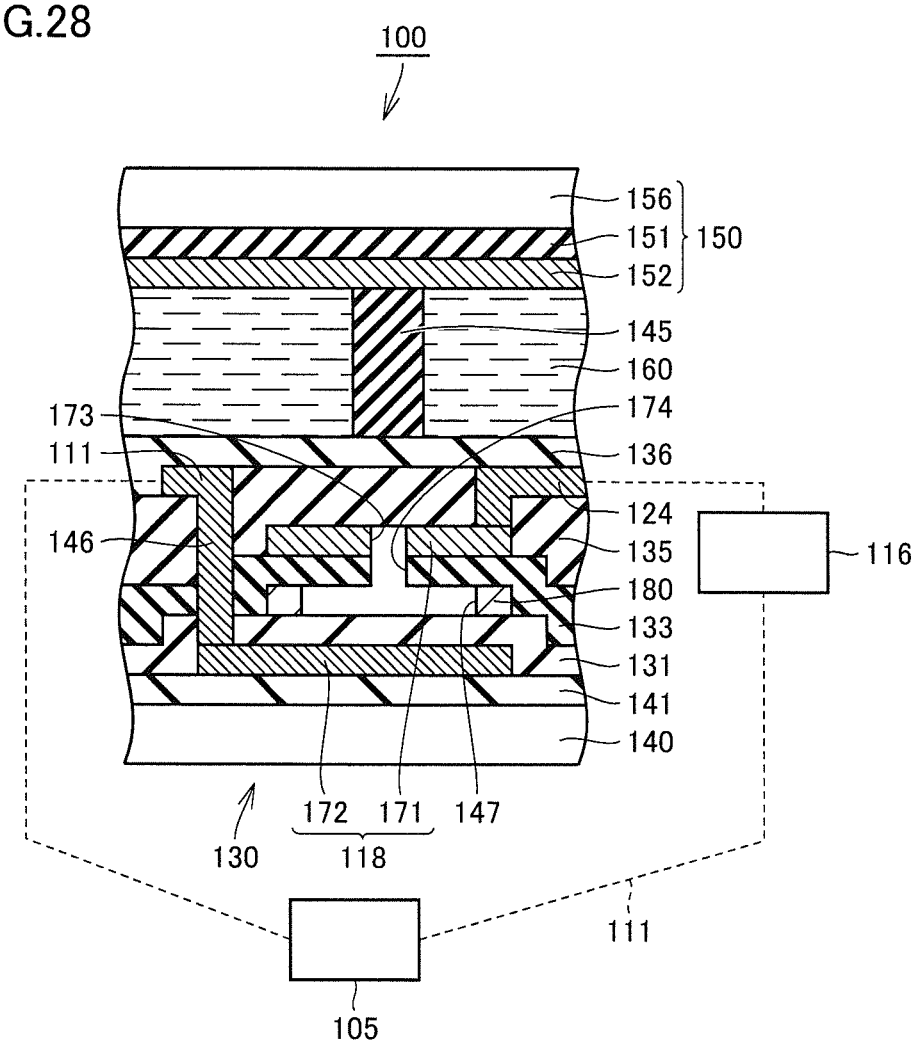
FIG. 28 is a cross-sectional view of liquid crystal display device 100 according to the third embodiment and is a cross-sectional view showing pressure sensor 118.

FIG. 27 is a cross-sectional view of liquid crystal display device 100 according to the third embodiment and is a cross-sectional view showing TFT element 115. FIG. 28 is a cross-sectional view of liquid crystal display device 100 according to the third embodiment and is a cross-sectional view showing pressure sensor 118.

As shown in this FIG. 27, liquid crystal display device 100 includes an underlying layer 141 formed on the main surface of glass substrate 140, underlying layer 131 formed on an upper surface of this underlying layer 141, and TFT element 115 formed on underlying layer 131.

Underlying layer 141 is formed of an insulating layer made of $SiO_2$, SiN, SiNO and the like. Underlying layer 141 has a film thickness of, for example, more than 0 nm and 500 nm or less. Underlying layer 141 preferably has a film thickness of 400 nm or less.

TFT element 115 includes semiconductor layer 132 formed on underlying layer 131, gate electrode 134 formed above semiconductor layer 132 with gate insulating layer 133 interposed therebetween, and drain electrode 137 and source electrode 138 connected to semiconductor layer 132. Gate electrode 134 is covered with interlayer dielectric 135 formed on gate insulating layer 133. Drain electrode 137 and source electrode 138 are formed to reach the upper surface of interlayer dielectric 135.

Upper insulating layer 136 is formed on interlayer dielectric 135, and pixel electrode 114 is formed on the upper surface of this upper insulating layer 136. Pixel electrode 114 is connected to the upper end of drain electrode 137.

As shown in FIG. 28, pressure sensor 118 includes lower electrode 172 formed on the upper surface of underlying layer 141, and upper electrode 171 located above lower electrode 172 and arranged to face lower electrode 172. A recess 147 is formed under upper electrode 171 to permit deflection of upper electrode 171. Lower electrode 172 is covered with underlying layer 131. Lower electrode 172 is formed in the shape of a flat plate.

A portion of underlying layer 131 located on lower electrode 172 extends along the upper surface of lower electrode 172 and is formed into a flat surface.

A contact 146 is connected to lower electrode 172, and this contact 146 is formed to reach the upper surface of interlayer dielectric 135. An upper end of contact 146 is connected to source line 111 formed on the upper surface of interlayer dielectric 135.

Upper electrode 171 is formed on the upper surface of gate insulating layer 133, and recess 147 is formed between upper electrode 171 and lower electrode 172 and between gate insulating layer 133 and underlying layer 131.

Upper electrode 171 is formed in the shape of a flat plate. A portion of gate insulating layer 133 located under upper electrode 171 extends along a lower surface of upper electrode 171 and is formed into a flat surface.

Connection wiring 124 is connected to upper electrode 171 and this connection wiring 124 is connected to the drain electrode of TFT element for selection 116 shown in FIG. 1.

Upper insulating layer 136 is formed to cover source line 111 connected to lower electrode 172 and connection wiring 124.

Common substrate 150 of liquid crystal display device 100 according to the third embodiment includes glass substrate 156, color filter substrate 151 formed on a lower surface of this glass substrate 156, common electrode 152 formed on the lower surface of this color filter substrate 151, and a pressing member 145 formed on a lower surface of this common electrode 152. Pressing member 145 is made of a resin such as an acrylic resin.

Control unit 105 senses source line 111 connected to contact 146 and an output of source line 111 connected to TFT element for selection 116.

As a result, control unit 105 can sense the capacitance between upper electrode 171 and lower electrode 172. Control unit 105 calculates the pressing force applied to common substrate 150, based on fluctuations in the capacitance between upper electrode 171 and lower electrode 172.

When a user presses common substrate 150 using a pen or someone's finger, a pressed portion of common substrate 150 deflects slightly.

Figure 29:
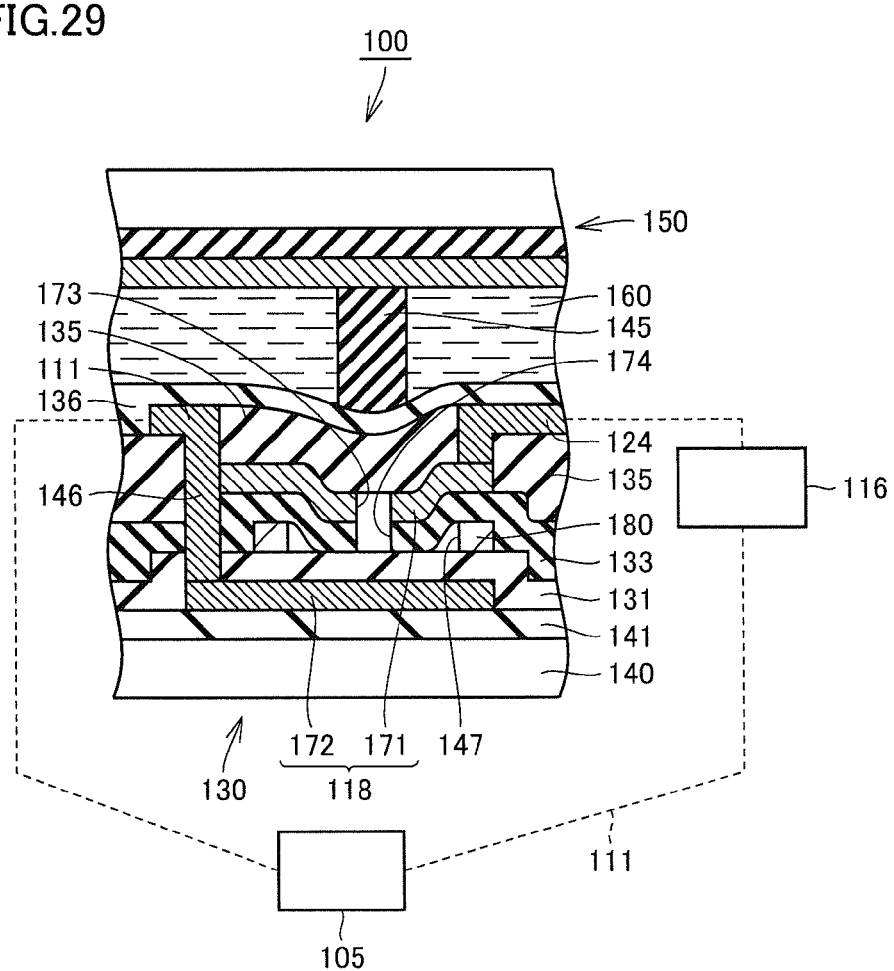
FIG. 29 is a cross-sectional view schematically showing a state of liquid crystal display device 100 when common substrate 150 is pressed.

FIG. 29 is a cross-sectional view schematically showing a state of liquid crystal display device 100 when common substrate 150 is pressed.

As shown in this FIG. 29, when pressing member 145 presses the upper surface of TFT array substrate 130, upper electrode 171 and gate insulating layer 133 located under this upper electrode 171 deflect.

Then, gate insulating layer 133 located under upper electrode 171 abuts underlying layer 131 located on lower electrode 172, and upper electrode 171 deforms.

Figure 30:
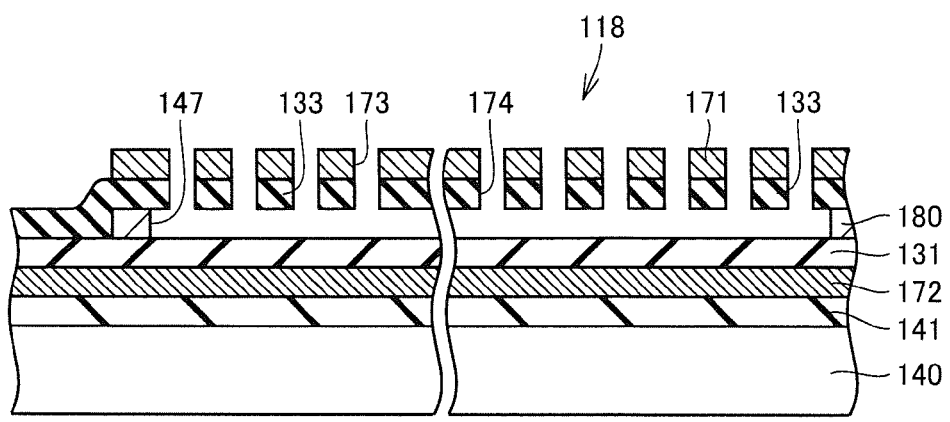
FIG. 30 is a cross-sectional view showing upper electrode 171 and a gate insulating layer 133 before upper electrode 171 and gate insulating layer 133 are deformed by the pressing force from a pressing member 145.

FIG. 30 is a cross-sectional view showing upper electrode 171 and gate insulating layer 133 before upper electrode 171 and gate insulating layer 133 are deformed by the pressing force from pressing member 145.

As shown in this FIG. 30, a plurality of holes 173 and 174 are formed in upper electrode 171 and gate insulating layer 133. Holes 173 and holes 174 are formed to communicate with one another.

Figure 31:
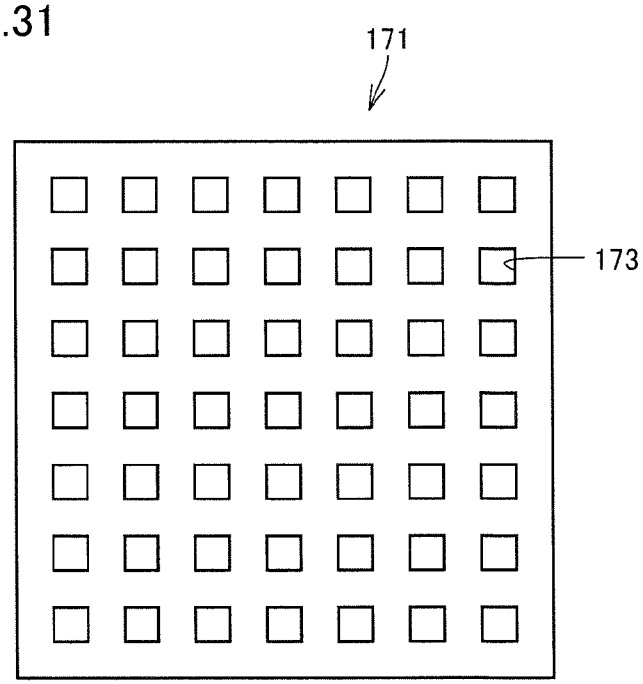
FIG. 31 is a plan view of upper electrode 171.

FIG. 31 is a plan view of upper electrode 171. As shown in this FIG. 31, upper electrode 171 is formed to have a substantially square shape, and hole 173 formed in upper electrode 171 is also formed to have a square shape. Holes 173 are formed in upper electrode 171 to be evenly distributed. One side of upper electrode 171 has a length of, for example, approximately 30 μm and one side of hole 173 has a length of, for example, approximately 2 μm. Upper electrode 171 is formed to have a width larger than a width of gate electrode 134. Therefore, upper electrode 171 is easily deformed by the external pressing force.

Upper electrode 171 is formed to have a film thickness of, for example, 50 nm or more and 600 nm or less, and preferably 100 nm or more and 500 nm or less.

As described above, upper electrode 171 is formed to have a length of a side that is much larger than a thickness of upper electrode 171. Therefore, upper electrode 171 can deform to easily deflect when a central portion of an upper surface of upper electrode 171 is pressed.

Upper electrode 171 is made of a metal material that is the same as that of the gate electrode. Upper electrode 171 is formed of, for example, a metal layer made of tungsten (W), tantalum (Ta), titanium (Ti), molybdenum (Mo) and the like, or an alloy containing an element such as tungsten (W), tantalum (Ta), titanium (Ti), and molybdenum (Mo), or a compound containing tungsten (W), tantalum (Ta), titanium (Ti), and molybdenum (Mo).

Preferably, upper electrode 171 and the gate electrode are formed of a tungsten (W) layer having a thickness of approximately 370 nm and a TaN (tantalum nitride) layer having a thickness of approximately 50 nm and formed on this tungsten (W) layer.

The shape of upper electrode 171 is not limited to the square shape and may be a rectangular shape. Various types of shapes such as a shape of a polygon more than a pentagon, a circular shape, and an oval shape can be used.

Figure 32:
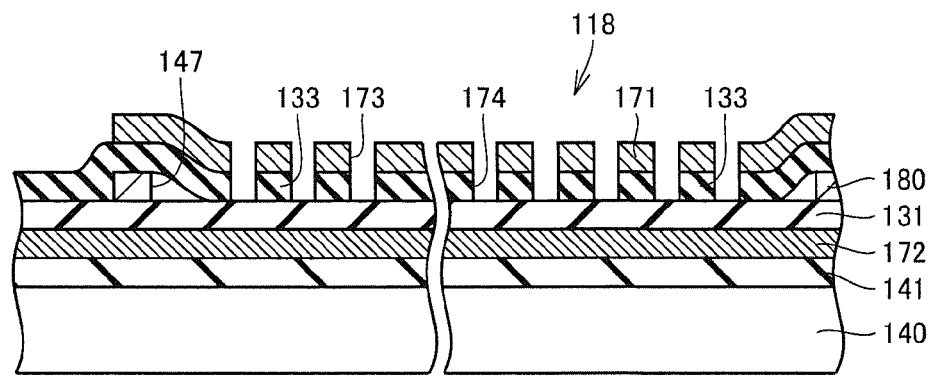
FIG. 32 is a cross-sectional view showing a state where upper electrode 171 and gate insulating layer 133 have been deformed by the pressing force from pressing member 145.

FIG. 32 is a cross-sectional view showing a state where upper electrode 171 and gate insulating layer 133 have been deformed by the pressing force from pressing member 145.

As shown in this FIG. 32, gate insulating layer 133 and upper electrode 171 deflect to go into recess 147.

An opening edge of recess 147 is slightly smaller than an outer edge of upper electrode 171 and most of upper electrode 171 deflects to enter recess 147.

Recess 147 is formed by a hole formed in semiconductor layer 180 and the upper surface of underlying layer 131. Therefore, a height of recess 147 is the same as a thickness of semiconductor layer 180. Semiconductor layer 180 is formed to have a thickness of, for example, 20 nm or more and 200 nm or less, and preferably 30 nm or more and 70 nm or less. The length of one side of upper electrode 171 is much larger than the height of recess 147.

Therefore, when upper electrode 171 and gate insulating layer 133 slightly deform, gate insulating layer 133 abuts the upper surface of underlying layer 131.

Furthermore, when upper electrode 171 and gate insulating layer 133 are pressed by pressing member 145, most of a portion of gate insulating layer 133 located in recess 147 abuts underlying layer 131 as shown in FIG. 32.

At this time, gate insulating layer 133 deforms to conform to the upper surface of underlying layer 131, and upper electrode 171 located on gate insulating layer 133 also deforms to conform to underlying layer 131.

Since underlying layer 131 is formed into a flat surface along the upper surface of lower electrode 172, upper electrode 171 deforms into a flat surface to conform to the shape of lower electrode 172.

Therefore, gate insulating layer 133 and underlying layer 131 are sandwiched between most of upper electrode 171 and lower electrode 172, and most of upper electrode 171 faces lower electrode 172 with gate insulating layer 133 and underlying layer 131 interposed therebetween.

Figure 33:
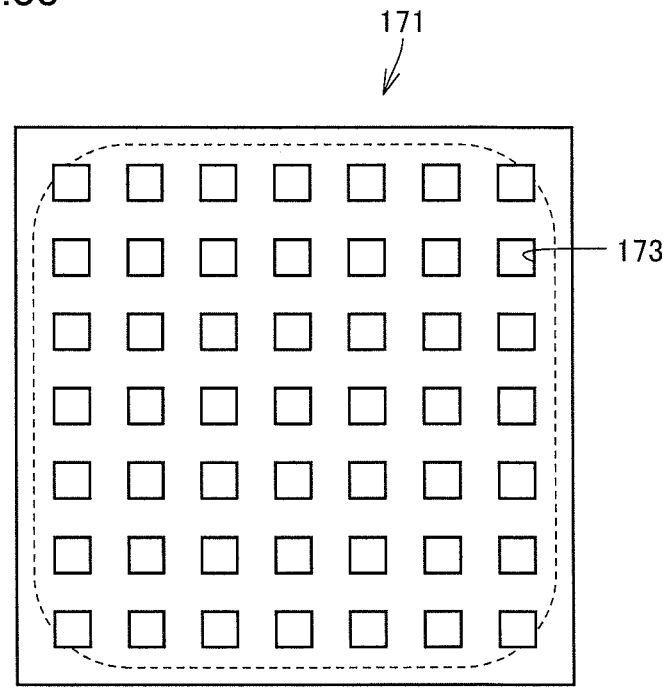
FIG. 33 is a plan view of upper electrode 171 when upper electrode 171 has been deformed as shown in FIG. 32.

FIG. 33 is a plan view of upper electrode 171 when upper electrode 171 has been deformed as shown in FIG. 32. In this FIG. 33, a region enclosed by a broken line represents a region where upper electrode 171 has deformed to conform to the upper surface of lower electrode 172, and this region enclosed by the broken line is a region facing underlying layer 131 and underlying layer 141 with underlying layer 131 interposed therebetween.

As shown in this FIG. 33, as a result of slight deformation of upper electrode 171, most of upper electrode 171 deforms to conform to lower electrode 172.

When pressing member 145 is slightly displaced downward, an area of this region enclosed by the broken line increases sharply. Therefore, the capacitance between upper electrode 171 and lower electrode 172 also increases sharply.

As described above, in pressure sensor 118 according to the third embodiment as well, the upper electrode deforms to conform to the shape of the lower electrode, and the characteristic of pressure sensor 118 exhibits the characteristic shown by the solid line in FIG. 8.

Therefore, liquid crystal display device 100 according to the third embodiment can accurately calculate the pressure applied to common substrate 150.

A method for manufacturing liquid crystal display device 100 according to the third embodiment will be described with reference to FIGS. 34 to 36. In liquid crystal display device 100 according to the third embodiment as well, TFT array substrate 130 and common substrate 150 are independently formed. Thereafter, TFT array substrate 130 and common substrate 150 are arranged to face each other.

Figure 34:
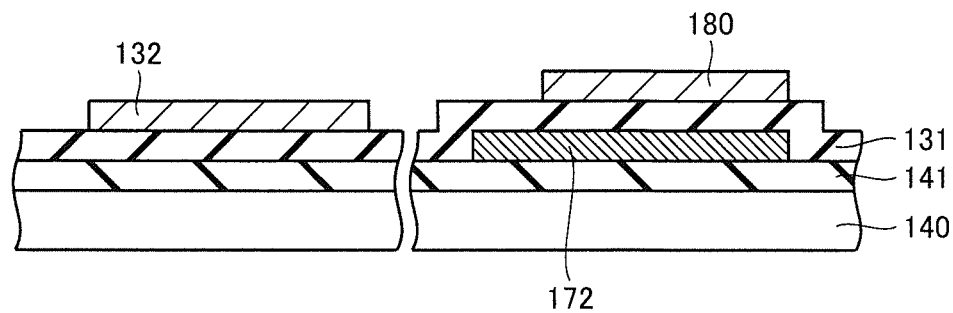
FIG. 34 is a cross-sectional view showing a first step of a process of manufacturing TFT array substrate 130.

FIG. 34 is a cross-sectional view showing a first step of a process of manufacturing TFT array substrate 130. As shown in this FIG. 34, glass substrate 140 having the main surface is prepared. Underlying layer 141 is formed on the main surface of this glass substrate 140. Underlying layer 141 is formed of, for example, an insulating layer made of $SiO_2$, SiN, SiNO and the like, and is formed of, for example, a silicon oxynitride layer (SiNO layer) having a thickness of approximately 50 nm and a silicon oxide layer (SiO layer) having a thickness of approximately 110 nm and formed on this silicon oxynitride layer (SiNO layer).

Underlying layer 141 is formed to have a film thickness of, for example, more than 0 nm and 500 nm or less. Underlying layer 141 is preferably formed to have a film thickness of 400 nm or less.

Thereafter, a metal layer made of molybdenum (Mo), tungsten (W) and the like is formed on the upper surface of underlying layer 141 by sputtering and the like. Then, this metal layer is patterned to form lower electrode 172. Lower electrode 172 is formed to have a film thickness of, for example, 50 nm or more and 600 nm or less. Lower electrode 172 is formed to have a film thickness of 50 nm or more and 300 nm or less.

The insulating layer made of $SiO_2$, SiN, SiNO and the like is formed to cover lower electrode 172, and underlying layer 131 is formed. Underlying layer 131 has a film thickness of approximately 50 nm or more and 400 nm or less, and preferably 50 nm or more and 200 nm or less.

The amorphous semiconductor layer is deposited on underlying layer 141. The amorphous semiconductor layer has a film thickness of, for example, 20 nm or more and 200 nm or less. The amorphous semiconductor layer preferably has a film thickness of approximately 30 nm or more and 70 nm. Thereafter, this amorphous semiconductor layer is crystallized to form the continuous grain silicon layer (CG silicon layer). The continuous grain silicon layer is patterned to form semiconductor layer 132 and semiconductor layer 180. Semiconductor layer 180 is formed on a portion of the upper surface of underlying layer 131 located above lower electrode 172.

Figure 35:
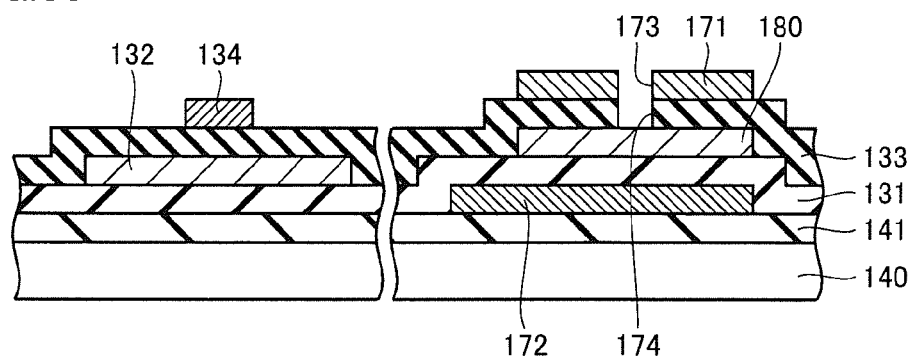
FIG. 35 is a cross-sectional view showing a second step of the process of manufacturing TFT array substrate 130.

FIG. 35 is a cross-sectional view showing a second step of the process of manufacturing TFT array substrate 130. As shown in this FIG. 35, the insulating layer made of $SiO_2$, SiN, SiNO and the like is formed, and gate insulating layer 133 is formed. Gate insulating layer 133 has a film thickness of, for example, 20 nm or more and 200 nm or less, and preferably 50 nm or more and 120 nm or less. Specifically, gate insulating layer 133 is formed of a $SiO_2$ layer having a thickness of approximately 80 nm.

After the formation of gate insulating layer 133, $P^+$ is doped into semiconductor layer 132 and semiconductor layer 180 under the conditions of 45 KeV and 5E15 $cm^{-2}$.

Then, the metal layer is formed on the upper surface of gate insulating layer 133. This metal layer is formed of, for example, a metal film made of tungsten (W), tantalum (Ta), titanium (Ti), molybdenum (Mo) and the like, or an alloy film containing tungsten (W), tantalum (Ta), titanium (Ti), molybdenum (Mo) and the like, or a compound containing an element such as tungsten (W), tantalum (Ta), titanium (Ti), and molybdenum (Mo).

This metal layer has a film thickness of, for example, 50 nm or more and 600 nm or less, and preferably 100 nm or more and 500 nm or less.

Thereafter, this metal layer is patterned to form gate electrode 134 and upper electrode 171. At this time, hole 173 is simultaneously formed in upper electrode 171.

In other words, in the method for manufacturing liquid crystal display device 100 according to the third embodiment, gate electrode 134 and upper electrode 171 can be simultaneously formed and an increase in the number of manufacturing steps is suppressed.

After the formation of upper electrode 171 and gate electrode 134, a resist mask covering a portion other than upper electrode 171 is formed, and gate insulating layer 133 is etched using upper electrode 171 and this mask. Gate insulating layer 133 is etched using an acid-based solution such as an HF (hydrogen fluoride) aqueous solution. As a result, hole 174 is formed in gate insulating layer 133.

Figure 36:
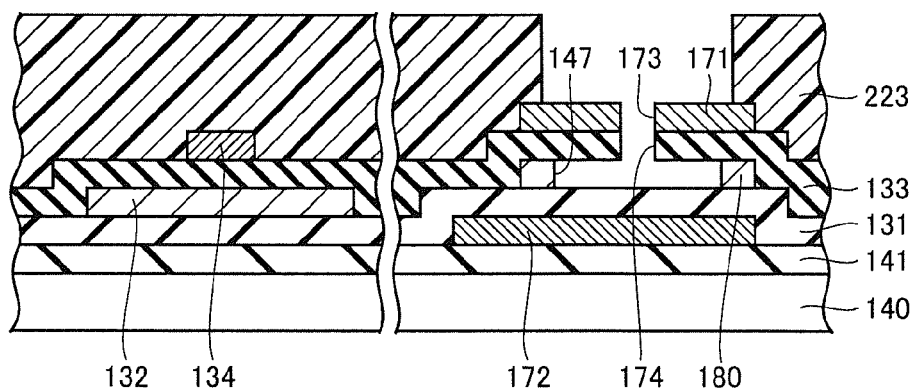
FIG. 36 is a cross-sectional view showing a third step of the process of manufacturing TFT array substrate 130.

FIG. 36 is a cross-sectional view showing a third step of the process of manufacturing TFT array substrate 130. As shown in this FIG. 36, a resist is first formed on the upper surface of gate insulating layer 133 to cover upper electrode 171 and gate electrode 134, and this resist is patterned. A resist pattern 223 is thus formed. This resist pattern 223 has a hole to expose hole 173 and hole 174 to the outside. Then, the substrate is immersed in an alkaline solution containing potassium hydroxide (KOH) and the like. The solution flows in through hole 173 and hole 174, and semiconductor layer 180 is etched. As a result, recess 147 is formed in semiconductor layer 180.

Thereafter, as shown in FIG. 28, resist pattern 223 is first removed and interlayer dielectric 135 is formed to cover gate electrode 134 and upper electrode 171. Interlayer dielectric 135 is patterned to form a plurality of contact holes, and thereafter, the metal layer is formed on the upper surface of interlayer dielectric 135 by sputtering. This metal layer is patterned to form drain electrode 137, source electrode 138, source line 111, contact 146, and connection wiring 124.

Then, upper insulating layer 136 is deposited and this upper insulating layer 136 is patterned to form a contact hole. Thereafter, the ITO film is deposited and this ITO film is patterned to form pixel electrode 114. TFT array substrate 130 of liquid crystal display device 100 according to the third embodiment is thus formed.

On the other hand, in order to form common substrate 150, glass substrate 156 is first prepared. Color filter substrate 151 is formed on the main surface of this glass substrate 156, and thereafter, common electrode 152 is formed. Then, a resin such as an acrylic resin is deposited on this common electrode 152. This acrylic resin is patterned to form pressing member 145. Common substrate 150 of liquid crystal display device 100 according to the third embodiment is thus formed. Thereafter, liquid crystal layer 160 is applied onto the upper surface of formed TFT array substrate 130, and common substrate 150 is arranged on the upper surface side of TFT array substrate 130. Liquid crystal display device 100 according to the present embodiment is thus formed.

Figure 37:
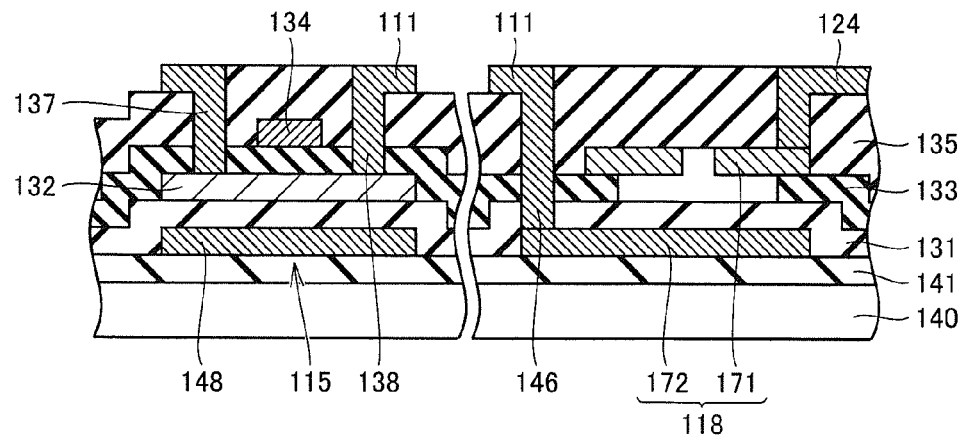
FIG. 37 is a cross-sectional view showing a modification of TFT array substrate 130 shown in FIG. 28.

FIG. 37 is a cross-sectional view showing a modification of TFT array substrate 130 shown in FIG. 28. In the example shown in this FIG. 37, a light blocking layer 148 is formed on a portion of the upper surface of underlying layer 141 located below semiconductor layer 132. This light blocking layer 148 is made of a material that is the same as (a material of the same kind as) that of lower electrode 172, and a film thickness of light blocking layer 148 is substantially identical to a film thickness of lower electrode 172. Specifically, light blocking layer 148 is formed of, for example, a metal film made of tungsten (W), tantalum (Ta), titanium (Ti), molybdenum (Mo) and the like, or an alloy film containing tungsten (W), tantalum (Ta), titanium (Ti), molybdenum (Mo) and the like, or a compound containing an element such as tungsten (W), tantalum (Ta), titanium (Ti), and molybdenum (Mo). Light blocking layer 148 has a film thickness of, for example, 50 nm or more and 600 nm or less, and preferably 100 nm or more and 500 nm or less.

Light blocking layer 148 suppresses irradiation of semiconductor layer 132 with light and suppresses fluctuations in characteristic of TFT element 115 caused by a photoelectric effect.

In the process of manufacturing TFT array substrate 130, light blocking layer 148 and lower electrode 172 are formed by patterning the metal layer deposited on underlying layer 141. Since lower electrode 172 and light blocking layer 148 can be formed in the same step as described above, an increase in the number of steps of manufacturing liquid crystal display device 100 is suppressed and lower electrode 172 and light blocking layer 148 can be formed.

Fourth Embodiment

Pressure sensor 118, liquid crystal display device 100 and a method for manufacturing liquid crystal display device 100 according to a fourth embodiment of the present invention will be described with reference to FIGS. 38 to 49. The same reference characters are given to the components shown in FIGS. 38 to 49 that are the same as or corresponding to those shown in FIGS. 1 to 37 above, and description thereof will not be repeated.

Figure 38:
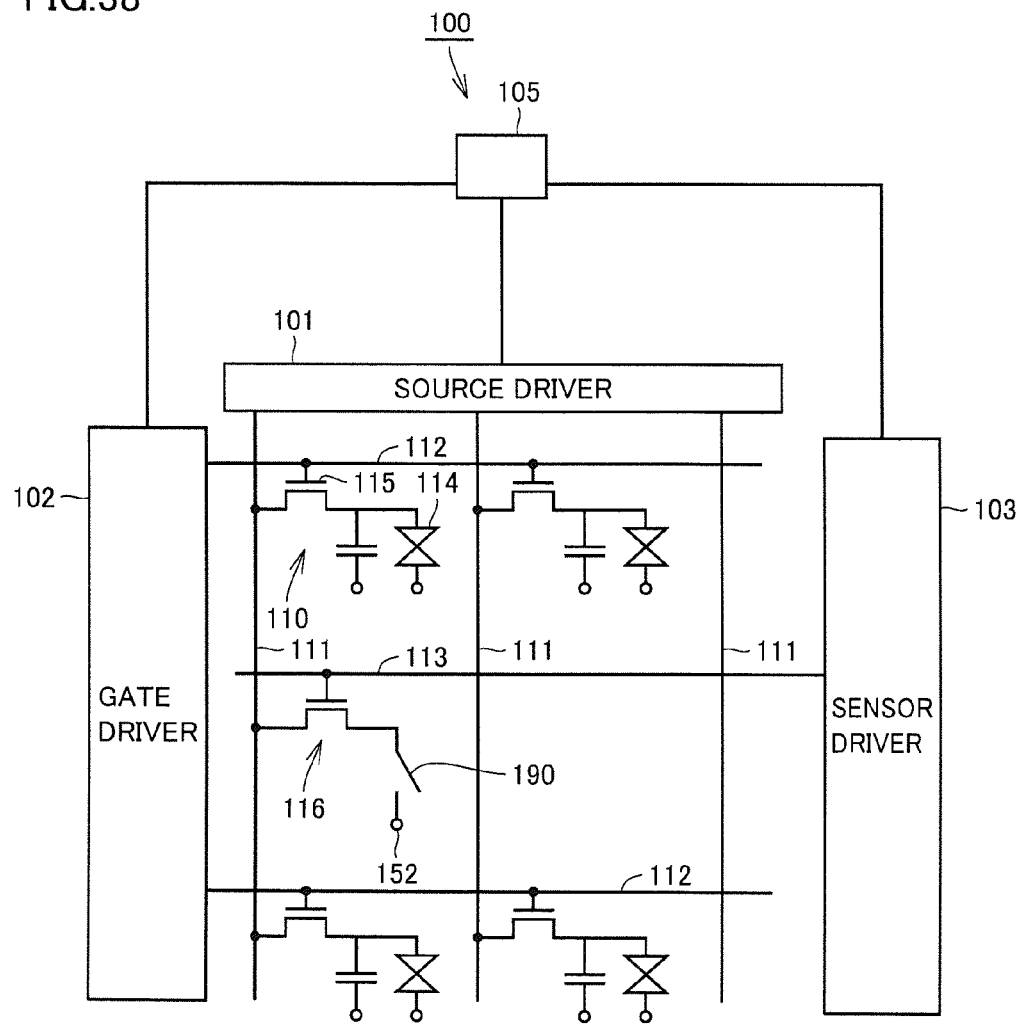
FIG. 38 is a circuit diagram schematically showing a circuit diagram of liquid crystal display device 100 according to a fourth embodiment.

FIG. 38 is a circuit diagram schematically showing a circuit diagram of liquid crystal display device 100 according to the fourth embodiment.

As shown in this FIG. 38, one electrode (lower electrode) of a pressure sensor 190 according to the fourth embodiment is connected to the drain electrode of TFT element for selection 116, and the other electrode (upper electrode) of pressure sensor 190 is connected to common electrode 152.

By switching ON/OFF of TFT element for selection 116, control unit 105 selects pressure sensor 190 for sensing.

In order to turn on selected TFT element for selection 116, a predetermined voltage is applied to gate line for sensing 113 to which selected TFT element for selection 116 is connected. A predetermined voltage is applied to source line 111 to which the source electrode of this selected TFT element for selection 116 is connected.

Pressure sensor 190 is formed to change an amount of current in accordance with the externally applied pressure.

Therefore, by sensing an amount of current flowing between source line 111 to which TFT element for selection 116 is connected and common electrode 152, control unit 105 can calculate the pressure applied to selected pressure sensor 190.

Figure 39:
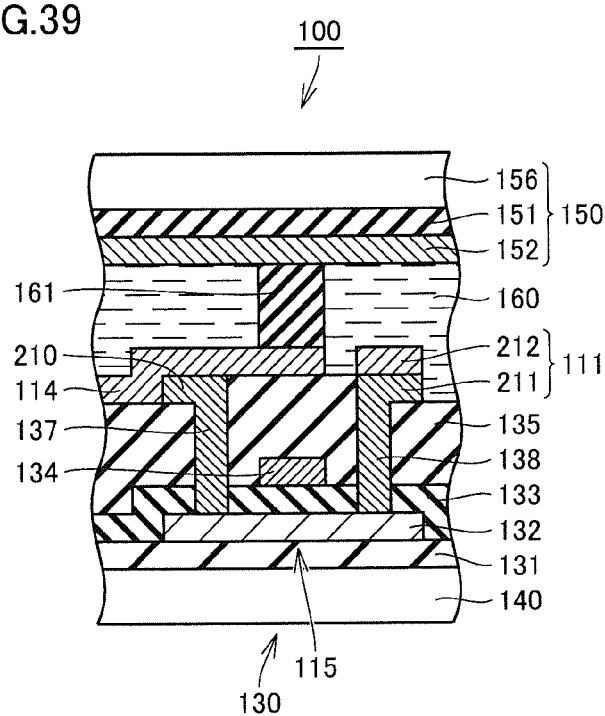
FIG. 39 is a cross-sectional view of liquid crystal display device 100 according to the fourth embodiment and is a cross-sectional view showing TFT element 115.

FIG. 39 is a cross-sectional view of liquid crystal display device 100 according to the fourth embodiment and is a cross-sectional view showing TFT element 115.

As shown in this FIG. 39, liquid crystal display device 100 includes TFT array substrate 130, common substrate 150 arranged above TFT array substrate 130, and liquid crystal layer 160 filled between TFT array substrate 130 and common substrate 150.

TFT array substrate 130 includes glass substrate 140, underlying layer 131 formed on the main surface of glass substrate 140, and TFT element 115 formed on this underlying layer 131.

TFT element 115 includes semiconductor layer 132 formed on underlying layer 131, gate insulating layer 133 formed to cover semiconductor layer 132, gate electrode 134 formed on this gate insulating layer 133, and drain electrode 137 and source electrode 138 connected to semiconductor layer 132.

Interlayer dielectric 135 is formed on gate insulating layer 133 to cover gate electrode 134, and drain electrode 137 and source electrode 138 are formed to reach the upper surface of this interlayer dielectric 135. A drain pad 210 is formed at the upper end of drain electrode 137, and pixel electrode 114 is connected to drain pad 210.

A wiring 211 is formed at the upper end of source electrode 138, and a transparent conductive layer 212 is formed on an upper surface of this wiring 211. Wiring 211 and transparent conductive layer 212 constitute source line 111 to which TFT element 115 is connected.

Spacer 161 is arranged between common substrate 150 and TFT array substrate 130.

Figure 40:
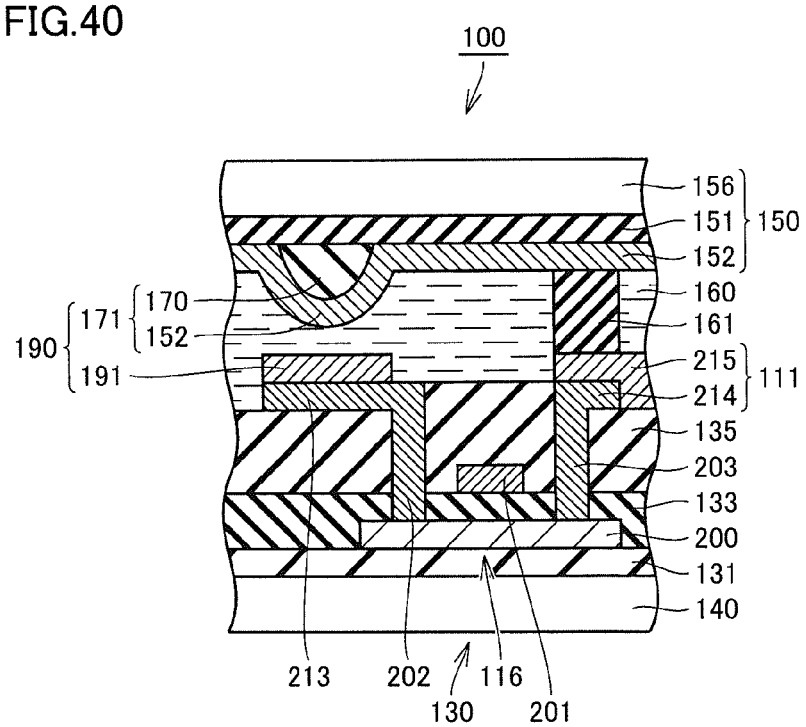
FIG. 40 is a cross-sectional view of liquid crystal display device 100 according to the fourth embodiment and is a cross-sectional view showing a TFT element for selection 116 and a pressure sensor 190.

FIG. 40 is a cross-sectional view of liquid crystal display device 100 according to the fourth embodiment and is a cross-sectional view showing TFT element for selection 116 and pressure sensor 190.

As shown in this FIG. 40, TFT element for selection 116 is formed in TFT array substrate 130, and pressure sensor 190 is formed between common substrate 150 and TFT array substrate 130.

TFT element for selection 116 includes a semiconductor layer 200 formed on underlying layer 131, gate insulating layer 133 formed to cover this semiconductor layer 200, a gate electrode 201 formed on the upper surface of gate insulating layer 133, and a drain electrode 202 and a source electrode 203 connected to semiconductor layer 200.

Interlayer dielectric 135 is formed on gate insulating layer 133 to cover gate electrode 201. An upper end of drain electrode 202 is formed to reach the upper surface of interlayer dielectric 135, and an electrode unit 213 is connected to the upper end of drain electrode 202. Electrode unit 213 is located on the upper surface of interlayer dielectric 135 and is formed into a flat surface.

An upper end of source electrode 203 is formed to reach the upper surface of interlayer dielectric 135, and a wiring 214 is connected to this upper end of source electrode 203. Wiring 214 is located on the upper surface of interlayer dielectric 135 and is formed into a flat surface. A transparent conductive layer 215 is formed on an upper surface of wiring 214, and transparent conductive layer 215 is formed of an ITO layer and the like. Wiring 214 and transparent conductive layer 215 constitute source line 111 to which TFT element for selection 116 is connected.

Pressure sensor 190 includes upper electrode 171 formed in common substrate 150, and a lower electrode 191 formed in TFT array substrate 130.

Upper electrode 171 is formed by projection 170 formed on the lower surface of color filter substrate 151, and common electrode 152 located on this projection 170. Projection 170 is made of a plastic resin such as an acrylic resin and is elastically deformable.

Lower electrode 191 is formed on an upper surface of electrode unit 213. Lower electrode 191 is formed of, for example, a transparent conductive layer such as an ITO film, and a resistance layer made of Si and the like. Lower electrode 191 has a film thickness of, for example, 50 nm or more and 400 nm or less, and preferably 50 nm or more and 200 nm or less.

In the example shown in this FIG. 40, in a state where the external force is not applied to common substrate 150, a small gap is formed between upper electrode 171 and lower electrode 191.

In the state where the external force is not applied to common substrate 150, upper electrode 171 is not in contact with lower electrode 191 and a current does not flow between upper electrode 171 and lower electrode 191. Therefore, electric power consumption is reduced.

Figure 41:
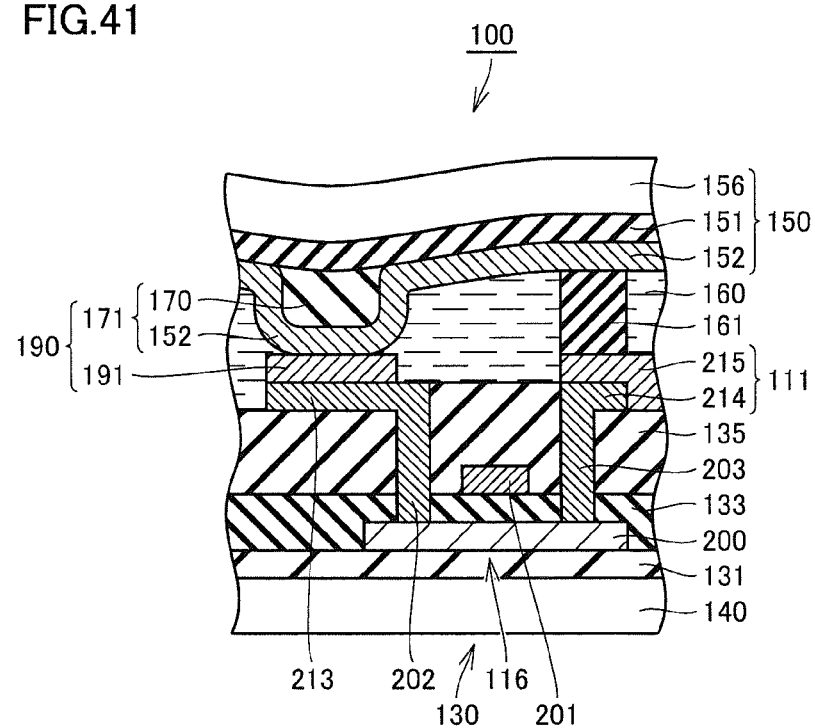
FIG. 41 is a cross-sectional view schematically showing a state where common substrate 150 is pressed.

FIG. 41 is a cross-sectional view schematically showing a state where common substrate 150 is pressed. As shown in this FIG. 41, when common substrate 150 is pressed, common substrate 150 deforms and upper electrode 171 comes into contact with lower electrode 191.

As a result of contact between upper electrode 171 and lower electrode 191, a current flows between upper electrode 171 and lower electrode 191. By sensing source line 111 to which TFT element for selection 116 is connected and common electrode 152, control unit 105 can sense an amount of current flowing between lower electrode 191 and upper electrode 171.

When the pressure at which common substrate 150 is pressed increases, projection 170 deforms. As a result of deformation of projection 170, a portion of common electrode 152 located on projection 170 also deforms to conform to the shape of lower electrode 191.

As a result, a contact area between lower electrode 191 and common electrode 152 increases sharply, and the amount of current flowing between lower electrode 191 and upper electrode 171 also increases. Therefore, control unit 105 can easily sense changes in the amount of current and easily calculate the pressing force applied to common substrate 150.

Therefore, in pressure sensor 190 and liquid crystal display device 100 according to the fourth embodiment as well, the pressing force applied to common substrate 150 can be accurately sensed. Upper electrode 171 may be in slight contact with lower electrode 191 in the initial state. In this case, by only applying small pressing force to common substrate 150, the amount of current flowing between upper electrode 171 and lower electrode 191 can be changed.

A method for manufacturing liquid crystal display device 100 according to the fourth embodiment will be described with reference to FIGS. 42 to 49.

In liquid crystal display device 100 according to the fourth embodiment as well, liquid crystal display device 100 is formed by separately forming common substrate 150 and TFT array substrate 130, and thereafter, assembling common substrate 150 and TFT array substrate 130 together so as to sandwich the liquid crystal layer.

Figure 42:
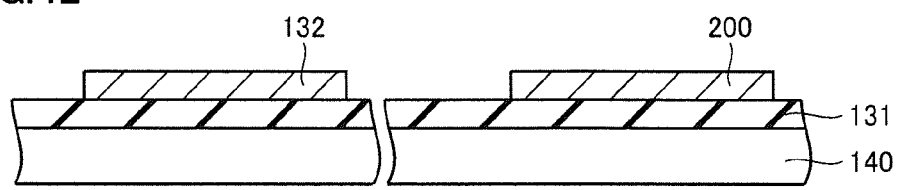
FIG. 42 is a cross-sectional view showing a first step of a process of manufacturing TFT array substrate 130.

FIG. 42 is a cross-sectional view showing a first step of a process of manufacturing TFT array substrate 130. As shown in this FIG. 42, glass substrate 140 having the main surface is prepared. Underlying layer 131 is formed on the main surface of glass substrate 140. Underlying layer 131 is formed of an insulating layer made of $SiO_2$, SiN, SiNO and the like. Underlying layer 131 is formed to have a film thickness of, for example, 500 nm or less, and preferably 400 nm or less.

Thereafter, the amorphous semiconductor layer is deposited on the upper surface of underlying layer 131. The amorphous semiconductor layer has a film thickness of, for example, 20 nm or more and 200 nm or less. The amorphous semiconductor layer preferably has a film thickness of approximately 30 nm or more and 70 nm Thereafter, this amorphous semiconductor layer is crystallized to form the continuous grain silicon layer (CG silicon layer). The continuous grain silicon layer is patterned to form semiconductor layer 132 and semiconductor layer 200.

As described above, semiconductor layer 132 of TFT element 115 and semiconductor layer 200 of TFT element for selection 116 can be formed in the same patterning step.

Figure 43:
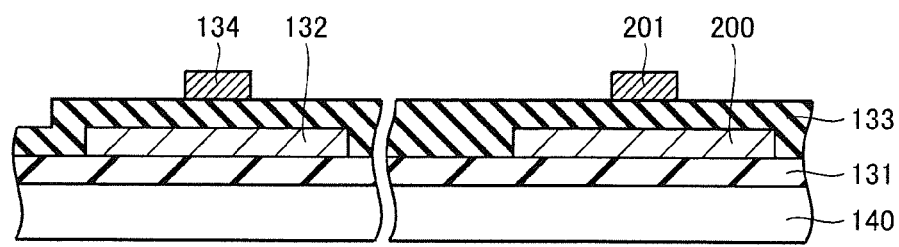
FIG. 43 is a cross-sectional view showing a second step of the process of manufacturing TFT array substrate 130.

FIG. 43 is a cross-sectional view showing a second step of the process of manufacturing TFT array substrate 130. As shown in this FIG. 43, gate insulating layer 133 is formed on underlying layer 131 to cover semiconductor layer 132 and semiconductor layer 200. Gate insulating layer 133 is formed of an insulating layer made of $SiO_2$, SiN, SiNO and the like. Gate insulating layer 133 has a film thickness of, for example, 20 nm or more and 200 nm or less, and preferably 50 nm or more and 120 nm or less.

The metal layer is formed on the upper surface of gate insulating layer 133 by sputtering and the like. This metal layer is formed of, for example, a metal film made of tungsten (W), tantalum (Ta), titanium (Ti), molybdenum (Mo) and the like, or an alloy film containing tungsten (W), tantalum (Ta), titanium (Ti), molybdenum (Mo) and the like, or a compound containing an element such as tungsten (W), tantalum (Ta), titanium (Ti), and molybdenum (Mo). This metal layer has a film thickness of, for example, 50 nm or more and 600 nm or less, and preferably 100 nm or more and 500 nm or less.

Then, this metal layer is patterned to form gate electrode 134 and gate electrode 201. As described above, gate electrode 134 of TFT element 115 and gate electrode 201 of TFT element for selection 116 can be formed in the same patterning step.

Figure 44:
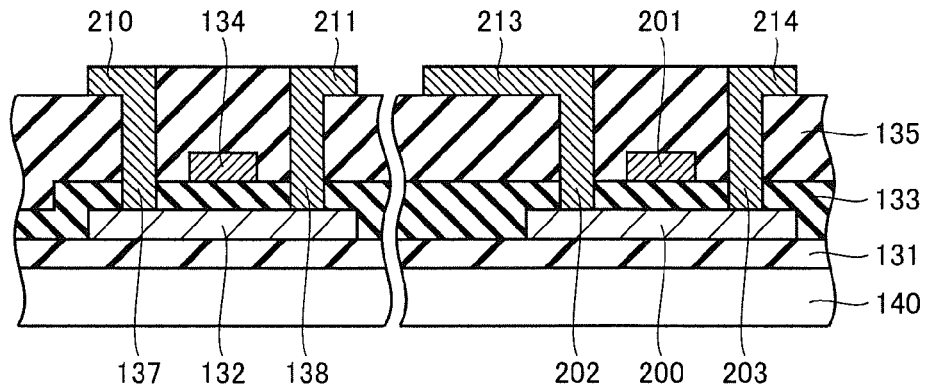
FIG. 44 is a cross-sectional view showing a third step of the process of manufacturing TFT array substrate 130.

FIG. 44 is a cross-sectional view showing a third step of the process of manufacturing TFT array substrate 130. As shown in this FIG. 44, interlayer dielectric 135 is formed to cover gate electrode 201 and gate electrode 134. Interlayer dielectric 135 is formed of, for example, an insulating layer made of $SiO_2$, SiN, SiNO and the like. Interlayer dielectric 135 is formed to have a film thickness of, for example, 100 nm or more and 1000 nm or less. Interlayer dielectric 135 preferably has a film thickness of 100 nm or more and 700 nm or less.

Interlayer dielectric 135 is patterned to form a plurality of contact holes. After the formation of the contact holes, a conductive layer is formed on interlayer dielectric 135 by sputtering. This metal layer is formed of a metal layer made of tungsten (W), tantalum (Ta), titanium (Ti), molybdenum (Mo) and the like, or an alloy containing an element such as tungsten (W), tantalum (Ta), titanium (Ti), and molybdenum (Mo), or a compound containing tungsten (W), tantalum (Ta), titanium (Ti), and molybdenum (Mo).

This metal layer is patterned to form drain electrode 137, drain pad 210, source electrode 138, wiring 211, drain electrode 202, electrode unit 213, source electrode 203, and wiring 214.

Thereafter, the transparent conductive layer made of ITO and the like is formed to cover drain pad 210, wiring 211, electrode unit 213, and wiring 214. This transparent conductive layer is patterned to form pixel electrode 114, transparent conductive layer 212, lower electrode 191, and transparent conductive layer 215 shown in FIGS. 39 and 40.

As a result, TFT array substrate 130 shown in FIGS. 39 and 40 can be formed. As described above, in the method for manufacturing liquid crystal display device 100 according to the fourth embodiment, TFT element for selection 116 and lower electrode 191 of pressure sensor 190 can be formed in the process of forming TFT element 115, and thus, an increase in the number of manufacturing steps is suppressed.

Figure 45:
FIG. 45 is a cross-sectional view showing a first step of a process of manufacturing common substrate 150.

FIG. 45 is a cross-sectional view showing a first step of a process of manufacturing common substrate 150. As shown in this FIG. 45, glass substrate 156 having the main surface is prepared. Then, color filter substrate 151 is formed on the main surface of this glass substrate 156.

Figure 46:
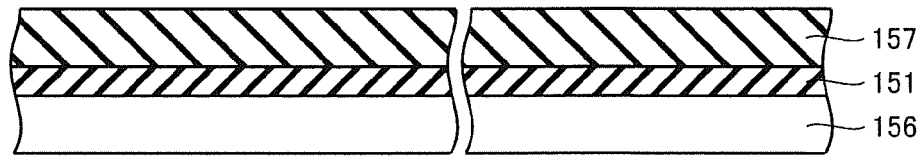
FIG. 46 is a cross-sectional view showing a second step of the process of manufacturing common substrate 150.

FIG. 46 is a cross-sectional view showing a second step of the process of manufacturing common substrate 150. As shown in this FIG. 46, plastic resin layer 157 is formed on the main surface of color filter substrate 151.

Plastic resin layer 157 has a film thickness of, for example, approximately 1 to 10 μm, and preferably approximately 2 to 5 μm.

Figure 47:
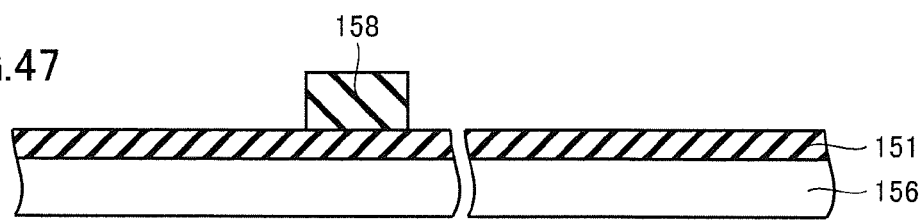
FIG. 47 is a cross-sectional view showing a third step of the process of manufacturing common substrate 150.
Figure 48:
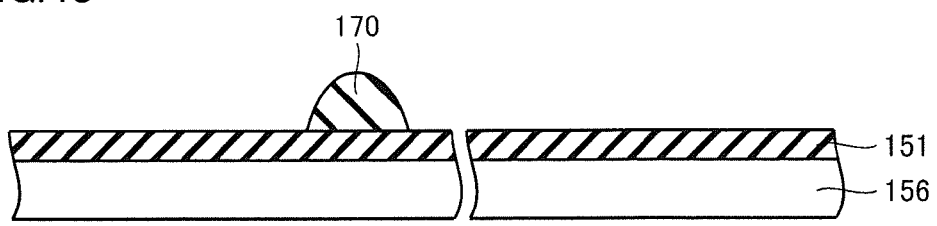
FIG. 48 is a cross-sectional view showing a fourth step of the process of manufacturing common substrate 150.

FIG. 47 is a cross-sectional view showing a third step of the process of manufacturing common substrate 150. As shown in this FIG. 47, plastic resin layer 157 is patterned to form resin pattern 158. FIG. 48 is a cross-sectional view showing a fourth step of the process of manufacturing common substrate 150. In this FIG. 48, resin pattern 158 is subjected to the annealing treatment to form projection 170 having a smooth surface.

Figure 49:
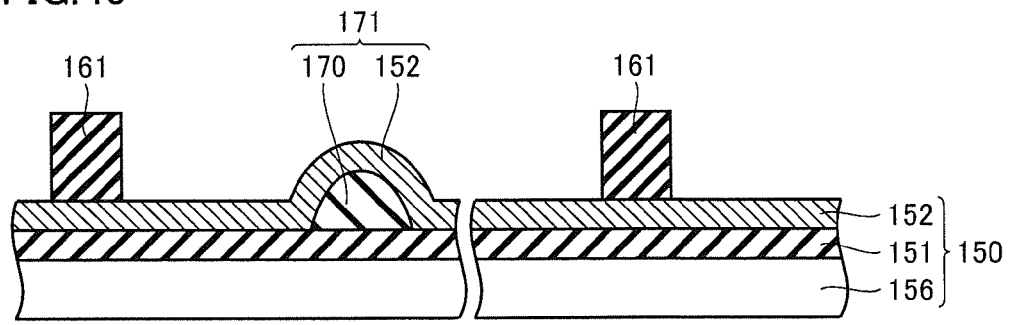
FIG. 49 is a cross-sectional view showing a fifth step of the process of manufacturing common substrate 150, and as shown in this FIG. 49, a common electrode 152 is formed on a surface of a color filter substrate 151 to cover projection 170.

FIG. 49 is a cross-sectional view showing a fifth step of the process of manufacturing common substrate 150. As shown in this FIG. 49, common electrode 152 is formed on the surface of color filter substrate 151 to cover projection 170. The upper electrode is thus formed.

After the formation of common electrode 152, the resin layer made of an acrylic resin and the like is formed. This resin layer is patterned to form a plurality of spacers 161. Common electrode 152 and TFT array substrate 130 thus formed are assembled together. Liquid crystal display device 100 is thus formed.

Fifth Embodiment

Pressure sensor 118, liquid crystal display device 100 and a method for manufacturing liquid crystal display device 100 according to a fifth embodiment of the present invention will be described with reference to FIGS. 50 to 57 and FIG. 38. The same reference characters are given to the components shown in FIGS. 50 to 57 that are the same as or corresponding to those shown in FIGS. 1 to 49 above, and description thereof will not be repeated. In addition, an electrical circuit of liquid crystal display device 100 according to the fifth embodiment corresponds to the electrical circuit shown in FIG. 38 above.

Figure 50:
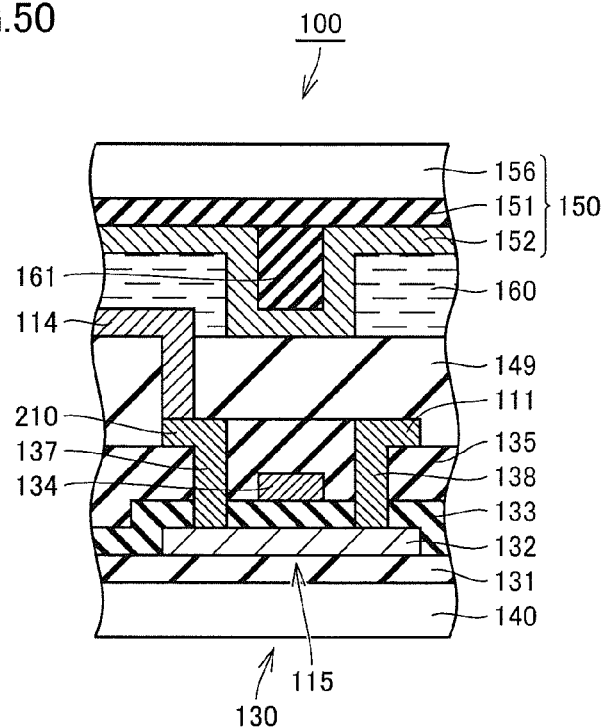
FIG. 50 is a cross-sectional view of liquid crystal display device 100 according to a fifth embodiment and is a cross-sectional view showing TFT element 115.

FIG. 50 is a cross-sectional view of liquid crystal display device 100 according to the fifth embodiment and is a cross-sectional view showing TFT element 115.

As shown in this FIG. 50, liquid crystal display device 100 includes glass substrate 140, underlying layer 131 formed on the main surface of this glass substrate 140, and TFT element 115 formed on the upper surface of underlying layer 131.

TFT element 115 includes semiconductor layer 132 formed on underlying layer 131, gate insulating layer 133 formed on underlying layer 131 to cover semiconductor layer 132, gate electrode 134 formed on this gate insulating layer 133, and drain electrode 137 and source electrode 138 connected to semiconductor layer 132.

Interlayer dielectric 135 is formed on gate insulating layer 133 to cover gate electrode 134. Drain pad 210 and source line 111 are formed on the upper surface of this interlayer dielectric 135. Drain electrode 137 is connected to drain pad 210, and source electrode 138 is connected to source line 111.

Furthermore, a resin layer 149 is formed on the upper surface of interlayer dielectric 135. Resin layer 149 is made of a plastic resin such as an acrylic resin. Resin layer 149 has a film thickness of, for example, 1 μm or more and 10 μm or less. Resin layer 149 preferably has a film thickness of 1.5 μm or more and 5 μm or less. Pixel electrode 114 is formed on an upper surface of resin layer 149 and pixel electrode 114 is connected to drain pad 210.

Figure 51:
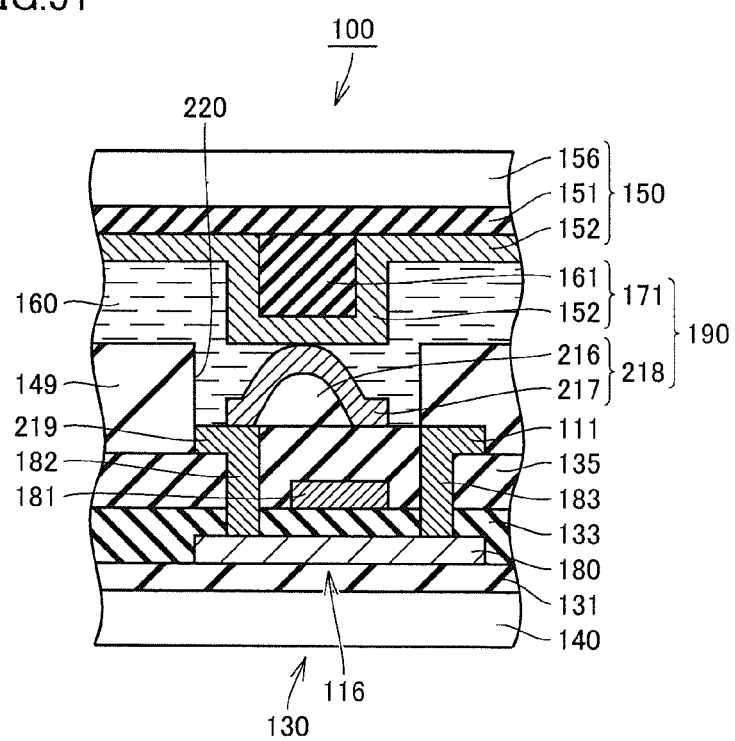
FIG. 51 is a cross-sectional view of liquid crystal display device 100 and is a cross-sectional view showing TFT element for selection 116.

FIG. 51 is a cross-sectional view of liquid crystal display device 100 and is a cross-sectional view showing TFT element for selection 116.

As shown in this FIG. 51, liquid crystal display device 100 includes TFT element for selection 116 formed on underlying layer 131.

TFT element for selection 116 includes semiconductor layer 180 formed on underlying layer 131, gate insulating layer 133 formed on underlying layer 131 to cover semiconductor layer 180, gate electrode 181 formed on this gate insulating layer 133, and drain electrode 182 and source electrode 183 connected to semiconductor layer 180.

A pad unit 219, source line 111 and a lower electrode 218 are formed on the upper surface of interlayer dielectric 135. The upper end of drain electrode 182 is connected to pad unit 219, and the upper end of source electrode 183 is connected to source line 111.

Therefore, by controlling a voltage applied to gate electrode 181, ON/OFF of TFT element for selection 116 can be switched.

Lower electrode 218 is connected to pad unit 219. Lower electrode 218 includes a projection 216 formed to protrude upward from the upper surface of interlayer dielectric 135 and a conductive layer 217 formed on a surface of this projection 216. Projection 216 is made of a material that is the same as that of resin layer 149 and projection 216 is made of, for example, an elastically deformable resin material such as an acrylic resin. Projection 216 has a curved outer surface. Conductive layer 217 is connected to pad unit 219.

Upper electrode 171 is formed on a portion of the lower surface of common substrate 150 located above lower electrode 218.

Upper electrode 171 is formed by spacer 161 formed on the lower surface of color filter substrate 151, and common electrode 152 formed on the lower surface of color filter substrate 151 to cover this spacer 161. Spacer 161 is made of, for example, an acrylic resin and is formed to protrude from the lower surface of color filter substrate 151 toward lower electrode 218.

When control unit 105 performs sensing, a predetermined voltage is applied to gate electrode 181 and TFT element for selection 116 is turned on.

When common substrate 150 is pressed, upper electrode 171 is displaced toward lower electrode 218 and upper electrode 171 presses lower electrode 218. Conductive layer 217 is pressed, and thereby conductive layer 217 deforms and lower electrode 218 deforms to conform to the surface shape of upper electrode 171. As a result, a contact area between common electrode 152 of upper electrode 171 and conductive layer 217 of lower electrode 218 increases sharply. Consequently, an amount of current flowing between common electrode 152 and conductive layer 217 increases.

By sensing the amount of current between common electrode 152 and source line 111 to which TFT element for selection 116 is connected, control unit 105 shown in FIG. 38 calculates the pressure applied to common substrate 150.

As described above, in liquid crystal display device 100 according to the fifth embodiment as well, the pressure applied to common substrate 150 can be accurately calculated because the amount of current flowing between upper electrode 171 and lower electrode 218 changes greatly when common substrate 150 is pressed.

A method for manufacturing liquid crystal display device 100 according to the fifth embodiment will be described with reference to FIGS. 52 to 57. In liquid crystal display device 100 according to the fifth embodiment as well, liquid crystal display device 100 is formed by independently forming TFT array substrate 130 and common substrate 150, and thereafter, assembling TFT array substrate 130 and common substrate 150 together.

Figure 52:
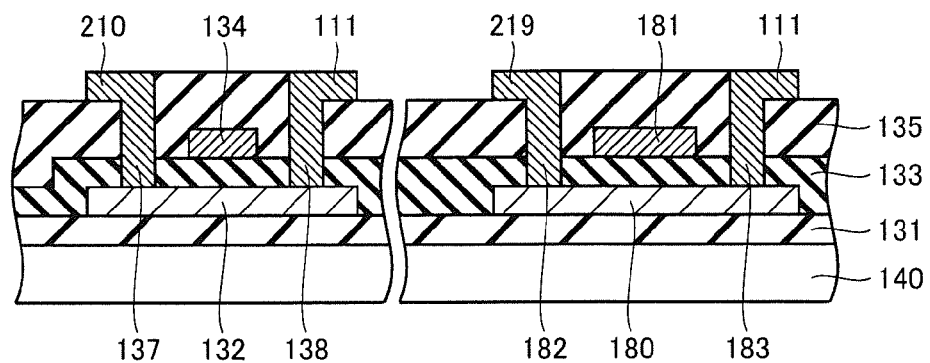
FIG. 52 is a cross-sectional view showing a step when TFT element 115 and TFT element for selection 116 are formed, in a process of manufacturing TFT array substrate 130.

FIG. 52 is a cross-sectional view showing a step when TFT element 115 and TFT element for selection 116 are formed, in a process of manufacturing TFT array substrate 130.

In this FIG. 52, the continuous grain silicon layer is formed from the amorphous semiconductor layer, and thereafter, this continuous grain silicon layer is patterned by the photolithography method and the like to form semiconductor layer 132 and semiconductor layer 180.

After the formation of semiconductor layer 132 and semiconductor layer 180, gate insulating layer 133 is formed on underlying layer 131. Gate electrode 134 and gate electrode 181 are formed by patterning the same metal layer formed on gate insulating layer 133.

After the formation of gate electrode 134 and gate electrode 181, interlayer dielectric 135 is formed. Drain pad 210, drain electrode 137, source electrode 138, pad unit 219, drain electrode 182, source electrode 183, and source line 111 are formed by patterning the same metal layer formed on interlayer dielectric 135.

Figure 53:
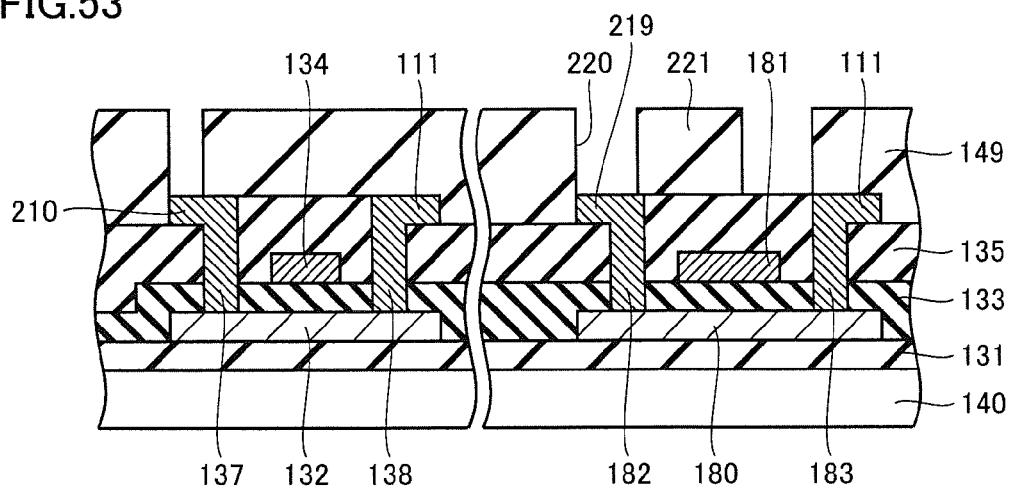
FIG. 53 is a cross-sectional view showing a manufacturing step for TFT array substrate 130 after the manufacturing step shown in FIG. 52.

FIG. 53 is a cross-sectional view showing a manufacturing step for TFT array substrate 130 after the manufacturing step shown in FIG. 52. As shown in this FIG. 53, an acrylic resin is formed on interlayer dielectric 135. Thereafter, this acrylic resin is patterned to form a projection 221 and resin layer 149. Projection 221 is located on interlayer dielectric 135 and projection 221 is located in a recess 220 formed in resin layer 149.

Figure 54:
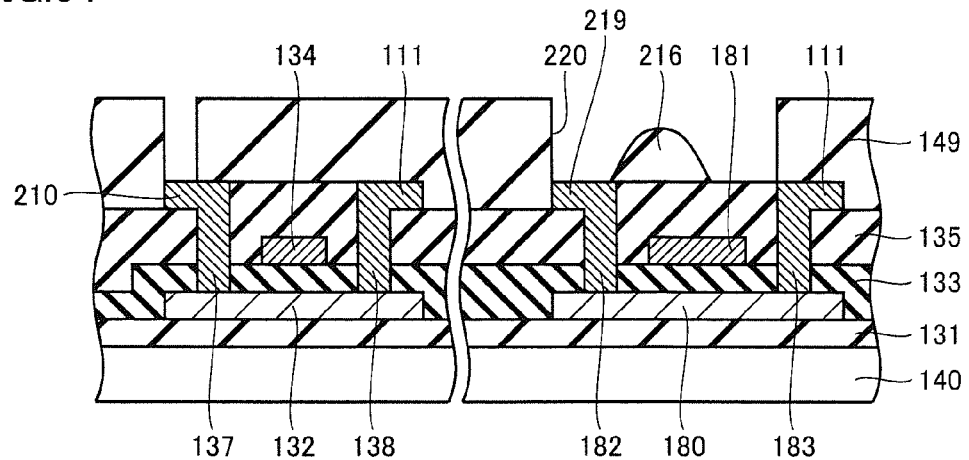
FIG. 54 is a cross-sectional view showing a manufacturing step after the manufacturing step shown in FIG. 53.

FIG. 54 is a cross-sectional view showing a manufacturing step after the manufacturing step shown in FIG. 53. As shown in this FIG. 54, glass substrate 140 having projection 221 is subjected to the annealing treatment in the oven. The annealing temperature is set to be, for example, 100° C. or higher and 300° C. or lower, and preferably 100° C. or higher and 200° C. or lower.

As a result, the resin on a surface of projection 221 flows and projection 216 having a curved surface is formed.

After the formation of projection 216 in such a manner, the transparent conductive layer made of ITO and the like is formed to cover resin layer 149 and projection 216. This transparent conductive layer is patterned to form pixel electrode 114 and conductive layer 217 shown in FIGS. 50 and 51. As a result, lower electrode 218 can be formed and TFT array substrate 130 can be formed.

Figure 55:
FIG. 55 is a cross-sectional view showing formation of color filter substrate 151 in a process of manufacturing common substrate 150.

FIG. 55 is a cross-sectional view showing formation of color filter substrate 151 in a process of manufacturing common substrate 150. As shown in this FIG. 55, color filter substrate 151 is formed on glass substrate 156.

Figure 56:
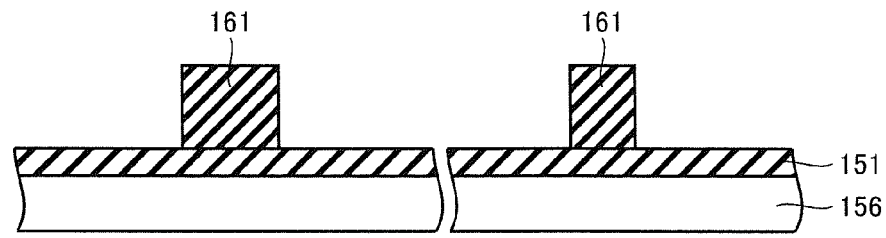
FIG. 56 is a cross-sectional view showing a step after the manufacturing step shown in FIG. 55 above.

FIG. 56 is a cross-sectional view showing a step after the manufacturing step shown in FIG. 55 above. As shown in this FIG. 56, the resin layer made of an acrylic resin and the like is formed on an upper surface of color filter substrate 151. Then, this resin layer is patterned to form a plurality of spacers 161.

Figure 57:
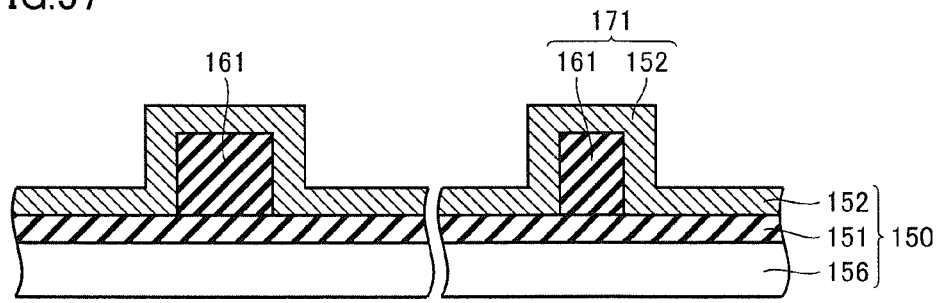
FIG. 57 is a cross-sectional view showing a step after the manufacturing step shown in FIG. 56 above.

FIG. 57 is a cross-sectional view showing a step after the manufacturing step shown in FIG. 56 above. As shown in this FIG. 57, the transparent conductive layer made of ITO and the like is formed. Common substrate 150 including upper electrode 171 and common electrode 152 is thus formed.

Then, common substrate 150 and TFT array substrate 130 are assembled together and liquid crystal display device 100 is thus formed.

Sixth Embodiment

A sixth embodiment of the present invention will be described with reference to FIGS. 58 to 74. The same reference characters are given to the components shown in FIGS. 58 to 74 that are the same as or corresponding to those shown in FIGS. 1 to 57 above, and description thereof will not be repeated.

Figure 58:
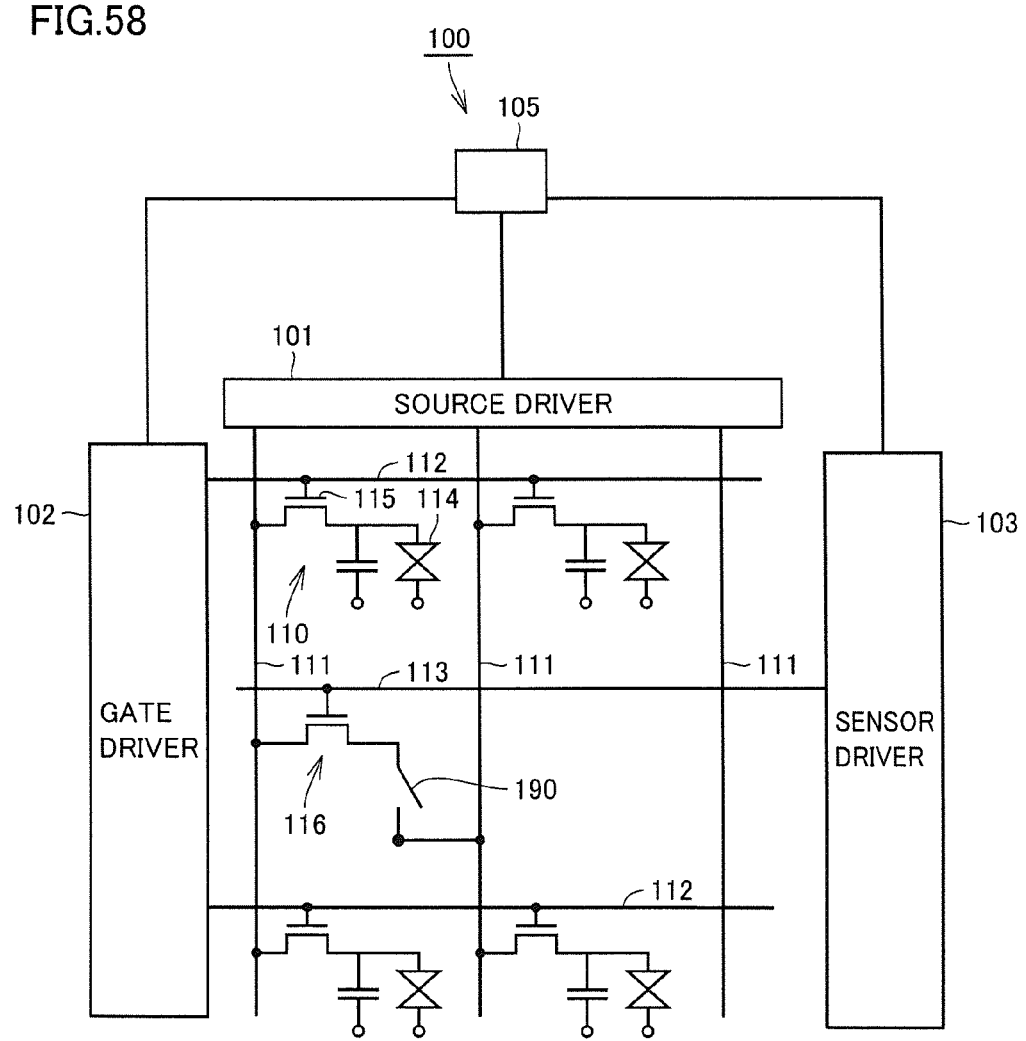
FIG. 58 is a circuit diagram showing an electrical circuit of liquid crystal display device 100 according to a sixth embodiment.

FIG. 58 is a circuit diagram showing an electrical circuit of liquid crystal display device 100 according to the sixth embodiment. As shown in this FIG. 58, pressure sensor 190 is connected to the drain electrode of TFT element for selection 116 and source line 111.

Figure 59:
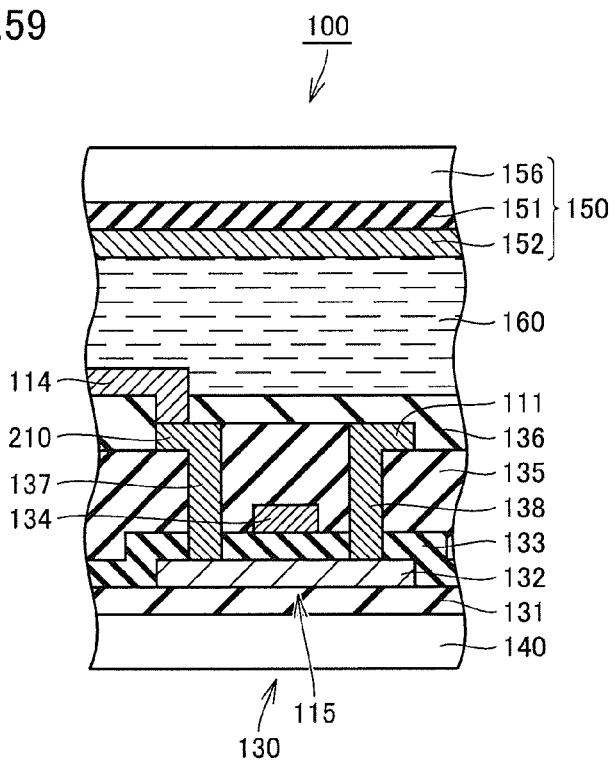
FIG. 59 is a cross-sectional view of liquid crystal display device 100 according to the sixth embodiment and is a cross-sectional view showing TFT element 115.

FIG. 59 is a cross-sectional view of liquid crystal display device 100 according to the sixth embodiment and is a cross-sectional view showing TFT element 115.

Figure 60:
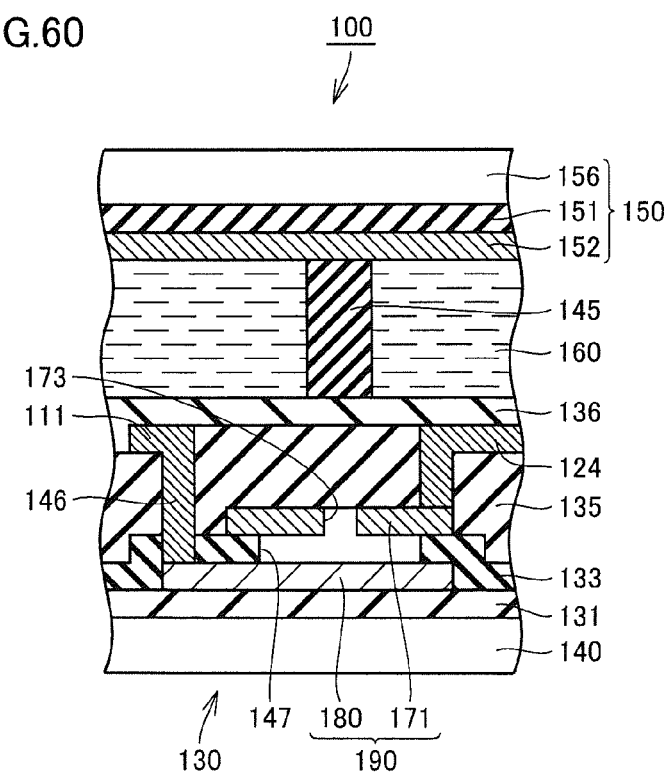
FIG. 60 is a cross-sectional view of liquid crystal display device 100 according to the sixth embodiment and is a cross-sectional view showing pressure sensor 190.

FIG. 60 is a cross-sectional view of liquid crystal display device 100 according to the sixth embodiment and is a cross-sectional view showing pressure sensor 190.

In these FIGS. 59 and 60, pressure sensing element 120 includes underlying layer 131 formed on the main surface of glass substrate 140, and TFT element 115 and pressure sensor 190 formed on underlying layer 131.

TFT element 115 includes semiconductor layer 132, gate electrode 134, drain electrode 137, and source electrode 138.

Pressure sensor 190 includes semiconductor layer 180 formed on underlying layer 131, and upper electrode 171 spaced apart from this semiconductor layer 180 and formed to face semiconductor layer 180. Semiconductor layer 180 functions as the lower electrode of pressure sensor 190.

Semiconductor layer 132 and semiconductor layer 180 are formed on the upper surface of underlying layer 131.

Gate insulating layer 133 is formed on underlying layer 131 to cover semiconductor layer 132 and semiconductor layer 180.

Gate electrode 134 is formed on a portion of the upper surface of gate insulating layer 133 located above semiconductor layer 132, and upper electrode 171 is formed on a portion of the upper surface of gate insulating layer 133 located above semiconductor layer 180.

Interlayer dielectric 135 is formed on the upper surface of gate insulating layer 133 to cover gate electrode 134 and upper electrode 171.

Drain electrode 137, source electrode 138, contact 146, and connection wiring 124 are formed to reach the upper surface of interlayer dielectric 135. Connection wiring 124 is connected to TFT element for selection 116 shown in FIG. 58 and the other end thereof is connected to upper electrode 171. The upper end of contact 146 is connected to source line 111 and a lower end of contact 146 is connected to semiconductor layer 180.

Drain electrode 137 and source electrode 138 are connected to semiconductor layer 132, and drain pad 210 is connected to the upper end of drain electrode 137. Source line 111 is connected to the upper end of source electrode 138. Drain pad 210 and source line 111 are formed on interlayer dielectric 135.

Upper insulating layer 136 is formed to cover drain pad 210, source line 111 and connection wiring 124.

Pixel electrode 114 is formed on upper insulating layer 136 and is connected to drain pad 210.

Pressing member 145 is formed on a portion of the lower surface of common substrate 150 located above upper electrode 171. Pressing member 145 is formed to protrude from the lower surface of common substrate 150 toward TFT array substrate 130.

Recess 147 is formed directly under upper electrode 171. This recess 147 is formed by a hole formed in gate insulating layer 133 and an upper surface of semiconductor layer 180.

In the example shown in this FIG. 60, in the state where common substrate 150 is not pressed, a lower end of pressing member 145 abuts the upper surface of upper insulating layer 136.

Figure 61:
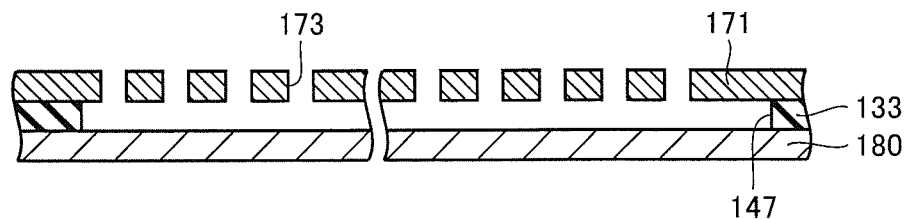
FIG. 61 is a cross-sectional view showing upper electrode 171 and a semiconductor layer 180 in a state (initial state) where common substrate 150 is not pressed.

FIG. 61 is a cross-sectional view showing upper electrode 171 and semiconductor layer 180 in the state (initial state) where common substrate 150 is not pressed.

Figure 62:
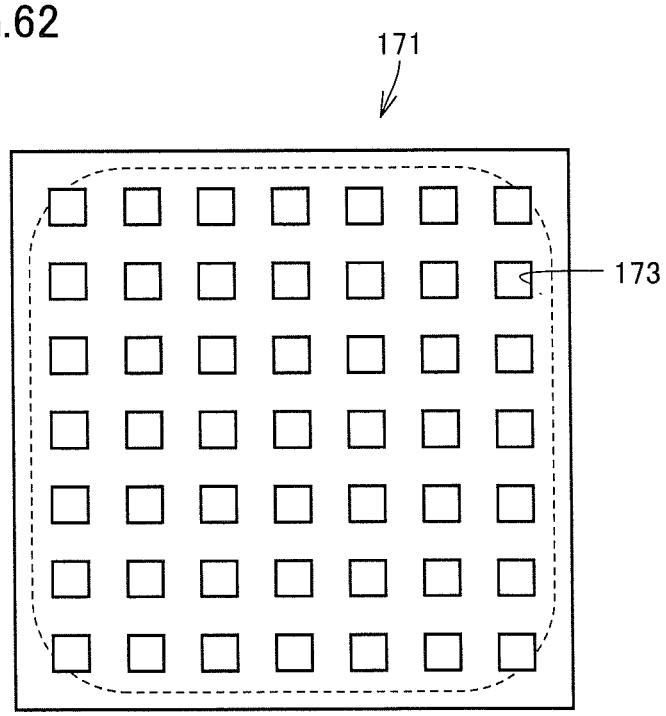
FIG. 62 is a plan view of upper electrode 171, and a plurality of holes 173 are formed in upper electrode 171.

As shown in this FIG. 61, in the initial state, upper electrode 171 is spaced apart from semiconductor layer 180 and upper electrode 171 is not in contact with semiconductor layer 180. FIG. 62 is a plan view of upper electrode 171. A plurality of holes 173 are formed in upper electrode 171.

Figure 63:
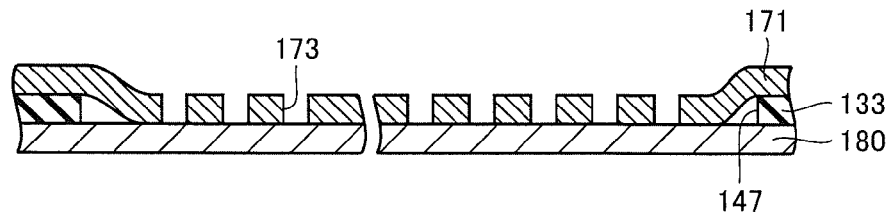
FIG. 63 is a cross-sectional view showing upper electrode 171 and semiconductor layer 180 in the state where common substrate 150 has been pressed.

FIG. 63 is a cross-sectional view showing upper electrode 171 and semiconductor layer 180 in the state where common substrate 150 has been pressed. As shown in this FIG. 63, when common substrate 150 is pressed, upper electrode 171 comes into contact with semiconductor layer 180. When the pressing force by which common substrate 150 is pressed is small, a contact area between upper electrode 171 and semiconductor layer 180 is small and an amount of current flowing between semiconductor layer 180 and upper electrode 171 is small.

Then, the pressing force by which common substrate 150 is pressed increases, upper electrode 171 deflects greatly, upper electrode 171 deforms to conform to semiconductor layer 180, and the contact area between upper electrode 171 and semiconductor layer 180 increases.

A region enclosed by a broken line in FIG. 62 represents an area of contact between upper electrode 171 and semiconductor layer 180.

As shown in these FIGS. 62 and 63, when the contact area between upper electrode 171 and semiconductor layer 180 increases, the amount of current flowing between upper electrode 171 and semiconductor layer 180 increases. In other words, when the pressing force by which common substrate 150 is pressed increases, the amount of current flowing between upper electrode 171 and semiconductor layer 180 also increases sharply.

Therefore, control unit 105 shown in FIG. 58 can easily sense changes in the amount of current between source line 111 to which TFT element for selection 116 is connected and source line 111 to which pressure sensor 190 is connected, and can accurately calculate the pressure applied to common substrate 150.

A method for manufacturing liquid crystal display device 100 according to the sixth embodiment will be described with reference to FIGS. 64 to 74.

In liquid crystal display device 100 according to the sixth embodiment as well, liquid crystal display device 100 is formed by independently forming TFT array substrate 130 and common substrate 150, and arranging formed TFT array substrate 130 and common substrate 150 to face each other.

Figure 64:
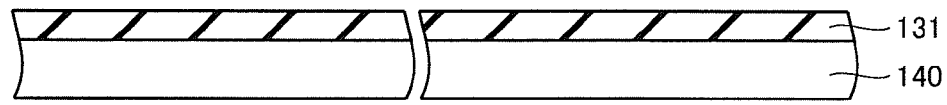
FIG. 64 is a cross-sectional view showing a first step of a process of manufacturing TFT array substrate 130.

FIG. 64 is a cross-sectional view showing a first step of a process of manufacturing TFT array substrate 130. In this FIG. 64, glass substrate 140 having the main surface is prepared. Then, the SiNO layer having a thickness of, for example, approximately 50 nm is formed by the plasma enhanced CVD (PECVD) method. Then, the $SiO_2$ layer having a thickness of, for example, approximately 110 nm is formed on the SiNO layer. Underlying layer 131 is thus formed on the main surface of glass substrate 140.

Figure 65:
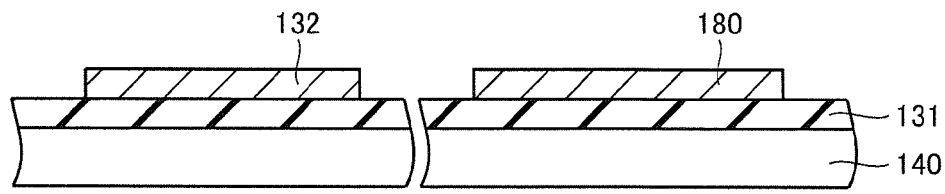
FIG. 65 is a cross-sectional view showing a second step of the process of manufacturing TFT array substrate 130.

FIG. 65 is a cross-sectional view showing a second step of the process of manufacturing TFT array substrate 130. As shown in this FIG. 65, and Si (silicon) layer having a thickness of, for example, approximately 50 nm is formed on the upper surface of underlying layer 131 by the plasma enhanced CVD method.

Thereafter, the continuous grain silicon layer is formed by irradiation with XeCl excimer laser, and then, this continuous grain silicon layer is patterned by the photolithography method and the like to form semiconductor layer 132 and semiconductor layer 180.

Figure 66:
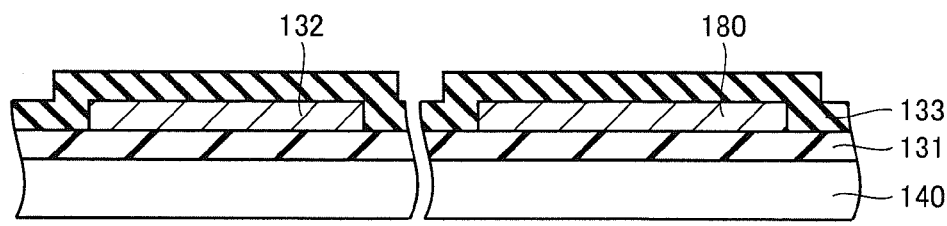
FIG. 66 is a cross-sectional view showing a third step of the process of manufacturing TFT array substrate 130.

FIG. 66 is a cross-sectional view showing a third step of the process of manufacturing TFT array substrate 130. In this FIG. 66, the $SiO_2$ layer having a thickness of, for example, approximately 80 nm is formed by the plasma enhanced CVD method to cover semiconductor layer 132 and semiconductor layer 180.

Figure 67:
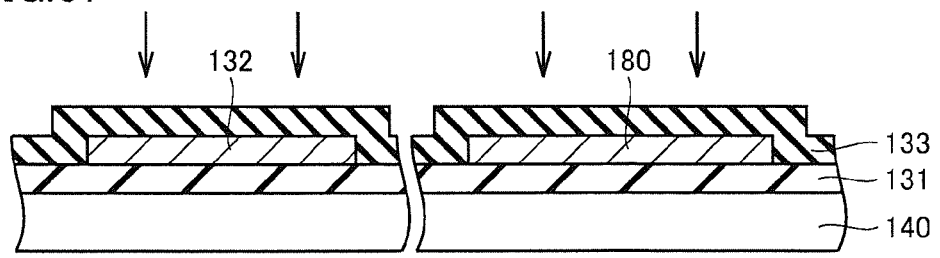
FIG. 67 is a cross-sectional view showing a fourth step of the process of manufacturing TFT array substrate 130.

FIG. 67 is a cross-sectional view showing a fourth step of the process of manufacturing TFT array substrate 130. In this FIG. 67, $P^+$ (phosphorus ion) is doped into semiconductor layer 132 and semiconductor layer 180 under the conditions of 45 KeV and 5E15 $cm^{-2}$.

Figure 68:
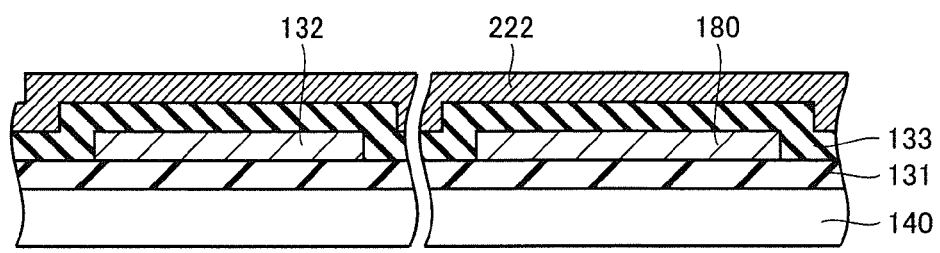
FIG. 68 is a cross-sectional view showing a fifth step of the process of manufacturing TFT array substrate 130.

FIG. 68 is a cross-sectional view showing a fifth step of the process of manufacturing TFT array substrate 130. In this FIG. 68, stacked metal layers 222 are formed on the upper surface of gate insulating layer 133 by sputtering and the like. Specifically, the tungsten (W) layer having a thickness of, for example, approximately 370 nm is formed by sputtering. After the formation of the tungsten layer, the tantalum nitride (TaN) layer having a thickness of, for example, approximately 50 nm is formed.

Figure 69:
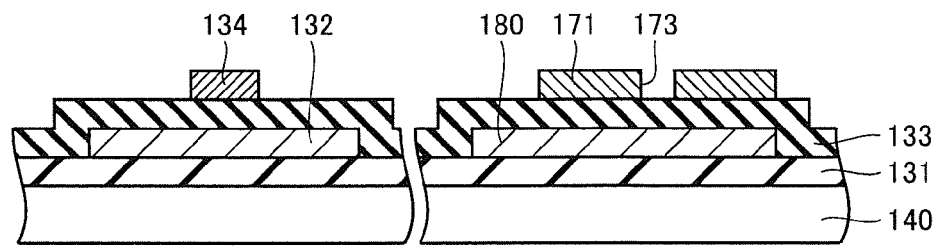
FIG. 69 is a cross-sectional view showing a sixth step of the process of manufacturing TFT array substrate 130.

FIG. 69 is a cross-sectional view showing a sixth step of the process of manufacturing TFT array substrate 130. As shown in this FIG. 69, stacked metal layers 222 shown in FIG. 68 is patterned to form gate electrode 134 and upper electrode 171. At least one or more holes 173 are formed in upper electrode 171.

Specifically, as shown in FIG. 62 above, a plurality of holes 173 are formed. Upper electrode 171 is formed to have a square shape and one side thereof has a length of 30 μm. Hole 173 is also formed to have a square shape and one side thereof has a length of 2 μm. A spacing between holes 173 is set to be 2 μm.

Figure 70:
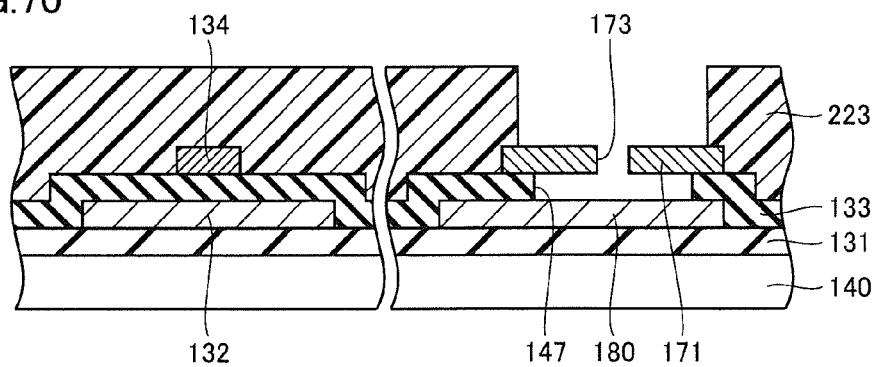
FIG. 70 is a cross-sectional view showing a seventh step of the process of manufacturing TFT array substrate 130.

FIG. 70 is a cross-sectional view showing a seventh step of the process of manufacturing TFT array substrate 130. In this FIG. 70, the resist is first formed and this resist is patterned. Resist pattern 223 is thus formed. This resist pattern 223 has a hole to expose hole 173 to the outside.

Then, the substrate having resist pattern 223 is immersed in buffered hydrogen fluoride (BHF). A mixture obtained by mixing hydrofluoric acid (HF) and ammonium fluoride ($NH_4F$) at a ratio of 1:10 is used as the buffered hydrogen fluoride (BHF). The substrate is immersed for approximately 13 minutes, for example.

As a result, the buffered hydrogen fluoride that has flown in through hole 173 etches a part of gate insulating layer 133. Consequently, recess 147 is formed under upper electrode 171.

Figure 71:
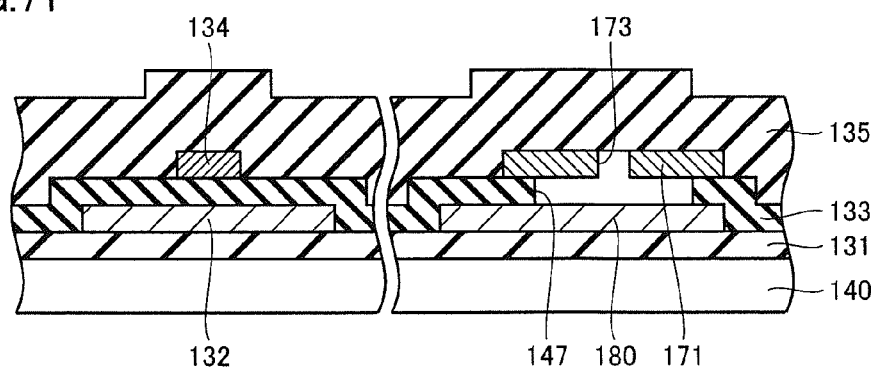
FIG. 71 is a cross-sectional view showing an eighth step of the process of manufacturing TFT array substrate 130.

FIG. 71 is a cross-sectional view showing an eighth step of the process of manufacturing TFT array substrate 130. In this FIG. 71, resist pattern 223 is removed, and thereafter, interlayer dielectric 135 is formed on gate insulating layer 133.

Specifically, the silicon oxide layer (Sift layer) having a thickness of approximately 700 nm is formed by the plasma enhanced CVD method, and the silicon nitride layer (SiN layer) having a thickness of, for example, approximately 250 nm is formed on this silicon oxide layer. Interlayer dielectric 135 is thus formed.

Figure 72:
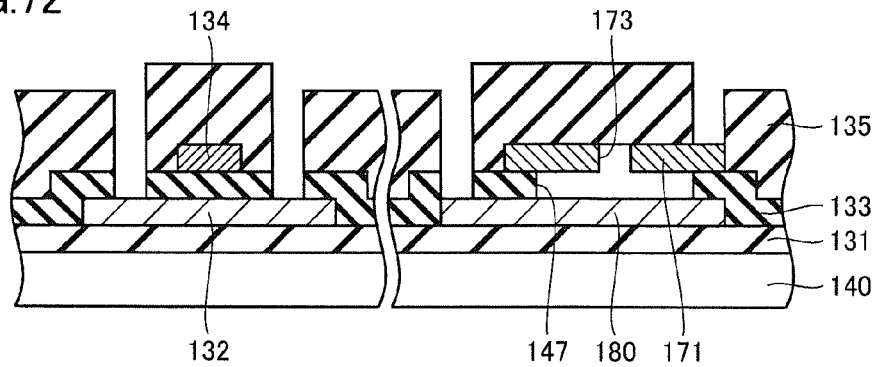
FIG. 72 is a cross-sectional view showing a ninth step of the process of manufacturing TFT array substrate 130.

FIG. 72 is a cross-sectional view showing a ninth step of the process of manufacturing TFT array substrate 130. As shown in this FIG. 72, interlayer dielectric 135 is patterned to form a plurality of contact holes.

Figure 73:
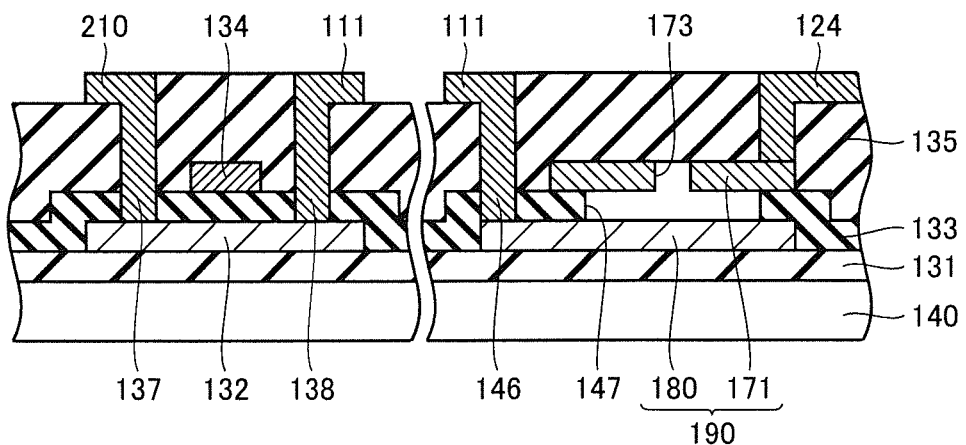
FIG. 73 is a cross-sectional view showing a tenth step of the process of manufacturing TFT array substrate 130.

FIG. 73 is a cross-sectional view showing a tenth step of the process of manufacturing TFT array substrate 130. In this FIG. 73, a titanium (Ti) layer having a thickness of, for example, approximately 100 nm is first formed. An Al—Si layer having a thickness of, for example, approximately 600 nm is formed on this titanium layer. A titanium (Ti) layer having a thickness of, for example, approximately 200 nm is formed on this Al—Si layer.

After the formation of the stacked metal layers in such a manner, these stacked metal layers are patterned to form drain pad 210, drain electrode 137, source line 111, source electrode 138, contact 146, and connection wiring 124.

Figure 74:
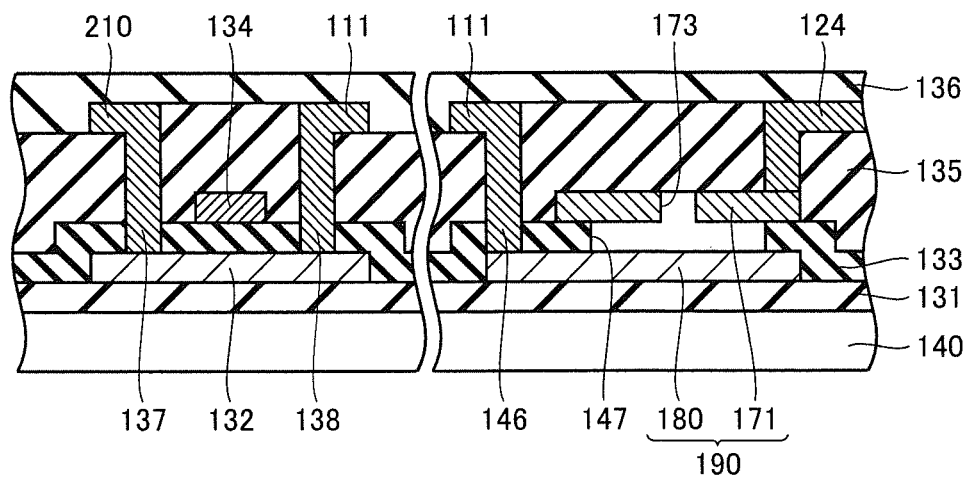
FIG. 74 is a cross-sectional view showing an eleventh step of the process of manufacturing TFT array substrate 130.

FIG. 74 is a cross-sectional view showing an eleventh step of the process of manufacturing TFT array substrate 130. As shown in this FIG. 74, upper insulating layer 136 is formed to cover drain pad 210, drain electrode 137, source line 111, source electrode 138, contact 146, connection wiring 124 and the like. Specifically, the silicon nitride layer (SiN layer) having a thickness of, for example, approximately 200 nm is formed by the plasma enhanced CVD method.

Thereafter, upper insulating layer 136 is patterned to form the ITO layer on the upper surface of patterned upper insulating layer 136. This ITO layer is patterned to form pixel electrode 114 shown in FIG. 59. TFT array substrate 130 is thus formed.

In order to form common substrate 150, glass substrate 156 is first prepared. Color filter substrate 151 is formed on the main surface of this glass substrate 156. The ITO layer is formed on the upper surface of this color filter substrate 151 to form common electrode 152.

Thereafter, the acrylic resin layer is formed on the upper surface of this common electrode 152 and this acrylic resin layer is patterned to form pressing member 145. Common substrate 150 shown in FIG. 59 is thus formed.

After the formation of TFT array substrate 130 and common substrate 150 in such a manner, the liquid crystal layer is applied onto the main surface of TFT array substrate 130.

Thereafter, common substrate 150 is arranged above TFT array substrate 130, and TFT array substrate 130 and common substrate 150 are assembled together. Liquid crystal display device 100 shown in FIGS. 59 and 60 is thus formed.

In liquid crystal display device 100 thus configured, the pressing force is applied from the TFT array substrate 130 side, for example.

Consequently, at 0.2 N, control unit 105 can sense a current flowing between source line 111 to which TFT element for selection 116 is connected and source line 111 to which pressure sensor 190 is connected. Furthermore, when the pressing force of approximately 1 N is applied to TFT array substrate 130, a resistance value is reduced to one-eighth.

Seventh Embodiment

A pressure sensor, liquid crystal display device 100 and a method for manufacturing liquid crystal display device 100 according to a seventh embodiment of the present invention will be described with reference to FIGS. 75 to 81 and FIG. 58. The same reference characters are given to the components shown in FIGS. 75 to 81 that are the same as or corresponding to those shown in FIGS. 1 to 74 above, and description thereof will not be repeated.

An electrical circuit of liquid crystal display device 100 according to the seventh embodiment corresponds to the electrical circuit shown in FIG. 58.

Figure 75:
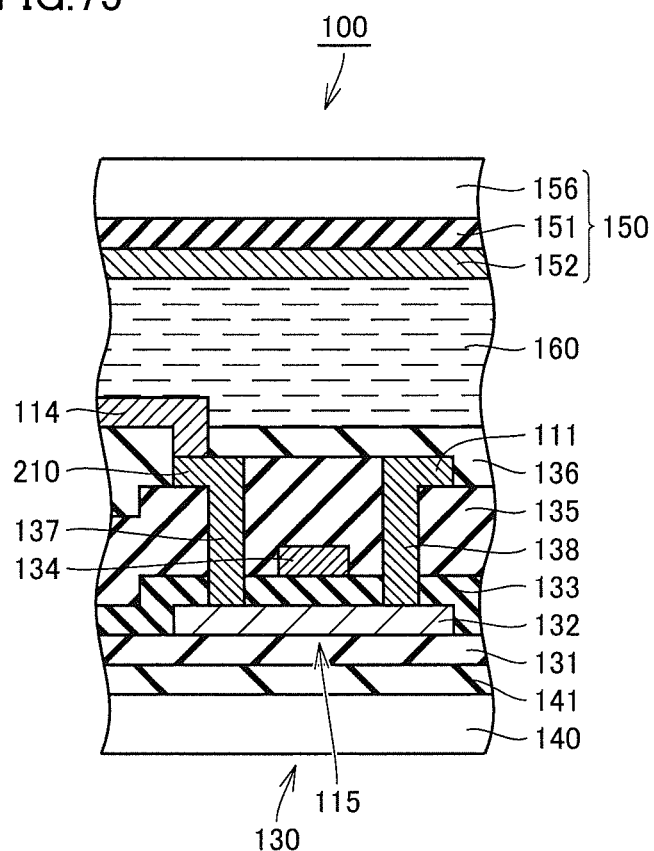
FIG. 75 is a cross-sectional view of liquid crystal display device 100 according to a seventh embodiment and is a cross-sectional view showing TFT element 115.
Figure 76:
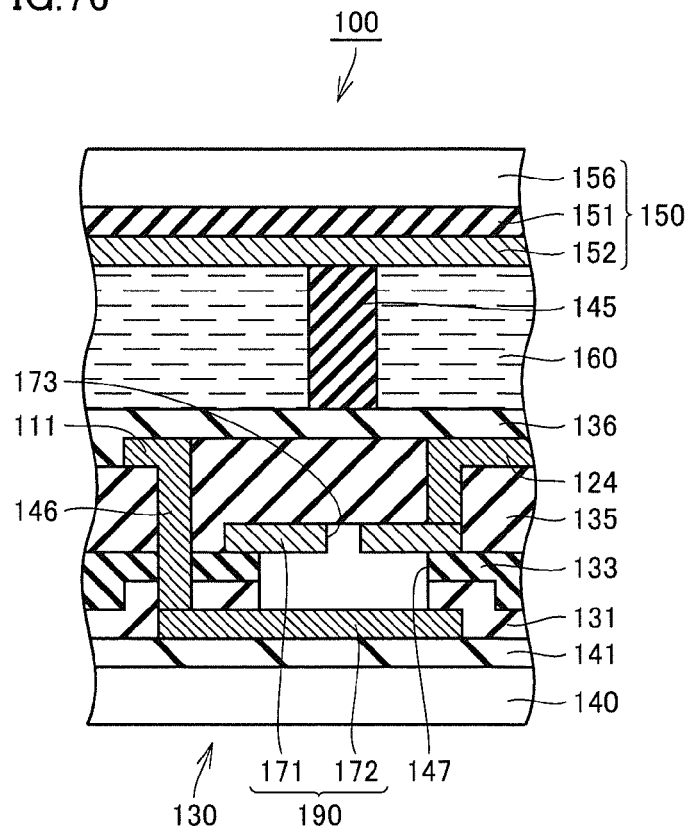
FIG. 76 is a cross-sectional view of liquid crystal display device 100 according to the seventh embodiment and is a cross-sectional view showing pressure sensor 190.

FIG. 75 is a cross-sectional view of liquid crystal display device 100 according to the seventh embodiment and is a cross-sectional view showing TFT element 115. FIG. 76 is a cross-sectional view of liquid crystal display device 100 according to the seventh embodiment and is a cross-sectional view showing pressure sensor 190.

As shown in these FIGS. 75 and 76, TFT array substrate 130 includes glass substrate 140, underlying layer 141 formed on the main surface of glass substrate 140, and TFT element 115 and pressure sensor 190 formed on this underlying layer 141.

TFT element 115 is formed on the upper surface of underlying layer 131 formed on underlying layer 141. TFT element 115 includes semiconductor layer 132 formed on underlying layer 131, gate electrode 134 formed on the upper surface of underlying layer 131 to cover semiconductor layer 132, and drain electrode 137 and source electrode 138 connected to semiconductor layer 132.

Interlayer dielectric 135 is formed on gate insulating layer 133 to cover gate electrode 134. Drain pad 210 and source line 111 are formed on the upper surface of interlayer dielectric 135. Drain electrode 137 is connected to drain pad 210, and source electrode 138 is connected to source line 111.

In FIG. 76, pressure sensor 190 includes lower electrode 172 formed on underlying layer 141, and lower electrode 172 located on the common substrate 150 side with respect to this lower electrode 172 and arranged to face lower electrode 172.

Underlying layer 131 and gate insulating layer 133 are formed on the upper surface of lower electrode 172. Recess 147 is formed between lower electrode 172 and upper electrode 171. Recess 147 is defined by a hole formed in underlying layer 131 and the hole formed in gate insulating layer 133, and the upper surface of lower electrode 172 is located at the bottom of this recess 147.

Therefore, in liquid crystal display device 100 according to the seventh embodiment as well, upper electrode 171 can deform to deflect to go into recess 147.

Therefore, in liquid crystal display device 100 according to the seventh embodiment as well, when common substrate 150 is pressed, upper electrode 171 comes into contact with lower electrode 172, and a current flows between upper electrode 171 and lower electrode 172.

When the pressing force by which common substrate 150 is pressed increases, a contact area between upper electrode 171 and lower electrode 172 increases, and the current flowing between upper electrode 171 and lower electrode 172 increases. As a result, control unit 105 shown in FIG. 58 can sense the pressing force applied to common substrate 150.

A method for manufacturing liquid crystal display device 100 according to the seventh embodiment will be described with reference to FIGS. 77 to 80.

In liquid crystal display device 100 according to the seventh embodiment as well, liquid crystal display device 100 is formed by separately forming TFT array substrate 130 and common substrate 150, and assembling formed common substrate 150 and TFT array substrate 130 together.

Figure 77:
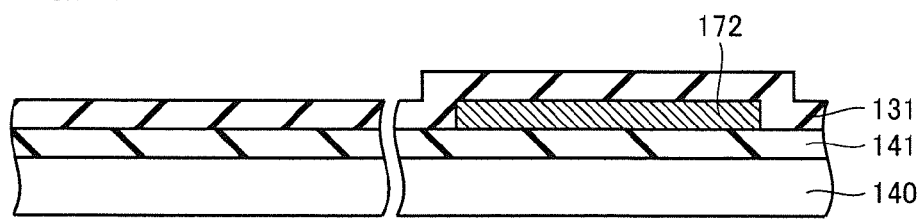
FIG. 77 is a cross-sectional view showing a first step of a process of manufacturing TFT array substrate 130.

FIG. 77 is a cross-sectional view showing a first step of a process of manufacturing TFT array substrate 130. As shown in this FIG. 77, glass substrate 140 having the main surface is prepared. Underlying layer 141 is formed on the main surface of this glass substrate 140. Underlying layer 141 is made of, for example, $SiO_2$, SiN, SiNO and the like. Underlying layer 141 has a film thickness of, for example, 500 nm or less, and preferably 400 nm or less.

The metal layer made of molybdenum (Mo), tungsten (W) and the like is formed on the upper surface of this underlying layer 141 by sputtering. Then, this metal layer is patterned to form lower electrode 172. Lower electrode 172 is formed to have a film thickness of, for example, 50 nm or more and 600 nm or less. Lower electrode 172 is preferably formed to have a film thickness of 50 nm or more and 300 nm or less.

The insulating layer such as a $SiO_2$ layer, a SiN layer and a SiNO layer is formed to cover lower electrode 172, and underlying layer 131 is formed.

Figure 78:
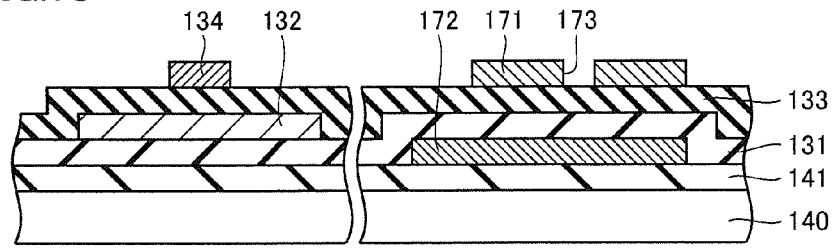
FIG. 78 is a cross-sectional view showing a second step of the process of manufacturing TFT array substrate 130.

FIG. 78 is a cross-sectional view showing a second step of the process of manufacturing TFT array substrate 130. As shown in this FIG. 78, the amorphous semiconductor layer is deposited on underlying layer 131. The amorphous semiconductor layer has a film thickness of, for example, 20 nm or more and 200 nm or less. The amorphous semiconductor layer preferably has a film thickness of approximately 30 nm or more and 70 nm Thereafter, this amorphous semiconductor layer is crystallized to form the continuous grain silicon layer (CG silicon layer). The continuous grain silicon layer is patterned to form semiconductor layer 132.

The insulating layer made of $SiO_2$, SiN, SiNO and the like is formed, and gate insulating layer 133 is formed. Gate insulating layer 133 has a film thickness of, for example, 20 nm or more and 200 nm or less, and preferably 50 nm or more and 120 nm or less.

Then, the metal layer is formed on the upper surface of gate insulating layer 133. This metal layer is formed of, for example, a metal film made of tungsten (W), tantalum (Ta), titanium (Ti), molybdenum (Mo) and the like, or an alloy film containing tungsten (W), tantalum (Ta), titanium (Ti), molybdenum (Mo) and the like, or a compound containing an element such as tungsten (W), tantalum (Ta), titanium (Ti), and molybdenum (Mo).

This metal layer has a film thickness of, for example, 50 nm or more and 600 nm or less, and preferably 100 nm or more and 500 nm or less.

Thereafter, this metal layer is patterned to form gate electrode 134 and upper electrode 171. At this time, hole 173 is simultaneously formed in upper electrode 171. As described above, in the seventh embodiment as well, upper electrode 171 and gate electrode 134 can be formed in the same step.

Figure 79:
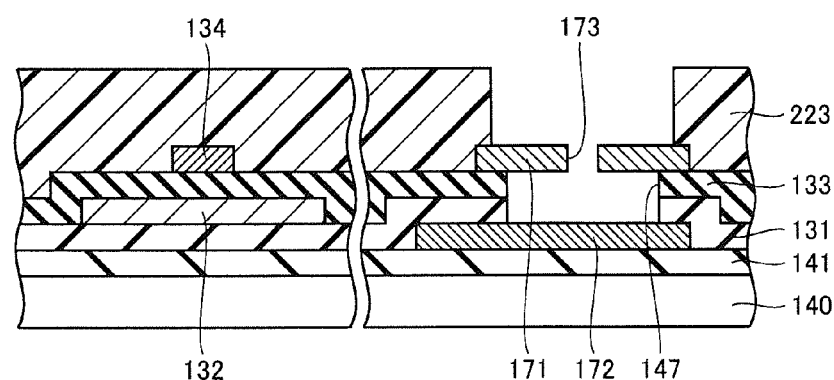
FIG. 79 is a cross-sectional view showing a third step of the process of manufacturing TFT array substrate 130.

FIG. 79 is a cross-sectional view showing a third step of the process of manufacturing TFT array substrate 130. As shown in this FIG. 79, the resist is first formed and this resist is patterned. Resist pattern 223 is thus formed. This resist pattern 223 has a hole to expose hole 173 to the outside.

Then, the substrate is immersed in an acid-based solution such as an HF (hydrogen fluoride) aqueous solution. The solution flows in through hole 173 and etches gate insulating layer 133 and underlying layer 131. As a result, recess 147 is formed.

Figure 80:
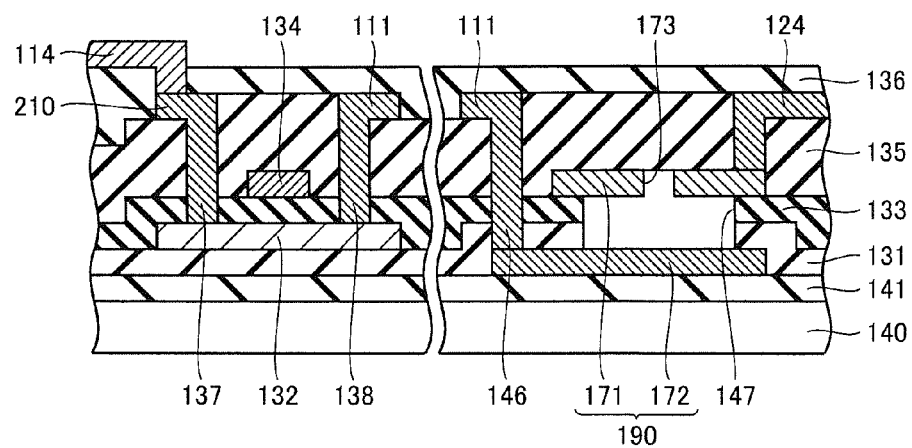
FIG. 80 is a cross-sectional view showing a fourth step of the process of manufacturing TFT array substrate 130.

FIG. 80 is a cross-sectional view showing a fourth step of the process of manufacturing TFT array substrate 130. As shown in this FIG. 80, resist pattern 223 shown in FIG. 79 is removed. Interlayer dielectric 135 is formed. This interlayer dielectric 135 is patterned to form a plurality of contact holes. Thereafter, the metal layer is formed on the upper surface of interlayer dielectric 135 and this metal layer is patterned to form drain pad 210, drain electrode 137, source electrode 138, source line 111, contact 146, and connection wiring 124.

Thereafter, upper insulating layer 136 is formed and this upper insulating layer 136 is patterned to form the contact hole.

The ITO layer is formed on the upper surface of upper insulating layer 136 having this contact hole and this ITO layer is patterned to form pixel electrode 114. TFT array substrate 130 is thus formed.

Common substrate 150 is formed similarly to common substrate 150 of liquid crystal display device 100 according to the third embodiment described above.

Common substrate 150 and TFT array substrate 130 thus formed are assembled together. Liquid crystal display device 100 according to the seventh embodiment is thus formed.

Figure 81:
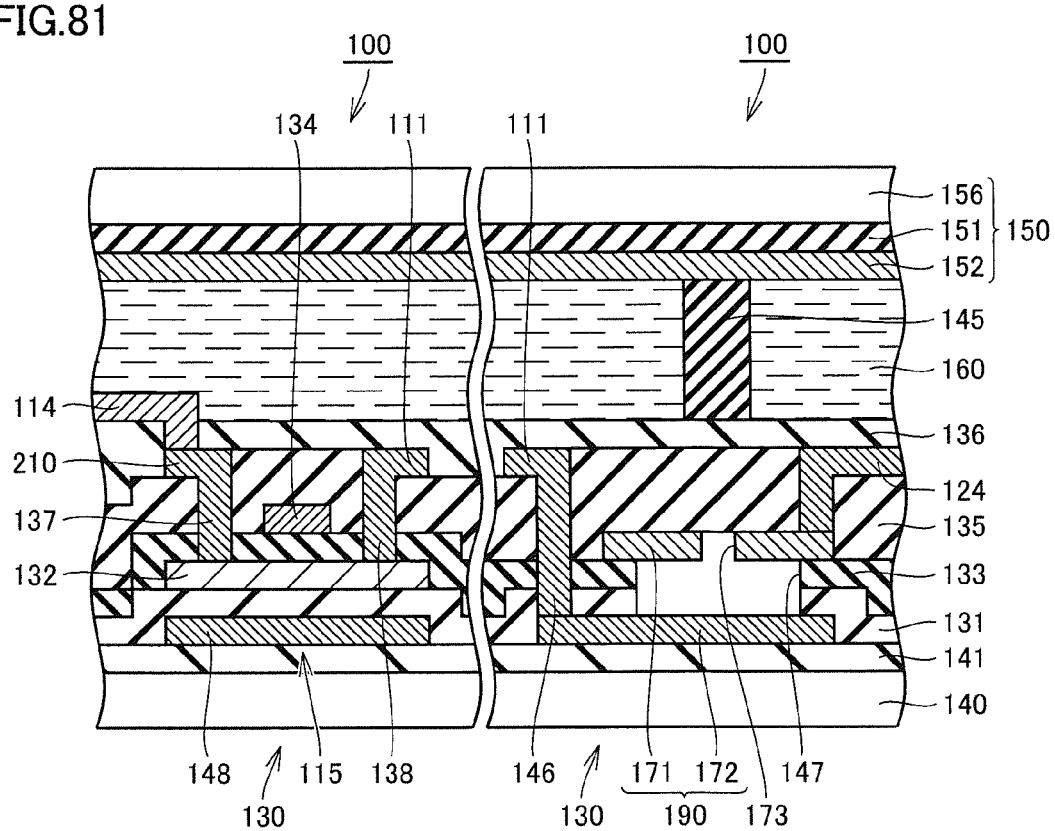
FIG. 81 is a cross-sectional view showing a modification of liquid crystal display device 100 according to the seventh embodiment.

FIG. 81 is a cross-sectional view showing a modification of liquid crystal display device 100 according to the seventh embodiment. As shown in this FIG. 81, light blocking layer 148 may be formed on underlying layer 141 located below semiconductor layer 132.

Light blocking layer 148 is made of a metal material of the same kind as that of lower electrode 172, and a film thickness of light blocking layer 148 is substantially identical to a film thickness of lower electrode 172.

Light blocking layer 148 and lower electrode 172 are formed by patterning one metal layer and can be formed in the same patterning step.

Although the example in which the present invention is applied to the liquid crystal display device has been described in the aforementioned first to seventh embodiments, the present invention is also applicable to an organic electroluminescence (EL) display or a plasma display. In addition, each substrate may be a flexible substrate. When the present invention is applied to the organic electroluminescence display, an organic EL layer serves as the display medium layer.

This organic electroluminescence display includes a first substrate formed on a first main surface, a second substrate spaced apart from the first substrate and having a second electrode on a main surface facing the first main surface, and an organic EL layer formed between a first electrode and the second electrode.

The organic electroluminescence display further includes a lower electrode formed on the first substrate, an upper electrode arranged closer to the second substrate than this lower electrode, and a sensing unit capable of sensing a capacitance between the lower electrode and the upper electrode or an amount of current flowing between the lower electrode and the upper electrode. At least one of the upper electrode and the lower electrode can deform to conform to the other.

When the present invention is applied to the plasma display, a phosphor layer serves as the display medium layer. This plasma display includes a front plate and a back plate. The front plate includes a front glass substrate, a display electrode formed on a lower surface of this front glass substrate, a light blocking layer, and a dielectric layer formed on the lower surface of the front glass substrate to cover the display electrode and the light blocking layer. A protection layer is formed on a lower surface of this dielectric layer.

The back plate includes a back glass substrate, an address electrode formed on an upper surface of this back glass substrate, an underlying dielectric layer formed on the upper surface of the back glass substrate to cover this address electrode, a plurality of partition walls formed on this underlying dielectric layer and partitioning a discharge space, and a phosphor layer formed in a groove between the partition walls. The front plate and the back plate are arranged to face each other. A perimeter is hermetically sealed by a sealant, and a discharge gas is injected into the discharge space.

This plasma display further includes a lower electrode arranged on the back plate side, an upper electrode arranged on the back plate side, and a sensing unit capable of sensing a capacitance or an amount of current defined by the upper electrode and the lower electrode. At least one of the upper electrode and the lower electrode can deform to conform to the other.

Eighth Embodiment

Figure 82:
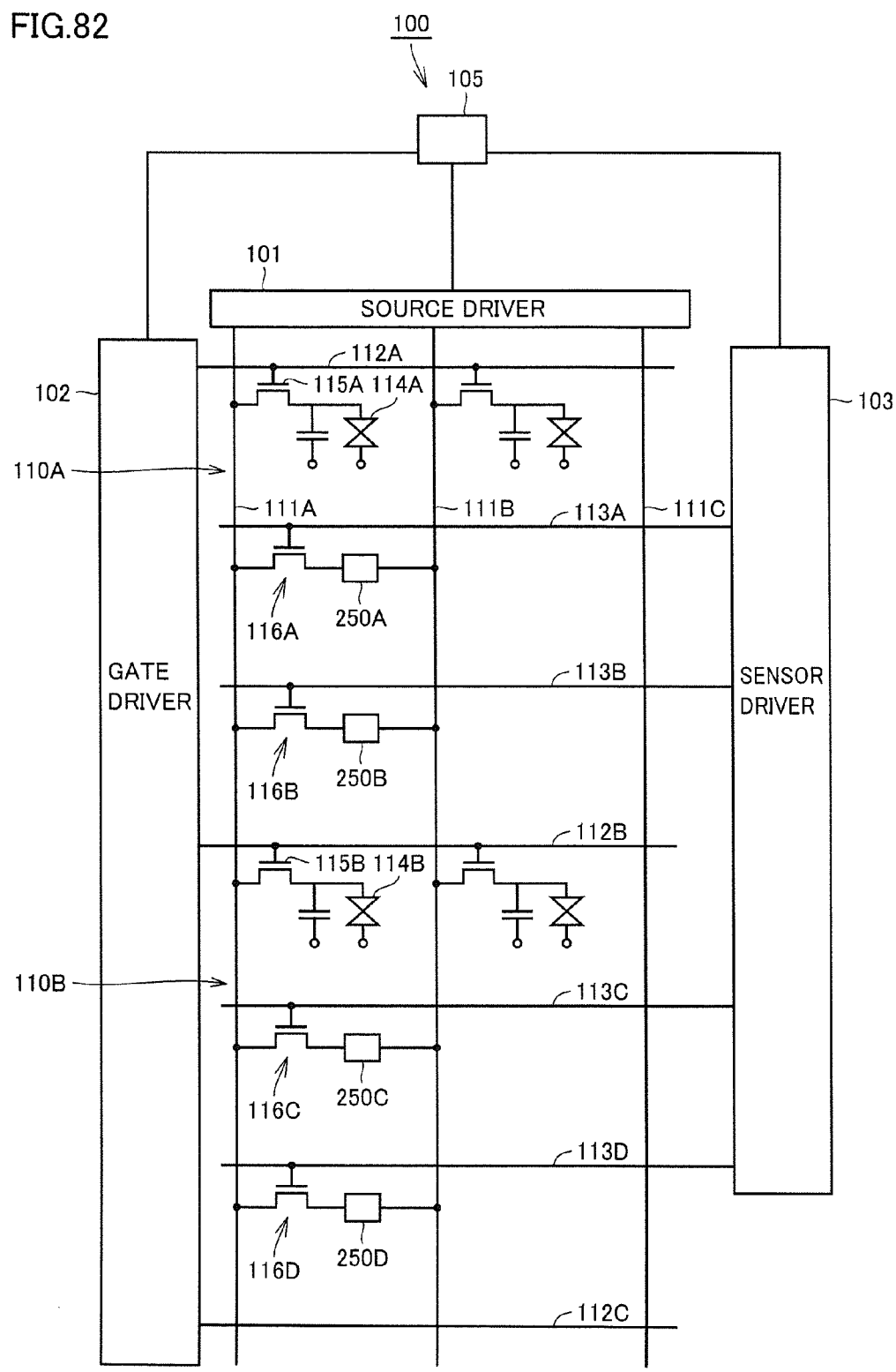
FIG. 82 is a diagram schematically showing an electrical circuit of liquid crystal display device 100 according to an eighth embodiment.

Liquid crystal display device 100 according to an eighth embodiment will be described with reference to FIGS. 82 to 97. FIG. 82 is a diagram schematically showing an electrical circuit of liquid crystal display device 100 according to the eighth embodiment. As shown in this FIG. 82, liquid crystal display device 100 includes control unit 105 and a plurality of pixels 110A and 110B arranged in an array. Pixels 110A and 110B include TFT (Thin Film Transistor) elements 115A and 115B, and pixel electrodes 114A and 114B connected to these TFT elements 115A and 115B, respectively.

Liquid crystal display device 100 includes a plurality of gate lines 112A to 112C and gate lines for sensing 113A to 113D extending in the first direction and spaced apart from one another in the second direction, and a plurality of source lines 111A to 111C extending in the second direction and spaced apart from one another in the first direction.

Gate lines 112A and 112B and source lines 111A and 111B constitute pixel 110A, and gate lines 112B and 112C and source lines 111A and 111B constitute pixel 110B.

Gate line for sensing 113A and gate line for sensing 113B are arranged between gate line 112A and gate line 112B and are formed to pass through pixel 110A. Gate line for sensing 113C and gate line for sensing 113D are arranged between gate line 112B and gate line 112C and are formed to pass through pixel 110B.

TFT element 115A, pixel electrode 114A connected to this TFT element 115A, TFT elements for selection 116A and 116B, a highly-sensitive sensor 250A, and a low-sensitive sensor 250B are arranged in pixel 110A. A gate electrode of TFT element 115A is connected to gate line 112A, and a source electrode of TFT element 115A is connected to source line 111A. Pixel electrode 114A is connected to a drain electrode of TFT element 115A.

A source electrode of TFT element for selection 116A is connected to source line 111A, and a gate electrode of TFT element for selection 116A is connected to gate line for sensing 113A. Highly-sensitive sensor 250A is connected to a drain electrode of TFT element for selection 116A and to source line 111B.

A source electrode of TFT element for selection 116B is connected to source line 111A, and a gate electrode of TFT element for selection 116B is connected to gate line for sensing 113B. Low-sensitive sensor 250B is connected to a drain electrode of TFT element for selection 116B and to source line 111B.

TFT element 115B, pixel electrode 114B connected to this TFT element 115B, TFT elements for selection 116C and 116D, and highly-sensitive sensors 250C and 250D are arranged in pixel 110B. A gate electrode of TFT element 115B is connected to gate line 112B, and a source electrode of TFT element 115B is connected to source line 111A. Pixel electrode 114B is connected to a drain electrode of TFT element 115B.

A source electrode of TFT element for selection 116C is connected to source line 111A, and a gate electrode of TFT element for selection 116C is connected to gate line for sensing 113C. Highly-sensitive sensor 250C is connected to a drain electrode of TFT element for selection 116C and to source line 111B.

A source electrode of TFT element for selection 116D is connected to source line 111A, and a gate electrode of TFT element for selection 116D is connected to gate line for sensing 113D. Low-sensitive sensor 250D is connected to a drain electrode of TFT element for selection 116D and to source line 111B.

Highly-sensitive sensors 250A and 250C and low-sensitive sensors 250B and 250D are arranged between the common substrate and the matrix substrate, and when the common substrate is pressed, these sensors output loads applied to the respective sensors.

ON/OFF of TFT elements for selection 116A to 116D is switched as appropriate in a time-divisional manner, and control unit 105 senses an output from the selected sensor.

A pressure sensor, an ON/OFF sensor or the like can be used as highly-sensitive sensors 250A and 250C and low-sensitive sensors 250B and 250D.

A capacitance-fluctuation-type pressure sensor, a current-amount (resistance value)-fluctuation-type pressure sensor or the like can be used as the pressure sensor.

Figure 83:
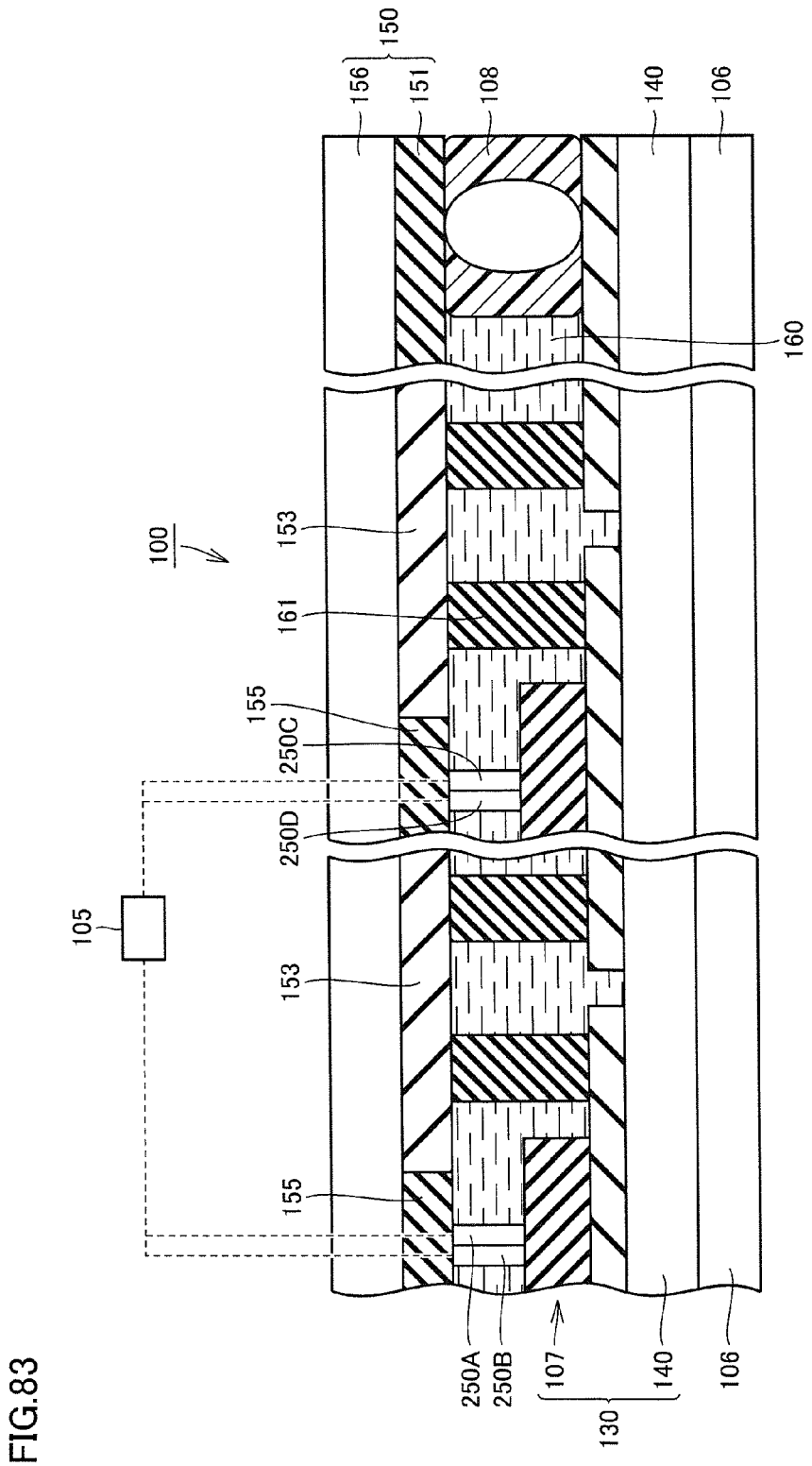
FIG. 83 is a cross-sectional view schematically showing liquid crystal display device 100 according to the eighth embodiment.

FIG. 83 is a cross-sectional view schematically showing liquid crystal display device 100 according to the eighth embodiment. In the figures in the specification including this FIG. 83, the aspect ratio and the like are not accurately shown, and liquid crystal display device 100 and the like are schematically shown.

As shown in FIG. 83, liquid crystal display device 100 includes TFT array substrate 130, common substrate 150 spaced apart from TFT array substrate 130, and a backlight unit 106 arranged on the opposite side of common substrate 150 with respect to TFT array substrate 130.

Backlight unit 106 is a unit that emits light toward TFT array substrate 130. The polarizing plate arranged at glass substrate 140 and backlight unit 106 is not shown.

Liquid crystal layer 160 is filled between TFT array substrate 130 and common substrate 150. A sealing member 108 extending annularly is arranged on the outer peripheral edge side of TFT array substrate 130 and common substrate 150. This sealing member 108 seals a region between TFT array substrate 130 and common substrate 150, thereby preventing leakage of liquid crystal layer 160.

TFT array substrate 130 includes glass substrate 140 having the main surface (first main surface) and a construction 107 formed on the main surface of this glass substrate 140. Construction 107 includes a plurality of insulating layers, conductive layers, semiconductor layers and the like, and constitutes the switching element, the pixel electrode and the like.

A plurality of spacers (photo spacers) 161 are arranged between TFT array substrate 130 and common substrate 150. A spacing between TFT array substrate 130 and common substrate 150 is maintained at a predetermined spacing by these spacers 161.

Common substrate 150 includes glass substrate 156 having the main surface and color filter substrate 151 formed on the main surface of this glass substrate 156. The main surface of glass substrate 156 is arranged to face the main surface of glass substrate 140. In this FIG. 83, common electrode 152, an orientation layer and the like are not shown.

Color filter substrate 151 includes grid-like black matrix 155 formed to define a plurality of window portions, and colored layer 153 formed in the window portion. Colored layer 153 includes a blue layer, a red layer and a green layer, and one colored layer is formed in each window portion.

Highly-sensitive sensors (first sensors) 250A and 250C and low-sensitive sensors (second sensors) 250B and 250D are arranged under black matrix 155 and between TFT array substrate 130 and common substrate 150. Highly-sensitive sensor 250A and low-sensitive sensor 250B are arranged to be adjacent to each other, and highly-sensitive sensor 250C and low-sensitive sensor 250D are arranged to be adjacent to each other. Highly-sensitive sensors 250A and 250C and low-sensitive sensors 250B and 250D are connected to control unit 105.

Based on outputs from highly-sensitive sensor 250A and low-sensitive sensor 250B, control unit 105 calculates the pressing force applied to a portion of glass substrate 156 provided with highly-sensitive sensor 250A and low-sensitive sensor 250B. Similarly, based on outputs from highly-sensitive sensor 250C and low-sensitive sensor 250D, control unit 105 calculates the pressing force applied to a portion of glass substrate 156 provided with highly-sensitive sensor 250C and low-sensitive sensor 250D. A specific configuration and the like of each sensor will be described below.

In the example shown in this FIG. 83, highly-sensitive sensor 250A and low-sensitive sensor 250B are arranged to be adjacent to each other. Therefore, when the user presses glass substrate 156, substantially the same load is applied to highly-sensitive sensor 250A and low-sensitive sensor 250B. Similarly, substantially the same load is applied to highly-sensitive sensor 250C and low-sensitive sensor 250D.

Figure 84:
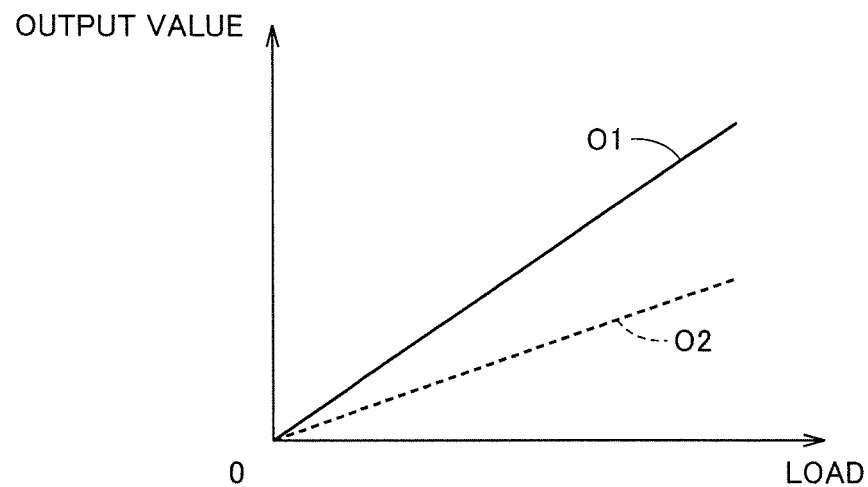
FIG. 84 is a graph schematically showing characteristics of a highly-sensitive sensor 250A and a low-sensitive sensor 250B.

FIG. 84 is a graph schematically showing characteristics of highly-sensitive sensor 250A and low-sensitive sensor 250B. The horizontal axis in this graph indicates a load applied to the portion of glass substrate 156 provided with highly-sensitive sensor 250A and low-sensitive sensor 250B. The vertical axis in this graph indicates output values of highly-sensitive sensor 250A and low-sensitive sensor 250B.

A first output value O1 indicates an output characteristic of highly-sensitive sensor 250A, and a second output value O2 indicates an output characteristic of low-sensitive sensor 250B. When a load is applied to the portion of glass substrate 156 where highly-sensitive sensor 250A and low-sensitive sensor 250B are located, the load is applied to highly-sensitive sensor 250A and low-sensitive sensor 250B. Highly-sensitive sensor 250A outputs first output value O1 corresponding to the applied load and low-sensitive sensor 250B also outputs second output value O2 corresponding to the applied load. In the example shown in this FIG. 84, a rate of change in first output value O1 is larger than a rate of change in second output value O2, and a difference between first output value O1 and second output value O2 becomes larger as the load becomes larger.

Based on the difference between first output value O1 and second output value O2, control unit 105 calculates the load applied to a portion of common substrate 150 located above highly-sensitive sensor 250A and low-sensitive sensor 250B.

Assume that a portion of black matrix 155 where highly-sensitive sensor 250C and low-sensitive sensor 250D are located is thicker than a portion of black matrix 155 where highly-sensitive sensor 250A and low-sensitive sensor 250B are located.

Figure 85:
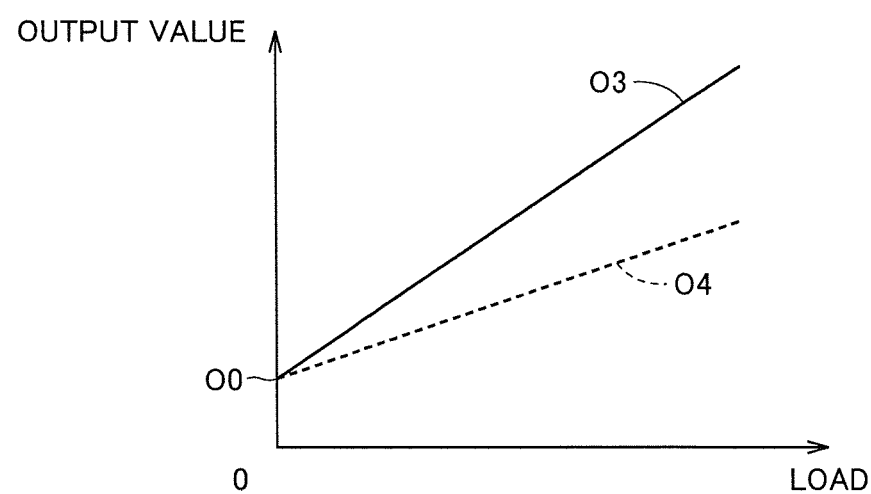
FIG. 85 is a graph showing output characteristics of a highly-sensitive sensor 250C and a low-sensitive sensor 250D.

In this case, output characteristics of highly-sensitive sensor 250C and low-sensitive sensor 250D are as shown in FIG. 85. In the graph shown in this FIG. 85, a third output value O3 indicates an output of highly-sensitive sensor 250C, and a fourth output value O4 indicates an output value of low-sensitive sensor 250D. In addition, in the graph shown in FIG. 85, the horizontal axis indicates a load applied to a portion of glass substrate 156 where highly-sensitive sensor 250C and low-sensitive sensor 250D are located.

As shown in FIG. 85, even in the state where no load is applied to glass substrate 156, initial values of highly-sensitive sensor 250C and low-sensitive sensor 250D are O0 that is larger than zero.

As a result of application of the load to glass substrate 156, third output value O3 increases similarly to first output value O1 and fourth output value O4 increases similarly to second output value O2. Therefore, when the equal load is applied to glass substrate 156 at the respective positions, the difference between first output value O1 and second output value O2 is substantially equal to a difference between third output value O3 and fourth output value O4.

As described above, even when manufacturing variations occur in the thickness of black matrix 155 and the like, for example, the load at the position where each pair of the sensors is provided can be accurately sensed.

Although the example in which highly-sensitive sensor 250A and low-sensitive sensor 250B as well as highly-sensitive sensor 250C and low-sensitive sensor 250D are schematically shown has been described in FIG. 83, a detailed configuration of the respective sensors will be described.

Liquid crystal display device 100 in which the capacitance-fluctuation-type pressure sensor is used will be described with reference to FIGS. 86 to 97.

Figure 86:
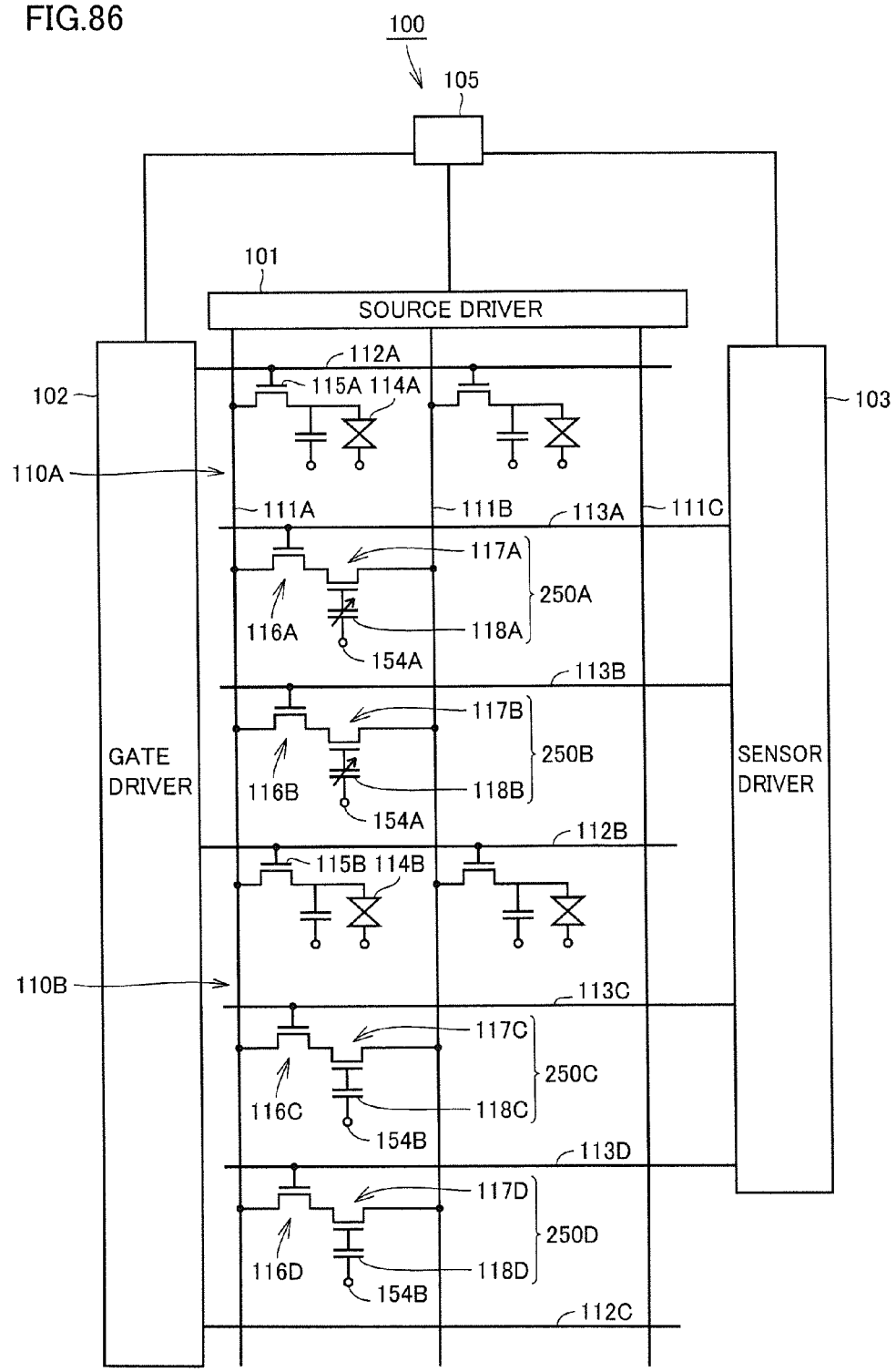
FIG. 86 is a diagram schematically showing an electrical circuit of liquid crystal display device 100 in which a highly-sensitive sensor and a low-sensitive sensor including capacitance-fluctuation-type pressure sensors are used.

FIG. 86 is a diagram schematically showing an electrical circuit of liquid crystal display device 100 in which the highly-sensitive sensor and the low-sensitive sensor including the capacitance-fluctuation-type pressure sensors are used.

In liquid crystal display device 100 shown in this FIG. 86, highly-sensitive sensors 250A and 250C include output elements 117A and 117C, and pressure sensors 118A and 118C, respectively. Similarly, low-sensitive sensors 250B and 250D include output elements 117B and 117D, and pressure sensors 118B and 118D, respectively.

Each of pressure sensors 118A to 118D includes an upper electrode and a lower electrode, and the lower electrode is connected to a gate electrode of each of output elements 117A to 117D. The upper electrode of each of pressure sensors 118A and 118B is connected to an upper electrode wiring 154A. The upper electrode of each of pressure sensors 118C and 118D is connected to an upper electrode wiring 154B.

TFT elements for selection 116A to 116D are switched as appropriate in a time-divisional manner, and control unit 105 senses outputs from highly-sensitive sensor 250A, low-sensitive sensor 250B, highly-sensitive sensor 250C, and low-sensitive sensor 250D connected to selected TFT elements for selection 116A to 116D. Specifically, control unit 105 senses an amount of current, which is an electrical characteristic from each sensor.

Outputs of output elements 117A to 117D fluctuate in accordance with a voltage applied to the gate electrodes of output elements 117A to 117D. This voltage applied to the gate electrodes is determined by a potential of the lower electrodes of pressure sensors 118A to 118D connected to the gate electrodes.

The potential of the lower electrodes of pressure sensors 118A to 118D is determined by a capacitance between the lower electrode and the upper electrode. The capacitance between the upper electrode and the lower electrode fluctuates in accordance with the pressing force applied to the substrate having the upper electrode. In other words, control unit 105 can sense the pressing force applied to the substrate, based on the amount of current from output elements 117A to 117D.

Figure 87:
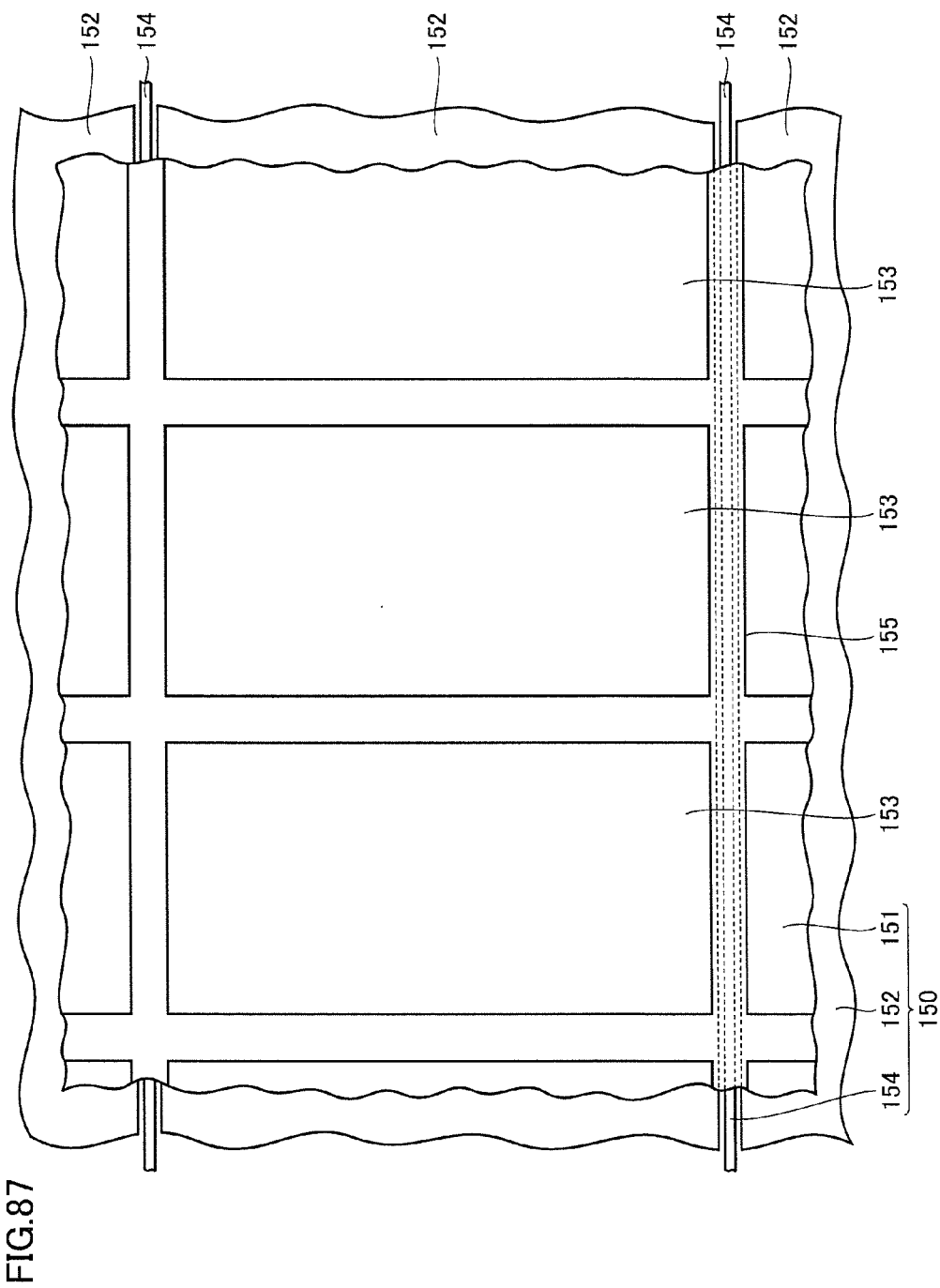
FIG. 87 is a plan view of common substrate 150.

FIG. 87 is a plan view of common substrate 150. In this FIG. 87, glass substrate 156 is not shown, and color filter substrate 151, common electrode 152 and the like are shown.

As shown in this FIG. 87, common substrate 150 includes color filter substrate 151, common electrode 152 and upper electrode wiring 154.

Color filter substrate 151 includes black matrix 155 formed in the shape of a grid, and colored layer 153 formed within the framework of this black matrix 155 and made of red, green and blue coloring photosensitive materials. One colored layer 153 is arranged above one pixel 110.

A plurality of common electrodes 152 are provided and upper electrode wiring 154 is arranged between common electrodes 152. Upper electrode wiring 154 is located under black matrix 155 and common electrode 152 is located at least under colored layer 153. Common electrode 152 and upper electrode wiring 154 are transparent electrodes made of, for example, ITO (Indium Tin Oxide).

Figure 88:
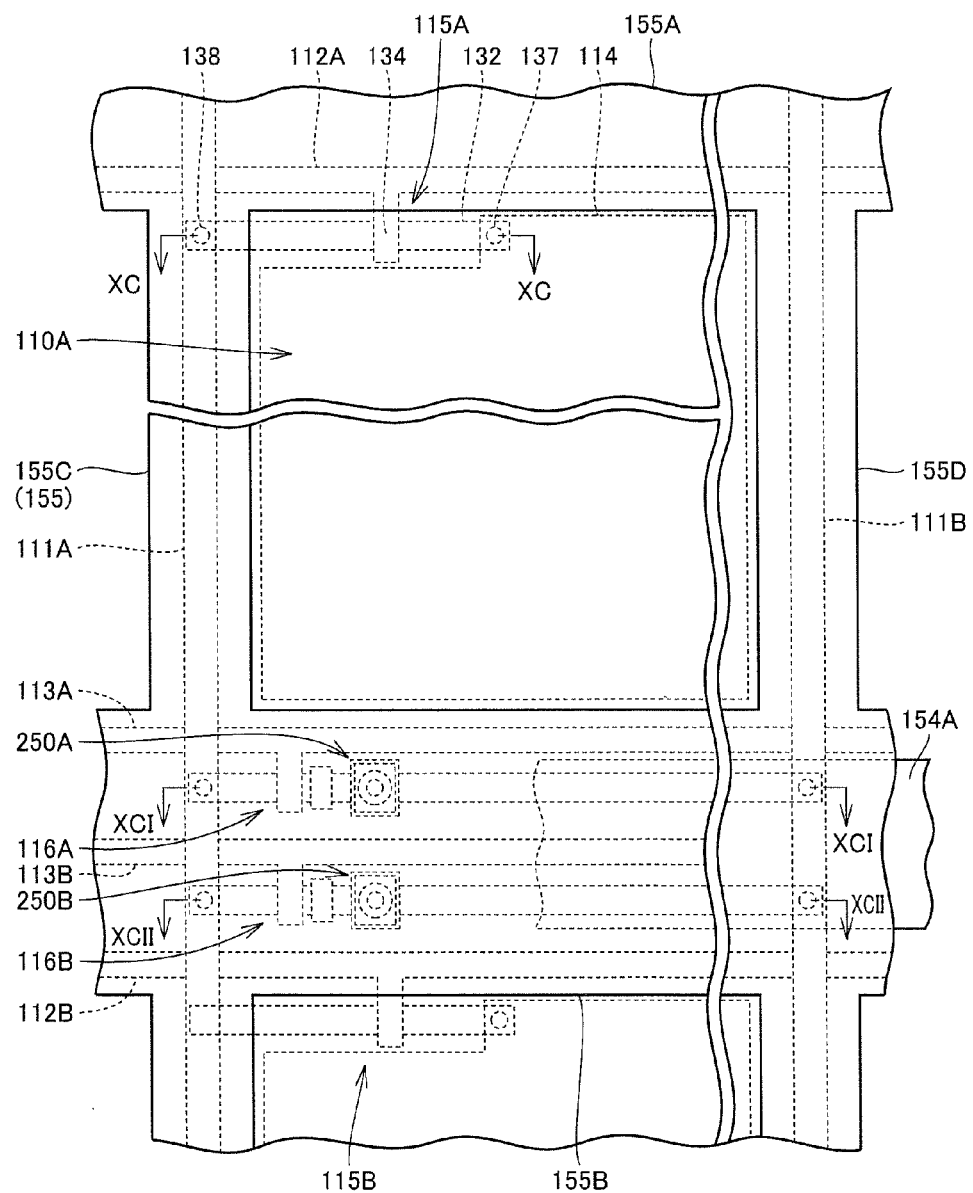
FIG. 88 is a plan view when TFT array substrate 130 is viewed two-dimensionally from the common substrate 150 side.

FIG. 88 is a plan view when TFT array substrate 130 is viewed two-dimensionally from the common substrate 150 side. As shown in this FIG. 88, gate lines 112A and 112B as well as source lines 111A and 111B are arranged under black matrix 155.

TFT element for selection 116A, highly-sensitive sensor 250A, TFT element for selection 116B, and low-sensitive sensor 250B are also located under black matrix 155.

Black matrix 155 defines the window portion corresponding to pixel 110A, and this window portion is defined by side portions 155A to 155D of black matrix 155.

Side portion 155A is located above gate line 112A, and side portion 155B is located above gate line 112B, highly-sensitive sensor 250A, low-sensitive sensor 250B, and TFT elements for selection 116A and 116B. Side portion 155C is located above source line 111A, and side portion 155D is located above source line 111B.

TFT element 115A includes semiconductor layer 132, gate electrode 134 formed on semiconductor layer 132, and drain electrode 137 and source electrode 138 connected to semiconductor layer 132. Source electrode 138 is connected to source line 111A, and drain electrode 137 is connected to pixel electrode 114.

As shown in this FIG. 86, highly-sensitive sensor 250A and low-sensitive sensor 250B are arranged to be adjacent to each other, and highly-sensitive sensor 250A and low-sensitive sensor 250B are formed to be aligned in the direction in which source lines 111A and 111B extend.

Figure 89:
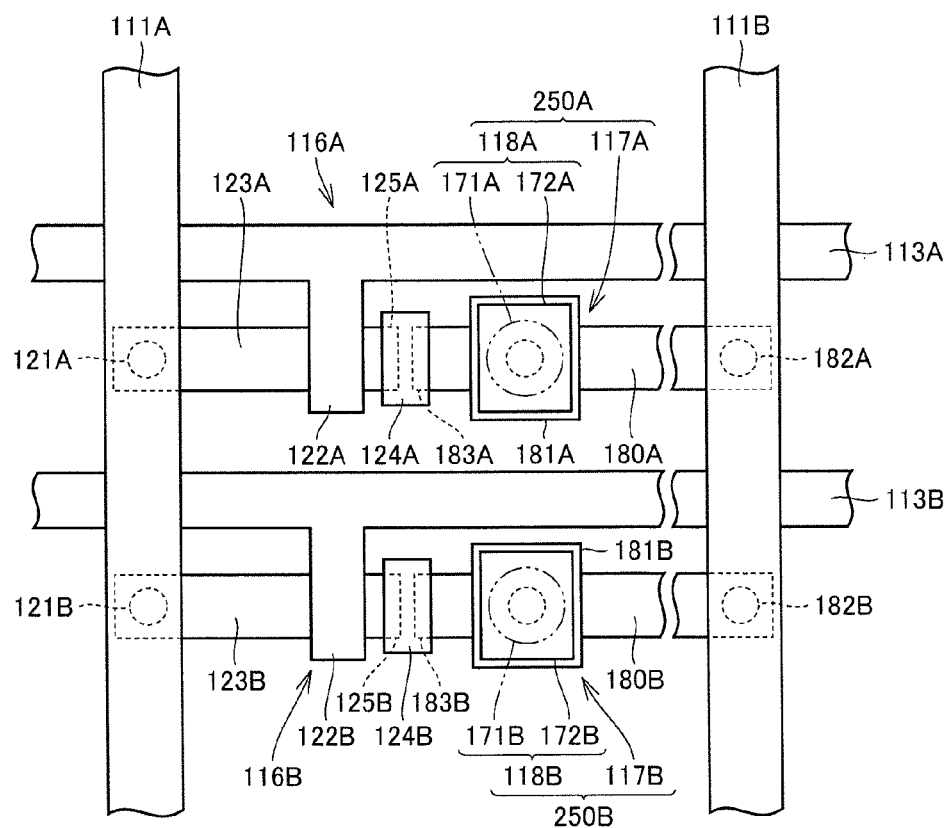
FIG. 89 is a plan view showing highly-sensitive sensor 250A and low-sensitive sensor 250B located below a side portion 155B in FIG. 88.

FIG. 89 is a plan view showing highly-sensitive sensor 250A and low-sensitive sensor 250B located below side portion 155B in FIG. 88.

As shown in this FIG. 89, TFT element for selection 116A includes a semiconductor layer 123A, a source electrode 121A connecting semiconductor layer 123A and source line 111A, a gate electrode 122A connected to gate line for sensing 113A, and a drain electrode 125A.

Output element 117A of highly-sensitive sensor 250A includes a semiconductor layer 180A, a gate electrode 181A formed on this semiconductor layer 180A, a drain electrode 182A connecting source line 111B and semiconductor layer 180A, and a source electrode 183A. Drain electrode 125A of TFT element for selection 116A and source electrode 183A of output element 117A are connected by a connection wiring 124A. Pressure sensor 118A of highly-sensitive sensor 250A includes an upper electrode 171A and a lower electrode 172A, and upper electrode 171A is formed to be circular when viewed two-dimensionally from above.

TFT element for selection 116B includes a semiconductor layer 123B, a gate electrode 122B formed on semiconductor layer 123B, a source electrode 121B connecting semiconductor layer 123B and source line 111A, and a drain electrode 125B.

Output element 117B of low-sensitive sensor 250B includes a semiconductor layer 180B, a gate electrode 181B formed on this semiconductor layer 180B, a drain electrode 182B connecting source line 111B and semiconductor layer 180B, and a source electrode 183B. Pressure sensor 118B includes an upper electrode 171B and a lower electrode 172B.

Source electrode 183B of output element 117B and drain electrode 125B of TFT element for selection 116B are connected by a connection wiring 124B.

Figure 90:
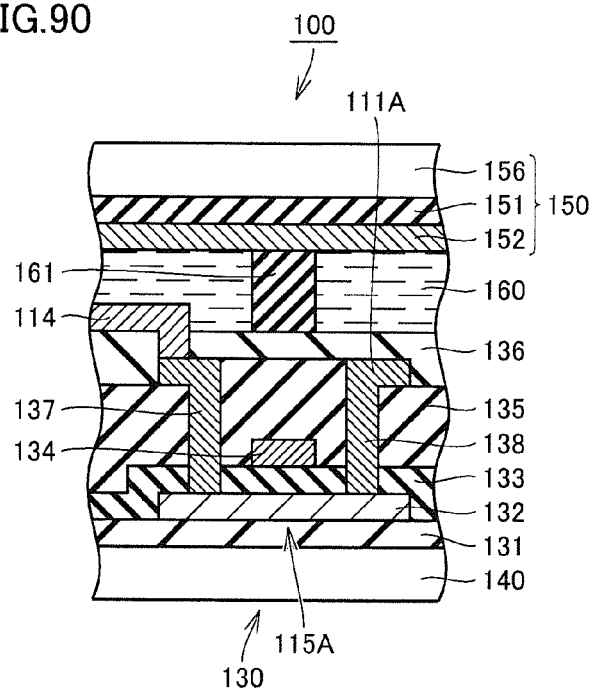
FIG. 90 is a cross-sectional view taken along line XC-XC shown in FIG. 88.

FIG. 90 is a cross-sectional view taken along line XC-XC shown in FIG. 88. The cross-sectional views shown in FIG. 90 and FIGS. 91, 92 and the like below are cross-sectional views simplified for convenience of description, and the aspect ratio and the like in each figure are not accurate.

As shown in FIG. 90, liquid crystal display device 100 includes TFT array substrate 130, common substrate 150 spaced apart from TFT array substrate 130 so as to face TFT array substrate 130, and liquid crystal layer (display medium layer) 160 filled between common substrate 150 and TFT array substrate 130. Spacer 161 maintaining a spacing between TFT array substrate 130 and common substrate 150 at a predetermined spacing is formed between TFT array substrate 130 and common substrate 150.

Common substrate 150 includes glass substrate 156 having the main surface, color filter substrate 151 formed on the main surface of glass substrate 156, and common electrode 152 formed under this color filter substrate 151.

TFT array substrate 130 includes glass substrate (first substrate) 140 having the main surface (first main surface), and pixel electrode 114 located above glass substrate 140, and TFT element (switching element) 115A is formed on the main surface of this glass substrate 140.

Figure 91:
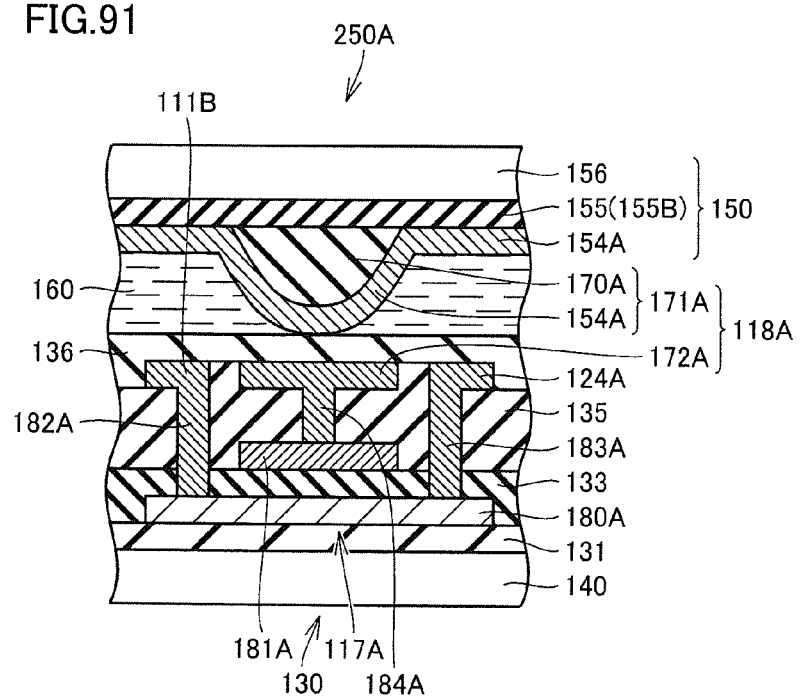
FIG. 91 is a cross-sectional view taken along line XCI-XCI shown in FIG. 88 and is a cross-sectional view showing highly-sensitive sensor 250A.

FIG. 91 is a cross-sectional view taken along line XCI-XCI shown in FIG. 88 and is a cross-sectional view showing highly-sensitive sensor 250A. As shown in this FIG. 91, underlying layer 131 is formed on the main surface of glass substrate 140, and output element 117A is formed on the upper surface of this underlying layer 131.

Output element 117A includes semiconductor layer 180A formed on underlying layer 131, gate insulating layer 133 formed to cover semiconductor layer 180A, gate electrode 181A formed on a portion of the upper surface of gate insulating layer 133 located above semiconductor layer 180A, and source electrode 183A and drain electrode 182A connected to semiconductor layer 180A.

Source electrode 183A is spaced apart from gate electrode 181A, and drain electrode 182A is arranged on the opposite side of source electrode 183A with respect to gate electrode 181A.

Interlayer dielectric 135 is formed on the upper surface of gate insulating layer 133 to cover gate electrode 181A.

Drain electrode 182A passes through gate insulating layer 133 and interlayer dielectric 135 and is connected to source line 111B formed on the upper surface of interlayer dielectric 135. Source electrode 183A is also formed to pass through gate insulating layer 133 and interlayer dielectric 135 and reach the upper surface of interlayer dielectric 135.

Lower electrode 172A and connection wiring 124A are formed on the upper surface of interlayer dielectric 135. Connection wiring 124A is connected to the drain electrode of TFT element for selection 116 shown in FIG. 88. Lower electrode 172A is connected to gate electrode 181A by a contact 184A. Therefore, a voltage applied to gate electrode 181A is determined by a potential of lower electrode 172A.

Upper insulating layer 136 is formed on lower electrode 172A. Lower electrode 172A is formed into a flat surface. At least a portion of upper insulating layer 136 located on lower electrode 172A is formed into a flat surface to conform to the upper surface of lower electrode 172A.

Pressure sensor (pressure detecting device) 118A includes lower electrode 172A described above, and upper electrode 171A located above this lower electrode 172A.

In the present embodiment, upper electrode 171A is formed in common substrate 150, and upper electrode 171A is constituted by a projection 170A formed on the lower side of side portion 155B of black matrix 155, and upper electrode wiring 154A formed to cover a surface of this projection 170A.

Projection 170A is made of, for example, an elastically deformable material such as an acrylic resin and a plastic resin. Projection 170A may be made of an elastically deformable conductive resin.

Projection 170A has a height of, for example, 1 μm or more and 10 μm or less. Projection 170A preferably has a height of 1.5 μm or more and 5 μm or less.

In the example shown in this FIG. 91, a portion of upper electrode wiring 154A located at a vertex of projection 170A is in contact with upper insulating layer 136.

In the present embodiment, projection 170A is formed to be circular in a cross section vertical to the protruding direction, and projection 170A has a smoothly curved surface.

The shape of projection 170A is not limited to the aforementioned shape. For example, projection 170A may be formed to extend over lower electrodes 172 of a plurality of pressure sensors 118. Projection 170A is not limited to a projection having a circular cross-sectional shape, and further, is not limited to a projection having a smoothly curved outer surface.

Figure 92:
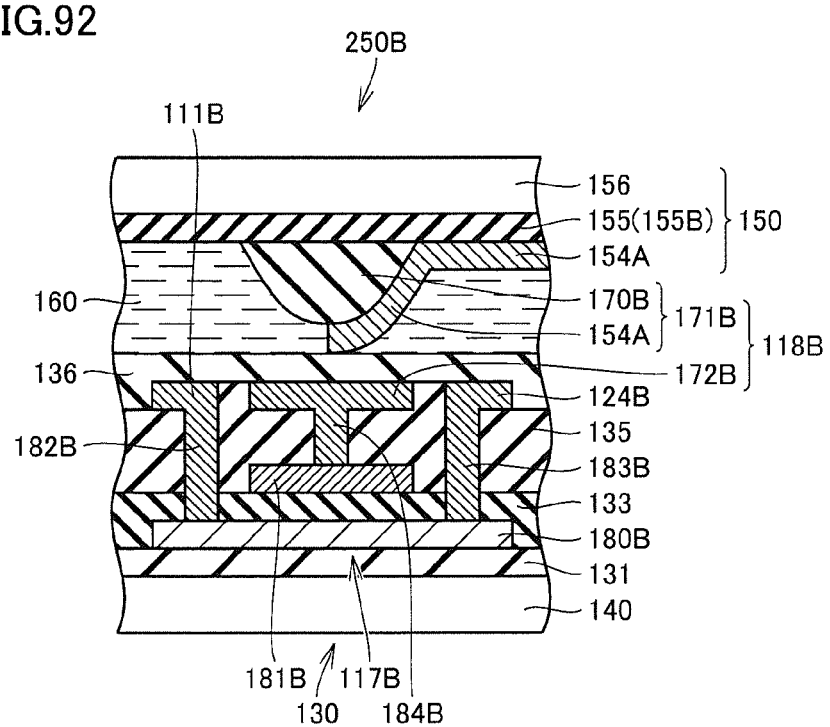
FIG. 92 is a cross-sectional view taken along line XCII-XCII in FIG. 88.

FIG. 92 is a cross-sectional view taken along line XCII-XCII in FIG. 88. As shown in this FIG. 92, underlying layer 131 is formed on the main surface of glass substrate 140, and output element 117B is formed on the upper surface of this underlying layer 131.

Output element 117B includes semiconductor layer 180B formed on underlying layer 131, gate insulating layer 133 formed to cover semiconductor layer 180B, gate electrode 181B formed on a portion of the upper surface of gate insulating layer 133 located above semiconductor layer 180B, and source electrode 183B and drain electrode 182B connected to semiconductor layer 180B.

Source electrode 183B is spaced apart from gate electrode 181B, and drain electrode 182B is arranged on the opposite side of source electrode 183B with respect to gate electrode 181B.

Interlayer dielectric 135 is formed on the upper surface of gate insulating layer 133 to cover gate electrode 181B.

Drain electrode 182B passes through gate insulating layer 133 and interlayer dielectric 135 and is connected to source line 111B formed on the upper surface of interlayer dielectric 135. Source electrode 183B is also formed to pass through gate insulating layer 133 and interlayer dielectric 135 and reach the upper surface of interlayer dielectric 135.

Lower electrode 172B and connection wiring 124B are formed on the upper surface of interlayer dielectric 135. Connection wiring 124B is connected to the drain electrode of TFT element for selection 116B shown in FIG. 88. Lower electrode 172B is connected to gate electrode 181B by a contact 184B. Therefore, a voltage applied to gate electrode 181B is determined by a potential of lower electrode 172B.

Upper insulating layer 136 is formed on lower electrode 172B. Lower electrode 172B is formed into a flat surface. At least a portion of upper insulating layer 136 located on lower electrode 172B is formed into a flat surface to conform to the upper surface of lower electrode 172B.

Pressure sensor (pressure detecting device) 118B includes lower electrode 172B described above, and upper electrode 171B located above this lower electrode 172B.

In the present embodiment, upper electrode 171B is formed in common substrate 150, and upper electrode 171B is constituted by a projection 170B formed on the lower side of side portion 155B of black matrix 155, and upper electrode wiring 154A formed on a surface of this projection 170B.

Projection 170A shown in FIG. 91 has substantially same shape as that of projection 170B described above. The surface of projection 170A is covered with upper electrode wiring 154A. A part of the surface of projection 170B is covered with upper electrode wiring 154A, while a part of the surface of projection 170B is exposed from upper electrode wiring 154A.

In the example shown in this FIG. 92, a half of the surface of projection 170B is covered with upper electrode wiring 154A and the rest is exposed from upper electrode wiring 154A.

Projection 170B is made of the same material as that of projection 170A. A height of projection 170B is substantially the same as a height of projection 170A. Furthermore, the shape of projection 170B is substantially the same as the shape of projection 170A.

As shown in FIGS. 91 and 92, output element 117A and output element 117B have substantially the same structure, and pressure sensor 118A and pressure sensor 118B have substantially the same structure.

Furthermore, projection 170A of highly-sensitive sensor 250A and projection 170B of low-sensitive sensor 250B are both formed on a lower surface of side portion 155B to be adjacent to each other.

Therefore, in the state where the external force is not applied to glass substrate 156, a distance between upper electrode 171A and lower electrode 172A is substantially the same as a distance between upper electrode 171B and lower electrode 172B. When the external force is applied to glass substrate 156, a displacement length of upper electrode 171A is substantially the same as a displacement length of upper electrode 171B.

Figure 93:
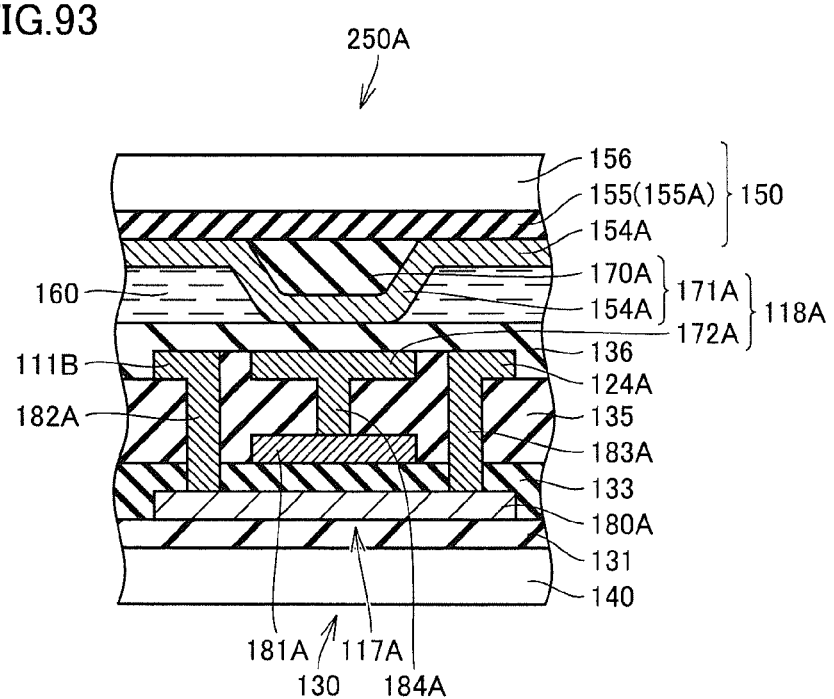
FIG. 93 is a cross-sectional view showing highly-sensitive sensor 250A when glass substrate 156 is pressed by the user.

FIG. 93 is a cross-sectional view showing highly-sensitive sensor 250A when glass substrate 156 is pressed by the user. As shown in this FIG. 93, when common substrate 150 is pressed by a pen or someone's finger, a pressed portion of common substrate 150 and its neighboring portion deflect.

As a result of deflection of glass substrate 156, upper electrode 171A comes closer to lower electrode 172A. Since upper electrode 171A comes closer to lower electrode 172A, upper electrode 171A is pressed against upper insulating layer 136, projection 170A deforms elastically, and upper electrode 171A deforms to conform to lower electrode 172A.

Figure 94:
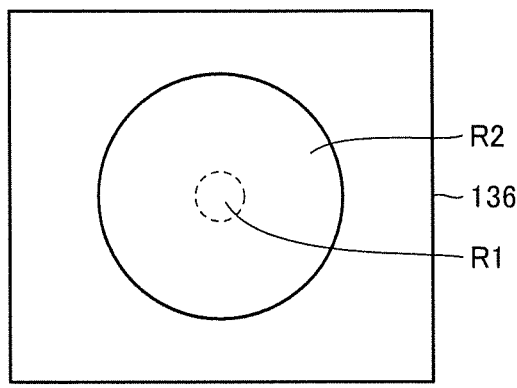
FIG. 94 is a plan view schematically showing a region where a portion of an upper electrode wiring 154A located on a surface of a projection 170A comes into contact with upper insulating layer 136.

FIG. 94 is a plan view schematically showing a region where a portion of upper electrode wiring 154A located on the surface of projection 170A comes into contact with upper insulating layer 136. In this FIG. 94, region R1 is a region enclosed by a broken line in FIG. 94 and region R2 is a region enclosed by a solid line. Region R1 represents a region where upper electrode wiring 154A located on upper electrode 171A is in contact with upper insulating layer 136 in the state (initial state) where common substrate 150 is not pressed.

Region R2 represents a region where upper electrode wiring 154A located on projection 170A comes into contact with upper insulating layer 136 in the state shown in FIG. 93. As shown in this FIG. 93, by slight displacement of upper electrode 171A, a contact area between upper electrode wiring 154A and upper insulating layer 136 increases greatly.

A distance between upper electrode wiring 154A located on the surface of upper electrode 171A and lower electrode 172A corresponds to a thickness of upper insulating layer 136.

As a result, a capacitance defined by upper electrode 171A and lower electrode 172A in the state shown in FIG. 93 is much larger than a capacitance defined by upper electrode 171A and lower electrode 172A in the initial state shown in FIG. 91.

Figure 95:
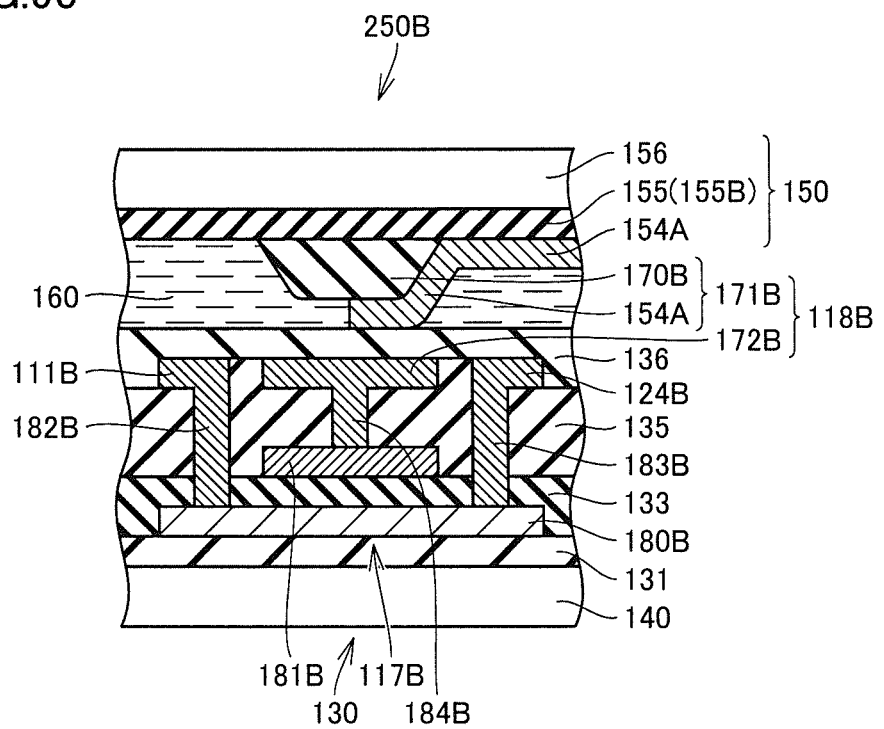
FIG. 95 is a cross-sectional view showing low-sensitive sensor 250B when glass substrate 156 is pressed by the user.

FIG. 95 is a cross-sectional view showing low-sensitive sensor 250B when glass substrate 156 is pressed by the user. As shown in this FIG. 95, when common substrate 150 is pressed by a pen or someone's finger, a pressed portion of common substrate 150 and its neighboring portion deflect.

As a result of deflection of glass substrate 156, upper electrode 171B comes closer to lower electrode 172B. Since upper electrode 171B comes closer to lower electrode 172B, upper electrode 171B is pressed against upper insulating layer 136, projection 170B deforms elastically, and upper electrode 171B deforms to conform to lower electrode 172B. As a result, upper electrode wiring 154A formed on the surface of projection 170B also deforms to conform to lower electrode 172B.

Now, a half of the surface of projection 170B is covered with upper electrode wiring 154A, and a half of the surface of projection 170B is exposed from upper electrode wiring 154A.

As described above, an area of a portion of upper electrode wiring 154A that can deform to conform to lower electrode 172A is different from an area of a portion of upper electrode wiring 154A that can deform to conform to lower electrode 172B.

In this example, the area of the portion of upper electrode wiring 154A that can deform to conform to lower electrode 172B is smaller than the area of the portion of upper electrode wiring 154A that can deform to conform to lower electrode 172A.

Therefore, the sensitivity of low-sensitive sensor 250B including pressure sensor 118B is lower than the sensitivity of highly-sensitive sensor 250A. In the example shown in FIGS. 93 and 94, the area of the portion of upper electrode wiring 154A that can deform to conform to lower electrode 172A is about twice as large as the area of the portion of upper electrode wiring 154A that can deform to conform to lower electrode 172B.

Figure 96:
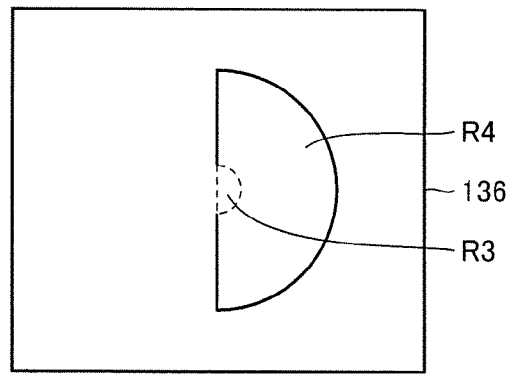
FIG. 96 is a plan view schematically showing a region where a portion of upper electrode wiring 154A located on a surface of a projection 170B comes into contact with upper insulating layer 136.

FIG. 96 is a plan view schematically showing a region where a portion of upper electrode wiring 154A located on the surface of projection 170B comes into contact with upper insulating layer 136. In this FIG. 96, a region R4 represents a region enclosed by a solid line and a region R3 represents a region enclosed by a broken line.

Region R3 represents a contact area between upper electrode wiring 154A located on projection 170B and upper insulating layer 136 when common substrate 150 is not pressed as shown in FIG. 92. Region R4 represents a region where upper electrode wiring 154A located on projection 170B comes into contact with upper insulating layer 136 when common substrate 150 is pressed as shown in FIG. 95.

As shown in this FIG. 96, when common substrate 150 is pressed, the contact area between upper electrode wiring 154A located on projection 170B and upper insulating layer 136 increases sharply.

Therefore, in pressure sensor 118B as well, when common substrate 150 is pressed, the capacitance fluctuates greatly.

Figure 97:
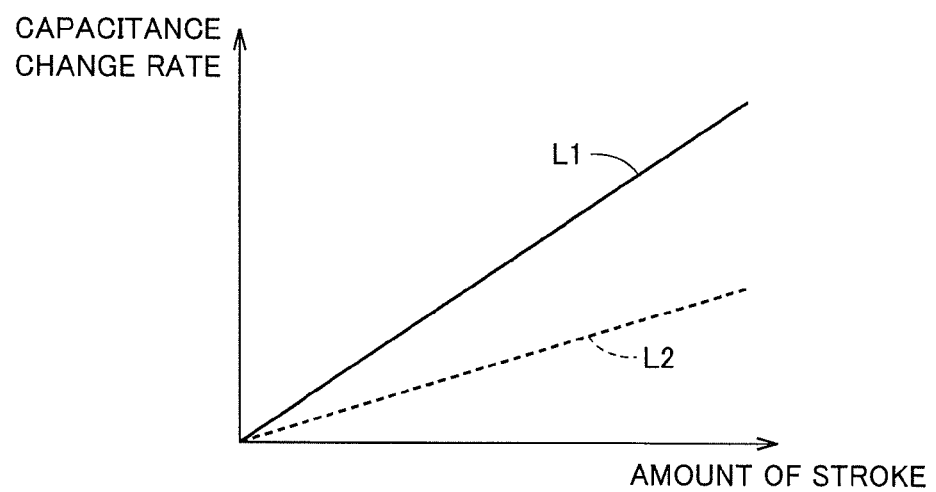
FIG. 97 is a graph showing characteristics of a pressure sensor 118A and a pressure sensor 118B.

FIG. 97 is a graph showing characteristics of pressure sensor 118A and pressure sensor 118B.

In the graph shown in this FIG. 97, the horizontal axis indicates amounts of stroke of upper electrode 171A and upper electrode 171B, and the vertical axis indicates capacitance change rates of pressure sensor 118A and pressure sensor 118B.

As shown in FIG. 89 above, pressure sensor 118A and pressure sensor 118B are arranged to be adjacent to each other, and pressure sensor 118A and pressure sensor 118B are both pressed by side portion 155B.

Therefore, the amount of stroke of the upper electrode of pressure sensor 118A is substantially identical to the amount of stroke of the upper electrode of pressure sensor 118B.

A graph L1 shows the characteristic of pressure sensor 118A, and a graph L2 shows the characteristic of pressure sensor 118B. As shown, the characteristic of pressure sensor 118A is very different from the characteristic of pressure sensor 118B.

Specifically, the capacitance change rate of pressure sensor 118A is larger than the capacitance change rate of pressure sensor 118B. Furthermore, L1 and L2 change substantially in a manner of linear function and an inclination of L1 is larger than an inclination of L2. In other words, the capacitance change rate of pressure sensor 118A is larger in change rate than the capacitance change rate of pressure sensor 118B.

Therefore, when the amounts of stroke of the respective upper electrodes are the same, a capacitance between upper electrode 171A and lower electrode 172A of pressure sensor 118A is larger than a capacitance between upper electrode 171B and lower electrode 172B of pressure sensor 118B.

The amount of stroke of upper electrode 171A is substantially identical to the amount of stroke of upper electrode 171B as described above. Therefore, when the amounts of stroke of the respective upper electrodes change, a difference between the capacitance between upper electrode 171A and lower electrode 172B and the capacitance between upper electrode 171B and lower electrode 172B fluctuates. In the example shown in this FIG. 97, when the amount of stroke of the upper electrode increases, the difference in capacitance increases.

In FIGS. 93 and 95, when the capacitance between upper electrode 171A and lower electrode 172A becomes larger than the capacitance between upper electrode 171B and lower electrode 172B, a voltage applied to gate electrode 181A becomes higher than a voltage applied to gate electrode 181B.

When a predetermined voltage or a higher voltage is applied to gate electrode 181A and gate electrode 181B, inversion layers are formed in semiconductor layer 180A and semiconductor layer 180B.

When the voltage applied to gate electrode 181A is higher than the voltage applied to gate electrode 181B, a region of an inversion layer formed in gate electrode 181A is larger than a region of an inversion layer formed in semiconductor layer 180B.

As a result, an amount of current flowing between drain electrode 182A and source electrode 183A when TFT element for selection 116A is turned on becomes larger than an amount of current flowing between drain electrode 182B and source electrode 183B when TFT element for selection 116B is turned on.

By sensing the respective amounts of current, control unit 105 shown in FIG. 86 can sense a difference between an amount of current flowing through highly-sensitive sensor 250A and an amount of current flowing through low-sensitive sensor 250B.

When TFT element for selection 116A is turned on and the other TFT elements for selection such as TFT element for selection 116B are off, control unit 105 senses the amount of current flowing through highly-sensitive sensor 250A.

When TFT element for selection 116B is turned on and the other TFT elements for selection such as TFT element for selection 116A are off, control unit 105 senses the amount of current flowing through low-sensitive sensor 250B.

A time difference between when TFT element for selection 116A is turned on and when TFT element for selection 116B is turned on is very short. A time difference between when the amount of current flowing through highly-sensitive sensor 250A is sensed and when the amount of current flowing through low-sensitive sensor 250B is sensed is much shorter than a time period during which the user touches the screen. Therefore, the aforementioned time differences are negligible.

Based on the difference between the amount of current flowing through highly-sensitive sensor 250A and the amount of current flowing through low-sensitive sensor 250B, control unit 105 calculates an amount of displacement of a portion of common substrate 150 where highly-sensitive sensor 250A and low-sensitive sensor 250B are located and a load applied to this portion.

Highly-sensitive sensor 250C has substantially the same configuration as that of highly-sensitive sensor 250A, and low-sensitive sensor 250D has substantially the same configuration as that of low-sensitive sensor 250B.

Based on a difference between an amount of current flowing through highly-sensitive sensor 250C and an amount of current flowing through low-sensitive sensor 250D, control unit 105 calculates an amount of displacement of a portion of common substrate 150 where highly-sensitive sensors 250C and low-sensitive sensor 250D are located and a load applied to this portion.

Even when there is a difference between a thickness of black matrix 155 pressing highly-sensitive sensor 250A and low-sensitive sensor 250B and a thickness of black matrix 155 pressing highly-sensitive sensor 250C and low-sensitive sensor 250D, the pressing force at the respective positions can be accurately sensed.

For example, a case where black matrix 155 pressing highly-sensitive sensor 250C and low-sensitive sensor 250D is thicker than black matrix 155 pressing highly-sensitive sensor 250A and low-sensitive sensor 250B will be discussed.

In this case, an output characteristic of highly-sensitive sensor 250C is indicated by third output value O3 shown in FIG. 85 and an output characteristic of low-sensitive sensor 250D is indicated by fourth output value O4. Furthermore, an output characteristic of highly-sensitive sensor 250A is indicated by first output value O1 and an output characteristic of low-sensitive sensor 250B is indicated by second output value O2.

Therefore, when the same load is applied to the respective positions, a difference between first output value O1 and second output value O2 is equal to a difference between third output value O3 and fourth output value O4. In other words, even when manufacturing variations occur, the load applied to the respective positions can be accurately sensed.

Ninth Embodiment

A ninth embodiment of the present invention will be described with reference to FIGS. 98 to 103. Although liquid crystal display device 100 in which the first example of the capacitance-fluctuation-type pressure sensor is used has been described in the aforementioned eighth embodiment, an example in which a second example of the capacitance-fluctuation-type pressure sensor is used will be described in the ninth embodiment. The same reference characters are given to the components shown in FIGS. 98 to 103 that are the same as or corresponding to those shown in FIGS. 1 to 97 above, and description thereof will not be repeated.

Figure 98:
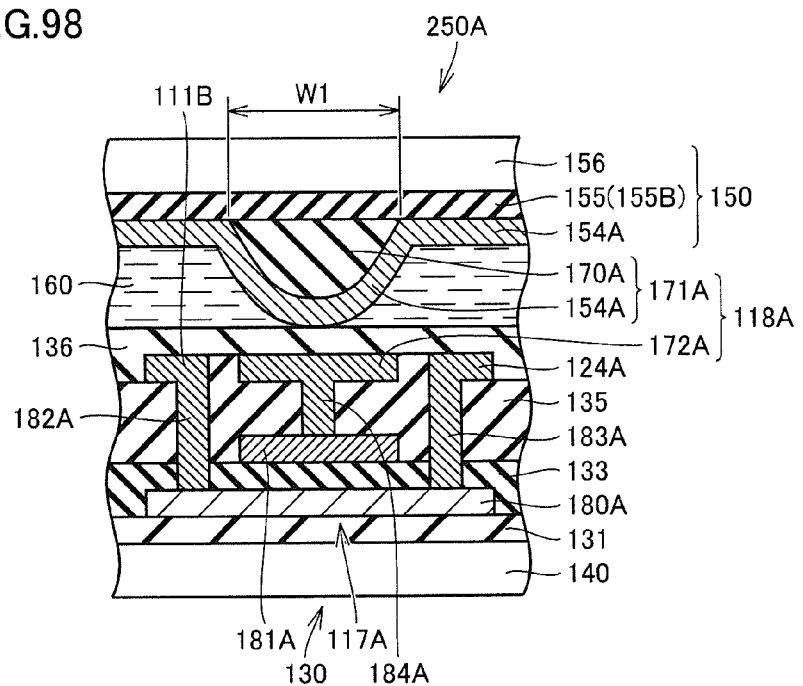
FIG. 98 is a cross-sectional view showing highly-sensitive sensor 250A of liquid crystal display device 100 according to a ninth embodiment.
Figure 99:
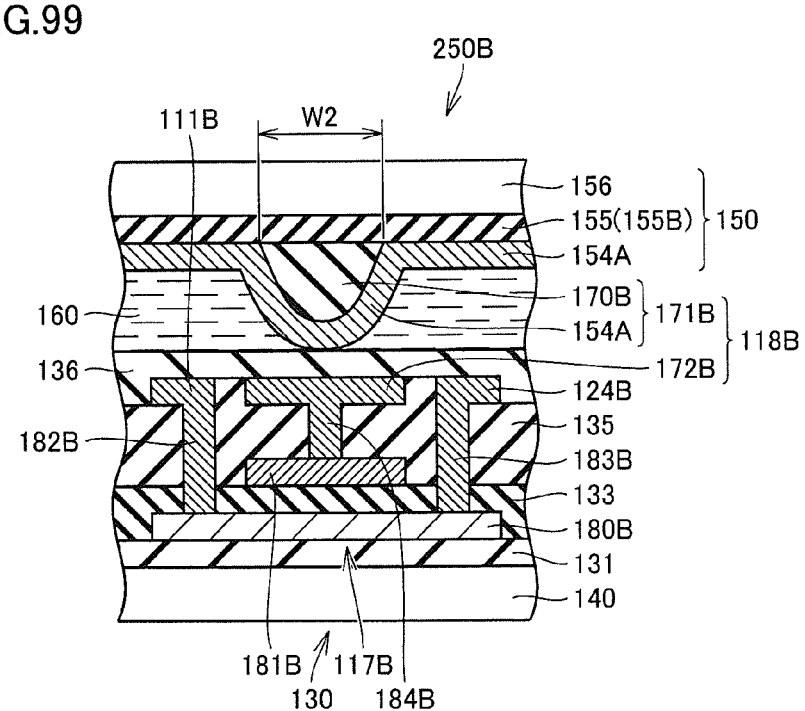
FIG. 99 is a cross-sectional view showing low-sensitive sensor 250B of liquid crystal display device 100 according to the ninth embodiment.

An electrical circuit of liquid crystal display device 100 according to the ninth embodiment is the same as that in FIG. 86 above. FIG. 98 is a cross-sectional view showing highly-sensitive sensor 250A of liquid crystal display device 100 according to the ninth embodiment. FIG. 99 is a cross-sectional view showing low-sensitive sensor 250B of liquid crystal display device 100 according to the ninth embodiment.

As shown in FIGS. 98 and 99, a width W1 of projection 170A provided in highly-sensitive sensor 250A is formed to be larger than a width W2 of projection 170B provided in low-sensitive sensor 250B.

As described above, in liquid crystal display device 100 according to the ninth embodiment, a shape of projection 170A provided in highly-sensitive sensor 250A is different from a shape of projection 170B provided in low-sensitive sensor 250B.

Figure 100:
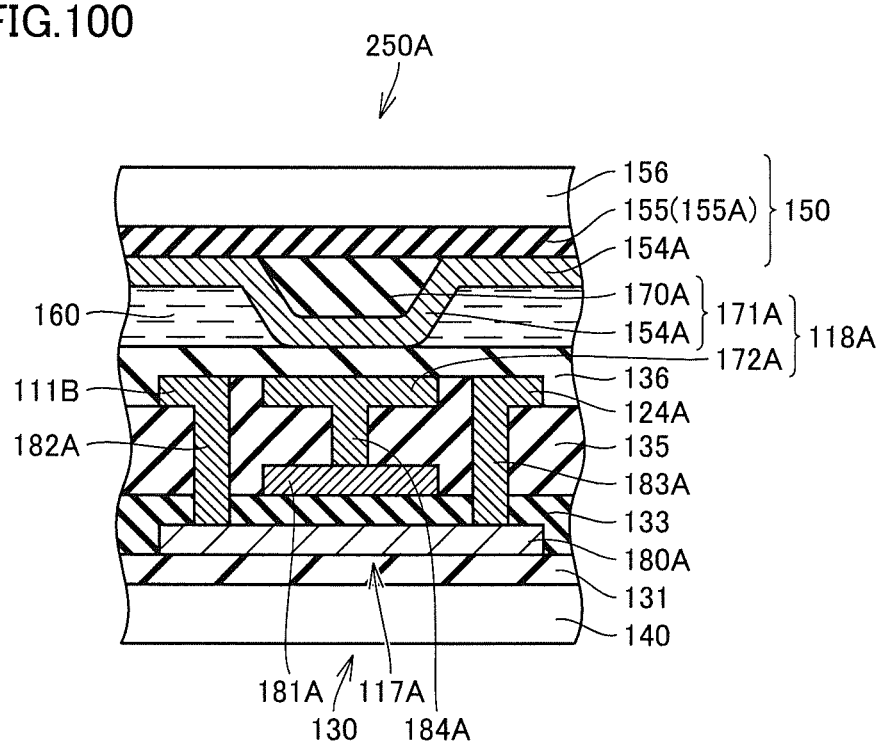
FIG. 100 is a cross-sectional view showing highly-sensitive sensor 250A when glass substrate 156 is pressed by the user.
Figure 101:
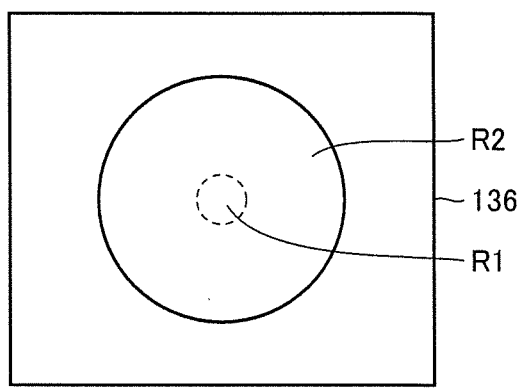
FIG. 101 is a plan view schematically showing a region where the portion of upper electrode wiring 154A located on the surface of projection 170A comes into contact with upper insulating layer 136.

FIG. 100 is a cross-sectional view showing highly-sensitive sensor 250A when glass substrate 156 is pressed by the user. FIG. 101 is a plan view schematically showing a region where the portion of upper electrode wiring 154A located on the surface of projection 170A comes into contact with upper insulating layer 136.

As shown in FIGS. 100 and 101, when glass substrate 156 is pressed by the user, a tip of upper electrode 171A comes into contact with upper insulating layer 136 and upper electrode 171A deforms.

As a result, the contact area between upper electrode wiring 154A formed on the surface of projection 170A and upper insulating layer 136 increases. In FIG. 101, region R1 represents a region where upper electrode wiring 154A is in contact with upper insulating layer 136 in the state where the external force is not applied to glass substrate 156. Region R2 represents a region where upper electrode wiring 154A comes into contact with upper insulating layer 136 in the state where glass substrate 156 is pressed.

Figure 102:
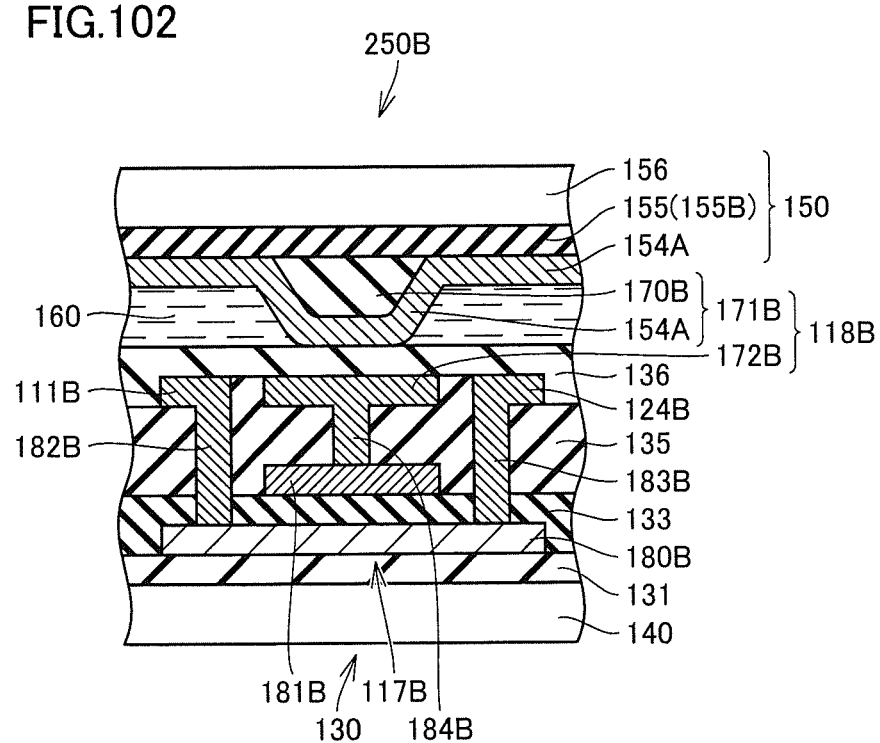
FIG. 102 is a cross-sectional view showing low-sensitive sensor 250B when glass substrate 156 is pressed by the user.
Figure 103:
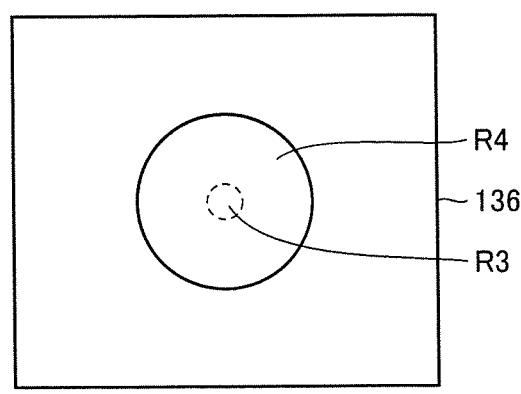
FIG. 103 is a plan view schematically showing a region where the portion of upper electrode wiring 154A located on the surface of projection 170B comes into contact with upper insulating layer 136.

FIG. 102 is a cross-sectional view showing low-sensitive sensor 250B when glass substrate 156 is pressed by the user. FIG. 103 is a plan view schematically showing a region where the portion of upper electrode wiring 154A located on the surface of projection 170B comes into contact with upper insulating layer 136.

In FIG. 103, region R3 represents a region where upper electrode wiring 154A located on projection 170B is in contact with upper insulating layer 136 in the state where the external force is not applied to glass substrate 156. Region R4 represents a region where upper electrode wiring 154A on projection 170B comes into contact with upper insulating layer 136 when the external force is applied to glass substrate 156.

When the region where upper electrode wiring 154A on projection 170B comes into contact with upper insulating layer 136 is indicated by region R4, the region where upper electrode wiring 154A on projection 170A comes into contact with upper insulating layer 136 is indicated by region R2.

As shown in FIGS. 101 and 103, an area of region R4 is smaller than an area of region R2. In the ninth embodiment as well, highly-sensitive sensor 250A and low-sensitive sensor 250B are arranged to be adjacent to each other and are both pressed by side portion 155B as shown in FIG. 89 above.

Therefore, in FIGS. 100 and 102, an amount of displacement of upper electrode 171A is substantially equal to an amount of displacement of upper electrode 171B. Therefore, in the ninth embodiment as well, output characteristics of pressure sensor 118A and pressure sensor 118B closely resemble the output characteristics of pressure sensor 118A and pressure sensor 118B mounted on liquid crystal display device 100 according to the aforementioned eighth embodiment.

Specifically, the output characteristic of pressure sensor 118B mounted on liquid crystal display device 100 according to the ninth embodiment is indicated by "second output value O2" shown in FIG. 84. The output characteristic of pressure sensor 118A in the ninth embodiment is indicated by "first output value O1".

In liquid crystal display device 100 according to the ninth embodiment as well, highly-sensitive sensor 250A and highly-sensitive sensor 250C are configured to be substantially the same, and low-sensitive sensor 250B and low-sensitive sensor 250D are also configured to be substantially the same.

Therefore, in liquid crystal display device 100 according to the ninth embodiment as well, even when manufacturing variations occur, the load applied to glass substrate 156 can be detected, similarly to liquid crystal display device 100 according to the aforementioned first embodiment.

Tenth Embodiment

Liquid crystal display device 100 according to a tenth embodiment will be described with reference to FIGS. 104 to 106. The same reference characters are given to the components shown in FIGS. 104 to 106 that are the same as or corresponding to those shown in FIGS. 1 to 103 above, and description thereof will not be repeated.

An electrical circuit of liquid crystal display device 100 according to the tenth embodiment is the same as that in FIG. 86 above.

Figure 104:
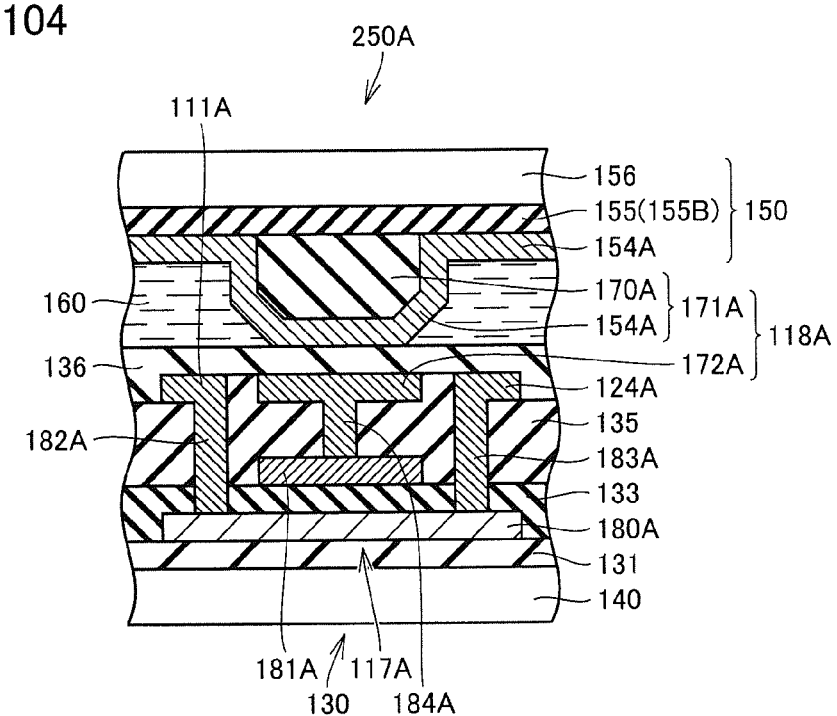
FIG. 104 is a cross-sectional view of highly-sensitive sensor 250A of liquid crystal display device 100 according to a tenth embodiment.

FIG. 104 is a cross-sectional view of highly-sensitive sensor 250A of liquid crystal display device 100 according to the tenth embodiment. As shown in this FIG. 104, projection 170A includes a cylindrical body portion and a tip shaped like a truncated cone and formed at a lower end of this body portion. This tip is formed to have such a shape that a diameter thereof is reduced with decreasing distance to lower electrode 172A, and a circumferential surface of the tip is formed to be tapered.

When glass substrate 156 is pressed by the user, the tip deforms and the contact area between upper electrode wiring 154A and upper insulating layer 136 increases. After the deformation of the tip is completed, the body portion of projection 170A deforms. Since the body portion of projection 170A is formed to be cylindrical, the contact area between upper insulating layer 136 and upper electrode wiring 154A hardly fluctuates even when the body portion deforms.

Even when glass substrate 156 is further pressed after the deformation of the tip, the capacitance between upper electrode 171A and lower electrode 172A hardly changes.

Figure 105:
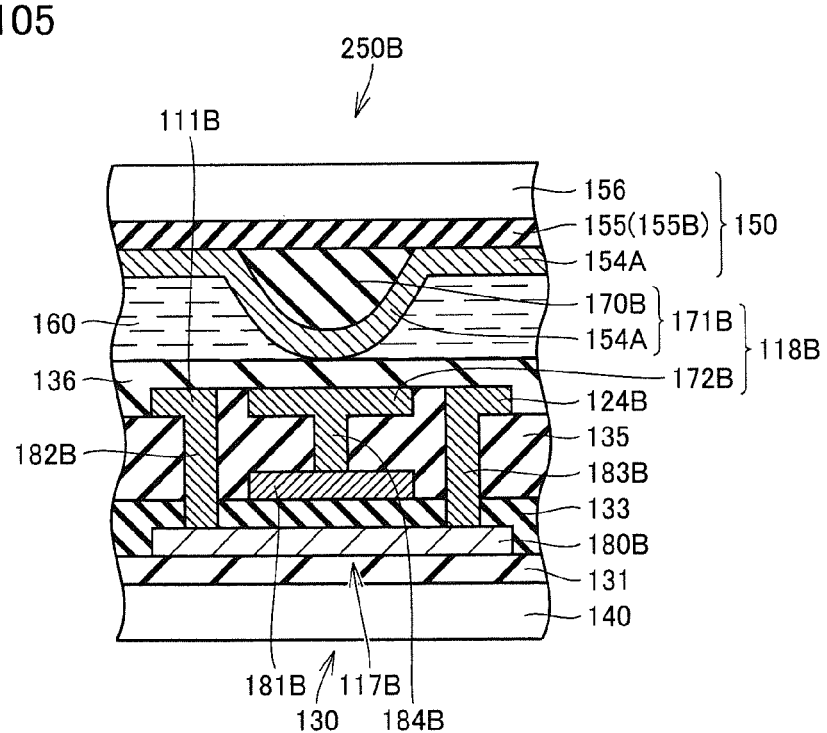
FIG. 105 is a cross-sectional view of low-sensitive sensor 250B of liquid crystal display device 100 according to the tenth embodiment.

FIG. 105 is a cross-sectional view of low-sensitive sensor 250B of liquid crystal display device 100 according to the tenth embodiment. As shown in this FIG. 105, projection 170B is formed similarly to projection 170A described in the aforementioned eighth and ninth embodiments. Specifically, projection 170B is formed to have a bowl shape. This projection 170B is formed such that a cross section in the direction vertical to the protruding direction is circular and such that a diameter thereof is reduced with decreasing distance to lower electrode 172B.

A width (diameter) of a root portion of projection 170A shown in FIG. 104 and a width (diameter) of a root portion of projection 170B shown in FIG. 105 are substantially the same.

Figure 106:
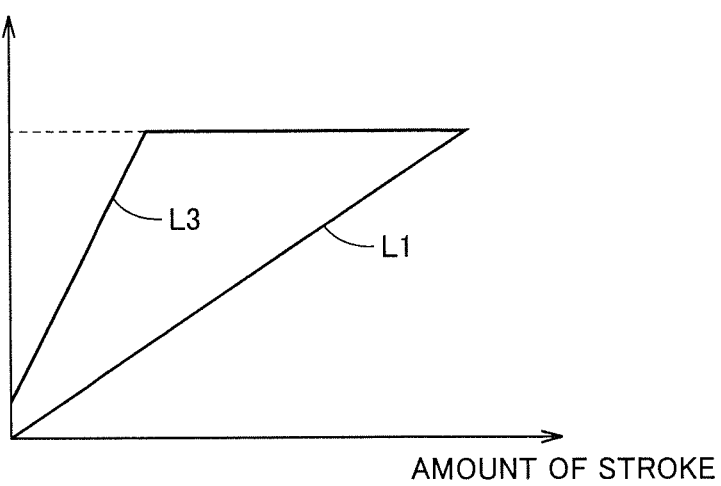
FIG. 106 is a graph showing a characteristic of pressure sensor 118A shown in FIG. 104 and a characteristic of pressure sensor 118B shown in FIG. 105.

FIG. 106 is a graph showing a characteristic of pressure sensor 118A shown in FIG. 104 and a characteristic of pressure sensor 118B shown in FIG. 105.

In FIG. 106, the horizontal axis indicates an amount of stroke of the upper electrode and the vertical axis indicates a capacitance between the upper electrode and the lower electrode of each pressure sensor. In the graph shown in FIG. 106, the characteristic of pressure sensor 118A is indicated by L3 and the characteristic of pressure sensor 118B is indicated by L1.

As shown in this FIG. 106, it can be seen that in pressure sensor 118A, the capacitance between the upper electrode and the lower electrode increases sharply when the upper electrode is slightly displaced. When the capacitance change rate reaches a predetermined value, the change in the capacitance between upper electrode 171A and lower electrode 172A of pressure sensor 118A stops.

As described above, even when the pressing force applied to glass substrate 156 is small, the capacitance of pressure sensor 118A is large. Therefore, even when the user's finger touches the screen, the contact of the finger can be reliably sensed.

When the load applied to glass substrate 156 is small, the capacitance change rate of pressure sensor 118A is larger than the capacitance change rate of pressure sensor 118B. Therefore, even when the small load applied to glass substrate 156 fluctuates, the capacitance of pressure sensor 118A fluctuates greatly and the change in the applied load can be accurately sensed.

Specifically, an amount of current outputted from output element 117A fluctuates greatly, and by sensing this amount of current, the change in the load can be grasped even when the load applied to glass substrate 156 is small.

On the other hand, even after the change in pressure sensor 118A stops, the capacitance between upper electrode 171B and lower electrode 172B increases when glass substrate 156 is further pressed.

Therefore, even when the large pressing force is applied to glass substrate 156 such as when glass substrate 156 is pressed by a pen or the like, the applied load can be obtained by sensing the amount of current from output element 117B.

In the state where glass substrate 156 is not pressed, the contact area between upper electrode wiring 154A of upper electrode 171A and upper insulating layer 136 is larger than the contact area between upper electrode wiring 154A of upper electrode 171B and upper insulating layer 136. Therefore, as shown in FIG. 106, in the initial state, the capacitance between upper electrode 171A and lower electrode 172A of pressure sensor 118A is larger than the capacitance between upper electrode 171B and lower electrode 172B of pressure sensor 118B.

A predetermined voltage is applied in advance to gate electrode 181A connected to lower electrode 172A, in order that the capacitance between upper electrode 171A and lower electrode 172A can be large from the initial state.

When glass substrate 156 is slightly pressed and the potential of lower electrode 172B slightly rises in such a state, a threshold voltage of output element 117A is exceeded. With such a configuration, even when very small pressing force is applied by the finger or the like, this pressing force can be sensed.

Eleventh Embodiment

Liquid crystal display device 100 according to an eleventh embodiment will be described with reference to FIGS. 107 to 120. The same reference characters are given to the components shown in FIGS. 107 to 120 that are the same as or corresponding to those shown in FIGS. 1 to 106 above, and description thereof will not be repeated.

Figure 107:
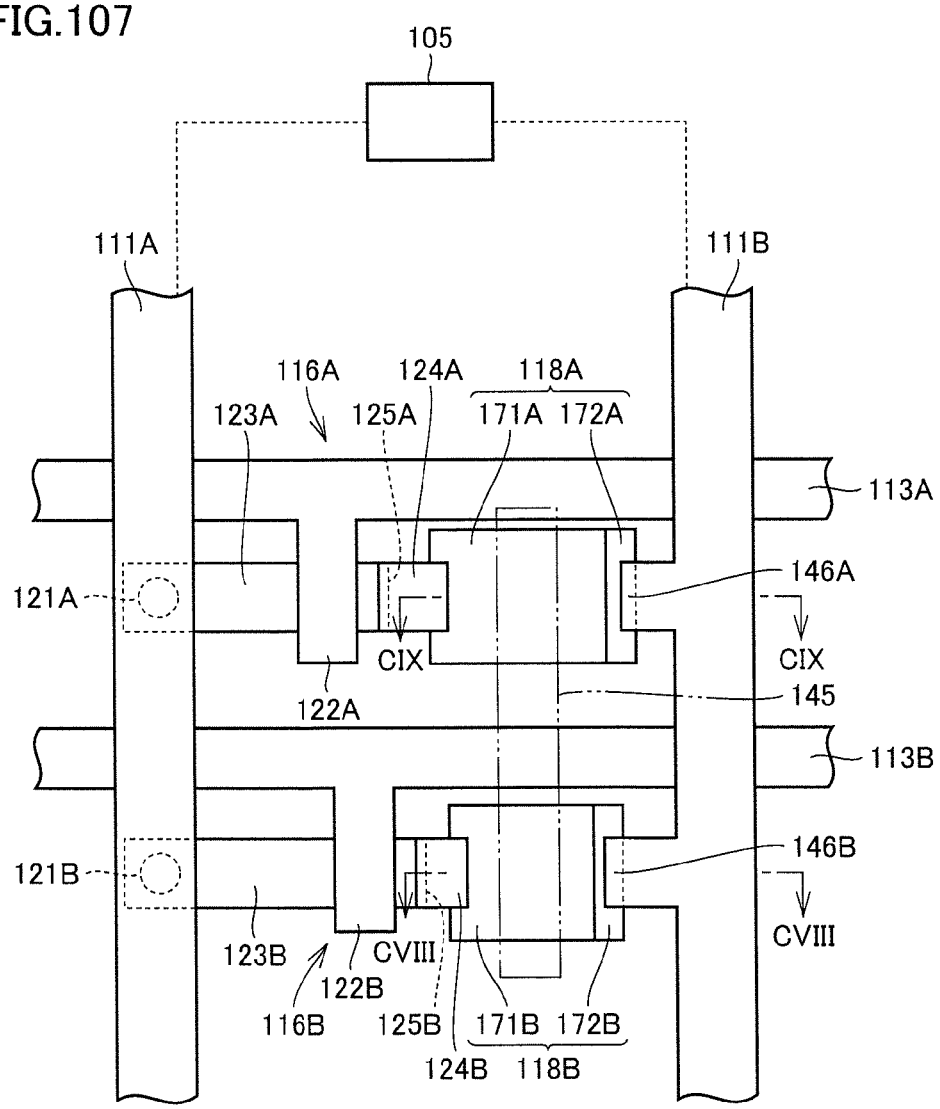
FIG. 107 is a plan view of TFT array substrate 130 of liquid crystal display device 100 according to an eleventh embodiment and is a plan view showing pressure sensor 118A and pressure sensor 118B.
Figure 108:
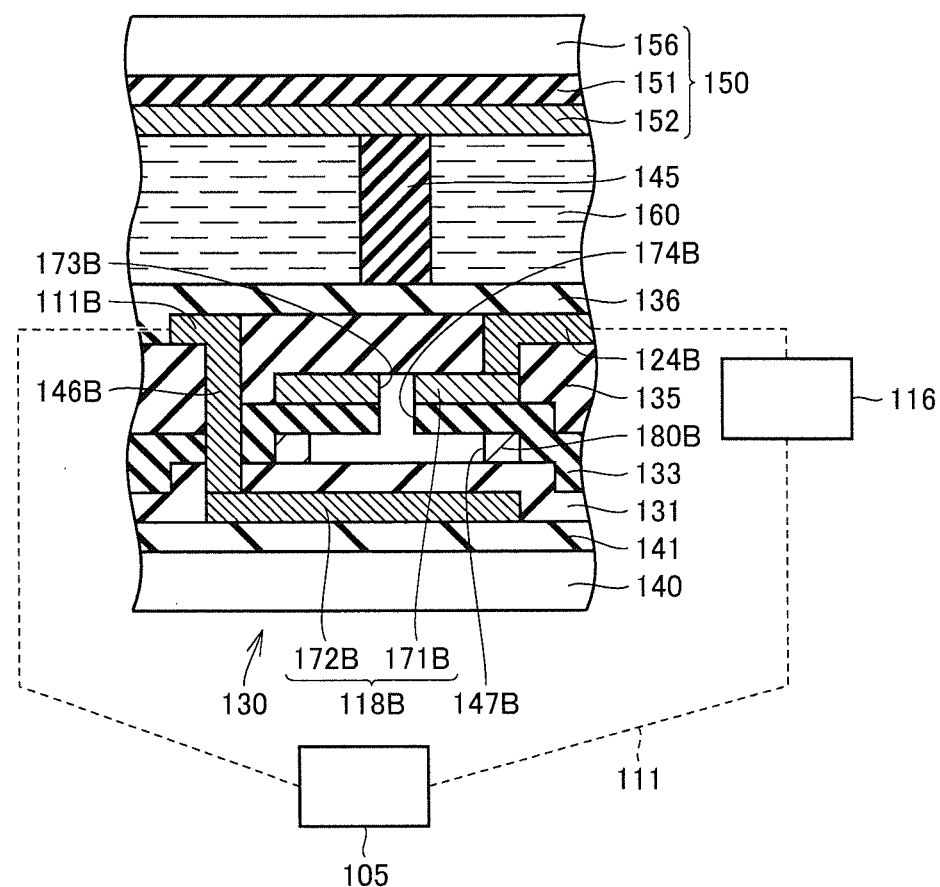
FIG. 108 is a cross-sectional view taken along line CVIII-CVIII in FIG. 107.
Figure 109:
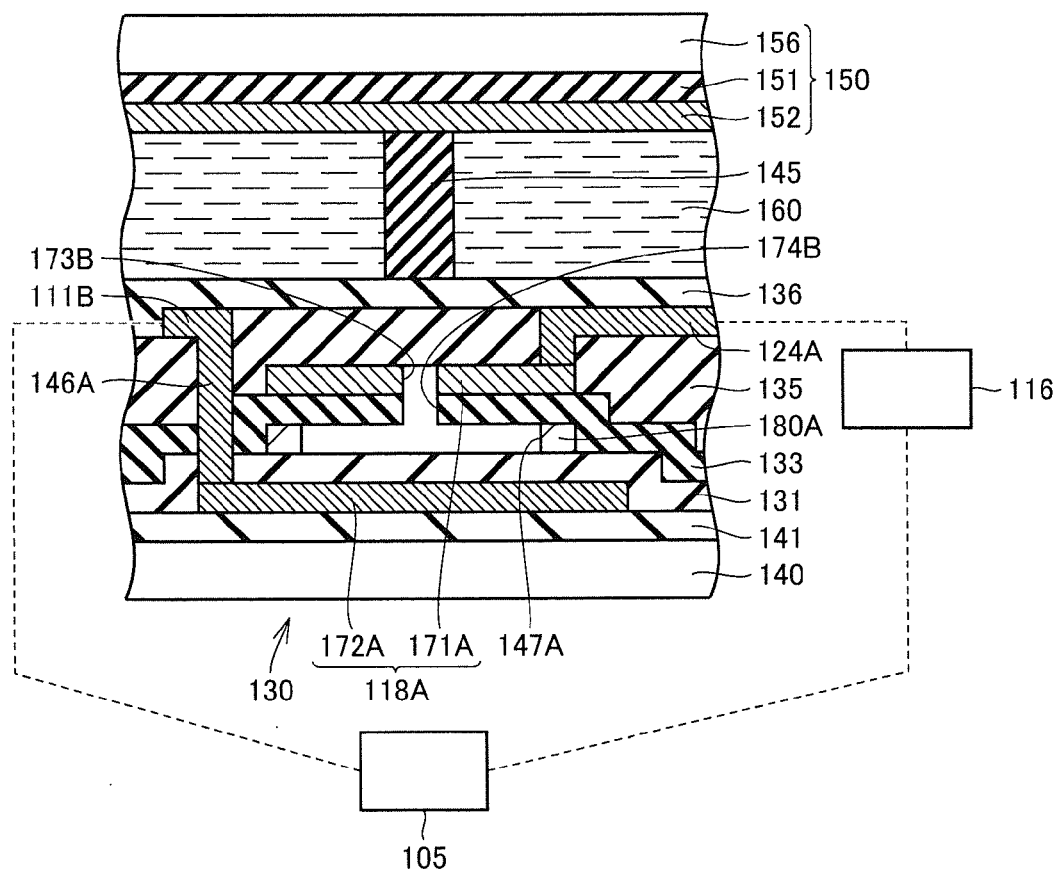
FIG. 109 is a cross-sectional view taken along line CIX-CIX shown in FIG. 107.

FIG. 107 is a plan view of TFT array substrate 130 of liquid crystal display device 100 according to the eleventh embodiment and is a plan view showing pressure sensor 118A and pressure sensor 118B. FIG. 108 is a cross-sectional view taken along line CVIII-CVIII in FIG. 107. FIG. 109 is a cross-sectional view taken along line CIX-CIX in FIG. 107.

As shown in FIG. 108, pressure sensor 118B includes lower electrode 172B, and upper electrode 171B spaced apart from lower electrode 172B and arranged on the glass substrate 156 side. As shown in FIG. 109, pressure sensor 118A includes lower electrode 172A, and upper electrode 171A spaced apart from this lower electrode 172A and arranged on the glass substrate 156 side.

As shown in FIG. 107, pressure sensor 118A and pressure sensor 118B are formed in TFT array substrate 130 to be adjacent to each other.

Pressure sensor 118A is connected to TFT element for selection 116A and source line 111B, and pressure sensor 118B is connected to TFT element for selection 116B and source line 111B.

Source electrode 121A of TFT element for selection 116A is connected to source line 111A, and drain electrode 125A of TFT element for selection 116A is connected to upper electrode 171A by connection wiring 124A. Lower electrode 172A of pressure sensor 118A is connected to source line 111B by a contact 146A.

Now, TFT element for selection 116A is turned on, a predetermined voltage is applied to source line 111A, and a potential of source line 111B is measured. Thereby, the capacitance of pressure sensor 118A can be sensed.

As shown in FIG. 107, pressure sensor 118B is connected to TFT element for selection 116B and source line 111B.

Source electrode 121B of TFT element for selection 116B is connected to source line 111A, and drain electrode 125B of TFT element for selection 116B is connected to upper electrode 171B by connection wiring 124B. Lower electrode 172B of pressure sensor 118B is connected to source line 111B by a contact 146B.

Similarly, TFT element for selection 116B is turned on, a predetermined voltage is applied to source line 111A, and a potential of source line 111B is measured. Thereby, the capacitance of pressure sensor 118B can be sensed.

As shown in FIG. 109, pressure sensor 118A includes lower electrode 172A formed on the upper surface of underlying layer 141, and upper electrode 171A located above lower electrode 172A and arranged to face lower electrode 172A. A recess 147A is formed under upper electrode 171A to permit deflection of upper electrode 171A. Semiconductor layer 180A includes a first support unit supporting one side portion of upper electrode 171A and a second support unit supporting the other side portion of upper electrode 171B, and recess 147A is formed between these first support unit and second support unit. Lower electrode 172A is covered with underlying layer 131A. Lower electrode 172A is formed in the shape of a flat plate.

A portion of underlying layer 131 located on lower electrode 172A extends along the upper surface of lower electrode 172A and is formed into a flat surface.

Contact 146A is connected to lower electrode 172A and this contact 146A is formed to reach the upper surface of interlayer dielectric 135. An upper end of contact 146A is connected to source line 111B formed on the upper surface of interlayer dielectric 135.

Upper electrode 171A is formed on the upper surface of gate insulating layer 133, and recess 147A is formed between upper electrode 171A and lower electrode 172A and between gate insulating layer 133 and underlying layer 131.

Upper electrode 171A is formed in the shape of a flat plate. A portion of gate insulating layer 133 located under upper electrode 171A extends along a lower surface of upper electrode 171A and is formed into a flat surface.

Connection wiring 124A is connected to upper electrode 171A, and this connection wiring 124A is connected to the drain electrode of TFT element for selection 116A.

Upper insulating layer 136 is formed to cover source line 111B connected to lower electrode 172A and connection wiring 124A.

In FIG. 108, a recess 147B is formed between upper electrode 171B and lower electrode 172B. Semiconductor layer 180B includes a third support unit supporting one side portion of upper electrode 171B and a fourth support unit supporting the other side portion of upper electrode 171B. Recess 147B is formed between these third support unit and fourth support unit.

A spacing between the first support unit and the second support unit of semiconductor layer 180A that defines recess 147A shown in FIG. 109 is formed to be larger than a spacing between the third support unit and the fourth support unit of semiconductor layer 180B that defines recess 147B shown in FIG. 108.

Figure 110:
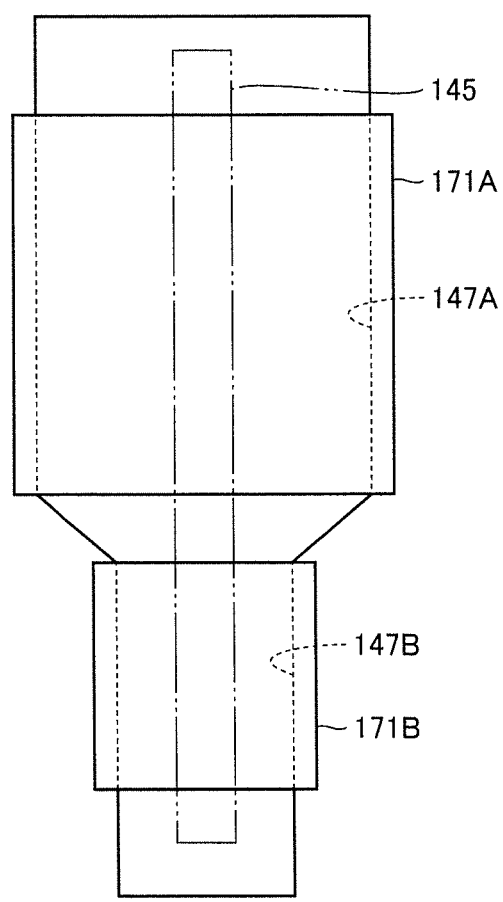
FIG. 110 is a plan view schematically showing an upper electrode 171A and an upper electrode 171B.

FIG. 110 is a plan view schematically showing upper electrode 171A and upper electrode 171B. As shown in this FIG. 110, upper electrode 171A is formed to have an area larger than an area of upper electrode 171B.

Pressing member 145 can press pressure sensor 118A and pressure sensor 118B, and pressing member 145 extends from an upper surface of upper electrode 171A to an upper surface of upper electrode 171B. Recess 147A and recess 147B are formed to communicate with each other.

When glass substrate 156 is pressed by the user, pressing member 145 is displaced downward. As a result of downward displacement of pressing member 145, upper electrode 171A and upper electrode 171B are pressed by pressing member 145 and upper electrode 171A and upper electrode 171B deflect. At this time, an amount of deflection of upper electrode 171A is substantially equal to an amount of deflection of upper electrode 171B because a member separating recess 147A and recess 147B is not present between recess 147A and recess 147B. Pressing member 145 is made of a resin such as an acrylic resin.

Figure 111:
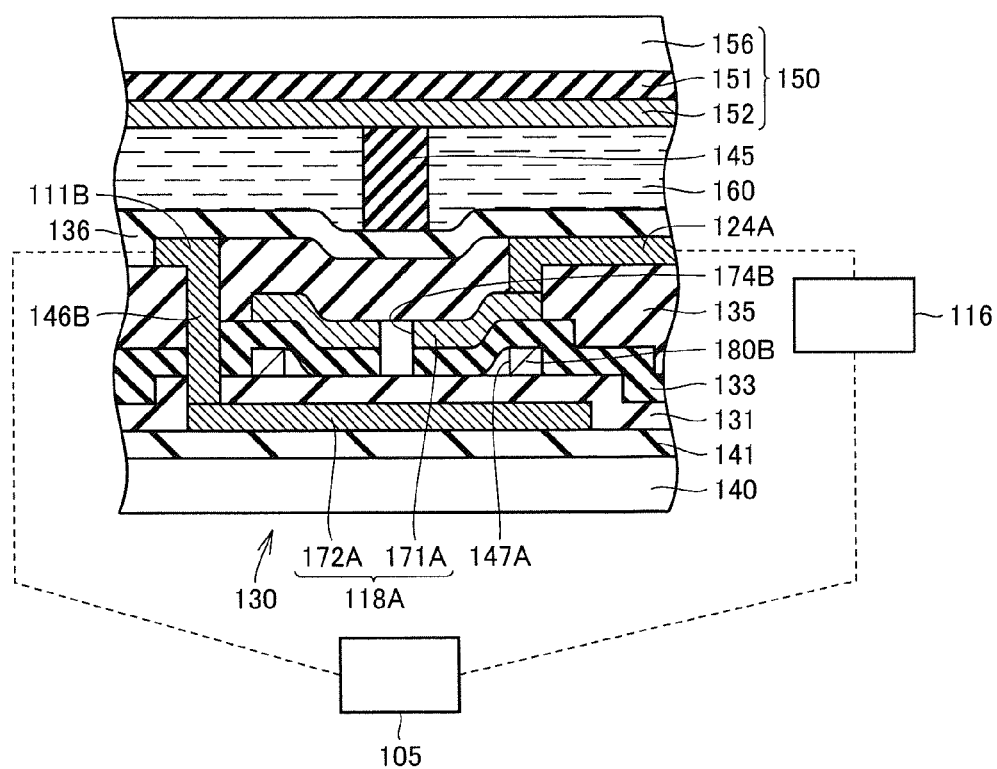
FIG. 111 is a cross-sectional view schematically showing a state of liquid crystal display device 100 when common substrate 150 is pressed.

FIG. 111 is a cross-sectional view schematically showing a state of liquid crystal display device 100 when common substrate 150 is pressed.

As shown in this FIG. 111, when pressing member 145 presses the upper surface of TFT array substrate 130, upper electrode 171A and gate insulating layer 133 located under this upper electrode 171A deflect.

Then, gate insulating layer 133 located under upper electrode 171A abuts underlying layer 131 located on lower electrode 172A, and upper electrode 171A deforms.

Figure 112:
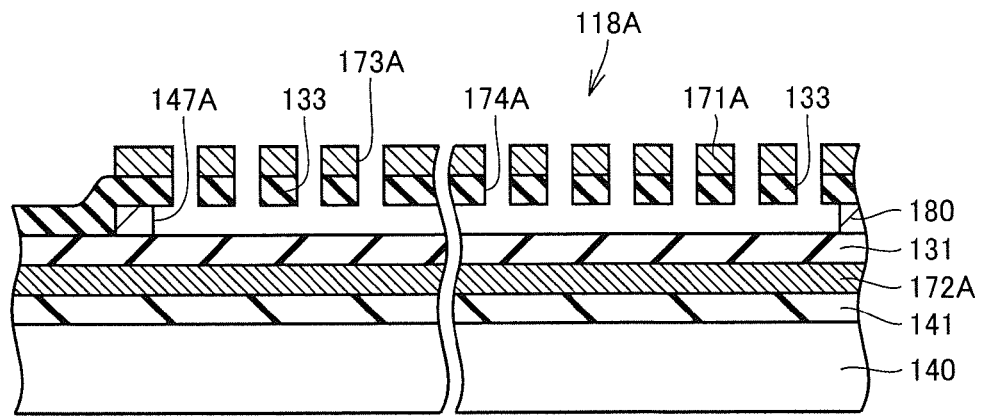
FIG. 112 is a cross-sectional view showing upper electrode 171A and gate insulating layer 133 before upper electrode 171A and gate insulating layer 133 are deformed by the pressing force from pressing member 145.

FIG. 112 is a cross-sectional view showing upper electrode 171A and gate insulating layer 133 before upper electrode 171A and gate insulating layer 133 are deformed by the pressing force from pressing member 145.

As shown in this FIG. 112, a plurality of holes 173A and 174A are formed in upper electrode 171A and gate insulating layer 133. Holes 173A and holes 174A are formed to communicate with one another.

Figure 113:
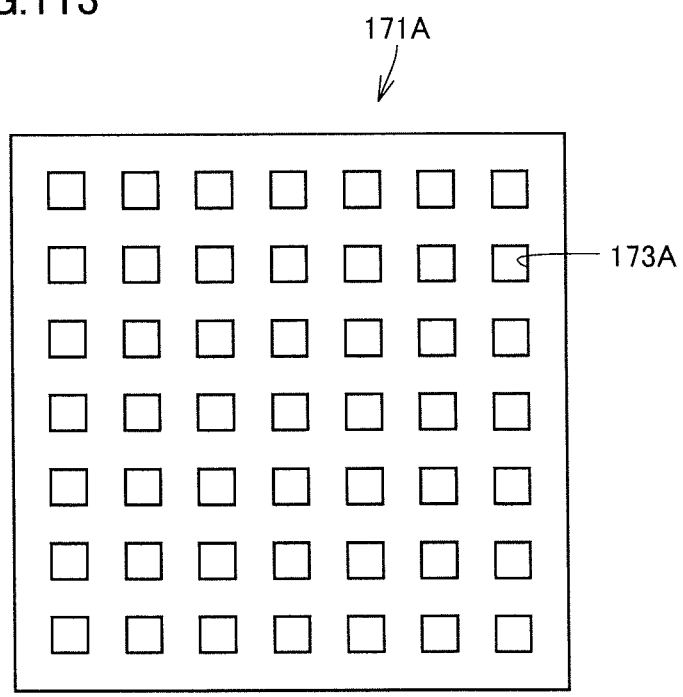
FIG. 113 is a plan view of upper electrode 171A.

FIG. 113 is a plan view of upper electrode 171A. As shown in this FIG. 113, upper electrode 171A is formed to have a substantially square shape, and hole 173A formed in upper electrode 171A is also formed to have a square shape. Holes 173A are formed in upper electrode 171A to be evenly distributed. One side of upper electrode 171A has a length of, for example, approximately 30 μm and one side of hole 173A has a length of, for example, approximately 2 μm. Upper electrode 171A is formed to have a width larger than a width of gate electrode 134. Therefore, upper electrode 171A is easily deformed by the external pressing force.

Upper electrode 171A is formed to have a film thickness of, for example, 50 nm or more and 600 nm or less, and preferably 100 nm or more and 500 nm or less.

As described above, upper electrode 171A is formed to have a length of a side that is much larger than a thickness of upper electrode 171A. Therefore, upper electrode 171A can deform to easily deflect when a central portion of the upper surface of upper electrode 171A is pressed.

Upper electrode 171A is made of a metal material that is the same as that of the gate electrode. Upper electrode 171A is formed of, for example, a metal layer made of tungsten (W), tantalum (Ta), titanium (Ti), molybdenum (Mo) and the like, or an alloy containing an element such as tungsten (W), tantalum (Ta), titanium (Ti), and molybdenum (Mo), or a compound containing tungsten (W), tantalum (Ta), titanium (Ti), and molybdenum (Mo).

Preferably, upper electrode 171A and the gate electrode are formed of a tungsten (W) layer having a thickness of approximately 370 nm and a TaN (tantalum nitride) layer having a thickness of approximately 50 nm and formed on this tungsten (W) layer.

The shape of upper electrode 171A is not limited to the square shape and may be a rectangular shape. Various types of shapes such as a shape of a polygon more than a pentagon, a circular shape, and an oval shape can be used.

Figure 114:
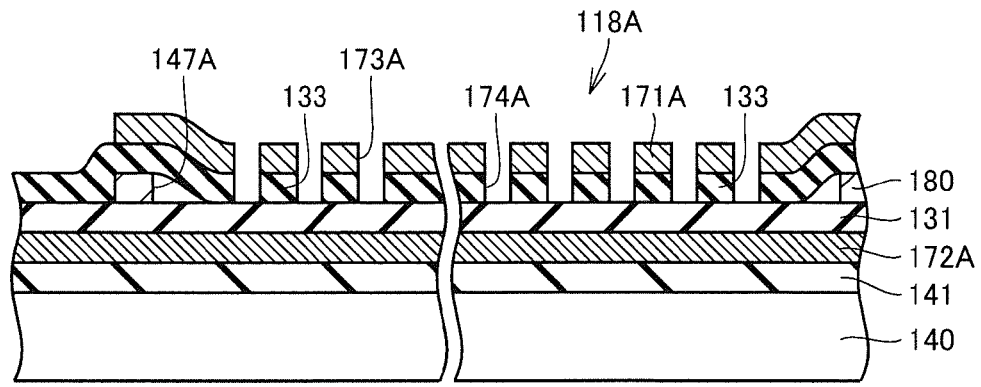
FIG. 114 is a cross-sectional view showing a state where upper electrode 171A and gate insulating layer 133 have been deformed by the pressing force from pressing member 145.

FIG. 114 is a cross-sectional view showing a state where upper electrode 171A and gate insulating layer 133 have been deformed by the pressing force from pressing member 145.

As shown in this FIG. 114, gate insulating layer 133 and upper electrode 171A deflect to go into recess 147A.

An opening edge of recess 147A is slightly smaller than an outer edge of upper electrode 171A and most of upper electrode 171A deflects to enter recess 147A.

Recess 147A is formed by a hole formed in semiconductor layer 180 and the upper surface of underlying layer 131. Therefore, a height of recess 147A is the same as a thickness of semiconductor layer 180. Semiconductor layer 180 is formed to have a thickness of, for example, 20 nm or more and 200 nm or less, and preferably 30 nm or more and 70 nm or less. The length of one side of upper electrode 171A is much larger than the height of recess 147A.

Therefore, when upper electrode 171A and gate insulating layer 133 slightly deform, gate insulating layer 133 abuts the upper surface of underlying layer 131.

Furthermore, when upper electrode 171A and gate insulating layer 133 are pressed by pressing member 145, most of a portion of gate insulating layer 133 located in recess 147A abuts underlying layer 131 as shown in FIG. 114.

At this time, gate insulating layer 133 deforms to conform to the upper surface of underlying layer 131, and upper electrode 171A located on gate insulating layer 133 also deforms to conform to underlying layer 131.

Since underlying layer 131 is formed into a flat surface along the upper surface of lower electrode 172A, upper electrode 171A deforms into a flat surface to conform to the shape of lower electrode 172A.

Therefore, gate insulating layer 133 and underlying layer 131 are sandwiched between most of upper electrode 171A and lower electrode 172A, and most of upper electrode 171A faces lower electrode 172A with gate insulating layer 133 and underlying layer 131 interposed therebetween.

Figure 115:
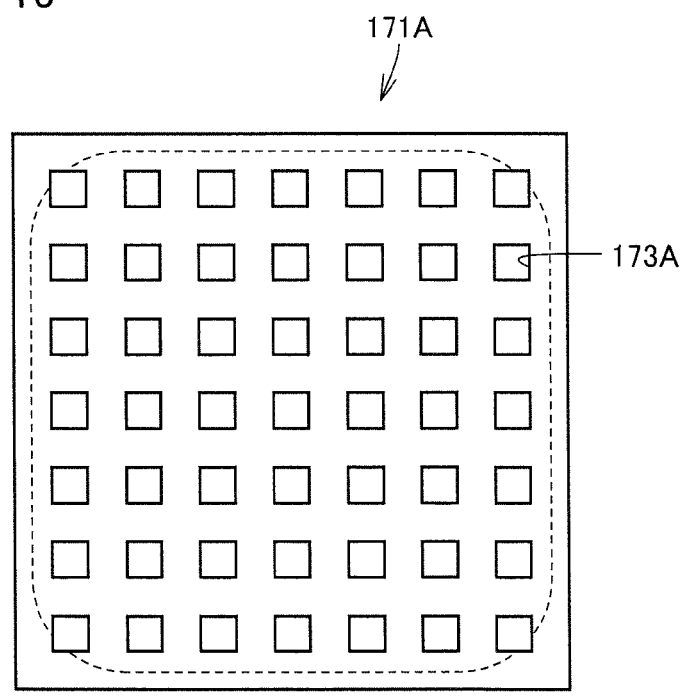
FIG. 115 is a plan view of upper electrode 171A when upper electrode 171A has been deformed as shown in FIG. 114.

FIG. 115 is a plan view of upper electrode 171A when upper electrode 171A has been deformed as shown in FIG. 114. In this FIG. 115, a region enclosed by a broken line represents a region where upper electrode 171A has deformed to conform to the upper surface of lower electrode 172A, and this region enclosed by the broken line is a region facing gate insulating layer 133 and lower electrode 172A with underlying layer 131 interposed therebetween.

As shown in this FIG. 115, as a result of slight deformation of upper electrode 171A, most of upper electrode 171A deforms to conform to lower electrode 172A.

When pressing member 145 is slightly displaced downward, an area of this region enclosed by the broken line increases sharply. Therefore, the capacitance between upper electrode 171A and lower electrode 172A also increases sharply.

Figure 116:
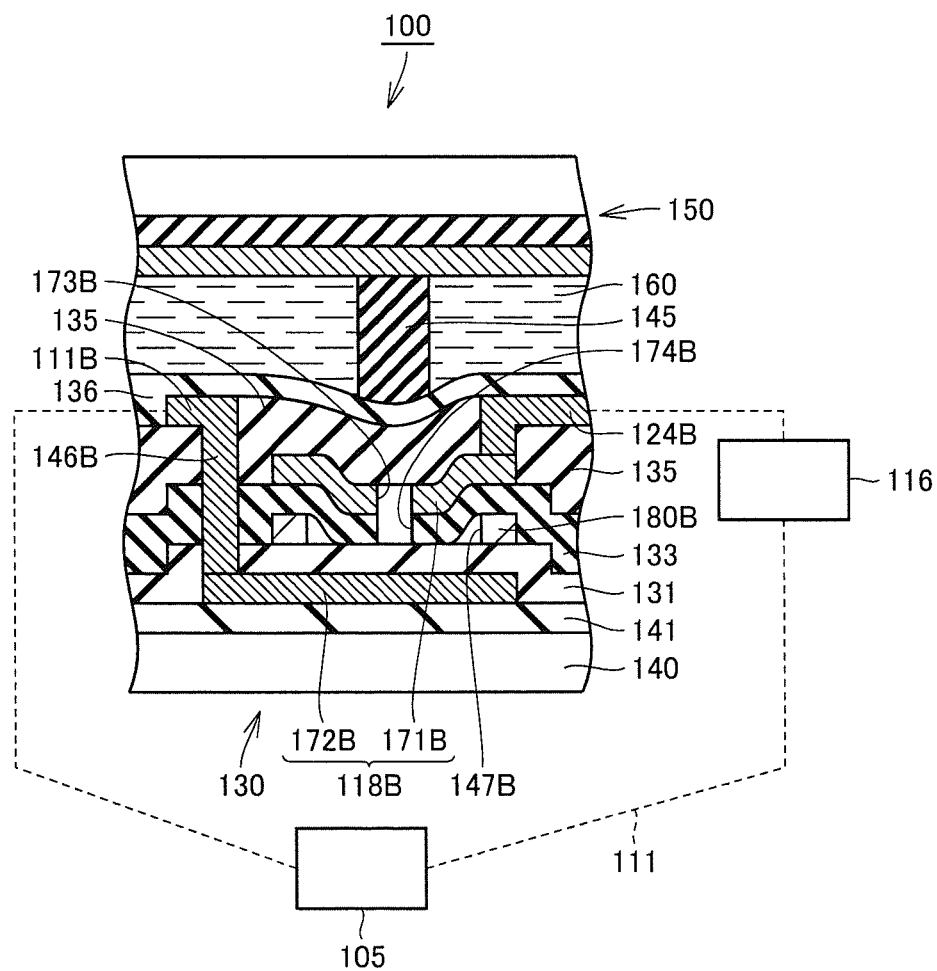
FIG. 116 is a cross-sectional view showing a state of pressure sensor 118B when common substrate 150 is pressed.

FIG. 116 is a cross-sectional view showing a state of pressure sensor 118B when common substrate 150 is pressed. In this FIG. 116, a thickness of upper electrode 171B is substantially the same as a thickness of upper electrode 171A, and upper electrode 171B is made of substantially the same material as that of upper electrode 171A.

When common substrate 150 is pressed by the user, upper electrode 171B is pressed by pressing member 145 and upper electrode 171B deforms to deflect.

As described above, an amount of displacement of pressing member 145 on the upper electrode 171A side is substantially the same as an amount of displacement of pressing member 145 on the upper electrode 171B side. Therefore, an amount of deflection of upper electrode 171A is substantially equal to an amount of deflection of upper electrode 171B. A depth of recess 147B is substantially the same as a depth of recess 147A.

Therefore, when common substrate 150 is pressed, upper electrode 171B deforms to conform to the shape of lower electrode 172B in pressure sensor 118B as well, similarly to pressure sensor 118A.

Figure 117:
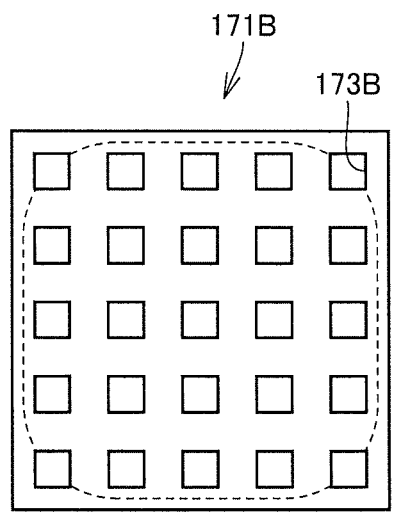
FIG. 117 is a plan view of upper electrode 171B.

FIG. 117 is a plan view of upper electrode 171B. A region enclosed by a broken line shown in this FIG. 117 represents a region where upper electrode 171B has deformed to conform to the upper surface of lower electrode 172B, and this region enclosed by the broken line is a region where upper electrode 171B faces lower electrode 172B with underlying layer 131 and gate insulating layer 133 interposed therebetween.

In this FIG. 117 and FIG. 115 above, it can be seen that as a result of pressing by the pressing member, an area of a region where upper electrode 171A faces lower electrode 172A is larger than an area of a region where upper electrode 171B faces lower electrode 172B.

Therefore, when common substrate 150 is pressed, the capacitance between upper electrode 171A and lower electrode 172A fluctuates more greatly than the capacitance between upper electrode 171B and lower electrode 172B.

Figure 118:
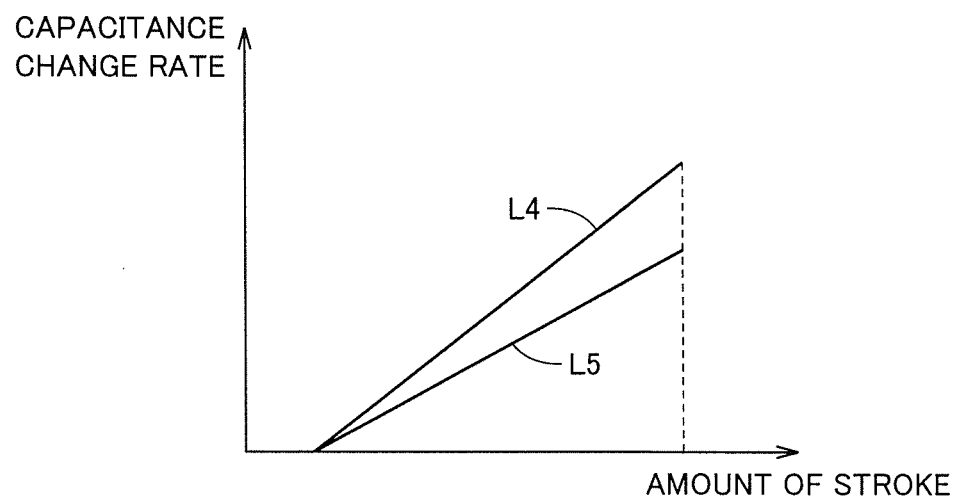
FIG. 118 is a graph showing characteristics of pressure sensor 118A and pressure sensor 118B.

FIG. 118 is a graph showing characteristics of pressure sensor 118A and pressure sensor 118B. In this FIG. 118, the horizontal axis indicates amounts of stroke of upper electrode 171A and upper electrode 171B, and the vertical axis indicates a capacitance change rate between upper electrode 171A and lower electrode 172A as well as a capacitance change rate between upper electrode 171B and lower electrode 172B. The capacitance change rate between upper electrode 171A and lower electrode 172A is indicated by L4 in the graph, and the capacitance change rate between upper electrode 171B and lower electrode 172B is indicated by L5.

As shown in this graph, it can be seen that the capacitance change rate between upper electrode 171A and lower electrode 172A is larger than the capacitance change rate between upper electrode 171B and lower electrode 172B.

In the initial state, upper electrode 171A is spaced apart from lower electrode 172A. Therefore, when glass substrate 156 starts to be pressed, upper electrode 171A does not deform to conform to lower electrode 172A although upper electrode 171A comes closer to lower electrode 172A.

When upper electrode 171A only comes closer to lower electrode 172A, the capacitance change rate between upper electrode 171A and lower electrode 172A is small.

When gate insulating layer 133 located under upper electrode 171A comes into contact with underlying layer 131, upper electrode 171A starts to deform to conform to lower electrode 172A.

As described above, when upper electrode 171A starts to deform, the capacitance change rate between upper electrode 171A and lower electrode 172A increases, and the capacitance change rate starts to increase as shown in the graph in FIG. 117.

Similarly, the capacitance between upper electrode 171B and lower electrode 172B hardly changes before upper electrode 171B comes into contact with lower electrode 172B. When upper electrode 171B starts to deform to conform to the shape of lower electrode 172B, the capacitance starts to change greatly. Therefore, as shown in FIG. 118, when the amount of stroke is small, the capacitance change rate between upper electrode 171A and lower electrode 172A as well as the capacitance change rate between upper electrode 171B and lower electrode 172B are both small. When the amount of stroke reaches a predetermined value or a larger value, the capacitance change rate starts to increase.

In liquid crystal display device 100 according to the eleventh embodiment, an area of a portion of upper electrode 171A that curves to conform to the shape of lower electrode 172A is proportional to the square of the amount of stroke. On the other hand, the capacitance between the electrodes is proportional to the area. Therefore, the capacitance of pressure sensor 118A and pressure sensor 118B increases in a manner of linear function with respect to the amount of stroke.

As a result of deformation of upper electrode 171A to conform to lower electrode 172A, the capacitance between upper electrode 171A and lower electrode 172A increases in a manner of quadratic function. Similarly, as a result of deformation of upper electrode 171B to conform to the shape of lower electrode 172B, the capacitance between upper electrode 171B and lower electrode 172B also increases in a manner of quadratic function.

The area of the region where upper electrode 171A faces lower electrode 172A is larger than the area of the region where upper electrode 171B faces lower electrode 172B, and in the initial state, a distance between upper electrode 171A and lower electrode 172A is substantially equal to a distance between upper electrode 171B and lower electrode 172B.

Therefore, an initial capacitance between upper electrode 171A and lower electrode 172A in the initial state is larger than an initial capacitance between upper electrode 171B and lower electrode 172B. Since the capacitance change rate between upper electrode 171A and lower electrode 172A is larger than the capacitance change rate between upper electrode 171B and lower electrode 172B as described above, the capacitance between upper electrode 171A and lower electrode 172A is larger than the capacitance between upper electrode 171B and lower electrode 172B.

Therefore, as the amount of stroke increases, a difference between the capacitance between upper electrode 171A and lower electrode 172A and the capacitance between upper electrode 171B and lower electrode 172B increases as well.

Based on the difference between the capacitance between upper electrode 171A and lower electrode 172A and the capacitance between upper electrode 171B and lower electrode 172B, control unit 105 calculates the amount of stroke and the load applied to a portion of glass substrate 156 where pressure sensor 118A and pressure sensor 118B are located.

Figure 119:
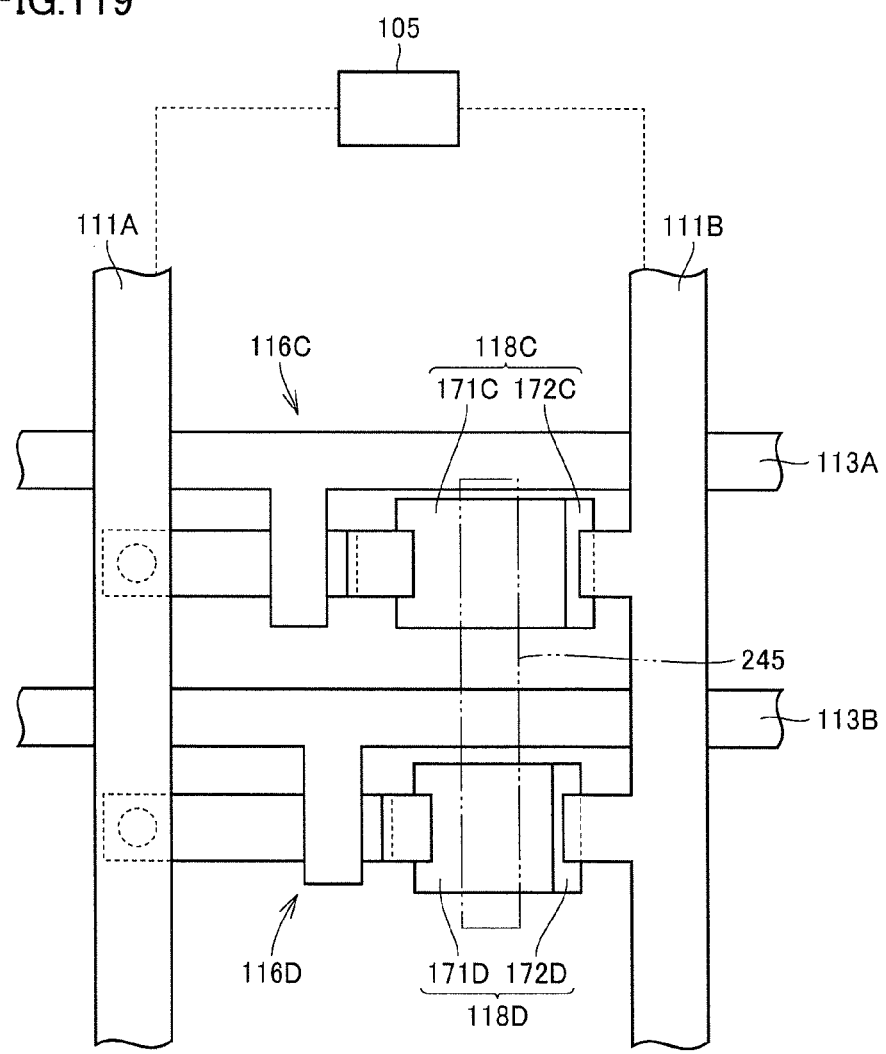
FIG. 119 is a plan view showing a pressure sensor different from pressure sensor 118A and pressure sensor 118B shown in FIG. 107.

FIG. 119 is a plan view showing a pressure sensor different from pressure sensor 118A and pressure sensor 118B shown in FIG. 107. A position shown in FIG. 119 is different from the position shown in FIG. 107.

In this FIG. 119 and FIG. 107 above, a capacitance change characteristic of pressure sensor 118A is substantially the same as a capacitance change characteristic of pressure sensor 118C, and a capacitance change characteristic of pressure sensor 118B is substantially the same as a capacitance change characteristic of pressure sensor 118D.

Pressure sensor 118C includes an upper electrode 171C and a lower electrode 172C, and pressure sensor 118D includes an upper electrode 171D and a lower electrode 172D.

Liquid crystal display device 100 includes a pressing member 245 pressing upper electrode 171C and upper electrode 171D. Therefore, when a portion of glass substrate 156 where pressure sensor 118C and pressure sensor 118D are located is pressed by the user, upper electrode 171C and upper electrode 171D are pressed. An amount of deflection of upper electrode 171C, an amount of deflection of upper electrode 171D and an amount of displacement of pressing member 245 are substantially identical to one another.

Based on a difference between a capacitance of pressure sensor 118C and a capacitance of pressure sensor 118D, control unit 105 calculates a load applied to the portion of glass substrate 156 where pressure sensors 118C and 118D are located, an amount of displacement of this portion and the like.

Because of manufacturing variations and the like, variations may occur between a height of pressing member 245 shown in FIG. 119 and a height of pressing member 145 shown in FIG. 107. A case where the height of pressing member 245 is higher than the height of pressing member 145 will now be discussed.

In this case, even in the state where glass substrate 156 is not pressed by the user, upper electrode 171C and upper electrode 171D are pressed by pressing member 245, and upper electrode 171C and upper electrode 171D deflect.

Therefore, the capacitance of pressure sensor 118C and pressure sensor 118D is larger by, for example, an error capacitance Cl than the capacitance of pressure sensor 118A and pressure sensor 118B.

On the other hand, based on a difference between the capacitance of pressure sensor 118C and the capacitance of pressure sensor 118D, control unit 105 calculates the load applied to each position and the like. Therefore, error capacitance Cl added to pressure sensor 118C and pressure sensor 118D due to an error caused by pressing member 245 does not affect the calculation of the load.

Therefore, occurrence of a difference between the load calculated by pressure sensor 118A and pressure sensor 118B and the load calculated by pressure sensor 118C and pressure sensor 118D is suppressed. Therefore, in liquid crystal display device 100 according to the eleventh embodiment as well, the load applied to each position in glass substrate 156 can be accurately calculated.

As described above, liquid crystal display device 100 according to the eleventh embodiment includes a first pressure sensor, a second pressure sensor having a capacitance change rate smaller than that of this first pressure sensor, a pressing member pressing both the first pressure sensor and the second pressure sensor, and a control unit capable of sensing a difference between a capacitance of the first pressure sensor and a capacitance of the second pressure sensor. With such a configuration, the control unit can precisely calculate a load applied by the user, even when manufacturing variations occur in a height of the pressing member and the like.

In the eleventh embodiment, by forming upper electrode 171A to be an enlarged version of upper electrode 171B as shown in FIG. 110 above, the capacitance change rate of pressure sensor 118A is made higher than the capacitance change rate of pressure sensor 118B. The shape of upper electrode 171A and upper electrode 171B is not, however, limited to the example shown in FIG. 110.

Figure 120:
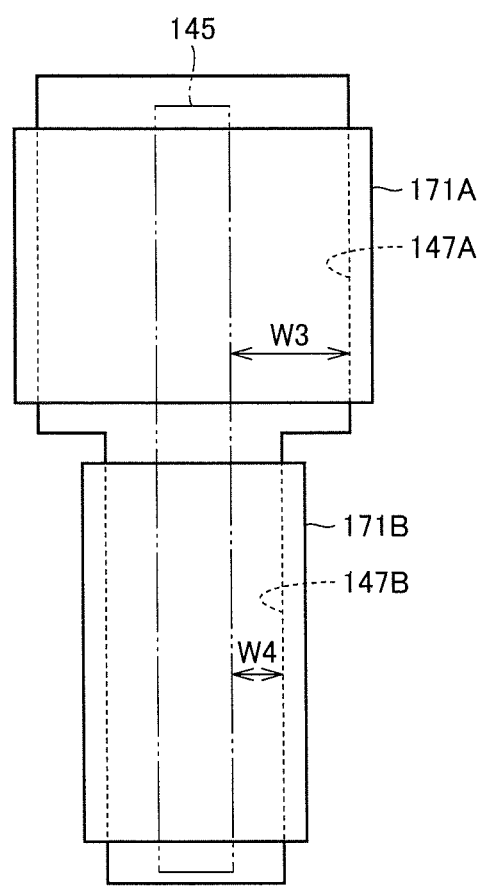

FIG. 120 is a plan view showing a modification of upper electrode 171A of pressure sensor 118A and upper electrode 171B of pressure sensor 118B.

In the example shown in this FIG. 120, a width of upper electrode 171A is larger than a width of upper electrode 171B.

Assume that a distance W3 indicates a distance from a portion of an opening edge of recess 147A that supports upper electrode 171A to pressing member 145. Similarly, assume that a distance W4 indicates a distance from a portion of an opening edge of recess 147B that supports upper electrode 171B. In the example shown in this FIG. 120, distance W3 is formed to be longer than distance W4. A length of upper electrode 171B in the direction in which pressing member 145 extends is longer than a length of upper electrode 171A in the direction in which pressing member 145 extends.

In the example shown in this FIG. 120, a region where upper electrode 171A deforms to conform to the shape of lower electrode 172A is larger than a region where upper electrode 171B deforms to conform to the shape of lower electrode 172B. Therefore, the capacitance change rate of the pressure sensor including upper electrode 171A is higher. As described above, the capacitance change rate of the pressure sensor can be adjusted in accordance with the shape of the upper electrode and the like.

Twelfth Embodiment

Liquid crystal display device 100 according to a twelfth embodiment will be described with reference to FIGS. 121 to 122. The same reference characters are given to the components shown in FIGS. 121 to 122 that are the same as or corresponding to those shown in FIGS. 1 to 120 above, and description thereof will not be repeated.

Figure 121:
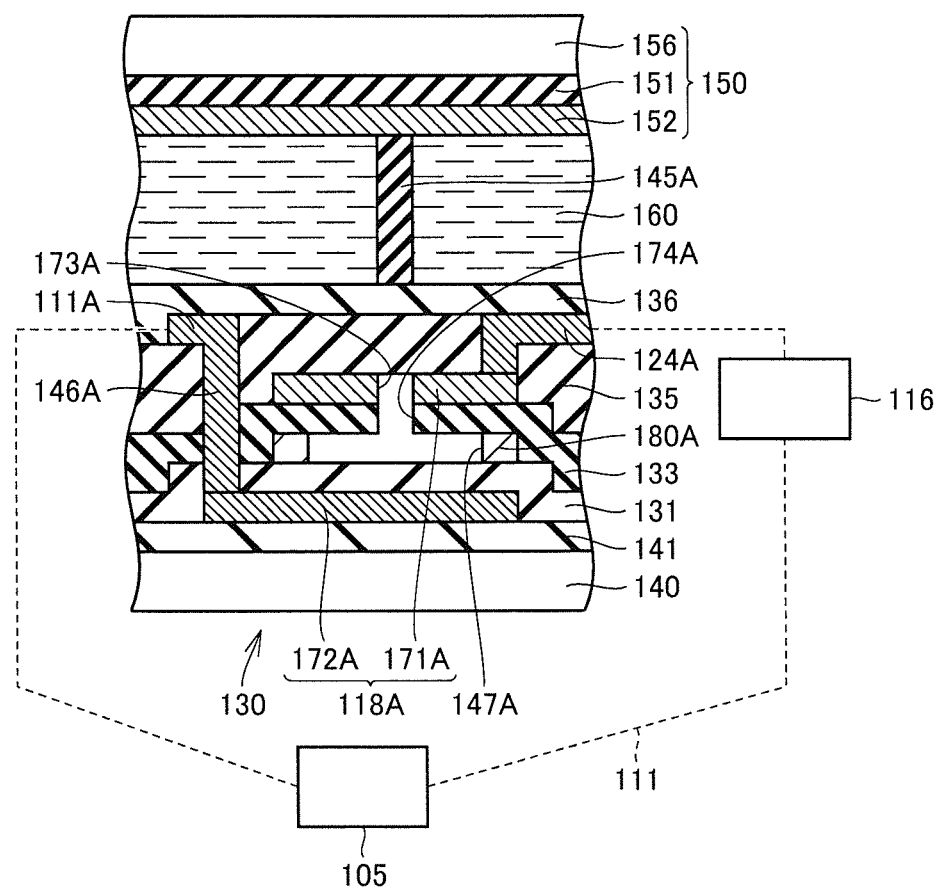

FIG. 121 is a cross-sectional view of liquid crystal display device 100 according to the twelfth embodiment and is a cross-sectional view showing pressure sensor 118A. FIG. 122 is a cross-sectional view of liquid crystal display device 100 according to the twelfth embodiment and is a cross-sectional view showing pressure sensor 118B.

Figure 122:
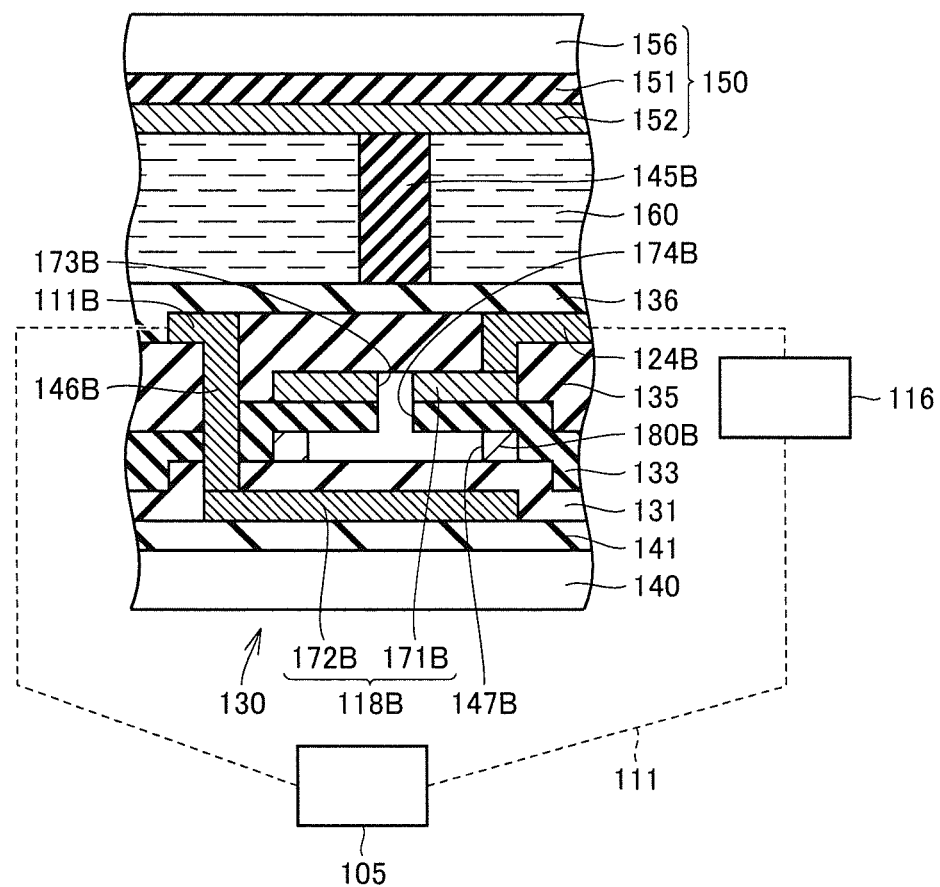

In FIGS. 121 and 122, a width of upper electrode 171A of pressure sensor 118A is formed to be substantially the same as a width of lower electrode 172B of pressure sensor 118B, and upper electrode 171A and upper electrode 171B are formed to have substantially the same shape. On the other hand, a width of pressing member 145A pressing upper electrode 171A is smaller than a width of pressing member 145B pressing upper electrode 171B.

Pressing member 145A and pressing member 145B may be integrally formed similarly to the aforementioned eleventh embodiment.

As a result, a capacitance change rate of pressure sensor 118A pressed by pressing member 145A having a smaller width is higher than a capacitance change rate of pressure sensor 118B pressed by pressing member 145B.

Based on a difference between the capacitance of pressure sensor 118A and the capacitance of pressure sensor 118B, control unit 105 calculates the load applied to a portion of glass substrate 156 where pressure sensor 118A and pressure sensor 118B are located, and the like. As a result, in liquid crystal display device 100 according to the twelfth embodiment as well, an output error of the pressure sensor caused by manufacturing variations and the like can be corrected.

Liquid crystal display device 100 according to the twelfth embodiment includes pressure sensor 118A, pressure sensor 118B arranged to be adjacent to this pressure sensor 118A, pressing member 145A pressing upper electrode 171A of pressure sensor 118A, and pressing member 145B pressing upper electrode 171B of pressure sensor 118B. By making a difference between the width of pressing member 145A and the width of pressing member 145B, a difference is made between the capacitance change rate of pressure sensor 118A and the capacitance change rate of pressure sensor 118B.

Pressing member 145A and pressing member 145B are not limited to the integrally formed pressing member. Pressing member 145A and pressing member 145B may be separately formed.

Thirteenth Embodiment

Liquid crystal display device 100 according to a thirteenth embodiment will be described with reference to FIGS. 123 to 125. The same reference characters are given to the components shown in FIGS. 123 to 125 that are the same as or corresponding to those shown in FIGS. 1 to 122 above, and description thereof will not be repeated.

Figure 123:
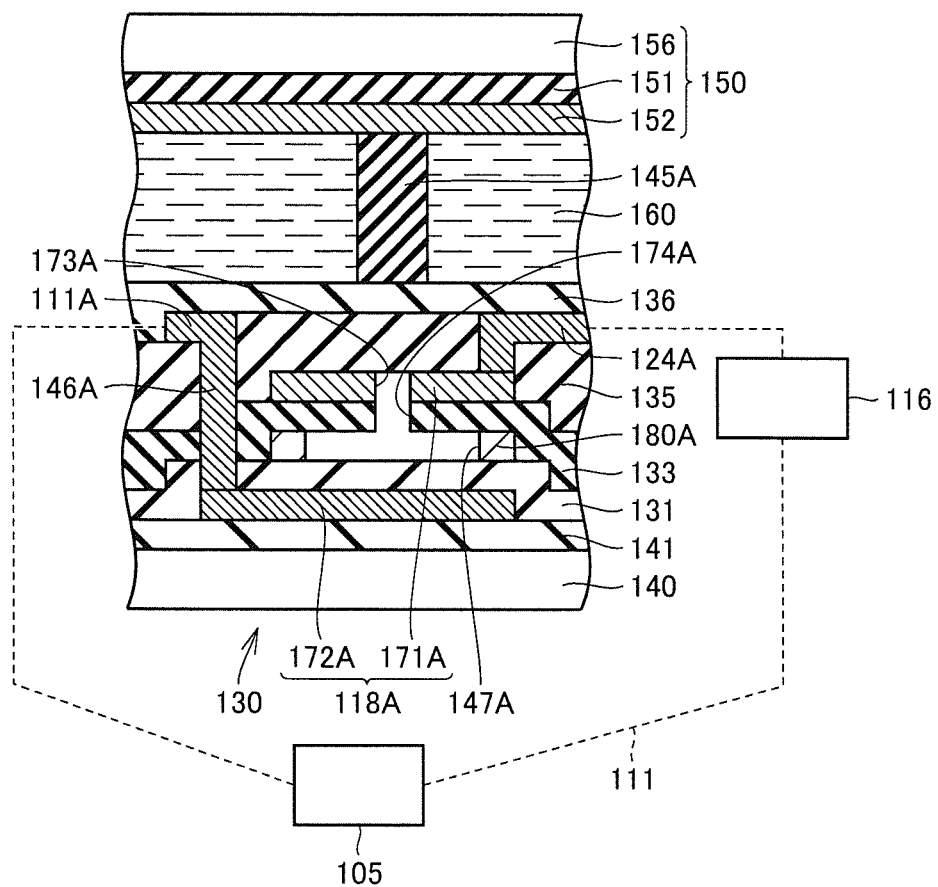

FIG. 123 is a cross-sectional view of liquid crystal display device 100 according to the thirteenth embodiment and is a cross-sectional view showing pressure sensor 118A. FIG. 124 is a cross-sectional view of liquid crystal display device 100 according to the thirteenth embodiment and is a cross-sectional view showing pressure sensor 118B.

Figure 124:
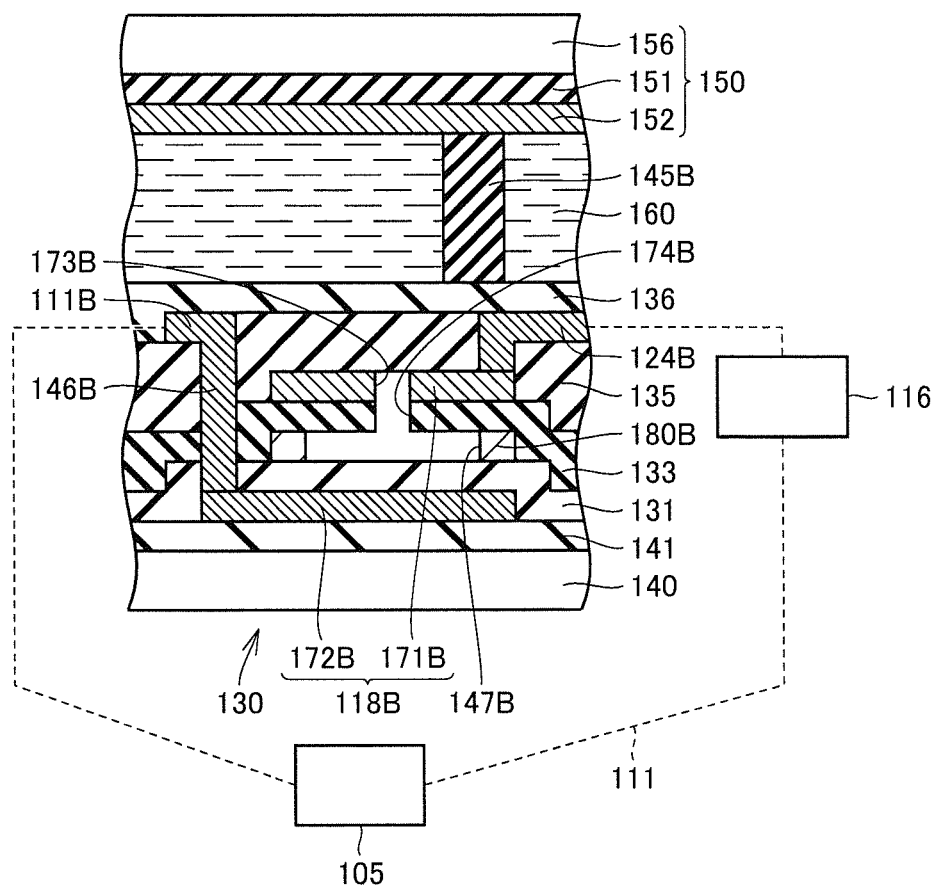

As shown in these FIGS. 123 and 124, a width of pressing member 145A and a width of pressing member 145B are substantially equal. In liquid crystal display device 100 according to the thirteenth embodiment, upper electrode 171A and upper electrode 171B have substantially the same shape.

Pressing member 145A presses a central portion of upper electrode 171A in the width direction, while pressing member 145B presses a position deviated from a central portion of upper electrode 171B in the width direction. Pressing member 145B presses a side portion of upper electrode 171B and its neighboring portion.

Therefore, even when an amount of displacement of pressing member 145A is equal to an amount of displacement of pressing member 145B, an area of a portion of upper electrode 171A that deforms to conform to the shape of lower electrode 172A is larger than an area of a portion of upper electrode 171B that deforms to conform to the shape of lower electrode 172B.

Therefore, with respect to amounts of displacement of upper electrode 171A and upper electrode 171B, the capacitance between upper electrode 171A and lower electrode 172A fluctuates more greatly than the capacitance between upper electrode 171B and lower electrode 172B.

Based on a difference between the capacitance between upper electrode 171A and lower electrode 172A and the capacitance between upper electrode 171B and lower electrode 172B, control unit 105 calculates the pressing force applied to a portion of glass substrate 156 where pressure sensor 118A and pressure sensor 118B are provided and an amount of displacement of this portion.

Figure 125:
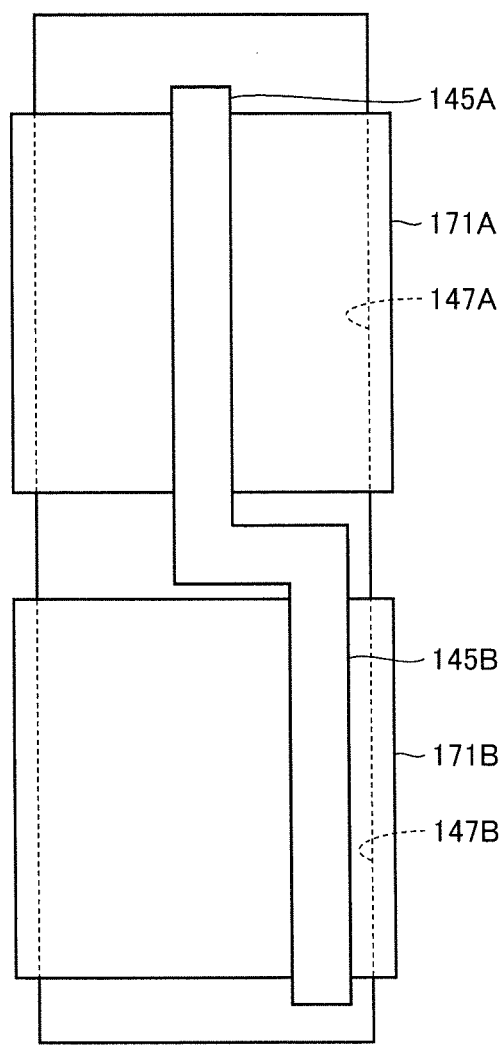

FIG. 125 is a plan view schematically showing an arrangement relationship between upper electrodes 171A and 171B and pressing members 145A and 145B. As shown in this FIG. 125, pressing member 145A and pressing member 145B are integrally formed. Therefore, when glass substrate 156 is pressed by the user, the amount of displacement of pressing member 145A and the amount of displacement of pressing member 145B are substantially equal.

In liquid crystal display device 100 according to the thirteenth embodiment as well, a plurality of pressure detecting elements including two pressure sensors 118A and 118B are arranged. The pressing member is arranged for each pressure detecting element. Even when variations occur in a height of each pressing member, control unit 105 can accurately sense the pressing force applied to glass substrate 156, similarly to liquid crystal display device 100 according to the aforementioned embodiments.

Fourteenth Embodiment

Liquid crystal display device 100 according to a fourteenth embodiment of the present invention will be described with reference to FIGS. 126 to 128. The same reference characters are given to the components shown in FIGS. 126 to 128 that are the same as or corresponding to those shown in FIGS. 1 to 125 above, and description thereof will not be repeated.

Figure 126:
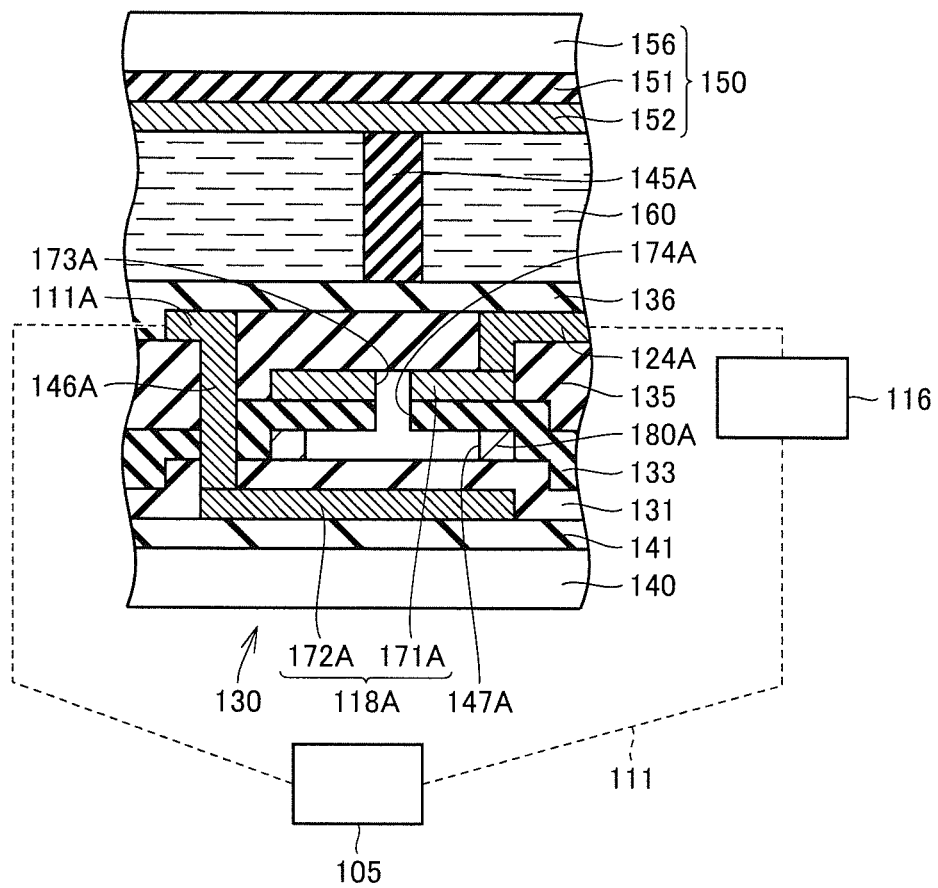

FIG. 126 is a cross-sectional view of liquid crystal display device 100 according to the fourteenth embodiment and is a cross-sectional view showing pressure sensor 118A. FIG. 127 is a cross-sectional view showing pressure sensor 118B. FIG. 128 is a plan view showing a positional relationship between upper electrodes 171A and 171B and pressing members 145A and 145B.

Figure 127:
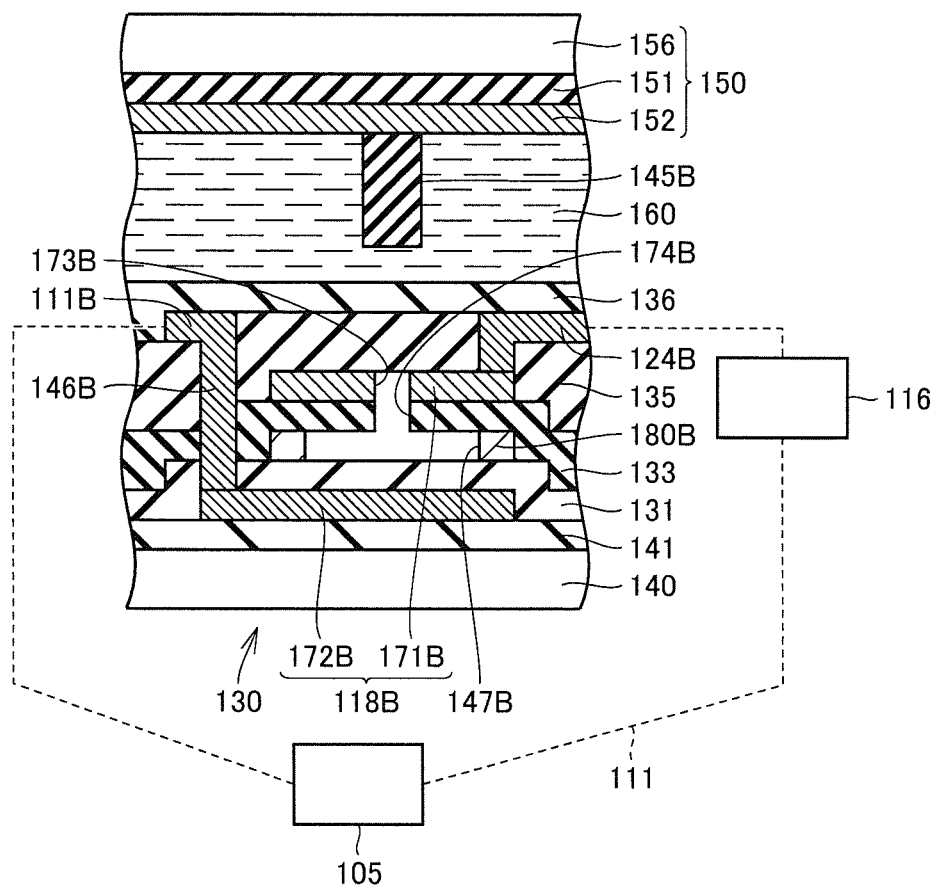

As shown in these FIGS. 126 to 128, upper electrode 171A and upper electrode 171B have substantially the same shape.

Pressing member 145A presses a central portion of upper electrode 171A in the width direction, and pressing member 145B presses a central portion of upper electrode 171B in the width direction. Pressing member 145A and pressing member 145B are independent of each other.

A height of pressing member 145B is lower than a height of pressing member 145A, and in a natural state, pressing member 145B is apart from the upper surface of upper insulating layer 136.

Therefore, the pressing force when the capacitance of pressure sensor 118A starts to fluctuate is smaller than the pressing force when the capacitance of pressure sensor 118B starts to fluctuate.

On the other hand, the maximum load that can be sensed by pressure sensor 118B is larger than the maximum load that can be sensed by pressure sensor 118A.

Therefore, when the user presses common substrate 150 with someone's finger, for example, pressure sensor 118A can sense the pressing force.

When the user presses common substrate 150 with a pen or the like, pressure sensor 118B can sense even the pressing force that is within a range of the pressing force that cannot be sensed by pressure sensor 118A.

As described above, by arranging the pressure sensors having different detectable ranges to be adjacent to each other, a wide range of the applied load can be sensed.

Fifteenth Embodiment

Liquid crystal display device 100 according to a fifteenth embodiment of the present invention will be described with reference to FIGS. 129 to 135. The same reference characters are given to the components shown in FIGS. 129 to 135 above that are the same as or corresponding to those shown in FIGS. 1 to 128 above, and description thereof will not be repeated.

Figure 129:
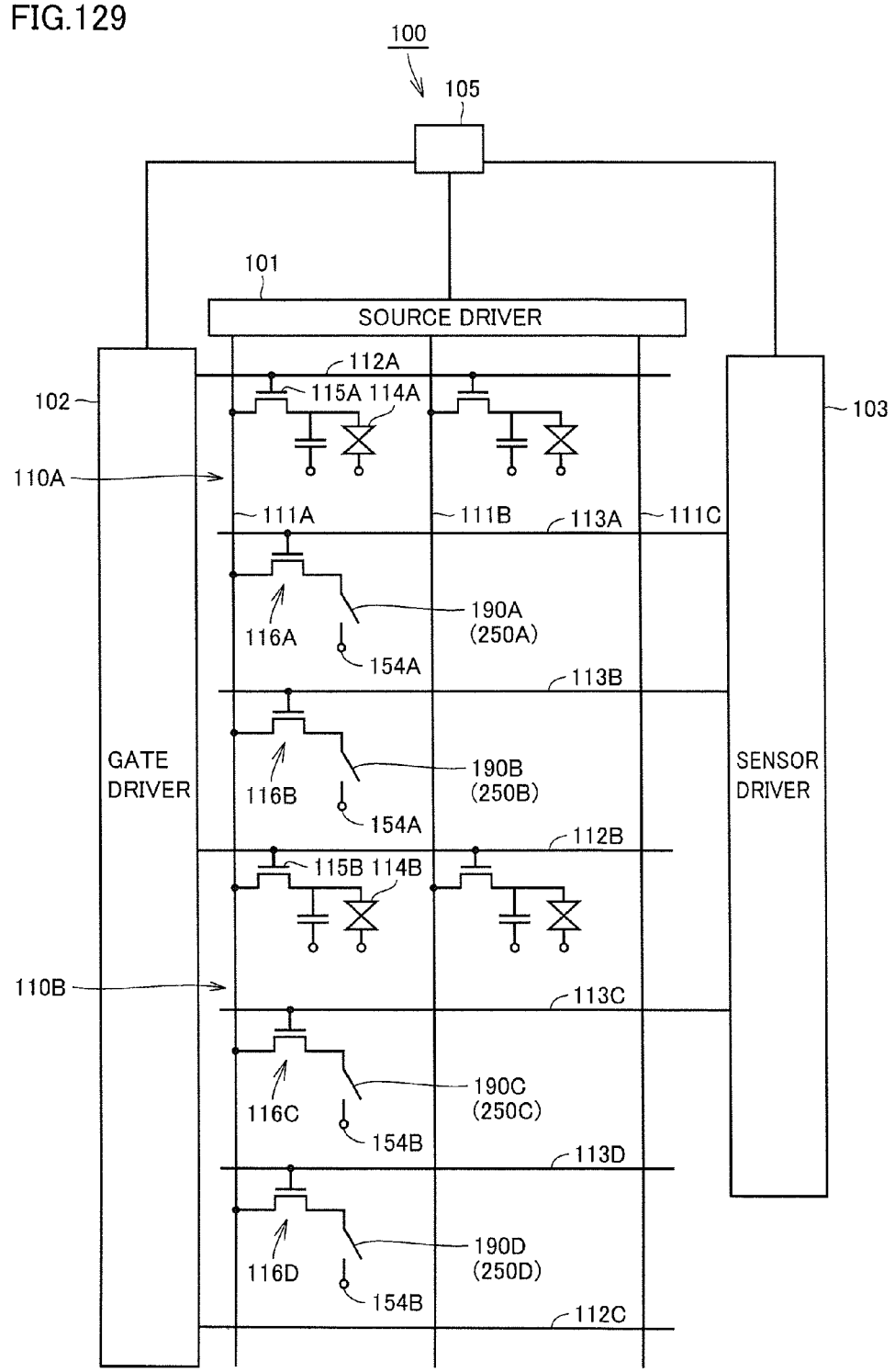

FIG. 129 is a circuit diagram schematically showing a circuit diagram of liquid crystal display device 100 according to the fifteenth embodiment. As shown in this FIG. 129, liquid crystal display device 100 according to the fifteenth embodiment includes a plurality of pressure sensors 190A, 190B, 190C, and 190D. Pressure sensors 190A and 190C function as highly-sensitive sensors 250A and 250C, and pressure sensors 190B and 190D function as low-sensitive sensors 250B and 250D.

Pressure sensors 190A, 190B, 190C, and 190D output amounts of current corresponding to loads applied to pressure sensors 190A, 190B, 190C, and 190D, respectively.

In the fifteenth embodiment, when the same load is applied, highly-sensitive sensors 250A and 250C output the amounts of current larger than the amounts of current outputted by low-sensitive sensors 250B and 250D.

Highly-sensitive sensor 250A and low-sensitive sensor 250B are provided in pixel 110A and are arranged to be adjacent to each other.

In addition, highly-sensitive sensor 250C and low-sensitive sensor 250D are both arranged in pixel 110B and are arranged to be adjacent to each other.

Electrodes (lower electrodes) of pressure sensors 190A, 190B, 190C, and 190D are connected to the drain electrodes of TFT elements for selection 116A, 116B, 116C, and 116D, respectively. The drain electrodes of TFT elements for selection 116A, 116B, 116C, and 116D are connected to source line 111A.

The other electrodes (upper electrodes) of pressure sensor 190A and pressure sensor 190B are connected to upper electrode wiring 154A, and the other electrodes (upper electrodes) of pressure sensor 190C and pressure sensor 190D are connected to upper electrode wiring 154B.

By switching TFT elements for selection 116A, 116B, 116C, and 116D, control unit 105 senses the amounts of current flowing through pressure sensors 190A, 190B, 190C, and 190D.

Specifically, by sensing an amount of current between upper electrode wirings 154A and 154B and source line 111A, control unit 105 can sense the amounts of current outputted from pressure sensors 190A, 190B, 190C, and 190D.

Based on a difference between the amount of current outputted from pressure sensor 190A and the amount of current outputted from pressure sensor 190B, control unit 105 calculates the load applied to a portion of glass substrate 156 where pressure sensor 190A and pressure sensor 190B are located, and the like.

Similarly, based on a difference between the amount of current outputted from pressure sensor 190C and the amount of current outputted from pressure sensor 190D, control unit 105 calculates the load applied to a portion of glass substrate 156 where pressure sensor 190C and pressure sensor 190D are located, and the like.

The upper electrode of pressure sensor 190A and the upper electrode of pressure sensor 190B are pressed by the same first pressing member, and the upper electrode of pressure sensor 190C and the upper electrode of pressure sensor 190D are also pressed by the same second pressing member.

Pressure sensor 190A and pressure sensor 190C are formed to have substantially the same configuration, and pressure sensor 190B and pressure sensor 190D are formed to have substantially the same configuration.

Therefore, when there is no difference between a height of the first pressing member and a height of the second pressing member and when the pressing force applied to pixel 110A is the same as the pressing force applied to pixel 110B, the difference between the amount of current outputted from pressure sensor 190A and the amount of current outputted from pressure sensor 190B is substantially the same as the difference between the amount of current outputted from pressure sensor 190C and the amount of current outputted from pressure sensor 190D.

A case where the height of the second pressing member is higher than the height of the first pressing member will now be discussed.

In this case, even when the same load is applied to pixel 110A and pixel 110B, an output from pressure sensor 190C is larger than the amount of current outputted from pressure sensor 190A. In addition, the amount of current outputted from pressure sensor 190D is larger than the amount of current outputted from pressure sensor 190B.

On the other hand, an error between the amount of current outputted from pressure sensor 190A and the amount of current outputted from pressure sensor 190C is substantially equal to an error between the amount of current outputted from pressure sensor 190B and the amount of current outputted from pressure sensor 190D.

Therefore, as described above, control unit 105 calculates the load applied to each position, based on a difference between an output current from pressure sensor 190A and an output current from pressure sensor 190B as well as a difference between an output current from pressure sensor 190C and an output current from pressure sensor 190D. Therefore, even when variations occur between the height of the first pressing member and the height of the second pressing member and the like due to manufacturing variations and the like, the load applied to each position can be accurately calculated.

Figure 130:
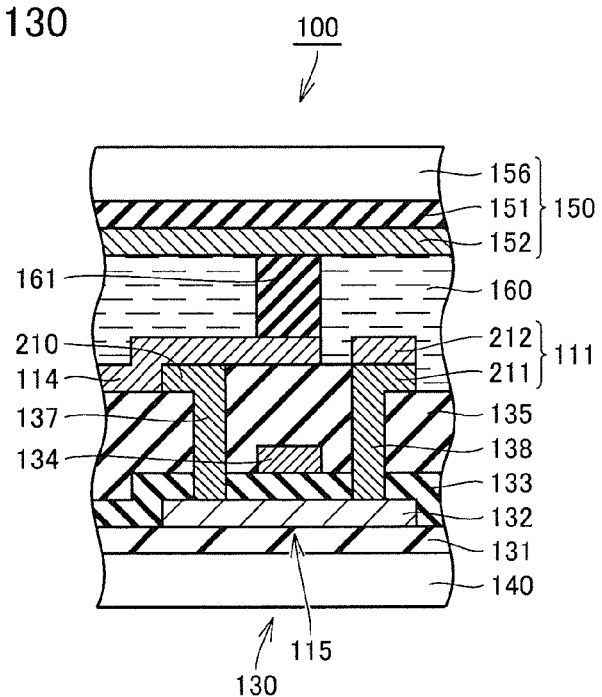

FIG. 130 is a cross-sectional view of liquid crystal display device 100 showing TFT element 115. As shown in this FIG. 130, liquid crystal display device 100 includes TFT array substrate 130, common substrate 150 arranged above TFT array substrate 130, and liquid crystal layer 160 filled between TFT array substrate 130 and common substrate 150.

TFT array substrate 130 includes glass substrate 140, underlying layer 131 formed on the main surface of glass substrate 140, and TFT element 115 formed on this underlying layer 131.

TFT element 115 includes semiconductor layer 132 formed on underlying layer 131, gate insulating layer 133 formed to cover semiconductor layer 132, gate electrode 134 formed on this gate insulating layer 133, and drain electrode 137 and source electrode 138 connected to semiconductor layer 132.

Interlayer dielectric 135 is formed on gate insulating layer 133 to cover gate electrode 134, and drain electrode 137 and source electrode 138 are formed to reach the upper surface of this interlayer dielectric 135. Drain pad 210 is formed at the upper end of drain electrode 137, and pixel electrode 114 is connected to drain pad 210.

Wiring 211 is formed at the upper end of source electrode 138, and transparent conductive layer 212 is formed on the upper surface of this wiring 211. Wiring 211 and transparent conductive layer 212 constitute source line 111 to which TFT element 115 is connected.

Spacer 161 is arranged between common substrate 150 and TFT array substrate 130.

Figure 131:
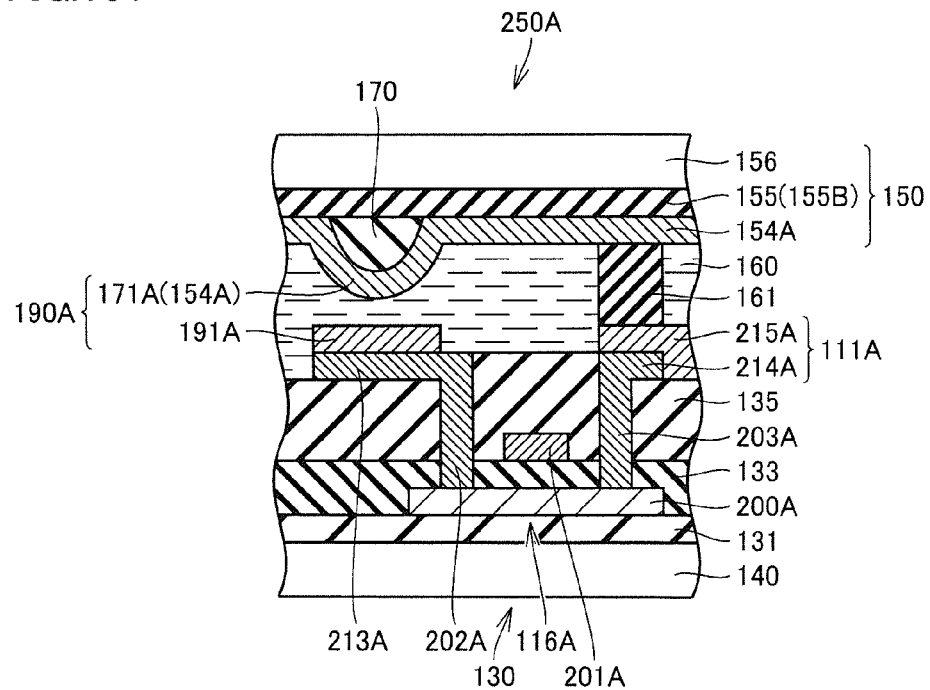

FIG. 131 is a cross-sectional view of liquid crystal display device 100 according to the fifteenth embodiment and is a cross-sectional view showing TFT element for selection 116A and pressure sensor 190A.

As shown in this FIG. 131, TFT element for selection 116A is formed in TFT array substrate 130, and pressure sensor 190A is formed between common substrate 150 and TFT array substrate 130.

TFT element for selection 116A includes a semiconductor layer 200A formed on underlying layer 131, gate insulating layer 133 formed to cover this semiconductor layer 200A, a gate electrode 201A formed on the upper surface of gate insulating layer 133, and a drain electrode 202A and a source electrode 203A connected to semiconductor layer 200A.

Interlayer dielectric 135 is formed on gate insulating layer 133 to cover gate electrode 201A. An upper end of drain electrode 202A is formed to reach the upper surface of interlayer dielectric 135, and an electrode unit 213A is connected to the upper end of drain electrode 202A. Electrode unit 213A is located on the upper surface of interlayer dielectric 135 and is formed into a flat surface.

An upper end of source electrode 203A is formed to reach the upper surface of interlayer dielectric 135, and a wiring 214A is connected to the upper end of this source electrode 203A. Wiring 214A is located on the upper surface of interlayer dielectric 135 and is formed into a flat surface. A transparent conductive layer 215A is formed on an upper surface of wiring 214A, and transparent conductive layer 215A is formed of an ITO layer and the like. Wiring 214A and transparent conductive layer 215A constitute source line 111A to which TFT element for selection 116A is connected.

Pressure sensor 190A includes upper electrode 171A formed in common substrate 150, and a lower electrode 191A formed in TFT array substrate 130.

Projection 170 protruding downward is formed on the lower surface of common substrate 150. This projection 170 is made of an elastically deformable resin and the like.

Upper electrode 171A is formed by a portion of upper electrode wiring 154A that covers projection 170 and that is located above lower electrode 191A.

Projection 170 is made of a plastic resin such as an acrylic resin and is elastically deformable.

Lower electrode 191A is formed on an upper surface of electrode unit 213A. Lower electrode 191A is formed of, for example, a transparent conductive layer such as an ITO film, and a resistance layer made of Si and the like. Lower electrode 191 has a film thickness of, for example, 50 nm or more and 400 nm or less, and preferably 50 nm or more and 200 nm or less.

In the example shown in this FIG. 131, in the state where the external force is not applied to common substrate 150, a small gap is formed between upper electrode 171A and lower electrode 191A.

In the state where the external force is not applied to common substrate 150, upper electrode 171A is not in contact with lower electrode 191A and a current does not flow between upper electrode 171A and lower electrode 191A. Therefore, electric power consumption is reduced.

FIG. 132 is a cross-sectional view of liquid crystal display device 100 according to the fifteenth embodiment and is a cross-sectional view showing pressure sensor 190B and TFT element for selection 116B.

As shown in this FIG. 132, TFT element for selection 116B includes a semiconductor layer 200B formed on underlying layer 131, gate insulating layer 133 formed to cover this semiconductor layer 200B, a gate electrode 201B formed on the upper surface of gate insulating layer 133, and a drain electrode 202B and a source electrode 203B connected to semiconductor layer 200B.

Interlayer dielectric 135 is formed on gate insulating layer 133 to cover gate electrode 201B. An upper end of drain electrode 202B is formed to reach the upper surface of interlayer dielectric 135, and an electrode unit 213B is connected to the upper end of drain electrode 202B. Electrode unit 213B is located on the upper surface of interlayer dielectric 135 and is formed into a flat surface.

An upper end of source electrode 203B is formed to reach the upper surface of interlayer dielectric 135, and a wiring 214B is connected to the upper end of this source electrode 203B. Wiring 214B is located on the upper surface of interlayer dielectric 135 and is formed into a flat surface. A transparent conductive layer 215B is formed on an upper surface of wiring 214B, and transparent conductive layer 215B is formed of an ITO layer and the like. Wiring 214B and transparent conductive layer 215B constitute source line 111B to which TFT element for selection 116B is connected.

Pressure sensor 190B includes upper electrode 171B formed in common substrate 150, and a lower electrode 191B formed in TFT array substrate 130. Upper electrode 171B is formed by a portion of upper electrode wiring 154A that covers projection 170 and that is located above lower electrode 191B.

Above lower electrode 191B, a part of the surface of projection 170 is exposed from upper electrode wiring 154A. In the example shown in this FIG. 132, substantially a half of the surface of projection 170 located above lower electrode 191B is exposed from upper electrode wiring 154A.

Therefore, in FIGS. 131 and 132, an area of upper electrode wiring 154A that functions as the upper electrode of pressure sensor 190A is substantially twice as large as an area of upper electrode wiring 154A that functions as the upper electrode of pressure sensor 190B.

FIG. 133 is a plan view schematically showing an arrangement relationship among lower electrodes 191A and 191B, projection 170, and upper electrode wiring 154A. As shown in this FIG. 133, projection 170 is formed to extend from a region above lower electrode 191A to a region above lower electrode 191B.

In FIG. 133, a region 176 is a region where a hole 175, projection 170 and lower electrode 191 overlap with one another when hole 175, projection 170 and lower electrode 191B are viewed two-dimensionally.

Therefore, a part of a portion of the lower surface of projection 170 located above lower electrode 191B is exposed from upper electrode wiring 154A. Therefore, an area of upper electrode 171B of pressure sensor 190B is smaller than an area of upper electrode 171A of pressure sensor 190A.

FIG. 134 is a cross-sectional view showing pressure sensor 190A and the like when common substrate 150 is pressed. FIG. 135 is a cross-sectional view showing pressure sensor 190B when common substrate 150 is pressed.

As shown in FIG. 134, when common substrate 150 is pressed, common substrate 150 deforms and upper electrode 171A comes into contact with lower electrode 191A.

As a result of contact between upper electrode 171A and lower electrode 191A, a current flows between upper electrode 171A and lower electrode 191A. By sensing source line 111A to which TFT element for selection 116A is connected and upper electrode wiring 154A, control unit 105 can sense an amount of current flowing between lower electrode 191A and upper electrode 171A.

When the pressure at which common substrate 150 is pressed increases, projection 170 deforms. As a result of deformation of projection 170, a portion of upper electrode wiring 154A located on projection 170 also deforms to conform to the shape of lower electrode 191A.

As a result, a contact area between lower electrode 191A and upper electrode wiring 154A increases sharply, and the amount of current flowing between lower electrode 191A and upper electrode 171A also increases. Therefore, control unit 105 can easily sense changes in the amount of current and easily calculate the pressing force applied to common substrate 150.

Similarly, as shown in FIG. 135, in pressure sensor 190B as well, when common substrate 150 is pressed, upper electrode 171B comes into contact with lower electrode 172B and a current flows between upper electrode 171B and lower electrode 172B.

At this time, the area of upper electrode wiring 154A that functions as upper electrode 171B is smaller than the area of upper electrode wiring 154A that functions as upper electrode 171A, and thus, a contact area between upper electrode 171A and lower electrode 172A is larger than a contact area between upper electrode 171B and lower electrode 172B.

Therefore, the amount of current flowing between upper electrode 171A and lower electrode 172A is larger than an amount of current flowing between upper electrode 171B and lower electrode 172B.

Upper electrode 171A and upper electrode 171B are both pressed by common projection 170. An amount of displacement of upper electrode 171A and an amount of displacement of upper electrode 171B are substantially identical.

Therefore, with respect to the amount of stroke of the upper electrode, the amount of current outputted from pressure sensor 190A is larger than the amount of current outputted from pressure sensor 190B.

In other words, pressure sensor 190A functions as highly-sensitive sensor 250A and pressure sensor 190B functions as low-sensitive sensor 250B.

As described above, pressure sensor 190C shown in FIG. 129 has substantially the same configuration as that of pressure sensor 190A, and pressure sensor 190D has substantially the same configuration as that of pressure sensor 190B.

Based on the difference between the amount of current from pressure sensor 190C that functions as highly-sensitive sensor 250C and the amount of current from pressure sensor 190D that functions as low-sensitive sensor 250D, control unit 105 calculates the pressing force applied to pixel 110B, and the like.

As described above, in liquid crystal display device 100 according to the fifteenth embodiment as well, control unit 105 calculates the pressing force applied to each pixel (sensing position) of common substrate 150, based on the difference between the output currents from two pressure sensors provided at each pixel (sensing position).

Therefore, in liquid crystal display device 100 according to the fifteenth embodiment as well, even when manufacturing variations occur in a height of the pressing member and the like, the pressing force applied to each position can be accurately calculated.

Sixteenth Embodiment

Liquid crystal display device 100 according to a sixteenth embodiment will be described with reference to FIGS. 136 to 142. The same reference characters are given to the components shown in FIGS. 136 to 142 that are the same as or corresponding to those shown in FIGS. 1 to 135 above, and description thereof will not be repeated.

FIG. 136 is a circuit diagram schematically showing an electrical circuit of liquid crystal display device 100 according to the sixteenth embodiment.

As shown in this FIG. 136, in liquid crystal display device 100 according to the sixteenth embodiment as well, pressure sensor 190A functioning as highly-sensitive sensor 250A and pressure sensor 190B functioning as low-sensitive sensor 250B are provided in pixel 110A.

In addition, pressure sensor 190C functioning as highly-sensitive sensor 250C and pressure sensor 190D functioning as low-sensitive sensor 250D are provided in pixel 110B.

Based on a difference between an amount of current outputted from pressure sensor 190A and an amount of current outputted from pressure sensor 190B, control unit 105 calculates the pressing force applied to pixel 110A.

Similarly, based on a difference between an amount of current outputted from pressure sensor 190C and an amount of current outputted from pressure sensor 190D, control unit 105 calculates the pressing force applied to pixel 110B.

FIG. 137 is a cross-sectional view of liquid crystal display device 100 showing TFT element 115A. As shown in this FIG. 137, liquid crystal display device 100 includes glass substrate 140, underlying layer 131 formed on the main surface of this glass substrate 140, and TFT element 115 formed on the upper surface of underlying layer 131.

TFT element 115 includes semiconductor layer 132 formed on underlying layer 131, gate insulating layer 133 formed on underlying layer 131 to cover semiconductor layer 132, gate electrode 134 formed on this gate insulating layer 133, and drain electrode 137 and source electrode 138 connected to semiconductor layer 132.

Interlayer dielectric 135 is formed on gate insulating layer 133 to cover gate electrode 134. Drain pad 210 and source line 111A are formed on the upper surface of this interlayer dielectric 135. Drain electrode 137 is connected to drain pad 210, and source electrode 138 is connected to source line 111.

Furthermore, resin layer 149 is formed on the upper surface of interlayer dielectric 135. Resin layer 149 is made of a plastic resin such as an acrylic resin. Resin layer 149 has a film thickness of, for example, 1 µm or more and 10 µm or less. Resin layer 149 preferably has a film thickness of 1.5 µm or more and 5 µm or less. Pixel electrode 114 is formed on the upper surface of resin layer 149 and pixel electrode 114 is connected to drain pad 210.

FIG. 138 is a cross-sectional view showing TFT element for selection 116 and pressure sensor 190A. As shown in this FIG. 138, liquid crystal display device 100 includes TFT element for selection 116A formed on underlying layer 131.

TFT element for selection 116A includes semiconductor layer 180A formed on underlying layer 131, gate insulating layer 133 formed on underlying layer 131 to cover semiconductor layer 180A, gate electrode 181A formed on this gate insulating layer 133, and drain electrode 182A and source electrode 183A connected to semiconductor layer 180A.

A pad unit 219A, source line 111A and a lower electrode 218A are formed on the upper surface of interlayer dielectric 135. An upper end of drain electrode 182A is connected to pad unit 219A, and an upper end of source electrode 183A is connected to source line 111A.

Therefore, by controlling a voltage applied to gate electrode 181A, ON/OFF of TFT element for selection 116A can be switched.

Lower electrode 218A is connected to pad unit 219A. Lower electrode 218A includes a projection 216A formed to protrude upward from the upper surface of interlayer dielectric 135 and a conductive layer 217A formed on a surface of this projection 216A. Projection 216A is made of the same material as that of resin layer 149A, and projection 216A is made of, for example, an elastically deformable resin material such as an acrylic resin. Projection 216A has a curved outer surface. Conductive layer 217A is connected to pad unit 219A.

Upper electrode 171A is formed on a portion of the lower surface of common substrate 150 located above lower electrode 218A.

Upper electrode 171A is formed by common electrode 152 formed on the lower surface of color filter substrate 151 to cover spacer 161 formed on the lower surface of color filter substrate 151. Spacer 161 is made of, for example, an acrylic resin and is formed to protrude from the lower surface of color filter substrate 151 toward lower electrode 218A.

When control unit 105 performs sensing, a predetermined voltage is applied to gate electrode 181A and TFT element for selection 116A is turned on.

When common substrate 150 is pressed, upper electrode 171A is displaced toward lower electrode 218A and upper electrode 171A presses lower electrode 218A. Since conductive layer 217A is pressed, conductive layer 217A deforms and lower electrode 218A deforms to conform to the surface shape of upper electrode 171A. As a result, a contact area between common electrode 152 of upper electrode 171A and conductive layer 217A of lower electrode 218A increases sharply. Consequently, an amount of current flowing between common electrode 152 and conductive layer 217A increases.

FIG. 139 is a cross-sectional view of liquid crystal display device 100 showing TFT element for selection 116B and pressure sensor 190B. As shown in this FIG. 139, TFT element for selection 116B includes semiconductor layer 180B formed on underlying layer 131, gate electrode 181B formed on gate insulating layer 133, and drain electrode 182B and source electrode 183B connected to semiconductor layer 180B.

A pad unit 219B, source line 111A and a lower electrode 218B are formed on the upper surface of interlayer dielectric 135. An upper end of drain electrode 182B is connected to pad unit 219B, and an upper end of source electrode 183B is connected to source line 111A.

Therefore, by controlling a voltage applied to gate electrode 181B, ON/OFF of TFT element for selection 116B can be switched.

Lower electrode 218B is connected to pad unit 219B. Lower electrode 218B includes a projection 216B formed to protrude upward from the upper surface of interlayer dielectric 135 and a conductive layer 217B formed on a surface of this projection 216B. Projection 216B is made of, for example, an elastically deformable resin material such as an acrylic resin. Projection 216B has a curved outer surface. Conductive layer 217B is connected to pad unit 219B.

Upper electrode 171B is formed on a portion of the lower surface of common substrate 150 located above lower electrode 218B.

When control unit 105 performs sensing, a predetermined voltage is applied to gate electrode 181B and TFT element for selection 116B is turned on.

When common substrate 150 is pressed, upper electrode 171B is displaced toward lower electrode 218B and upper electrode 171B presses lower electrode 218B. Since conductive layer 217B is pressed, conductive layer 217B deforms and lower electrode 218B deforms to conform to the surface shape of upper electrode 171B. As a result, a contact area between common electrode 152 of upper electrode 171B and conductive layer 217B of lower electrode 218B increases sharply. Consequently, an amount of current flowing between common electrode 152 and conductive layer 217B increases.

Hole 175 is formed in common electrode 152 and a part of spacer 161 is exposed from hole 175.

Therefore, an area of common electrode 152 that functions as upper electrode 171B of pressure sensor 190B is smaller than an area of common electrode 152 that functions as upper electrode 171A of pressure sensor 190A.

FIG. 140 is a plan view showing a positional relationship among common electrode 152, projections 216A and 216B, and spacer 161.

As shown in this FIG. 140, lower electrode 218A is spaced apart from lower electrode 218B. Spacer 161 is formed to extend from a region above lower electrode 218A to a region above lower electrode 218B. As described above, in the present embodiment as well, two pressure sensor 190A and pressure sensor 190B are pressed by the same pressing member (spacer).

As shown in FIG. 140, a region 177 is a region where hole 175, spacer 161 and projection 216B overlap with one another when hole 175, spacer 161 and projection 216B are viewed two-dimensionally.

In the example shown in this FIG. 140, region 177 occupies substantially a half of projection 216B when viewed two-dimensionally. An area of common electrode 152 that functions as the upper electrode of pressure sensor 190B is approximately a half of an area of common electrode 152 that functions as the upper electrode of pressure sensor 190A.

When spacer 161 presses lower electrode 218A and lower electrode 218B, a contact area between lower electrode 218A and upper electrode 171 is larger than a contact area between lower electrode 218B and upper electrode 171.

Therefore, when common substrate 150 is pressed, pressure sensor 190A can output a current larger than a current outputted by pressure sensor 190B, and pressure sensor 190A functions as a highly-sensitive sensor that is more sensitive than pressure sensor 190B.

Pressure sensor 190C shown in FIG. 136 is formed to have substantially the same configuration as that of pressure sensor 190A, and pressure sensor 190D is formed to have substantially the same configuration as that of pressure sensor 190B. The upper electrodes of pressure sensor 190C and pressure sensor 190D are pressed against the respective lower electrodes by the same spacer.

Based on a difference between an amount of current outputted from pressure sensor 190C and an amount of current outputted from pressure sensor 190D, control unit 105 calculates the load applied to pixel 110B.

Therefore, in liquid crystal display device 100 according to the sixteenth embodiment as well, even when a difference is made between a height of spacer 161 pressing the upper electrodes of pressure sensors 190A and 190B and a height of the spacer pressing the upper electrodes of pressure sensors 190C and 190D, the pressing force applied to each position can be accurately calculated, similarly to liquid crystal display device 100 according to the aforementioned embodiments.

In the example shown in FIGS. 138 and 139 above, by making a difference between an area of the upper electrode of pressure sensor 190B and an area of the upper electrode of pressure sensor 190A, a difference is made between the sensitivity of pressure sensor 190B and the sensitivity of pressure sensor 190A.

FIG. 141 is a cross-sectional view showing a modification of pressure sensor 190B. As shown in this FIG. 142, the sensitivity of pressure sensor 190B may be made lower than the sensitivity of pressure sensor 190A by narrowing an area of conductive layer 217B of pressure sensor 190B.

Means for making a difference between the shape of projection 216A and the shape of projection 216B can also be used, for example, as means for making a difference between the sensitivity of pressure sensor 190A and the sensitivity of pressure sensor 190B.

FIG. 142 is a cross-sectional view showing a second modification of pressure sensor 190B. In the example shown in this FIG. 142, a width of projection 216B is smaller than a width of projection 216A.

As a result, with respect to an amount of stroke of the upper electrode, a rate of increase in an amount of current outputted from pressure sensor 190B is smaller than a rate of increase in an amount of current outputted from pressure sensor 190A. Consequently, the amount of current outputted from pressure sensor 190B is smaller than the amount of current outputted from pressure sensor 190A.

Seventeenth Embodiment

Liquid crystal display device 100 according to a seventeenth embodiment will be described with reference to FIGS. 143 to 147. The same reference characters are given to the components shown in FIGS. 143 to 147 that are the same as or corresponding to those shown in FIGS. 1 to 142 above, and description thereof will not be repeated.

FIG. 143 is a circuit diagram schematically showing a circuit of liquid crystal display device 100 according to the seventeenth embodiment. As shown in this FIG. 143, in liquid crystal display device 100 according to the seventeenth embodiment as well, pressure sensor 190A and pressure sensor 190B are arranged in pixel 110A, and pressure sensor 190C and pressure sensor 190D are arranged in pixel 110B.

In liquid crystal display device 100 according to the seventeenth embodiment, one of the upper electrode and the lower electrode of each of pressure sensors 190A to 190D is connected to source line 111B and the other electrode is connected to the drain electrode of each of TFT elements for selection 116A to 116D.

By turning on the selected TFT element for selection and sensing an amount of current flowing between source line 111A and source line 111B, control unit 105 senses an amount of current from the pressure sensor connected to the selected TFT element for selection.

In liquid crystal display device 100 according to the seventeenth embodiment as well, the load applied to pixel 110A is calculated based on a difference between an output current from pressure sensor 190A and an output current from pressure sensor 190B, and the load applied to pixel 110B is calculated based on a difference between an output current from pressure sensor 190C and an output current from pressure sensor 190D.

FIG. 144 is a cross-sectional view showing TFT element 115. FIG. 145 is a cross-sectional view showing pressure sensor 190A. FIG. 146 is a cross-sectional view showing pressure sensor 190B.

As shown in FIGS. 144 to 146, underlying layer 131 is formed on the main surface of glass substrate 140, and TFT element 115A, pressure sensor 190A and pressure sensor 190B are formed on this underlying layer 131.

In FIG. 144, TFT element 115A includes semiconductor layer 132, gate electrode 134, drain electrode 137, and source electrode 138.

In FIGS. 145 and 146, pressure sensors 190A and 190B include semiconductor layers 180A and 180B formed on underlying layer 131, and upper electrodes 171A and 171B spaced apart from these semiconductor layers 180A and 180B and formed to face semiconductor layers 180A and 180B, respectively. Semiconductor layers 180A and 180B function as the lower electrodes of pressure sensors 190A and 190B, respectively.

Semiconductor layer 132 and semiconductor layers 180A and 180B are formed on the upper surface of underlying layer 131.

Gate insulating layer 133 is formed on underlying layer 131 to cover semiconductor layer 132 and semiconductor layers 180A and 180B.

Gate electrode 134 is formed on a portion of the upper surface of gate insulating layer 133 located above semiconductor layer 132, and upper electrodes 171A and 171B are formed on portions of the upper surface of gate insulating layer 133 located above semiconductor layers 180A and 180B, respectively.

Interlayer dielectric 135 is formed on the upper surface of gate insulating layer 133 to cover gate electrode 134A and upper electrodes 171A and 171B.

Drain electrode 137, source electrode 138, contacts 146A and 146B, and connection wirings 124A and 124B are formed to reach the upper surface of interlayer dielectric 135. Connection wirings 124A and 124B are connected to TFT elements for selection 116A and 116B, and the other ends are connected to upper electrodes 171A and 171B, respectively. The upper ends of contacts 146A and 146B are connected to source line 111B, and the lower ends of contacts 146A and 146B are connected to semiconductor layers 180A and 180B, respectively.

Drain electrode 137 and source electrode 138 are connected to semiconductor layer 132, and drain pad 210 is connected to the upper end of drain electrode 137. Source line 111 is connected to the upper end of source electrode 138. Drain pad 210 and source line 111 are formed on interlayer dielectric 135.

Upper insulating layer 136 is formed to cover drain pad 210, source line 111B and connection wirings 124A and 124B.

Pixel electrode 114 is formed on upper insulating layer 136 and is connected to drain pad 210.

Pressing member 145 is formed on a portion of the lower surface of common substrate 150 located above upper electrode 171A. Pressing member 145 is formed to protrude from the lower surface of common substrate 150 toward TFT array substrate 130.

Recesses 147A and 147B are formed directly under upper electrodes 171A and 171B, respectively. Each of these recesses 147A and 147B is formed by a hole formed in gate insulating layer 133 and the upper surface of semiconductor layer 180.

In FIGS. 145 and 146, when common substrate 150 is pressed by the user, pressing member 145 presses upper electrode 171A and upper electrode 171B.

When upper electrodes 171A and 171B are pressed, upper electrodes 171A and 171B deform to deflect. Then, upper electrodes 171A and 171B come into contact with lower electrodes 172A and 172B, respectively. At this time, upper electrodes 171A and 171B deform to conform to the shapes of lower electrodes 172A and 172B, respectively, and a contact area between upper electrodes 171A and 171B and lower electrodes 172A and 172B increases.

By separately turning on TFT elements for selection 116A and 116B, control unit 105 senses an amount of current flowing between upper electrode 171A and lower electrode 172A as well as an amount of current flowing between upper electrode 171B and lower electrode 172B.

FIG. 147 is a plan view schematically showing an arrangement relationship between pressing member 145 and upper electrodes 171A and 171B.

As shown in this FIG. 147, an area of upper electrode 171B is smaller than an area of upper electrode 171A. A width of upper electrode 171B is formed to be smaller than a width of upper electrode 171A.

Pressing member 145 is formed to extend from a region above upper electrode 171A to a region above upper electrode 171B, and upper electrode 171A and upper electrode 171B are pressed by the same pressing member 145.

Therefore, an amount of stroke of upper electrode 171A when common substrate 150 is pressed is substantially identical to an amount of stroke of upper electrode 171B when common substrate 150 is pressed.

Since the area of upper electrode 171B is smaller than the area of upper electrode 171A, an amount of current outputted from pressure sensor 190B is smaller than an amount of current outputted from pressure sensor 190A.

As described above, a difference is made between an output current from pressure sensor 190A and an output current from pressure sensor 190B, and based on this difference between the output currents, control unit 105 senses the load applied to pixel 110A.

Pressure sensor 190C shown in FIG. 143 is configured similarly to pressure sensor 190A, and pressure sensor 190D is configured similarly to pressure sensor 190B. The upper electrodes of pressure sensor 190C and pressure sensor 190D are both pressed by the same pressing member. Control unit 105 calculates the load applied to pixel 110B, based on a difference between an output current from pressure sensor 190C and an output current from pressure sensor 190D.

As described above, control unit 105 calculates the load applied to each position, based on the difference between the outputs from the two pressure sensors having different sensitivity. Therefore, in liquid crystal display device 100 according to the seventeenth embodiment as well, even when variations occur in a height of the pressing member, the load applied to each position can be accurately calculated, similarly to liquid crystal display device 100 according to the aforementioned embodiments.

FIG. 148 is a plan view showing a first modification of pressure sensor 190A and pressure sensor 190B. In the example shown in this FIG. 148, when upper electrode 171A and pressing member 145 are viewed two-dimensionally, pressing member 145 is located on a central portion of upper electrode 171A in the width direction.

On the other hand, when upper electrode 171B and pressing member 145 are viewed two-dimensionally, pressing member 145 is provided at a position deviated in the width direction from a central portion of upper electrode 171B in the width direction.

As described above, by making a difference between a position where upper electrode 171A is pressed by pressing member 145 and a position where upper electrode 171B is pressed by pressing member 145, a difference is made between the sensitivity of pressure sensor 190A and the sensitivity of pressure sensor 190B. In the example shown in this FIG. 148 as well, when an amount of displacement of pressing member 145 is the same, a contact area between upper electrode 171A and lower electrode 172A is larger than a contact area between upper electrode 171B and electrode 172B.

FIG. 149 is a plan view showing a second modification of pressure sensor 190A and pressure sensor 190B. In the example shown in this FIG. 149, a width of pressing member 145 located on upper electrode 171A is different from a width of pressing member 145 located on upper electrode 171B.

In the example shown in this FIG. 149, the width of the portion of pressing member 145 located on upper electrode 171A is large and the width of the portion of pressing member 145 located on upper electrode 171B is narrow. In the example shown in this FIG. 149 as well, the sensitivity of pressure sensor 190A is higher than the sensitivity of pressure sensor 190B.

Eighteenth Embodiment

A liquid crystal display device according to an eighteenth embodiment will be described with reference to FIGS. 150 to 156. The same reference characters are given to the components shown in FIGS. 150 to 156 that are the same as or corresponding to those shown in FIGS. 1 to 149 above, and description thereof will not be repeated.

FIG. 150 is a plan view schematically showing TFT array substrate 130 of the liquid crystal display device according to the eighteenth embodiment.

As shown in this FIG. 150, TFT array substrate 130 includes source lines 111A to 111C spaced apart from one another, a plurality of gate lines 112A to 112C spaced apart from one another in the direction in which source lines 111A to 111C extend and extending in the direction crossing source lines 111A to 111C, and a plurality of gate lines for sensing 113A to 113C.

Gate lines for sensing 113A to 113C extend along gate lines 112A to 112C. Source lines 111A to 111C are connected to control unit 105.

Source lines 111A to 111C and gate lines 112A to 112C constitute a plurality of pixels in TFT array substrate 130. A plurality of TFT elements 115A and 115B spaced apart from each other are formed at gate lines 112A to 112C, and one TFT element is arranged for each pixel.

Pixel 110A is defined by source lines 111A and 111B and gate lines 112A and 112B. Pixel 110B is defined by source lines 111A and 111B and gate lines 112B and 112C.

Pixels 110A and 110B are provided with TFT elements 115A and 115B, respectively, and a voltage is applied to pixel electrodes 114A and 114B by these TFT elements 115A and 115B, respectively.

A lower coil 272A is arranged in pixel 110A, and a lower coil 272B is arranged in pixel 110B.

A coil smaller than lower coil 272A is used as lower coil 272B. A plurality of lower coils 272B are aligned along gate line 112C, and a plurality of lower coils 272A are aligned along gate line 112B.

One end of lower coil 272A arranged in pixel 110A is connected to TFT element for selection 116A and the other end is connected to source line 111B. TFT element for selection 116A has the source electrode connected to source line 111A and the drain electrode connected to an end of lower coil 272A.

One end of lower coil 272B arranged in source line 111B is connected to TFT element for selection 116B and the other end is connected to source line 111B.

FIG. 151 is a plan view showing common substrate 150 of the liquid crystal display device according to the eighteenth embodiment. As shown in this FIG. 151, common substrate 150 includes common electrode 152, a coil wiring 273A and a coil wiring 273B. Coil wiring 273A and coil wiring 273B are spaced apart from each other.

A current constantly flows through coil wiring 273A and coil wiring 273B. Coil wiring 273A includes a plurality of serially-connected upper coils 271A, and coil wiring 273B includes a plurality of serially-connected upper coils 271B.

FIG. 152 is a plan view showing an arrangement state of upper coil 271A and lower coil 272A in a state where common substrate 150 shown in FIG. 151 is arranged on TFT array substrate 130 shown in FIG. 150.

As shown in this FIG. 152, upper coil 271A is located above lower coil 272A, and upper coil 271A and lower coil 272A overlap with each other when viewed two-dimensionally. Upper coil 271A and lower coil 272A have substantially the same size. These upper coil 271A and lower coil 272A constitute a highly-sensitive sensor 270A.

FIG. 153 is a plan view when lower coil 272B and upper coil 271B are viewed two-dimensionally in the state where common substrate 150 shown in FIG. 151 is arranged on TFT array substrate 130 shown in FIG. 151. As shown in this FIG. 153, lower coil 272B is smaller than upper coil 271B, and these lower coil 272B and upper coil 271B constitute a low-sensitive sensor 270B.

FIG. 154 is a cross-sectional view taken along line CLIV-CLIV in FIG. 152. FIG. 155 is a cross-sectional view taken along line CLV-CLV in FIG. 153. As shown in FIG. 154, TFT array substrate 130 includes glass substrate 140, underlying layer 131 formed on the main surface of this glass substrate 140, interlayer dielectric 135 formed on underlying layer 131, lower coil 272A formed on this interlayer dielectric 135, and upper insulating layer 136 formed on interlayer dielectric 135 to cover lower coil 272A. Common substrate 150 includes glass substrate 156, color filter substrate 151 formed on the lower surface of this glass substrate 156, and upper coil 271A formed on the lower surface of this color filter substrate 151.

A current is constantly supplied to upper coil 271A, and a predetermined amount of magnetic flux is emitted from upper coil 271A toward lower coil 272A.

When common substrate 150 is pressed by the user and upper coil 271A comes closer to lower coil 272A, the amount of magnetic flux flowing through lower coil 272A increases.

When the amount of magnetic flux flowing through lower coil 272A increases, an induced voltage is generated in lower coil 272A due to electromagnetic induction. At this time, when TFT element for selection 116A shown in FIG. 150 is turned on by control unit 105, a current corresponding to the induced voltage generated in lower coil 272A flows between source line 111A and source line 111B.

In FIG. 155, lower coil 272B is also formed on interlayer dielectric 135 and upper coil 271B is formed on the lower surface of color filter substrate 151.

A current constantly flows through upper coil 271B as well, and a predetermined amount of magnetic flux is emitted from upper coil 271B toward lower coil 272B. When common substrate 150 is pressed by the user, upper coil 271B comes closer to lower coil 272B.

When upper coil 271B comes closer to lower coil 272B, the amount of magnetic flux flowing through lower coil 272B increases. As a result, an induced voltage is generated in lower coil 272B as well.

Lower coil 272B is smaller than lower coil 272A shown in FIG. 154. Therefore, even if an amount of downward movement of upper coil 271A is the same as an amount of downward movement of upper coil 271B, the induced voltage generated in lower coil 272B is smaller than the induced voltage generated in lower coil 272A.

When control unit 105 shown in FIG. 150 turns on TFT element for selection 116B, a current corresponding to the induced voltage generated in lower coil 272B flows between source line 111A and source line 111B.

A distance between highly-sensitive sensor 270A and low-sensitive sensor 270B is much smaller than a size of the user's finger or a size of a tip of the pen.

Therefore, when common substrate 150 is pressed by the user, an amount of displacement of upper coil 271A located on pixel 110A is substantially identical to an amount of displacement of upper coil 271B located on pixel 110B.

Based on a difference between an amount of current outputted from highly-sensitive sensor 270A and an amount of current outputted from low-sensitive sensor 270B, control unit 105 calculates the pressing force applied to pixels 110A and 110B. Similarly, as to another position as well, control unit 105 calculates the load applied to a portion of common substrate 150 where these sensors are provided, based on a difference between amounts of current outputted from the two sensors.

Because of manufacturing variations, variations may occur in, for example, a thickness of interlayer dielectric 135. In such a case, a set of lower coil 272A and lower coil 272B may be formed on the upper side as compared with the other sets of lower coil 272A and lower coil 272B.

When common substrate 150 is pressed, an amount of current outputted from a sensor having a small spacing between the lower coil and the upper coil is larger than an amount of current outputted from a sensor having a large spacing between the lower coil and the upper coil.

Therefore, an output current from highly-sensitive sensor 270A formed on a thick portion of interlayer dielectric 135 is larger than an output current from the other highly-sensitive sensors 270A. Similarly, an output current from low-sensitive sensor 270B formed on a thick portion of interlayer dielectric 135 is larger than an output current from the other low-sensitive sensors 270B.

As described above, based on a difference between the output current from highly-sensitive sensor 270A and the output current from low-sensitive sensor 270B, control unit 105 calculates the applied load.

Therefore, by subtracting an output from low-sensitive sensor 270B formed on the thick portion of interlayer dielectric 135 from an output from highly-sensitive sensor 270A formed on the thick portion of interlayer dielectric 135, an error of highly-sensitive sensor 270A and an error of low-sensitive sensor 270B can be canceled out.

As a result, even when highly-sensitive sensor 270A and low-sensitive sensor 270B are formed on the thick portion of interlayer dielectric 135, the applied load can be accurately calculated.

As described above, liquid crystal display device 100 according to the eighteenth embodiment includes a highly-sensitive sensor including a first upper coil and a first lower coil, and a low-sensitive sensor including a second upper coil and a second lower coil, wherein the highly-sensitive sensor and the low-sensitive sensor are arranged to be adjacent to each other. By making a difference between at least one of sizes of the first upper coil and the second upper coil and sizes of the first lower coil and the second lower coil, the sensitivity of the low-sensitive sensor is made lower than the sensitivity of the highly-sensitive sensor. Based on a difference between an output from the low-sensitive sensor and an output from the highly-sensitive sensor, control unit 105 calculates the applied load.

In the example shown in FIGS. 150 to 155, the coils having different sizes are arranged on the TFT array substrate 130 side and the plurality of coils having a unified size and constantly supplied with a current are arranged on the common substrate 150 side, thereby forming highly-sensitive sensor 270A and low-sensitive sensor 270B.

A method for forming highly-sensitive sensor 270A and low-sensitive sensor 270B is not limited to the aforementioned method.

For example, a plurality of lower coils having a unified size may be arranged on the TFT array substrate 130 side and a plurality of upper coils having different sizes may be arranged on the lower surface of common substrate 150, thereby forming highly-sensitive sensor 270A and low-sensitive sensor 270B.

In the aforementioned embodiments including the eighteenth embodiment, the case has been described, in which the highly-sensitive pressure sensor and the low-sensitive pressure sensor are used and an output from the highly-sensitive pressure sensor is constantly larger than an output from the low-sensitive sensor. However, the output from the highly-sensitive sensor does not always have to be constantly larger than the output from the low-sensitive sensor.

FIG. 156 is a graph showing characteristics of an output value outputted from the highly-sensitive pressure sensor and an output value outputted from the low-sensitive pressure sensor.

The vertical axis indicates an output value from the pressure sensor. In the capacitance-fluctuation-type pressure sensor, the output value corresponds to a capacitance or an amount of current. In the current-amount-fluctuation-type pressure sensor, the output value corresponds to a resistance value or an amount of current. The horizontal axis indicates an amount of stroke of the upper electrode.

In this FIG. 156, L6 indicates a characteristic of the highly-sensitive pressure sensor and L7 indicates a characteristic of the low-sensitive sensor.

As shown in this FIG. 156, when the amount of stroke is small, the output value from the highly-sensitive pressure sensor may be set to be smaller than the output value from the low-sensitive pressure sensor.

The characteristics of the respective pressure sensors are set in such a manner. As a result, when a value obtained by subtracting the output value from the low-sensitive pressure sensor from the output value from the highly-sensitive pressure sensor is smaller than zero, this means application of the weak load to common substrate 150. When a difference between the output values is equal to or larger than zero, this means application of the large load.

Generally, the larger pressing force is applied to common substrate 150 when the user presses common substrate 150 with the tip of the pen or the like than when the user presses common substrate 150 with someone's finger.

For example, when the value obtained by subtracting the output value from the low-sensitive pressure sensor from the output value from the highly-sensitive pressure sensor is equal to or larger than zero, control unit 105 may determine that the user has pressed common substrate 150 with the pen or the like, and when the value is smaller than zero, control unit 105 may determine that the user has pressed common substrate 150 with someone's finger.

Nineteenth Embodiment

Liquid crystal display device 100 according to a nineteenth embodiment will be described with reference to FIGS. 157 and 158. The same reference characters are given to the components shown in FIGS. 157 and 158 that are the same as or corresponding to those shown in FIGS. 1 to 156 above, and description thereof will not be repeated.

Although the example in which the pressure sensors having different sensitivity are used has been described in the aforementioned embodiments, an example in which ON/OFF sensors having different sensitivity are used will be described.

Generally, the larger pressing force is applied to common substrate 150 when the user presses common substrate 150 with the tip of the pen or the like than when the user presses common substrate 150 with someone's finger.

Thus, by arranging the ON/OFF sensors having different sensitivity to be adjacent to each other, the range of detection of the pressure by the sensors is extended. Therefore, pressure regions when the user presses common substrate 150 with someone's finger and when the user presses common substrate 150 with the pen can be dealt with. Furthermore, based on pressure values, a pressing area and the like that are detected by the respective ON/OFF sensors, a contact object that has come into contact with a contact position can be estimated. Specifically, it can be estimated whether the pen or the finger has come into contact with the contact position.

FIG. 157 is a cross-sectional view of liquid crystal display device 100 showing a highly-sensitive ON/OFF sensor 290A. As shown in this FIG. 157, ON/OFF sensor 290A includes conductive layer 217A connected to drain electrode 182A of TFT element for selection 116A and formed on interlayer dielectric 135, and upper electrode 171A formed by common electrode 152 located on the surface of projection 170A. Conductive layer 217A functions as the lower electrode. Conductive layer 217A and upper electrode 171A are spaced apart from each other in the direction in which glass substrate 156 and glass substrate 140 are aligned, and are arranged to face each other.

On both sides of projection 170A, two spacers (support member) 161A and 161B are spaced apart from each other. Spacer (first support member) 161A and spacer (second support member) 161B are arranged between common substrate 150 and TFT array substrate 130 to keep a spacing between upper electrode 171A and conductive layer 217A.

FIG. 158 is a cross-sectional view of liquid crystal display device 100 showing a low-sensitive ON/OFF sensor 290B. As shown in this FIG. 158, ON/OFF sensor 290B includes conductive layer 217B connected to drain electrode 182B of TFT element for selection 116B and formed on interlayer dielectric 135, and upper electrode 171B formed by common electrode 152 located on the surface of projection 170B. Conductive layer 217B functions as the lower electrode. Conductive layer 217B and upper electrode 171B are spaced apart from each other in the direction in which glass substrate 156 and glass substrate 140 are aligned, and are arranged to face each other.

On both sides of projection 170B, two spacers 161C and 161D are spaced apart from each other. Spacer (third support member) 161C and spacer (fourth support member) 161D are arranged between common substrate 150 and TFT array substrate 130 to keep a spacing between upper electrode 171B and conductive layer 217B.

When common substrate 150 is pressed, spacer 161C and spacer 161D as well as spacer 161A and spacer 161B shown in FIG. 157 deform to reduce the heights thereof. Liquid crystal display device 100 includes a plurality of not-shown other spacers and these spacers also deform similarly. Consequently, common substrate 150 deflects to come closer to TFT array substrate 130.

When common substrate 150 deforms to deflect and upper electrode 171A shown in FIG. 157 comes into contact with conductive layer 217A and when TFT element for selection 116A is turned on, a current flows between upper electrode 171A and conductive layer 217A. Similarly, when upper electrode 171B shown in FIG. 158 comes into contact with conductive layer 217B and when TFT element for selection 116B is turned on, a current flows between upper electrode 171B and conductive layer 217B. A spacing L1 between spacers 161A and 161B located on both sides of projection 170A is larger than a spacing L2 between spacers 161C and 161D located on both sides of projection 170B.

Therefore, a portion of common substrate 150 located between spacers 161C and 161D does not easily deflect as compared with a portion of common substrate 150 located between spacers 161A and 161B. Furthermore, a height H1 of projection 170A is substantially identical to a height H2 of projection 170B. Therefore, in the state where the external load is not applied, a distance between upper electrode 171A and conductive layer 217A is substantially identical to a distance between upper electrode 171B and conductive layer 217B.

Since the spacing between spacers 161A and 161B is larger than the spacing between spacers 161C and 161D and the distances between the respective upper electrodes and the respective lower electrodes are substantially identical, a load when ON/OFF sensor 290A is turned on is smaller than a load when ON/OFF sensor 290B is turned on.

In liquid crystal display device 100 according to the nineteenth embodiment, when the user operates the screen with someone's finger or the like, it can be sensed, based on an output from ON/OFF sensor 290A, that the user has touched the screen. Furthermore, by sensing a current from ON/OFF sensor 290B, it can be sensed that the user has operated the screen with the pen or the like at high pressing force.

As described above, by providing the ON/OFF sensors that are turned on at different loads, the range of sensing of the detectable pressing force can be extended.

In liquid crystal display device 100 according to the nineteenth embodiment, two types of ON/OFF sensors are used to extend the range of sensing of the pressing force. Three or more types of ON/OFF sensors having different sensitivity may, however, be provided.

In liquid crystal display device 100 according to the nineteenth embodiment, the sensitivity of each ON/OFF sensor is adjusted by the spacing between the spacers provided at each ON/OFF sensor. Each spacer is formed by forming a resin layer on the upper surface of common substrate 150 or TFT array substrate 130, and thereafter, patterning this resin and the like. Therefore, making a difference in the spacing between the spacers can be easily achieved by changing a mask when the resin layer is patterned.

In the example shown in FIGS. 157 and 158, by making a difference between the spacing between spacer 161A and spacer 161B and the spacing between spacer 161C and spacer 161D, a difference is made between the sensitivity of ON/OFF sensor 290A and the sensitivity of ON/OFF sensor 290B. A method for making a difference between the sensitivity of the respective sensors is not, however, limited to this method.

A first modification of liquid crystal display device 100 according to the nineteenth embodiment will be described with reference to FIGS. 159 and 160. In the example shown in these FIGS. 159 and 160, spacing L1 between spacer 161A and spacer 161B is substantially identical to spacing L2 between spacer 161C and spacer 161D. On the other hand, height H2 of projection 170B is formed to be lower than height H1 of projection 170A. Therefore, a spacing between upper electrode 171A and conductive layer 217A of ON/OFF sensor 290A is narrower than a spacing between upper electrode 171B and conductive layer 217B of ON/OFF sensor 290B. As described above, by making a difference in the spacing between the upper electrode and the lower electrode of each sensor, a difference may be made between the sensitivity of the respective sensors.

A second modification of liquid crystal display device 100 according to the nineteenth embodiment will be described with reference to FIGS. 161 and 162. In the example shown in these FIGS. 161 and 162, a spacing between upper electrode 171A and conductive layer 217A of ON/OFF sensor 290A is narrower than a spacing between upper electrode 171B and conductive layer 217B of ON/OFF sensor 290B, and further, a spacing between spacer 161A and spacer 161B is larger than a spacing between spacer 161C and spacer 161D. As a result, ON/OFF sensor 290A is turned on at a load smaller than a load when ON/OFF sensor 290B is turned on.

As a method for making a difference between the sensitivity of the respective sensors, there are a method for using different materials for the spacers and a method for differently structuring the spacers, for example. Specifically, the distances between the upper electrodes and the lower electrodes of the respective sensors are substantially matched and the distances between the respective spacers are substantially matched. On the other hand, the spacer of one sensor is made of a material that elastically deforms more easily than a material of the spacer of the other sensor, or the spacer of one sensor is structured to elastically deform more easily than the spacer of the other sensor. As a result, a difference can be made between the sensitivity of the two sensors.

Twentieth Embodiment

A place where highly-sensitive sensor 250A and low-sensitive sensor 250B are arranged will be described with reference to FIGS. 163 to 165. The same reference characters are given to the components shown in FIGS. 163 to 165 that are the same as or corresponding to those shown in FIGS. 1 to 162 above, and description thereof will not be repeated.

FIG. 163 is a cross-sectional view of liquid crystal display device 100 showing one example of arrangement of highly-sensitive sensor 250A and low-sensitive sensor 250B.

As shown in this FIG. 163, pressing member 145 includes a shaft portion 142 protruding downward from the lower surface of common substrate 150 and a contact portion 143 formed at an end of this shaft portion 142.

Highly-sensitive sensor 250A and low-sensitive sensor 250B are arranged under contact portion 143, and contact portion 143 is in contact with both highly-sensitive sensor 250A and low-sensitive sensor 250B. According to liquid crystal display device 100 configured in such a manner, the load applied to common substrate 150 can be transmitted to both highly-sensitive sensor 250A and low-sensitive sensor 250B. Furthermore, the same pressing member presses highly-sensitive sensor 250A and low-sensitive sensor 250B. Therefore, the pressing force applied to a portion of common substrate 150 where the pressing member is located, an amount of displacement of this portion, and the like can be detected.

FIG. 164 is a cross-sectional view of liquid crystal display device 100 showing another example of arrangement of highly-sensitive sensor 250A and low-sensitive sensor 250B.

In the example shown in this FIG. 164, highly-sensitive sensor 250A and low-sensitive sensor 250B are formed at common substrate 150 and are pressed by pressing member 145 formed at TFT array substrate 130.

In the example shown in this FIG. 164 as well, one pressing member presses highly-sensitive sensor 250A and low-sensitive sensor 250B.

FIG. 165 is a cross-sectional view of liquid crystal display device 100 showing another example of arrangement of highly-sensitive sensor 250A and low-sensitive sensor 250B. In the example shown in this FIG. 165, highly-sensitive sensor 250A and low-sensitive sensor 250B are arranged on a lower surface of sealing member 108. Highly-sensitive sensor 250A and low-sensitive sensor 250B are arranged to be adjacent to each other.

These highly-sensitive sensor 250A and low-sensitive sensor 250B can sense the pressing force applied to the outer periphery of common substrate 150. Highly-sensitive sensor 250A and low-sensitive sensor 250B may be arranged between an upper surface of sealing member 108 and common substrate 150.

Twenty-First Embodiment

Liquid crystal display device 100 according to a twenty-first embodiment will be described with reference to FIGS. 166 to 168. The same reference characters are given to the components shown in FIGS. 166 to 168 that are the same as or corresponding to those shown in FIGS. 1 to 165 above, and description thereof will not be repeated.

FIG. 166 is a plan view schematically showing liquid crystal display device 100 according to the twenty-first embodiment. FIG. 167 is a cross-sectional view taken along line CLXVII-CLXVII shown in FIG. 166. As shown in this FIG. 167, liquid crystal display device 100 includes a plurality of pressure sensors 301 and 302, a pressing member 303 pressing pressure sensor 301, and a pressing member 304 pressing pressure sensor 302.

Pressure sensor 301 is arranged at a central portion of liquid crystal display device 100 in the width direction, and pressure sensor 302 is arranged closer to the outer periphery of liquid crystal display device 100 than pressure sensor 301.

Pressing member 303 is formed on a portion of the lower surface of common substrate 150 located above pressure sensor 301, and pressing member 304 is formed on a portion of the lower surface of common substrate 150 located above pressure sensor 302.

A height of pressing member 303 in the direction vertical to the lower surface of common substrate 150 is formed to be lower than a height of pressing member 304. Therefore, a spacing between pressing member 303 and pressure sensor 301 is larger than a spacing between pressing member 304 and pressure sensor 302.

FIG. 168 is a cross-sectional view showing a state where common substrate 150 of liquid crystal display device 100 shown in FIG. 167 is pressed. As shown in this FIG. 168, an amount of displacement of a portion of common substrate 150 located on the outer peripheral side of liquid crystal display device 100 is smaller than an amount of displacement of a portion of common substrate 150 located at the central portion.

In other words, comparing a case where a portion of the upper surface of common substrate 150 located above pressing member 303 is pressed and a case where a portion of the upper surface of common substrate 150 located above pressing member 304 is pressed at the same pressing force, the pressing position is displaced more greatly in the case where the portion located above pressing member 303 is pressed.

The height of pressing member 303 located on the central portion side of liquid crystal display device 100 is formed to be lower than the height of pressing member 304 located on the outer peripheral side of liquid crystal display device 100. Therefore, when a load is applied to a portion of common substrate 150 where pressing member 303 is formed, pressing member 303 comes into contact with pressure sensor 301. Similarly, when a load F1 is applied to a portion of common substrate 150 where pressing member 304 is located, pressing member 304 comes into contact with pressure sensor 302.

In light of the fact that a difference in an amount of deflection of common substrate 150 occurs at the respective positions as described above, the distance between the pressing member and the pressure sensor is reduced with decreasing distance to the outer periphery of liquid crystal display device 100, in liquid crystal display device 100 according to the twenty-first embodiment.

According to liquid crystal display device 100 configured in such a manner, the following can be suppressed: when the same pressing force is applied, an output value outputted from the pressure sensor fluctuates in accordance with the pressing position.

Therefore, when any positions of common substrate 150 are pressed, each pressure sensor outputs an accurate output value corresponding to the pressing force.

In the example shown in these FIGS. 167 and 168, by increasing the height of the pressing member with decreasing distance to the outer periphery of liquid crystal display device 100, the gap between the pressing member and the sensor is reduced with decreasing distance to the outer periphery of liquid crystal display device 100. In other words, the sensitivity of the pressure sensor is set differently in accordance with the position of the pressure sensor.

A method for increasing the sensitivity of the pressure sensor with decreasing distance to the outer periphery of liquid crystal display device 100 is not limited to the aforementioned method.

For example, the pressure sensor may be brought closer to common substrate 150 with decreasing distance to the outer periphery of liquid crystal display device 100, or the ON/OFF sensors having different sensitivity may be used as in the nineteenth embodiment.

Twenty-Second Embodiment

Liquid crystal display device 100 according to a twenty-second embodiment will be described with reference to FIG. 169. Liquid crystal display device 100 according to the present embodiment includes a pressure detecting element capable of outputting a current and the like corresponding to a difference between outputs from two pressure sensors.

Therefore, in liquid crystal display device 100 according to the twenty-second embodiment, control unit 105 does not need to calculate a difference between output values from the respective pressure sensors.

Twenty-Third Embodiment

A twenty-third embodiment of the present invention will be described with reference to FIGS. 170 to 172. The same reference characters are given to the components shown in FIGS. 170 to 172 that are the same as or corresponding to those shown in FIGS. 1 to 169 above, and description thereof will not be repeated.

FIG. 170 is a cross-sectional view of liquid crystal display device 100 according to the twenty-third embodiment. As shown in this FIG. 170, a pressure sensing element 261A and a pressure sensing element 261B are provided between common substrate 150 and TFT array substrate 130 to be adjacent to each other. Pressure sensing element 261A includes pressing member 145A and a sensor 260A located between glass substrate 156 and glass substrate 140. In the example shown in this FIG. 170, pressing member 145A is formed on the lower surface of common substrate 150, and when common substrate 150 is pressed, sensor 260A is pressed by pressing member 145A and TFT array substrate 130. Pressing member 145A may be arranged on the upper surface of TFT array substrate 130 and sensor 260A may be arranged on the common substrate 150 side.

Pressure sensing element 261B includes pressing member 145B and a sensor 260B located between glass substrate 156 and glass substrate 140, and when glass substrate 156 is pressed, sensor 260B is pressed by pressing member 145B. Pressing member 145B is also formed on the lower surface of common substrate 150, and when glass substrate 156 is pressed, sensor 260B is sandwiched between pressing member 145B and TFT array substrate 130. Pressing member 145B may be formed on the upper surface of TFT array substrate 130 and sensor 260B may be arranged on the common substrate 150 side.

In the example shown in this FIG. 170, the pressure sensors or the ON/OFF sensors having the same sensitivity are used as sensor 260A and sensor 260B. Therefore, when the pressure sensors are used, the minimum load and the maximum load that can be sensed by sensor 260A and sensor 260B are identical. When the ON/OFF sensors are used, the load when sensor 260A is turned on and the load when sensor 260B is turned on are identical.

Pressing member 145A is structured to be elastically more deformable at the small pressing force than pressing member 145B. Pressing member 145A may be made of a material that elastically deforms more greatly at the small pressing force than a material of pressing member 145B.

When a portion of the upper surface of common substrate 150 where pressing member 145B and pressing member 145A are provided is pressed, the pressing force applied to sensor 260B by pressing member 145B is larger than the pressing force applied to sensor 260A by pressing member 145A.

The case where sensor 260A and sensor 260B are the ON/OFF sensors will be described first. When the pressing force applied to common substrate 150 is gradually increased, sensor 260B is turned on earlier than sensor 260A because the load applied to sensor 260B is larger than the load applied to sensor 260A. When the pressing force applied to common substrate 150 is further increased, sensor 260A is turned on.

As described above, pressure sensing element 261B including sensor 260B can sense the pressing force smaller than the pressing force that can be sensed by pressure sensing element 261A including sensor 260A, and pressure sensing element 261B is a pressure sensing element that is more highly sensitive than pressure sensing element 261A. The case where sensor 260A and sensor 260B are the pressure sensors will be described.

When the pressing force applied to common substrate 150 is gradually increased, the load applied to sensor 260B becomes larger than the minimum load that can be sensed by the sensor, earlier than the load applied to sensor 260A, because the load applied to sensor 260B is larger than the load applied to sensor 260A. Then, sensor 260B outputs a current corresponding to the applied load.

When the pressing force applied to common substrate 150 is further increased, the load applied to sensor 260A also becomes larger than the minimum load that can be sensed by the sensor, and both sensor 260A and sensor 260B output a current corresponding to the applied load.

Thereafter, when the pressing force applied to common substrate 150 continues to be increased, the load applied to sensor 260B becomes larger than the maximum load that can be accurately sensed by the sensor. On the other hand, the load applied to sensor 260A is smaller than the maximum load that can be accurately sensed by sensor 260A and sensor 260A accurately outputs a current corresponding to the applied load. As described above, liquid crystal display device 100 according to the twenty-third embodiment includes pressure sensing element 261A and pressure sensing element 261B having different sensitivity, and thus, a wide range of sensing of the detectable pressing force can be set.

Although one pair of pressure sensing elements including pressure sensing element 261A and pressure sensing element 261B is shown in the example shown in this FIG. 170, a plurality of pairs of such pressure sensing elements are distributed between common substrate 150 and TFT array substrate 130. Furthermore, although two types of pressure sensing elements having different sensitivity are provided in the example shown in FIG. 170, three or more types of pressure sensing elements having different sensitivity may be provided. In addition, a plurality of pressure sensing elements having different sensitivity may be provided in accordance with the shape of constructions located around the spacers and the pressing members, and the like.

FIG. 171 is a cross-sectional view showing a first modification of the liquid crystal display device according to the twenty-third embodiment. In the example shown in this FIG. 171, a height of a position where sensor 260A is provided is different from a height of a position where pressure sensing element 261B is provided. Specifically, the position where sensor 260B is provided is higher than the position where sensor 260A is provided, and sensor 260B is closer to common substrate 150 than sensor 260A.

Pressing member 145A and pressing member 145B are made of an elastically deformable material such as a resin. A length of pressing member 145A is substantially the same as a length of pressing member 145B and a height of a position where pressing member 145A is provided is substantially the same as a height of a position where pressing member 145B is provided. Therefore, a distance between a lower end of pressing member 145A and sensor 260A is larger than a distance between a lower end of pressing member 145B and sensor 260B.

When the upper surface of common substrate 150 is pressed by the user, sensor 260B is first pressed by pressing member 145B. Thereafter, when the pressing force applied to common substrate 150 is further increased, pressing member 145A presses sensor 260A. Consequently, even when the pressing force applied to common substrate 150 is small, pressure sensing element 261B can sense this pressing force. When the pressing force applied to common substrate 150 becomes equal to or larger than the predetermined pressing force, pressure sensing element 261A senses this pressing force. Consequently, in the example shown in FIG. 171 as well, the range of sensing of the detectable pressing force can be extended.

FIG. 172 is a cross-sectional view showing a second modification of the liquid crystal display device according to the twenty-third embodiment. In the example shown in this FIG. 172, pressure sensing element 261B is provided at a position adjacent to spacer 161, and pressure sensing element 261A is provided at a position farther from spacer 161 than pressure sensing element 261B.

Since spacer 161 keeps a spacing between common substrate 150 and TFT array substrate 130, common substrate 150 easily deflects with increasing distance from spacer 161. When the user presses a portion of the upper surface of common substrate 150 located above pressure sensing element 261A and pressure sensing element 261B, the load at which pressing member 145A presses sensor 260A is larger than the load at which pressing member 145B presses sensor 260B.

Consequently, even when the pressing force applied to common substrate 150 is small, the pressing force at which pressing member 145A presses sensor 260A is larger than the minimum load that can be sensed by sensor 260A.

When the pressing force by which common substrate 150 is pressed is increased, the pressing force at which pressing member 145B presses sensor 260B becomes larger than the minimum load that can be sensed by sensor 260B, and pressure sensing element 261B also starts sensing.

When the pressing force by which common substrate 150 is pressed is further increased, the load applied to sensor 260A becomes larger than the maximum load that can be sensed by sensor 260A. On the other hand, pressure sensing element 261B continues sensing.

Consequently, in the example shown in this FIG. 172 as well, the range of sensing of the pressing force applied to common substrate 150 can be extended.

As described above, in the example shown in FIG. 172, by making a difference between a spacing between pressure sensing element 261A and spacer 161 and a spacing between pressure sensing element 261B and spacer 161, a difference can be made between the sensitivity of the respective pressure sensing elements and the range of sensing of the pressing force applied to common substrate 150 can be extended.

Twenty-Fourth Embodiment

Liquid crystal display device 100 according to a twenty-fourth embodiment of the present invention will be described with reference to FIGS. 173 to 177. The same reference characters are given to the components shown in FIGS. 173 to 177 that are the same as or corresponding to those shown in FIGS. 1 to 172 above, and description thereof will not be repeated.

FIG. 173 is a cross-sectional view schematically showing liquid crystal display device 100 according to the twenty-fourth embodiment. As shown in this FIG. 173, highly-sensitive sensor 250A and low-sensitive sensor 250B are arranged near a peripheral edge of liquid crystal display device 100. Highly-sensitive sensor 250C and low-sensitive sensor 250D are arranged closer to a central portion of liquid crystal display device 100 than highly-sensitive sensor 250A and low-sensitive sensor 250B.

An amount of displacement of a pressing site when a central portion of common substrate 150 is pressed at the predetermined pressing force is smaller than an amount of displacement of a pressing site when a peripheral edge of common substrate 150 is pressed at the predetermined pressing force. Therefore, when a portion of common substrate 150 where highly-sensitive sensor 250A and low-sensitive sensor 250B are located and a portion of common substrate 150 where highly-sensitive sensor 250C and low-sensitive sensor 250D are located are separately pressed at the same pressing force, the portion where highly-sensitive sensor 250C and low-sensitive sensor 250D are located is displaced more greatly.

The ON/OFF sensors are used as highly-sensitive sensors 250A and 250C and low-sensitive sensors 250B and 250D. An amount of stroke of the upper electrode when highly-sensitive sensor 250A is turned on is smaller than an amount of stroke of the upper electrode when highly-sensitive sensor 250C is turned on. Furthermore, an amount of stroke of the upper electrode when low-sensitive sensor 250B is turned on is smaller than an amount of stroke of the upper electrode when low-sensitive sensor 250D is turned on.

Therefore, even if an amount of deflection on the outer peripheral side of common substrate 150 is smaller than an amount of deflection on the central portion side of common substrate 150 when common substrate 150 is pressed, the load when highly-sensitive sensor 250A is turned on can be matched to the load when highly-sensitive sensor 250C is turned on. Similarly, the load when low-sensitive sensor 250B is turned on can be matched to the load when low-sensitive sensor 250D is turned on.

A specific configuration of each sensor will now be described with reference to FIGS. 174 to 177.

FIG. 174 is a cross-sectional view showing highly-sensitive sensor 250A. Highly-sensitive sensor 250A includes upper electrode 171A formed on the surface of projection 170A, and conductive layer 217A formed on the upper surface of interlayer dielectric 135 of TFT array substrate 130.

Projection 170A is formed on the lower surface of common substrate 150 (color filter substrate 151) and protrudes toward TFT array substrate 130. Assume that height H1 indicates a height of projection 170A.

On both sides of projection 170A, spacer 161A and spacer 161B are spaced apart from each other, and projection 170A is formed at a central portion between spacer 161A and spacer 161B. Assume that spacing L1 indicates a spacing between spacer 161A and spacer 161B.

FIG. 175 is a cross-sectional view of liquid crystal display device 100 showing low-sensitive sensor 250B. As shown in FIG. 175, low-sensitive sensor 250B includes upper electrode 171B formed on the surface of projection 170B and formed to protrude downward from common substrate 150 (color filter substrate 151), and conductive layer 217B formed on the upper surface of interlayer dielectric 135 of TFT array substrate 130. Height H2 of projection 170B is formed to be substantially equal to height H1 of projection 170A shown in FIG. 174 above.

On both sides of projection 170B, spacer 161C and spacer 161D are spaced apart from each other. Spacing L2 between spacer 161C and spacer 161D is formed to be larger than aforementioned spacing L1 between spacer 161A and spacer 161B.

Therefore, a portion of common substrate 150 located between spacer 161A and spacer 161B deflects more easily than a portion of common substrate 150 located between spacer 161C and spacer 161D. Therefore, highly-sensitive sensor 250A is turned on at the pressing force smaller than the pressing force when low-sensitive sensor 250B is turned on.

As a result, at the position where highly-sensitive sensor 250A and low-sensitive sensor 250B are provided, a distinction can be made, for example, between the time when common substrate 150 is pressed with the finger and the time when common substrate 150 is pressed with the pen.

FIG. 176 is a cross-sectional view showing highly-sensitive sensor 250C. As shown in FIG. 176, highly-sensitive sensor 250C includes upper electrode 171C formed on a surface of a projection 170C formed on the lower surface of common substrate 150, and a conductive layer 217C formed on interlayer dielectric 135 of TFT array substrate 130. On both sides of projection 170C, a spacer 161E and a spacer 161F are spaced apart from each other, and projection 170C is formed at a central portion between spacer 161E and spacer 161F.

A spacing L3 between spacer 161E and spacer 161F is substantially the same as spacing L1 between spacer 161A and spacer 161B shown in FIG. 174. On the other hand, a height H3 of projection 170C is formed to be lower than height H1 of projection 170A.

Therefore, a distance between upper electrode 171C and conductive layer 217C is larger than a distance between upper electrode 171A and conductive layer 217A. Therefore, an amount of displacement of common substrate 150 when highly-sensitive sensor 250C is turned on is larger than an amount of displacement of common substrate 150 when highly-sensitive sensor 250A is turned on.

Highly-sensitive sensor 250C is located closer to the central portion of common substrate 150 than highly-sensitive sensor 250A. When common substrate 150 is pressed, a portion of common substrate 150 where highly-sensitive sensor 250C is located deflects more greatly than a portion of common substrate 150 where highly-sensitive sensor 250A is located. Therefore, the pressing force when highly-sensitive sensor 250A is turned on can be substantially matched to the pressing force when highly-sensitive sensor 250C is turned on.

FIG. 177 is a cross-sectional view of liquid crystal display device 100 showing low-sensitive sensor 250D. As shown in this FIG. 177, low-sensitive sensor 250D includes upper electrode 171D formed on a surface of a projection 170D, and a conductive layer 217D formed on interlayer dielectric 135. A spacer 161G and a spacer 161H are formed on both sides of projection 170D.

A height H4 of projection 170D is substantially identical to height H3 of projection 170C shown in FIG. 176. Furthermore, a spacing L4 between spacer 161G and spacer 161H of low-sensitive sensor 250D is formed to be smaller than spacing L3 between spacer 161E and spacer 161F of highly-sensitive sensor 250C.

Therefore, low-sensitive sensor 250D is turned on when the pressing force larger than the pressing force when highly-sensitive sensor 250C is turned on is applied. Therefore, a distinction can be made between the time when a portion of common substrate 150 where highly-sensitive sensor 250C and low-sensitive sensor 250D are provided is pressed with the user's finger and the time when the portion is pressed with the pen or the like.

Furthermore, spacing L4 of low-sensitive sensor 250D is substantially identical to spacing L2 of low-sensitive sensor 250B shown in FIG. 175, and height H4 of projection 170D of low-sensitive sensor 250D is formed to be lower than height H2 of projection 170B of low-sensitive sensor 250B. Therefore, an amount of deflection of common substrate 150 when low-sensitive sensor 250D is turned on is larger than an amount of deflection when low-sensitive sensor 250B is turned on.

Low-sensitive sensor 250D is located closer to the central portion of common substrate 150 than low-sensitive sensor 250B. When common substrate 150 is pressed, the portion of common substrate 150 where low-sensitive sensor 250D is located deflects more greatly than the portion of common substrate 150 where low-sensitive sensor 250B is located. Therefore, consequently, the pressing force when low-sensitive sensor 250D is turned on is substantially identical to the pressing force when low-sensitive sensor 250B is turned on.

As described above, liquid crystal display device 100 according to the present embodiment includes a plurality of pressure sensing elements including the highly-sensitive sensor and the low-sensitive sensor provided to be adjacent to this highly-sensitive sensor. With decreasing distance to the central portion of common substrate 150, the amount of deflection of common substrate 150 when the highly-sensitive sensor is turned on increases and the amount of deflection of common substrate 150 when the low-sensitive sensor is turned on increases as well.

Consequently, in the respective pressure sensing elements, the pressing force when the highly-sensitive sensor is turned on can be matched, and the pressing force when the low-sensitive sensor is turned on can be matched. As a result, in the respective pressure sensing elements, the pressing force when it is determined that the finger has come into contact with the substrate can be matched, and in the respective pressure sensing elements, the pressing force when it is determined that the pen has come into contact with the substrate can be matched. Therefore, occurrence of variations in the range of sensing in the respective pressure sensing elements can be suppressed.

In the present embodiment, by adjusting the spacing between the spacers, a difference is made between the first pressing force when highly-sensitive sensor 250A is turned on and the second pressing force when low-sensitive sensor 250B provided to be adjacent to this highly-sensitive sensor 250A is turned on. By adjusting the height of the projection, the pressing force when the highly-sensitive sensor (low-sensitive sensor) located on the central portion side is turned on is substantially matched to the pressing force when the highly-sensitive sensor (low-sensitive sensor) located on the peripheral edge side is turned on.

For example, as a first modification, the height of the projection of the highly-sensitive sensor may be formed to be higher than the height of the projection of the low-sensitive sensor provided to be adjacent to this highly-sensitive sensor, and thereby, the first pressing force when the highly-sensitive sensor is turned on may be made smaller than the second pressing force when the low-sensitive sensor is turned on. In this case, the spacing between the spacers of the highly-sensitive sensor (low-sensitive sensor) located on the central portion side of common substrate 150 is made narrower than the spacing between the spacers of the highly-sensitive sensor (low-sensitive sensor) located on the peripheral edge side of common substrate 150.

As a second modification, the spacers of the highly-sensitive sensor (low-sensitive sensor) located on the central portion side of common substrate 150 may be made of a material that elastically deforms more easily than a material of the spacers of the highly-sensitive sensor (low-sensitive sensor) located on the peripheral edge side of common substrate 150. Although the example in which the ON/OFF sensors are applied has been described in the present embodiment, the pressure sensors may be used instead of the ON/OFF sensors.

Twenty-Fifth Embodiment

A liquid crystal display device according to a twenty-fifth embodiment of the present invention will be described with reference to FIGS. 178 to 180. The same reference characters are given to the components shown in FIGS. 178 to 180 that are the same as or corresponding to those shown in FIGS. 1 to 177 above, and description thereof will not be repeated.

FIG. 178 is a cross-sectional view of liquid crystal display device 100 according to the twenty-fifth embodiment. Liquid crystal display device 100 shown in this FIG. 178 is provided with highly-sensitive sensor 250A and low-sensitive sensor 250B. Low-sensitive sensor 250B is located on the inner side of liquid crystal display device 100 as compared with highly-sensitive sensor 250A. Although only one highly-sensitive sensor 250A and only one low-sensitive sensor 250B are shown in the example shown in this FIG. 178, a plurality of highly-sensitive sensors 250A are provided on the outer peripheral side of liquid crystal display device 100 and a plurality of low-sensitive sensors 250B are provided on the inner side of liquid crystal display device 100.

A portion of common substrate 150 located near sealing member 108 does not easily deflect as compared with a central portion of common substrate 150 and a portion located around the central portion. Highly-sensitive sensor 250A is arranged near sealing member 108, and low-sensitive sensor 250B is arranged at the central portion of common substrate 150 and around the central portion.

Either the ON/OFF sensor or the pressure sensor can be used as highly-sensitive sensor 250A and low-sensitive sensor 250B. The case where highly-sensitive sensor 250A and low-sensitive sensor 250B are the ON/OFF sensors will be described first.

When a portion of the upper surface of common substrate 150 where highly-sensitive sensor 250A is located and a portion of the upper surface of common substrate 150 where low-sensitive sensor 250B is located are pressed at the same pressing force, an amount of deflection of the portion where highly-sensitive sensor 250A is located is smaller than an amount of deflection of the portion where low-sensitive sensor 250B is located.

Therefore, even when the respective portions are pressed at the same pressing force, the load applied to highly-sensitive sensor 250A is smaller than the load applied to low-sensitive sensor 250B.

On the other hand, highly-sensitive sensor 250A is turned on even at the load smaller than the load when low-sensitive sensor 250B is turned on.

Therefore, the pressing force applied to common substrate 150 when highly-sensitive sensor 250A is turned on can be substantially matched to the pressing force applied to common substrate 150 when low-sensitive sensor 250B is turned on.

Similarly, in the case where highly-sensitive sensor 250A and low-sensitive sensor 250B are the pressure sensors, an output value from highly-sensitive sensor 250A can be substantially matched to an output value from low-sensitive sensor 250B.

A structure of highly-sensitive sensor 250A and low-sensitive sensor 250B will be described with reference to FIGS. 179 and 180. In the example shown in FIGS. 179 and 180, highly-sensitive sensor 250A and low-sensitive sensor 250B are the ON/OFF sensors.

In FIG. 179, highly-sensitive sensor 250A includes upper electrode 171A and conductive layer 217A functioning as the lower electrode, and spacer 161A and spacer 161B are spaced apart from each other on both sides of upper electrode 171A. Projection 170A is formed on the lower surface of common substrate 150 and upper electrode 171A is formed by common electrode 152 located on projection 170A.

In FIG. 180, low-sensitive sensor 250B includes upper electrode 171B and conductive layer 217B functioning as the lower electrode, and spacer 161C and spacer 161D are spaced apart from each other on both sides of upper electrode 171B. Projection 170B is formed on the lower surface of common substrate 150 and upper electrode 171B is formed by common electrode 152 located on projection 170B.

In FIGS. 179 and 180, height H1 of projection 170A is substantially identical to height H2 of projection 170B. Therefore, in the state where the external pressing force is not applied, a spacing between upper electrode 171A and conductive layer 217A is substantially identical to a spacing between upper electrode 171B and conductive layer 217B.

On the other hand, spacing L1 between spacer 161A and spacer 161B is larger than spacing L2 between spacer 161C and spacer 161D. Therefore, a portion of the upper surface of common substrate 150 located between spacer 161A and spacer 161B deflects more easily than a portion of the upper surface of common substrate 150 located between spacer 161C and spacer 161D. Consequently, the sensitivity of highly-sensitive sensor 250A can be made higher than the sensitivity of low-sensitive sensor 250B.

Similarly, in the case where the pressure sensors are used as highly-sensitive sensor 250A and low-sensitive sensor 250B, a difference can be made between the sensitivity of the respective sensors, by making a difference in the spacing between the spacers.

In the specification, liquid crystal display device 100 in which the grid-like black matrix is used as the black matrix has been described. A black matrix including window portions formed in a staggered manner or a stripe-type black matrix may, however, be used as the black matrix.

Although the embodiments of the present invention have been described above, it should be understood that the embodiments disclosed herein are illustrative and not limitative in any respect. The scope of the present invention is defined by the terms of the claims, and is intended to include any modifications within the scope and meaning equivalent to the terms of the claims. Furthermore, the above numerical values or the like are merely provided for illustrative purposes, and the present invention is not limited to the aforementioned numerical values and ranges.

INDUSTRIAL APPLICABILITY

The present invention is applicable to a display device, a pressure detecting device and a method for manufacturing the display device, and is particularly suitable for a display device including a detecting unit detecting an electrical signal defined by a lower electrode and an upper electrode, for a pressure detecting device and for a method for manufacturing the display device.

REFERENCE SIGNS LIST

100 liquid crystal display device; 101 source driver; 102 gate driver; 103 sensor driver; 105 control unit; 110 pixel; 111 source line; 112 gate line; 113 gate line for sensing; 114 pixel electrode; 115 TFT element; 117 output element; 118, 190 pressure sensor; 120 pressure sensing element; 121, 138, 183, 203 source electrode; 122 gate electrode; 123 semiconductor layer; 124 connection wiring; 125, 137, 182, 202 drain electrode; 130 TFT array substrate; 131 underlying layer; 132, 180, 200 semiconductor layer; 133 gate insulating layer; 134, 181, 201 gate electrode; 135, 139 interlayer dielectric; 136 upper insulating layer; 140 glass substrate; 141 underlying layer; 145 pressing member; 146 contact; 147 recess; 148 light blocking layer; 149 resin layer; 150 common substrate; 151 color filter substrate; 152 common electrode; 153 colored layer; 155 black matrix; 156 glass substrate; 157 plastic resin layer; 158 resin pattern; 160 liquid crystal layer; 161 spacer; 170 projection; 171 upper electrode; 172, 189, 191, 218 lower electrode; 173, 174 hole; 184 contact; 185 pad unit; 186 connection unit; 187 reflection electrode; 210 drain pad; 211 wiring; 212 transparent conductive layer; 213 electrode unit; 214 wiring; 215 transparent conductive layer; 216 projection; 217 conductive layer; 219 pad unit; 220 recess; 221 projection; 222 stacked metal layers; 223 resist pattern

The invention claimed is:

1. A display device, comprising:
a first substrate having a first main surface;
a second substrate spaced apart from said first substrate and having a second main surface facing said first main surface; and
a first pressure sensor and a second pressure sensor arranged between said first substrate and said second substrate; wherein
sensitivity of said first pressure sensor being different from sensitivity of said second pressure sensor;
said first pressure sensor includes a first sensor electrode and a second sensor electrode facing said first sensor electrode;
said second pressure sensor includes a third sensor electrode and a fourth sensor electrode facing said third sensor electrode;
the display device further comprises:
a first pressing member pressing said second sensor electrode toward said first sensor electrode; and
a second pressing member pressing said fourth sensor electrode toward said third sensor electrode,
when said second sensor electrode is pressed by said first pressing member, said second sensor electrode comes into contact with said first sensor electrode to conform to said first sensor electrode,
when said fourth sensor electrode is pressed by said second pressing member, said fourth sensor electrode comes into contact with said third sensor electrode to conform to said third sensor electrode,
a shape of said first pressing member is different from a shape of said second pressing member,
said first pressing member presses a central portion of said second sensor electrode, and
said second pressing member presses a portion of said fourth sensor electrode located closer to a peripheral edge of said fourth sensor electrode than a central portion of said fourth sensor electrode.

2. A display device, comprising:
a first substrate having a first main surface;
a second substrate spaced apart from said first substrate and having a second main surface facing said first main surface; and
a first pressure sensor and a second pressure sensor arranged between said first substrate and said second substrate; wherein
sensitivity of said first pressure sensor being different from sensitivity of said second pressure sensor;
said first pressure sensor includes a first coil located between said first substrate and said second substrate, and a second coil spaced apart from said first coil in a stacking direction of said first substrate and said second substrate and arranged to face said first coil;
said second pressure sensor includes a third coil located between said first substrate and said second substrate, and a fourth coil spaced apart from said third coil in the stacking direction of said first substrate and said second substrate and arranged to face said third coil;
said first coil and said third coil are located closer to said first substrate or said second substrate than said second coil and said fourth coil;
a size of said first coil is different from a size of said third coil;
said first coil and said third coil are located closer to said first substrate or said second substrate than said second coil and said fourth coil, and
an amount of current supplied to said second coil is different from an amount of current supplied to said third coil.

* * * * *